(12) United States Patent
Koelbl et al.

(10) Patent No.: US 7,523,423 B1
(45) Date of Patent: Apr. 21, 2009

(54) METHOD AND APPARATUS FOR PRODUCTION OF DATA-FLOW-GRAPHS BY SYMBOLIC SIMULATION

(75) Inventors: Alfred Koelbl, Dachau (DE); Carl Preston Pixley, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 671 days.

(21) Appl. No.: 11/149,756

(22) Filed: Jun. 10, 2005

Related U.S. Application Data

(60) Provisional application No. 60/635,152, filed on Dec. 10, 2004.

(51) Int. Cl.
*G06F 17/50* (2006.01)
(52) U.S. Cl. .................................. 716/3; 716/4; 716/18
(58) Field of Classification Search ...................... 716/1, 716/3–5, 18; 703/13–16
See application file for complete search history.

(56) References Cited

U.S. PATENT DOCUMENTS 6,745,160 B1 * 6/2004 Ashar et al. .................... 703/14
7,260,800 B1 * 8/2007 Koelbl et al. .................... 716/5

* cited by examiner

*Primary Examiner*—Vuthe Siek
(74) *Attorney, Agent, or Firm*—Park, Vaughan & Fleming LLP

(57) ABSTRACT

One embodiment of the present invention provides a system that produces a non-canonical data flow graph (DFG) structure by symbolic simulation of an input representation for a high-level model (HLM). This system considers all scenarios for flow-of-control for the HLM, and represents the flows-of-control under consideration with execution paths. Then, the system determines a set of next execution paths to be processed from a set of active execution paths, and determines a set of indication points, in the input representation, from the set of next execution paths. The system then determines a next symbolic simulation operation to be performed for producing the non-canonical DFG structure using the indication points, and performs the next symbolic simulation operation on the input representation to produce the non-canonical DFG structure. Symbolic simulation can be used with any application utilizing non-canonical representations of an HLM.

47 Claims, 83 Drawing Sheets

FIGURE 2A

```
1   /* DEFINITIONS FOR GLOBAL VARIABLES */
2
3   type_RTLM RTLM; /* Declares "RTLM" to be any data structure suitable for representing the
4   RTLM that is being compared to the HLM */
5
6   type_HLM HLM; /* Declares "HLM" to be any data structure suitable for representing the HLM
7   that is being compared to the RTLM */
8
9   type_dfg RTLM_dfg; /* Declares "RTLM_dfg" to be any data structure suitable for representing
10  the conversion of RTLM into a DFG */
11
12  type_dfg HLM_dfg; /* Declares "HLM_dfg" to be any data structure suitable for representing the
13  conversion of HLM into a DFG */
14
15  type_ts RTLM_ts[MAX_TIME]; /* Declares "RTLM_ts" to be an array of any data structure
16  suitable for representing the conversion of RTLM_dfg into a timestep. The first timestep is indexed
17  as array element RTLM_ts[0], the second timestep is indexed as array element RTLM_ts[1] and a
18  timestep "n" is is indexed as array element RTLM_ts[n]. */
19
20  type_ts HLM_ts[MAX_TIME]; /* Declares "HLM_ts" to be an array of any data structure
21  suitable for representing the conversion of HLM_dfg into a timestep. The first timestep is indexed as
22  array element HLM_ts[0], the second timestep is indexed as array element HLM_ts[1] and a timestep
23  "n" is is indexed as array element HLM_ts[n]. */
24
25  type_ts CS_ts[MAX_TIME]; /* Declares "CS_ts" to be an array of any data structure suitable for
26  representing a timestep of the combining structure. Each timestep n of combining structure,
27  represented by an element CS_ts[n], is suitable for connecting together a timestep RTLM_ts[n] and
28  HLM_ts[n], to produce a miter for timestep n. */
29
30  type_FPT  FPT[2]; /* Declares "FPT" to be an array of any data structure suitable for
31  representing a Fixed Point Target. */
32
33
34  /* Below are definitions for symbolic constants using the "#define" command of the C programming
35  language's preprocessor. Each #define associates a symbolic name with a value. */
36
37  #define TRUE 1
38  #define FALSE 0
39  #define MAX_TIME [integer]  /* Defines maximum number of timesteps to be tried, for SDV
40  propagation, to be value of integer textually inserted at "[integer]." */
```

FIGURE 2B

```
1    test_for_equivalency( RTLM, HLM )
2    {
3
4        /* converts contents of global variable RTLM into a DFG using a standard technique */
5        RTLM_dfg = RTLM_2_DFG( RTLM );
6
7        /* converts contents of global variable HLM into a DFG using symbolic simulation*/
8        HLM_dfg = HLM_2_DFG( HLM );
9
10       /* generate_timestep accepts a DFG argument and returns a timestep model of it.
11       generate_timestep is called twice: once to produce a timestep model "RTLM_ts" from RTLM_dfg and
12       a second time to produce a timestep model "HLM_ts" from HLM_dfg. The control and datapath
13       portions, of RTLM_ts and HLM_ts, can already be identified. */
14       RTLM_ts = generate_timestep( RTLM_dfg );
15       HLM_ts = generate _timestep( HLM_dfg );
16
17       /* Generate a timestep model of combining structure (CS_ts), to complete the miter for each timestep
18       of RTLM_ts and HLM_ts utilized. A combining structure timestep model is generated as follows.
19       First, each of RTLM_ts and HLM_ts is classified. Then, based upon such DFG classification, an
20       appropriate type combining structure is employed. */
21       CS_ts = generate_test_bench (RTLM_ts, HLM_ts );
22
23       ATR_end = 0;
24       ATR_begin = 0;
25
26       /* Label datapath nodes of initial ATR. */
27       label_datapath_nodes (&RTLM_ts, &HLM_ts);
28
29       /* initialize_ initial_timestep initializes datapath present-state inputs of initial timestep with integer
30       SDVs. initialize_ initial_timestep initializes control present-state inputs of initial timestep with
31       symbolic Boolean values. */
32       initialize_ initial_timestep (ATR_begin, ATR_end, &RTLM_ts, &HLM_ts, RTLM,
33       HLM);
34
35       /* initialize_timestep_inputs initializes initial timestep of first and second parameters as follows:
36               -- datapath primary inputs of first and second parameters set with integer SDVs
37               -- control logic primary inputs of first and second parameters set with symbolic Boolean
38                  values
39       */
40       initialize_timestep_inputs (&RTLM_ts[ATR_begin], &HLM_ts[ATR_begin]);
41
42       return equivalence_checking_with_CERs (&ATR_begin, &ATR_end, &RTLM_ts,
43       &HLM_ts, &CS_ts );
44
45   } /* end test_for_equivalency */
```

```
1    if (a == 0)
2    {
3            if (b < 1)
4                    c = 5;
5            else
6                    c = 3;
7            a = c;
8    }
```

FIGURE 7A

```
1   Produce DFG representation for initial values of HLM variables;
2
3   Foreach HLM variable, produce an initial output-list representation;
4
5   Create an EP pointing to first CFG node and having a path condition = 1;
6
7   Push EP;
8
9   While ( not_empty(EP_queue) )
10  {
11          If two EPs, EP1 and EP2, on EP_queue point to same CFG node
12              merge_EPs( );
13
14          If top EP points to a conditional node
15              split_EP( );
16
17          If top EP points to an assignment node
18              process_and_advance_EP( );
19
20          If top EP points to an END node
21              pop EP from EP_queue;
22
23  }
24
25  foreach HLM variable
26          Convert the remaining OL_elements into a DFG representation whose output
27          drives the node representing HLM variable;
```

FIGURE 7B

```
1    merge_EPs( )
2    {
3
4    Remove EP1 and EP2 from EP_queue;
5
6    Create EP3 pointing to same CFG node as EP1 and EP2;
7
8    Set path condition "pc3," of EP3, to a simplified disjunction of the path conditions of
9    EP1 and EP2 (which are, respectively, pc1 and pc2);
10
11   Push EP3 onto EP_queue;
12
13   If pc3 has less variables in its support than pc1, pc2
14         For each HLM variable "curr_HLM_var"
15                construct_DFG(curr_HLM_var, pc3);
16
17   }
18
19   construct_DFG(curr_HLM_var, pc3)
20   {
21
22   identify a set, "IS_pc3," containing the OL_elements, of the output-list for
23   curr_HLM_var, whose path condition intersect pc3;
24
25   if IS_pc3 contains >1 element
26   {
27         /* Given the list IS_pc3, create a group of multiplexors to represent them and return a pointer
28         to the output of such multiplexor group. */
29         ptr2_mpg = merge_OL_elements(IS_pc3);
30
31         Append a new OL_element "OLE_new," to output-list for curr_HLM_var,
32         whose path condition is pc3 and whose DFG-pointer has the value of
33         ptr2_mpg;
34
35         For all OL_elements in output-list for curr_HLM_var, that are members of
36         IS_pc3, change path condition such that they do not intersect pc3;
37
38         If any OL_element "OLE_completely_contained" in output-list for
39         curr_HLM_var, that was a member of IS_pc3, had a path condition that was
40         completely contained in pc3, its path condition is now zero, so remove
41         OLE_completely_contained from the output-list for curr_HLM_var;
42
43         Return ptr2_mpg;
44   }
45   else /* IS_pc3 contains 1 element */
46         return DFG-pointer of one OL_element of IS_pc3;
47   } /* end "construct_DFG" */
```

FIGURE 7C

```
1    /* Given a list of OL_elements, create a group of multiplexors to represent them and
2    return a pointer to the output of such multiplexor group. */
3    merge_OL_elements(IS_pc3)
4    {
5
6    construct a nested ITE expression, "ITE_IS_pc3," from IS_pc3;
7
8    convert ITE_IS_pc3 into MTBDD "MTBDD_IS_pc3;"
9
10   simplify MTBDD_IS_pc3 to produce simp_MTBDD_IS_pc3;
11
12   convert simp_MTBDD_IS_pc3 into an ITE expression "simp_ITE_IS_pc3;"
13
14   build multiplexor group, "mpg_simp_ITE_IS_pc3," for DFG, to represent
15   simp_ITE_IS_pc3;
16
17   return pointer to mpg_simp_ITE_IS_pc3;
18
19   }
```

FIGURE 7D

```
1   split_EP( )
2   {
3
4   Build DFG for conditonal expression of conditional node;
5
6   Create new BDD variable "vnew" that represents value of conditional expression;
7
8   Create two new EPs, EP_if with pc1 = pc*vnew and EP_else with pc2 = pc*-vnew,
9           where pc is the path condition of the top EP;
10  pop EP from EP_queue;
11
12  Push EP_if and EP_else on EP_queue;
13
14  }
```

FIGURE 7E

```
1   process_and_advance_EP( )
2   {
3
4   ptr2_rhs_DFG = merge_rhs( );
5
6   Write to output-list, for variable of lhs, an OL_element, LE1, with a path condition
7   whose value is that of top EP and a DFG-pointer whose value is that of
8   ptr2_rhs_DFG;
9
10  Insure that OL_elements for lhs variable, other than LE1, cover complementary path
11  conditions to those covered by LE1;
12
13  Advance top EP to next CFG node;
14
15  pop EP from EP_queue;
16
17  push EP back onto EP_queue;
18
19  }
```

FIGURE 7F

```
1    merge_rhs( )
2    {
3
4    Identify the set, "rhs_HLM_vars," of HLM variables of the rhs of the assignment;
5
6    For each variable "vcurr" in rhs_HLM_vars:
7    {
8            construct a DFG, pointed to by "vcurr_DFG," for the path condition
9            "pc_of_top_EP" of the top EP by calling:
10                   construct_DFG (vcurr, pc_of_top_EP);
11
12           Add pointer of vcurr_DFG to the list of pointers "rhs_HLM_DFGs;"
13   }
14
15   Identify the set, "rhs_HLM_cons," of HLM constants of the rhs of the assignment;
16
17   For each constant "ccurr" of rhs_HLM_cons:
18   {
19           construct a DFG node for HLM_DFG, pointed to by "ccurr_node," to represent
20           the constant;
21
22           Add pointer of ccurr_node to the list of pointers "rhs_HLM_DFGs;"
23   }
24
25   Produce a DFG, pointed to by "rhs_DFG," that produces the value of the rhs of the
26   assignment, under path condition of the top EP, from rhs_HLM_DFGs as applied
27   through any operators of the rhs;
28
29   return value of pointer stored in rhs_DFG;
30
31   }
```

Starting configuration with unprocessed graph

END node assigned priority of 1 and its predecessors pushed on queue

Since all of 614's successors don't have priorities assigned, mark 614 as "waiting" and push back on queue Since all nodes on queue are waiting, unmark 614, assign 614 highest priority thus far plus one and push 613 on queue Since all of 613's successors do not have priorities, push 613 back on queue and mark it as "waiting"

Since all nodes on queue are waiting, unmark all waiting nodes, set priority of 613 to highest priority thus far plus one, set predecessors of 613 to priority of 613 plus one, mark 613 as DONE and push 613's predecessors on queue Since all of node 616's successors already have priorities, and since 616 already has a priority, mark predecessors to 616 at priority of 616 plus one, mark 616 as DONE and push predecessors on queue Since all of 611's successors don't have priorities, mark 611 as waiting and push back on queue Since 613 is already DONE, just pop it Since all of 614's successors already have priorities, and since 614 already has a priority, push predecessor 613 on queue Since all of 611's successors don't have priorities, push predecessor 611 back on queue Since 613 is DONE, pop it from queue.

Since all nodes on queue are waiting, pop 611, unmark it as waiting, set 611's priority to max priority of all nodes (e.g., 5) plus one Set predecessors to 611, 610 and 612, to priority of 611 plus one; mark 611 DONE; push 610 and 612 on queue Pop 610

Pop 612; push 611

FIGURE 9A

```
1   computePriorities( )
2   {
3           priority(function-end-node) = 1;
4           push(predecessors of function-end-node);
5
6           while ( not_empty(CFG_traversal_queue) )
7           {
8                   curr_node = pop(CFG_traversal_queue);
9
10                  if (marked-done(curr_node)) continue; // Avoid cycles
11
12                  if (all successors of curr_node already have priorities)
13                  {
14                          // curr_node is ready to be processed.
15                          if (curr_node does not yet have priority)
16                                  priority(curr_node) = max(priorities of successors to
17                                  curr_node);
18                          adjustPredecessors(curr_node);
19                          push(predecessors of curr_node);
20                  }
21
22                  else
23                  {
24                          // We push back the node because some of its
25                          // successors have not yet been processed.
26                          mark-waiting(curr_node);
27                          push(curr_node);
28                  }
29
30                  If (all nodes on CFG_traversal_queue are waiting)
31                  {
32                          // All nodes in the queue must be on cycles.
33                          // There are no more nodes that can be processed
34                          // right now. We just take the first one and assign
35                          // a priority to it. We make sure all nodes in
36                          // the cycle get a higher priority than all other
37                          // nodes by assigning the maximum priority
38                          // encountered so far plus one.
39
40                          curr_node = pop(CFG_traversal_queue);
41                          unmark all waiting nodes;
42                          priority(curr_node) = max(priorities of all nodes) + 1;
43                          adjustPredecessors(curr_node);
44                          push(predecessors of curr_node);
45                  }
46          }
47  }
```

FIGURE 9B

```
1   adjustPredecessors(curr_node)
2   {
3           preds_curr_node = predecessors(curr_node);
4
5           if (    size(preds_curr_node) == 1 &&
6                   one element of preds_curr_node already has a priority assigned &&
7                   marked-done(one element of preds_curr_node) == false)
8           {
9                   p = one element of preds_curr_node;
10                  priority(p) = max(priority(p), priority(curr_node));
11          }
12
13          if (curr_node has more than one incoming edge)
14          {
15                  // Make sure that all predecessor priorities are
16                  // higher than this node's priority.
17                  for each element p of preds_curr_node
18                          priority(p) = max(priority(p), priority(curr_node) + 1);
19                  mark curr_node as done;
20          }
21  }
```

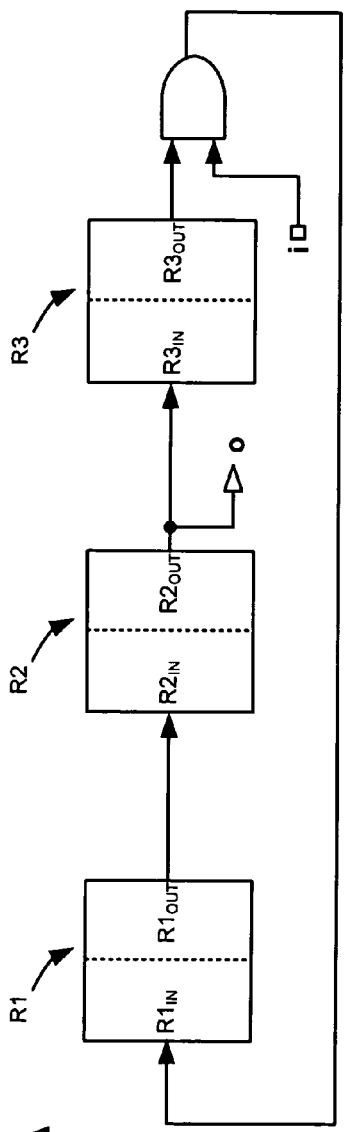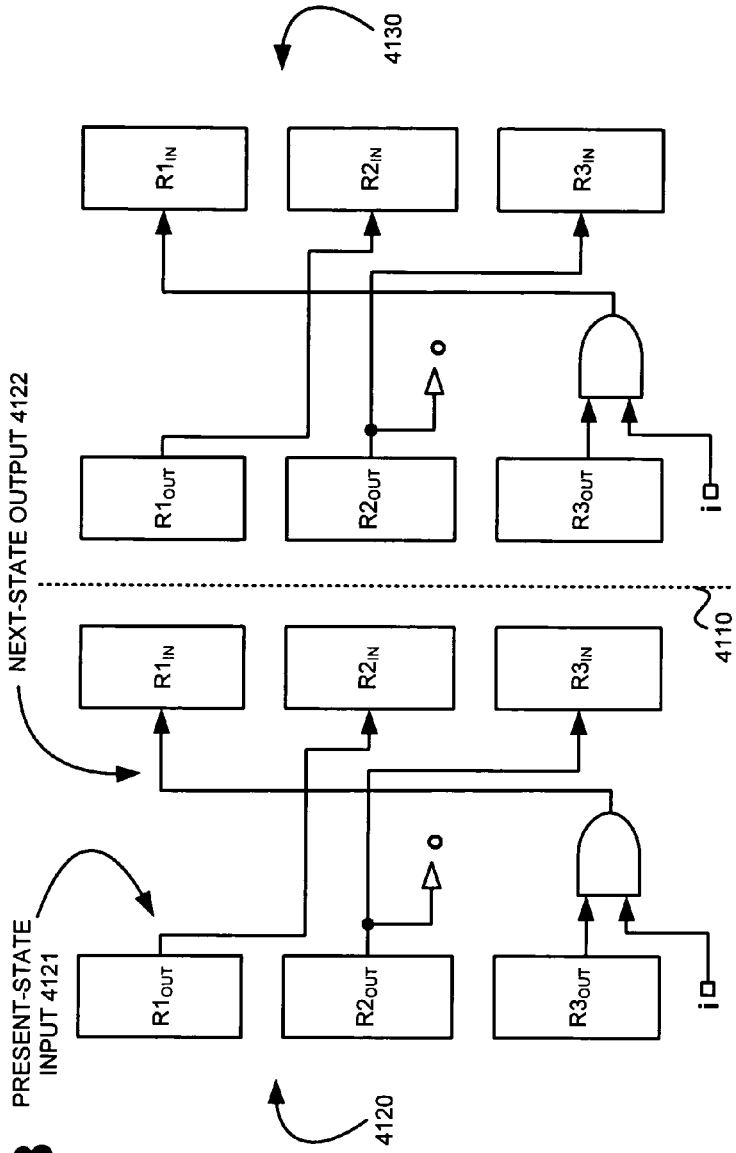
Figure 10A
Figure 10B

FIGURE 11

```
1    foreach output/register-input-node o {
2        tfi_list := empty;
3        traverseFanin(o, tfi_list);
4        store tfi_list at output/register-input o;
5    }
6
7
8    /* won't get stuck in infinite loop if there's a cycle bc this pseudocode only
9    works on the timeframe model where all loops have already been split into
10   present st and next st */
11   traverseFanin(node n, list tfi_list)
12   {
13       foreach input-node i of n {
14           traverseFanin(l, tfi_list);
15       }
16       if (n is input of design or register-output) {
17           append i to tfi_list;
18       }
19   }
```

FIGURE 12

```
1    /* This loop just iterates over all the outputs and calls computeRegistersOnPath for each */
2    foreach output o {
3            path_list := empty;
4            visited_reg_list := empty;
5            if (computeRegistersOnPath(o, path_list, visited_reg_list) == false) {
6                    hasSequentialCycle(o) := true;
7            } else {
8                    store path_list at output o;
9            }
10   }
11
12
13   /* between an output and a primary input, determines the number of registers.  Produces a list where
14      each element indicates an output/input pair and the number of registers in-between them. This
15      function also determines whether there are any cycles. */
16   bool computeRegistersOnPath(node n, int numregs, list path_list, list
17   visited_reg_list)
18   {
19           foreach i, where i is a primary input or register-output in tfi_list(n) {
20                   if (i is input || user has declared register i as memory) {
21                           append pair (i, numregs) to path_list;
22                   } else {
23                           // This is a register output, so continue at the corresponding
24                           //  register input. Increment number of registers.
25
26                           if (visited_reg_list already contains i) {
27                                   // Detected a register cycle
28                                   return false;
29                           }
30                           insert i in visited_reg_list;
31                           node rin := get corresponding register-input of i;
32                           if (computeRegistersOnPath(rin, numregs + 1, path_list,
33                                   visited_reg_list) == false) {
34                                   return false;
35                           }
36                   }
37           }
38           return true;
39   }
```

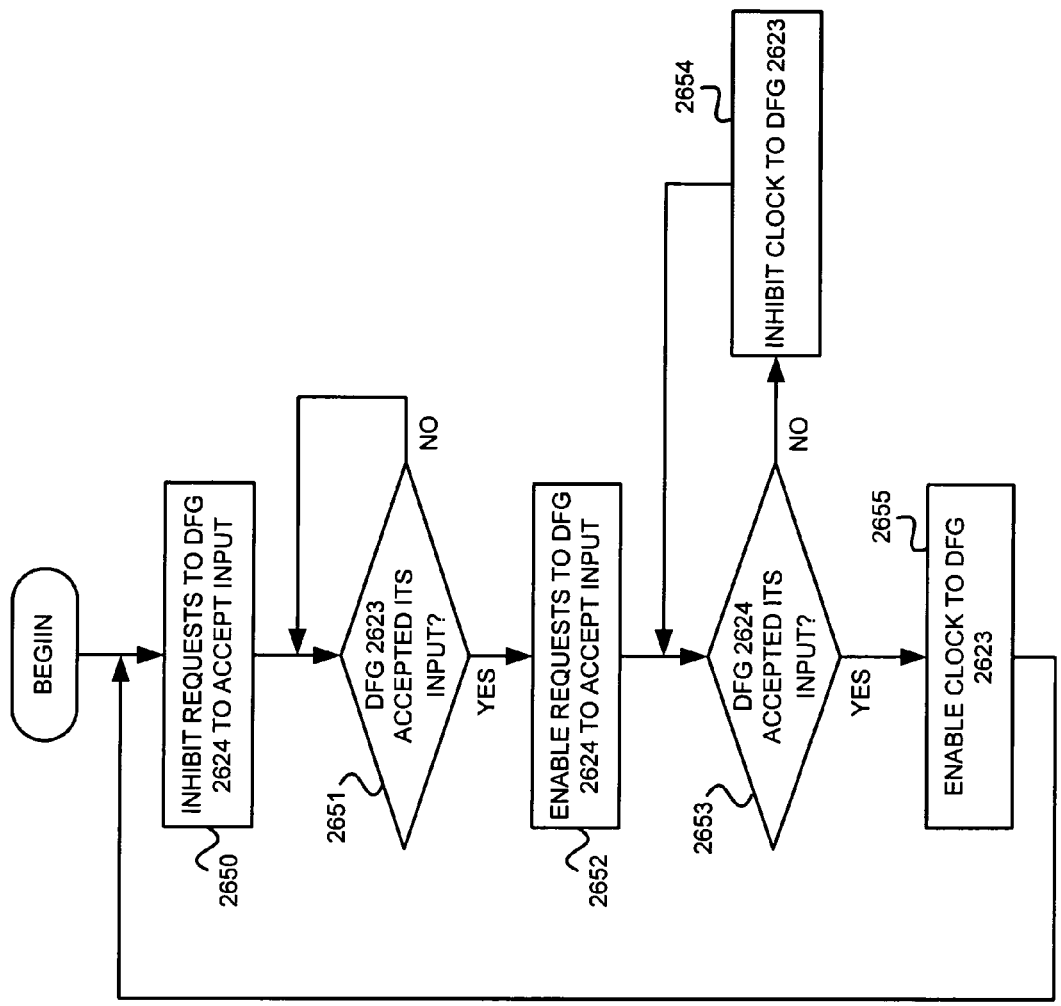

Figure 17

|  | INPUT DFG CLASS "1" | | | |
|---|---|---|---|---|
| | COMBINATIONAL | PIPELINED | HANDSHAKING | UNKNOWN |
| COMBINATIONAL | COMBINATIONAL | PIPELINED | ERROR | CYCLE-ACCURATE |
| PIPELINED | PIPELINED | PIPELINED | ERROR | CYCLE-ACCURATE |
| HANDSHAKING | ERROR | ERROR | STREAM-BASED | CYCLE-ACCURATE |
| UNKNOWN | CYCLE-ACCURATE | CYCLE-ACCURATE | CYCLE-ACCURATE | CYCLE-ACCURATE |

INPUT DFG CLASS "2"

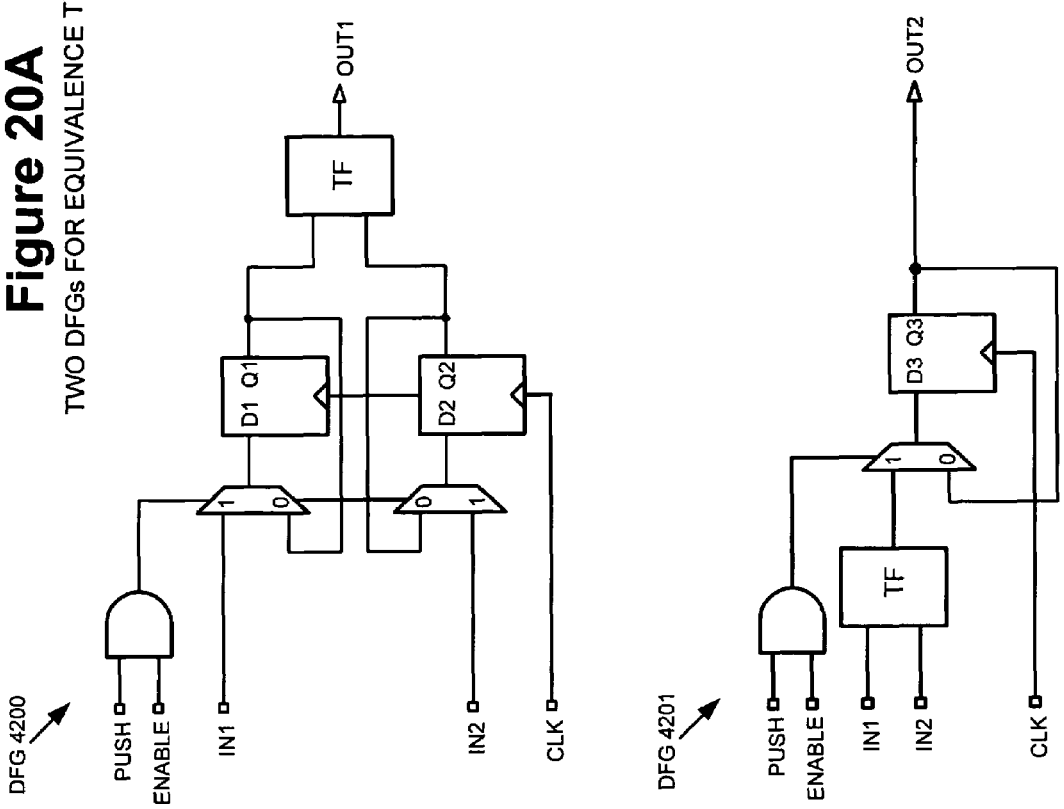

CONVERT TO TIMEFRAME MODEL WITH DATAPATH AND CONTROL IDENTIFIED

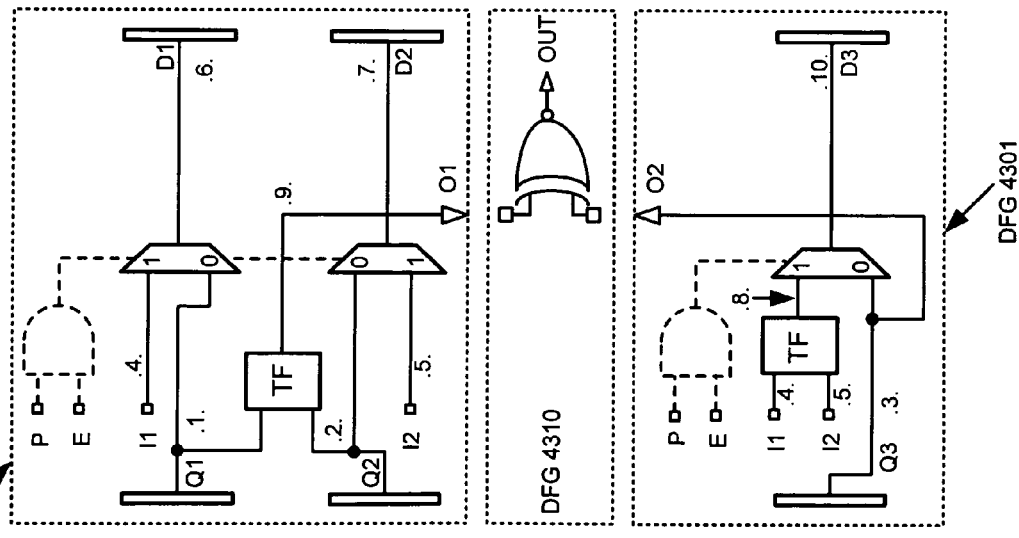
Figure 21A CONNECT TEST BENCH: LABEL DATAPATH NODES

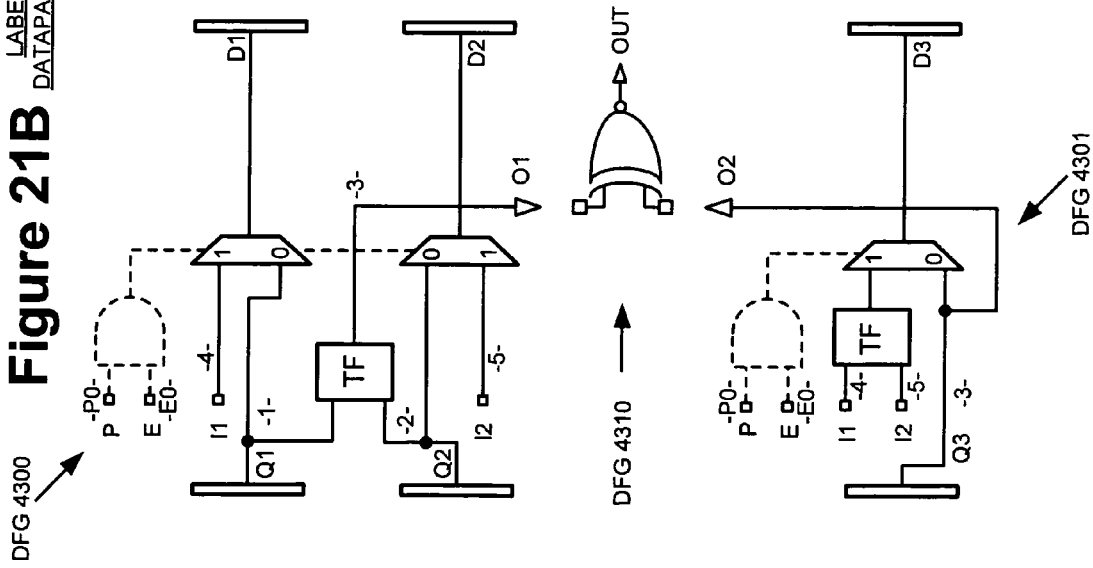
Figure 21B LABELS BECOME INITIAL INTEGER SDVs OF DATAPATH; INJECT SYMBOLIC BOOLEAN VALUES AT CONTROL PRIMARY INPUTS

Figure 21C
DETERMINE CONTROL EXPRESSIONS
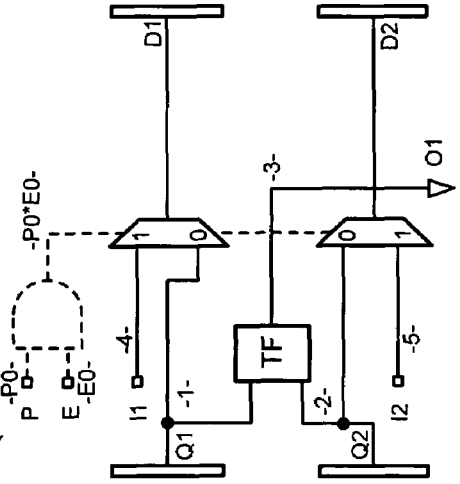
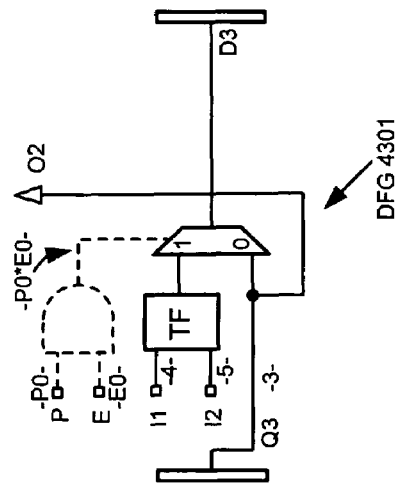

PROPAGATE SDVs

DETERMINE CERs

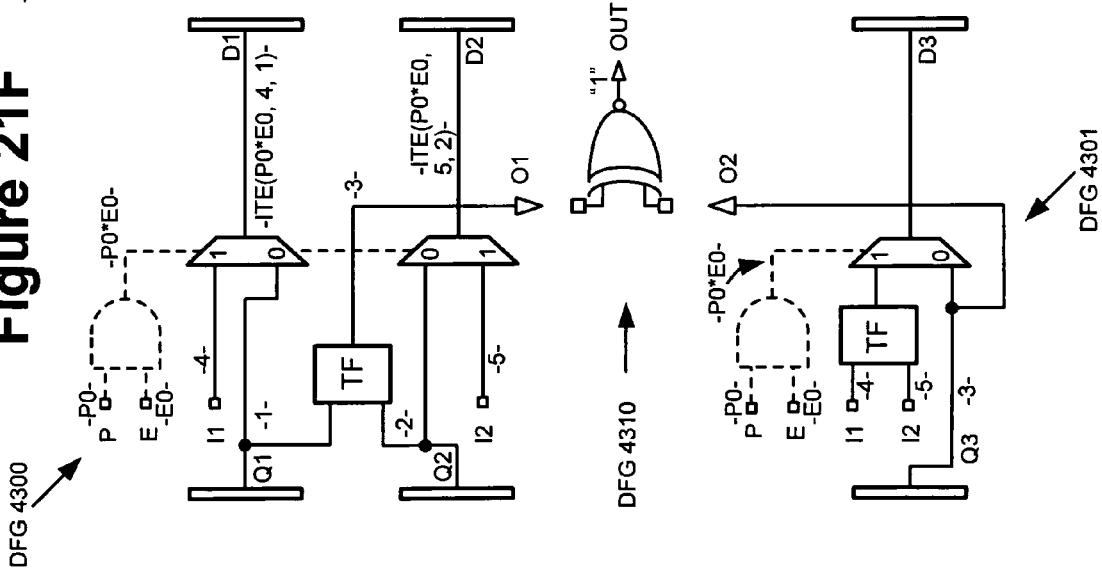
Figure 21F — PROPAGATE SDVs AS A RESULT OF CERs

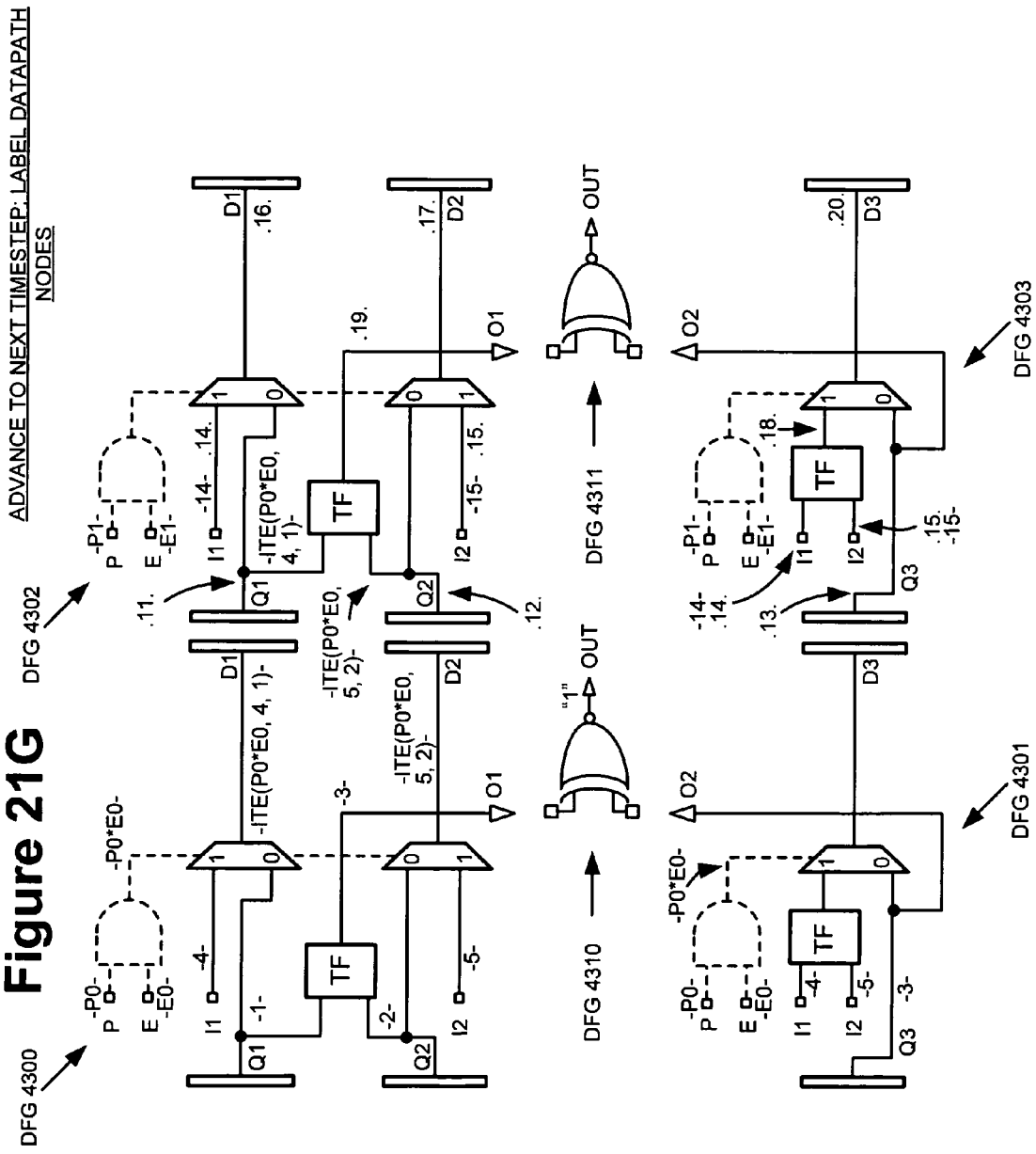

FIGURE 24

```
1   /* Core equivalence determining procedure */
2   equivalence_checking_with_CERs ( &ATR_begin, &ATR_end, &RTLM_ts,
3   &HLM_ts, &CS_ts )
4   {
5
6   if ( find_FPT(&ATR_end, & ATR_begin, &RTLM_ts, &HLM_ts, &CS_ts, &FPT[0] )
7   == TRUE )
8   {
9           ATR_end = ATR_end + 1;
10          label_datapath_nodes (&RTLM_ts, &HLM_ts);
11
12          /* initialize_timestep_state initializes present state of RTLM_ts [ATR_end] and
13          HLM_ts[ATR_end] with next-state SDVs of RTLM_ts [ATR_end -1] and
14          HLM_ts[ATR_end -1]. */
15          initialize_timestep_state (&RTLM_ts, &HLM_ts, ATR_end);
16
17          /* initialize_timestep_inputs initializes timestep, of timestep passed to it as first and second
18          parameters, as follows:
19                  -- datapath primary inputs of first and second parameters set with integer SDVs
20                  -- control logic primary inputs of first and second parameters set with symbolic
21                      Boolean values
22          */
23          initialize_timestep_inputs (&RTLM_ts[ATR_end], &HLM_ts[ATR_end]);
24
25          if ( find_FPT(&ATR_end, &ATR_begin, &RTLM_ts, &HLM_ts, &CS_ts,
26          &FPT[1] ) == TRUE )
27                      if ( FPT[0] == FPT[1] )
28                              return_value = TRUE;
29                      else
30                      {
31                              /* only proved equivalence for some timesteps */
32                              return_value = FALSE;
33                      }
34          else
35          {
36                  generate_counter_example ( );
37                  return_value = FALSE;
38          }
39  }
40  else
41          {
42                  generate_counter_example ( );
43                  return_value = FALSE;
44          }
45
46  return return_value;
47
48  } /* end equivalence_checking_with_CERs */
```

FIGURE 25A

```
1    find_FPT(*ATR_end, *ATR_begin, *RTLM_ts, *HLM_ts, *CS_ts, *FPT )
2    {
3
4       /* declare and initialize local variables */
5       int new_SDVs = TRUE;
6       int new_CERs = FALSE;
7       int try_next_timestep = TRUE;
8       int return_value = FALSE;
9
10      while ( try_next_timestep )
11      {
12              /* Evaluate the control expressions of RTLM_ts[ATR_end] and HLM_ts[ATR_end] */
13              eval_control_exps (RTLM_ts[ATR_end], HLM_ts[ATR_end]);
14
15              /* Fully propagate SDVs, as a result of adding the latest timestep, from
16              RTLM_ts[ATR_begin] to RTLM_ts[ATR_end] and from HLM_ts[ATR_begin] to
17              HLM_ts[ATR_end]; where "ATR_begin" is the timestep at which the last reencode was
18              performed */
19              propagate_SDVs (ATR_end, RTLM_ts, HLM_ts);
20
21              /* ready_to_reencode determines whether there exists a value for t_ready-1, where
22              ATR_end ≥ t_ready-1 ≥ ATR_begin, such that:
23              -- all primary outputs, of RTLM_ts[ATR_begin] to RTLM_ts[t_ready-1] and of
24              HLM_ts[ATR_begin] to HLM_ts[t_ready-1], have SDVs
25              -- all next-state outputs, of RTLM_ts[ATR_begin] to RTLM_ts[t_ready-1] and of
26              HLM_ts[ATR_begin] to HLM_ts[t_ready-1], have SDVs
27              -- For CS_ts[ATR_begin] to CS_ts[t_ready-1], test bench output indicates RTLM_dfg =
28              HLM_dfg */
29              if ( ready_to_reencode (ATR_end, &t_ready, ATR_begin, RTLM_ts, HLM_ts,
30              CS_ts) == TRUE )
31              {
32                      /* reencode t_ready such that:
33                      -- all present-state inputs, of RTLM_ts[t_ready] and HLM_ts[t_ready], have integer
34                      SDVs
35                      -- all primary inputs, of RTLM_ts[t_ready] and HLM_ts[t_ready], have integer SDVs
36                      */
37                      reencode (t_ready, &RTLM_ts, &HLM_ts);
38
39                      /* record_FPT records, in FPT:
40                      For each signal of RTLM_ts[t_ready] and HLM_ts[t_ready], the correspondence
41                      between the timestep-independent name of the signal and its SDV value */
42                      record_FPT (t_ready, RTLM_ts, HLM_ts, &FPT);
43
44                      /* Update timestep last reencoded to be the timestep just reencoded. */
45                      ATR_begin = t_ready;
46                      return_value = TRUE;
47                      try_next_timestep = FALSE;
48              }
```

FIGURE 25B

```
1       else
2           if ( ATR_end = MAX_TIME )
3           {
4               return_value = FALSE;
5               try_next_timestep = FALSE;
6           }
7           else
8           {
9               ATR_end = ATR_end + 1;
10              label_datapath_nodes (ATR_end, &RTLM_ts, &HLM_ts);
11
12              /* initialize_timestep_state initializes present state of RTLM_ts [ATR_end]
13              and HLM_ts[ATR_end] with next-state SDVs of RTLM_ts [ATR_end-1] and
14              HLM_ts[ATR_end-1]. */
15              initialize_timestep_state (&RTLM_ts, &HLM_ts);
16
17              /* initialize_timestep_inputs initializes timestep, of timestep passed to it as
18              first and second parameters, as follows:
19                      -- datapath primary inputs set with integer SDVs
20                      -- control logic primary inputs set with symbolic Boolean values
21              */
22              initialize_timestep_inputs (&RTLM_ts[ATR_end],
23              &HLM_ts[ATR_end]);
24              try_next_timestep = TRUE;
25          }
26
27      } /* end while on "try_next_timestep" */
28
29      return return_value;
30
31  } /* end procedure "find_FPT" */
```

FIGURE 26

```
1   /* Propagate SDVs as follows:
2   -- Propagate SDVs from multiplexor inputs to multiplexor outputs;
3   -- Propagate SDVs from TF inputs to TF outputs;
4   -- Always stop SDV propagation when reaching a next-state register input or a primary output. */
5   propagate_SDVs (ATR_end, RTLM_ts, HLM_ts);
6   {
7
8       /* declare and initialize local variables */
9       int new_mux_prop = TRUE;
10      int new_TF_prop = TRUE;
11
12      while (new_mux_prop OR new_TF_prop)
13      {
14              /*      "mux_prop" fully propagates SDVs from multiplexor inputs to multiplexor outputs
15              based upon the current propagation through ITEs.  An SDV added to a multiplexor output is
16              an ITE SDV.
17                      An ITE SDV can be added when there is a symbolic Boolean expression on the
18              multiplexor's control input and each data input of the multiplexor has an SDV. */
19              new_mux_prop = mux_prop( );
20
21              /*      "TF_prop" fully propagates SDVs from TF inputs to TF outputs based upon the
22              current propagation through multiplexors. */
23              new_TF_prop = TF_prop( );
24      }
25
26  } /* end "propagate_SDVs" */
```

FIGURE 27

```
1   TF_prop( )
2   {
3
4   For each pair of TFs, TF1 and TF2, of the testbench:
5   {
6           For each pair of inputs, TF1_in and TF2_in, where TF1_in is an input of TF1
7           and TF2_in is an input of TF2:
8           {
9                   CER_TF1in_TF2in = SDVs_to_CER( get_SDV_4node(TF1_in),
10                  get_SDV_4node(TF2_in) );
11
12                  If ( CER_can_be_true( CER_TF1in_TF2in ) == TRUE )
13                      If ( Comb_Equiv_Check (TF1, TF2) == TRUE )
14                          /* CER_TF1out_TF2out will be based on the CER between TF1_in
15                             and TF2_in. CER_TF1out_TF2out may be based on CERs
16                             between other pairs of inputs of TF1 and TF2.
17                             CER_TF1out_TF2out may also be based on the functionality of
18                             TF1/TF2. */
19                          CER_TF1out_TF2out = determine whether there is a
20                          CER for which TF1_out = TF2_out;
21
22                          If ( non_null (CER_TF1out_TF2out) == TRUE )
23                              Add_CER(CER_TF1out_TF2out, TF1_out,
24                              TF2_out);
25
26          } /* end "For each pair of inputs" */
27  } /* end "For each pair of TFs" */
28
29  } /* end "TF_prop" */
```

FIGURE 28A

```
1    Add_CER(CER_TF1out_TF2out, TF1_out, TF2_out)
2    {
3
4        /* Determine transitive closure of all nodes connected to TF1_out by CERs */
5        connected1 := determineConnectedNodeSet(TF1_out);
6        /* Determine transitive closure of all nodes connected to TF2_out by CERs */
7        connected2 := determineConnectedNodeSet(TF2_out);
8        /* total set of nodes to be processed is union of the two transitive closures */
9        nodeset := connected1 ∪ connected2;
10
11       /* Each node has a location for temporarily storing the new SDV being determined for it. Those
12       temporary SDVs are initialized with the unique label of each node of nodeset. */
13       foreach node n ∈ nodeset
14       {
15               SDVnew(n) = label(n);
16               If (SDV(n) == NULL) SDV(n) = label(n);
17       }
18
19       /* Next step in the algorithm is to reconstruct the SDVs of all connected nodes. First, for each pair of
20       nodes (nlow, nhigh), we determine their equivalence relationship. This is done for three cases:
21           1.  nlow is in the same equivalence class as TF1_out, nhigh is in the same equivalence class
22               as TF2_out:
23                   The condition for equivalence between nlow and TF1_out is SDV(nlow) ==
24                       SDV(TF1_out).
25                   The condition for equivalence between nhigh and TF2_out is SDV(nhigh) ==
26                       SDV(TF2_out).
27                   The condition for equivalence between TF1_out and TF2_out is
28                       CER_TF1out_TF2out.
29               Thus the complete condition for equivalence of nlow and nhigh is:
30                   c1 := (SDV(nlow) == SDV(TF1_out)) & CER_TF1out_TF2out & (SDV(nhigh) ==
31                       SDV(TF2_out))
32           2.  nlow is in the same equivalence class as TF2_out, nhigh is in the same equivalence class
33               as TF1_out. The complete condition for this case is (analogous to case 1):
34                   c2 := (SDV(nlow) == SDV(TF2_out)) & CER_TF1out_TF2out & (SDV(nhigh) ==
35                       SDV(TF1_out)).
36           3.  nlow is already in the same equivalence class as nhigh. Then the condition is simply:
37                   c3 := (SDV(nlow) == SDV(nhigh)).
38       The disjunction of all three conditions gives the condition for equivalence between nlow and nhigh.
39       An ITE SDV with that condition is added to the node with the higher label. Note that first selection of
40       nlow is NOP since there's no nhigh. */
```

FIGURE 28B

```
1    foreach node nlow ∈ a set, comprised of the following set in descending
2    order of its labels: nodeset
3    {
4            foreach node nhigh ∈ a set, comprised of the following set in descending
5            order of its labels: { x | x ∈ nodeset AND label(x) > label(nlow) }
6            {
7                    /* If nlow can be in the same transitive closure with TF1_out, prior to the connection
8                    of TF1_out and TF2_out, then c1 will have a non-null value */
9                    c1 =
10                           SDVs_to_CER (SDV(nlow), SDV(TF1_out)) &
11                           CER_TF1out_TF2out &
12                           SDVs_to_CER (SDV(nhigh), SDV(TF2_out));
13                   /* If nlow can be in the same transitive closure with TF2_out, prior to the connection
14                   of TF1_out and TF2_out, then c2 will have a non-null value */
15                   c2 =
16                           SDVs_to_CER (SDV(nlow), SDV(TF2_out)) &
17                           CER_TF1out_TF2out &
18                           SDVs_to_CER (SDV(nhigh), SDV(TF1_out));
19                   /* If nlow and nhigh are already in same transitive closure, prior to the connection of
20                   TF1_out and TF2_out, then c3 will have a non-null value */
21                   c3 =
22                           SDVs_to_CER (SDV(nlow), SDV(nhigh));
23                   /*      In below, note use of "SDVnew(nhigh)" on both sides of assignment, which
24                   builds ITE SDVs from "inside out." */
25                   SDVnew(nhigh) := ite(c1 | c2 | c3, SDVnew(nlow), SDVnew(nhigh));
26           }
27   }
28
29   foreach node n ∈ nodeset
30   {
31           SDV(n) := SDVnew(n);
32   }
33
34   } /* end "Add_CER" */
```

FIGURE 29A

```
1    /* See Figure 22B for state of TF outputs after below has been accomplished */
2
3    /* Call to Add_CER by TF_prop at line 23 of Figure 27 */
4    CER_TF1out_TF2out = NOT(P0*E0)
5    TF1_out = node_labeled_9
6    TF2_out = node_labeled_19
7
8    /* Add_CER, lines 5-9 of Figure 28A */
9    connected1 = determineConnectedNodeSet(TF1_out) = { node_labeled_3,
10        node_labeled_9 }
11   connected2 = { node_labeled_19 }
12   nodeset = { node_labeled_3, node_labeled_9, node_labeled_19 }
13
14   /* Add_CER, loop of lines 11-17 of Figure 28A */
15   SDVnew(node_labeled_3) = 3
16   SDVnew(node_labeled_9) = 9
17   SDVnew(node_labeled_19) = 19
18   SDV(node_labeled_19) = 19
19
20   /* Below is nodeset, in descending order, from which nlow is selected. Lines 1-2 of of Figure 28B.
21   */
22   { node_labeled_19, node_labeled_9, node_labeled_3 }
23
24   /* First value for nlow for which there is an nhigh. Set by line 1 of of Figure 28B. */
25   nlow = node_labeled_9
26   /* First, and only, value for nhigh when nlow is node_labeled_9. Set by line 4 of of Figure 28B. */
27   nhigh = node_labeled_19
28
29   /* Determine c1 of Figure 28B, lines 9-12. Of c1, c2 and c3, only c1 is non-zero. */
30   c1 = (SDV(nlow) == SDV(TF1_out)) & CER_TF1out_TF2out & (SDV(nhigh) ==
31       SDV(TF2_out));
32   c1 = (SDV(node_labeled_9) == SDV(node_labeled_9)) & CER_TF1out_TF2out &
33       (SDV(node_labeled_19) == SDV(node_labeled_19));
34   c1 = (3 == 3) & NOT(P0*E0) & 19 == 19);
35   c1 = NOT(P0*E0);
36
37   /* Determine SDVnew(nhigh) of Figure 28B, line 25. */
38   SDVnew(nhigh) = ite(NOT(P0*E0) | 0 | 0, SDVnew(nlow), SDVnew(nhigh));
39   SDVnew(nhigh) = ite(NOT(P0*E0) | 0 | 0, 9, 19);
40   SDVnew(node_labeled_19) = ite(NOT(P0*E0), 9, 19);
```

FIGURE 29B

```
1   /* See Figure 22C for state of TF outputs after below has been accomplished */
2
3   /* Second value for nlow. Set by line 1 of of Figure 28B. */
4   nlow = node_labeled_3
5
6   /* Below is the set of nodes, in descending order, from which nhigh is selected. Lines 4-5 of Figure
7   28B. */
8   { node_labeled_19, node_labeled_9 }
9
10  /* First value for nhigh when nlow is node_labeled_3. Set by line 4 of of Figure 28B. */
11  nhigh = node_labeled_19
12
13  /* Determine c1 of Figure 28B, lines 9-12. Of c1, c2 and c3, only c1 is non-zero. */
14  c1 = (SDV(nlow) == SDV(TF1_out)) & CER_TF1out_TF2out & (SDV(nhigh) ==
15      SDV(TF2_out));
16  c1 = (SDV(node_labeled_3) == SDV(node_labeled_9)) & CER_TF1out_TF2out &
17      (SDV(node_labeled_19) == SDV(node_labeled_19));
18  c1 = (3 == 3) & NOT(P0*E0) & 19 == 19);
19  c1 = NOT(P0*E0);
20
21  /* Determine SDVnew(nhigh) of Figure 28B, line 25. */
22  SDVnew(nhigh) = ite(NOT(P0*E0) | 0 | 0, SDVnew(nlow), SDVnew(nhigh));
23  SDVnew(nhigh) = ite(NOT(P0*E0) | 0 | 0, 10, 19);
24  SDVnew(node_labeled_19) = ite(NOT(P0*E0), 3, 19);
25
26
27  /* See Figure 22D for state of TF outputs after below has been accomplished */
28
29  /* Second value for nhigh when nlow is node_labeled_3. Set by line 4 of of Figure 28B. */
30  nhigh = node_labeled_9
31
32  /* Determine c1 of Figure 28B, lines 9-12. Of c1, c2 and c3, only c3 is non-zero. */
33  c3 = (SDV(nlow) == SDV(nhigh));
34  c3 = (SDV(node_labeled_3) == SDV(node_labeled_9));
35  c3 = 3 == 3
36
37  /* Determine SDVnew(nhigh) of Figure 28B, line 25. */
38  SDVnew(node_labeled_9) = ite(0 | 0 | 1, SDVnew(node_labeled_3),
39      SDVnew(node_labeled_9));
40  SDVnew(node_labeled_9) = ite(1, 3, 3);
41  SDVnew(node_labeled_9) = 3;
42
43
44  /* See Figure 22E for state of TF outputs after below has been accomplished */
45
46  /* Before returning from Add_CER, update SDVs according to loop of Figure 28B, lines 29-32 */
47  SDV(node_labeled_3) = SDVnew(node_labeled_3) = 3;
48  SDV(node_labeled_9) = SDVnew(node_labeled_9) = 3;
49  SDV(node_labeled_19) = SDVnew(node_labeled_19) = ITE(NOT(P0*E0), 3, 19);
```

FIGURE 29C

```
1    /* See Figure 22F for state of TF outputs after below has been accomplished */
2
3    /* Next call to Add_CER by TF_prop at line 23 of Figure 27 */
4    CER_TF1out_TF2out = P0*E0
5    TF1_out = node_labeled_19
6    TF2_out = node_labeled_8
7
8    connected1 = { node_labeled_3, node_labeled_9, node_labeled_19 }
9    connected2  = { node_labeled_8 }
10   nodeset = { node_labeled_3, node_labeled_8, node_labeled_9, node_labeled_19 }
11
12   SDVnew(node_labeled_3) = 3
13   SDVnew(node_labeled_8) = 8
14   SDV(node_labeled_8) = 8
15   SDVnew(node_labeled_9) = 9
16   SDVnew(node_labeled_19) = 19
17
18
19   /* See Figure 22G for state of TF outputs after below has been accomplished */
20
21   /* Below is nodeset, in descending order, from which nlow is selected.  Lines 1-2 of Figure 28B.
22   */
23   { node_labeled_19, node_labeled_9, node_labeled_8, node_labeled_3 }
24
25   /* First value for nlow for which there is an nhigh.  Set by line 1 of of Figure 28B. */
26   nlow = node_labeled_9
27   /* First, and only, value for nhigh when nlow is node_labeled_9.  Set by line 4 of of Figure 28B. */
28   nhigh = node_labeled_19
29
30   /* c1, c2 and c3 all evaluate to zero */
31
32   SDVnew(nhigh) = ite(0 | 0 | 0, SDVnew(nlow), SDVnew(nhigh));
33   SDVnew(node_labeled_19) = ite( 0 | 0 | 0, 3, (ITE(NOT(P0*E0)), 3, 19) );
34   SDVnew(node_labeled_19) = (ITE(NOT(P0*E0)), 3, 19);
```

FIGURE 29D

```
1   /* See Figure 22H for state of TF outputs after below has been accomplished */
2
3   /* Second value for nlow for which there is an nhigh. Set by line 1 of Figure 28B. */
4   nlow = node_labeled_8
5   /* First value for nhigh when nlow is node_labeled_8. Set by line 4 of of Figure 28B. */
6   nhigh = node_labeled_19
7
8   c2 = (SDV(nlow) == SDV(TF2_out)) & CER_TF1out_TF2out & (SDV(nhigh) ==
9       SDV(TF1_out));
10  c2 = (SDV(node_labeled_8) == SDV(node_labeled_8)) & P0*E0 &
11      (SDV(node_labeled_19) == SDV(node_labeled_19));
12  c2 = (8 == 8) & P0*E0 & (ITE( NOT(P0*E0), 3,19) == ITE( NOT(P0*E0), 3,19));
13  c2 = P0*E0
14
15  SDVnew(nhigh) = ite(0 | P0*E0 | 0, SDVnew(nlow), SDVnew(nhigh));
16  SDVnew(node_labeled_19) = ite(P0*E0 , SDVnew(node_labeled_8),
17      SDVnew(node_labeled_19) );
18  SDVnew(node_labeled_19) = ite(P0*E0 , 8, ITE( NOT(P0*E0), 3,19) );
19
20
21  /* See Figure 22I for state of TF outputs after below has been accomplished */
22
23  /* Second value for nhigh when nlow is node_labeled_8. Set by line 4 of of Figure 28B. */
24  nhigh = node_labeled_9
25
26  /* c1, c2 and c3 all evaluate to zero */
27
28  SDVnew(nhigh) = ite(0 | 0 | 0, SDVnew(nlow), SDVnew(nhigh));
29  SDVnew(node_labeled_9) = ite( 0 | 0 | 0, 8, 9 );
30  SDVnew(node_labeled_9) = 9;
31
32
33  /* See Figure 22I for state of TF outputs after below has been accomplished */
34
35  /* Third value for nlow for which there is an nhigh. Set by line 1 of of Figure 28B. */
36  nlow = node_labeled_3
37  /* First value for nhigh when nlow is node_labeled_3. Set by line 4 of of Figure 28B. */
38  nhigh = node_labeled_19
39
40  c3 = ( SDV(nlow) == SDV(nhigh) );
41  c3 = ( SDV(node_labeled_3) == SDV(node_labeled_19) );
42  c3 = ( 3 == ite(P0*E0, 8, ITE( NOT(P0*E0), 3,19) )
43  c3 = NOT(P0*E0)
44
45  SDVnew(nhigh) = ite(0 | NOT(P0*E0) | 0, SDVnew(nlow), SDVnew(nhigh));
46  SDVnew(node_labeled_19) = ite(NOT(P0*E0), SDVnew(node_labeled_3),
47      SDVnew(node_labeled_19) );
48  SDVnew(node_labeled_19) = ite(NOT(P0*E0), 3, ite(P0*E0, 8, ITE( NOT(P0*E0),
49      3,19) ) );
```

FIGURE 29E

```
1    /* See Figure 22J for state of TF outputs after below has been accomplished */
2
3    /* Second value for nhigh when nlow is node_labeled_3. Set by line 4 of of Figure 28B. */
4    nhigh = node_labeled_9
5
6    c3 = (SDV(nlow) == SDV(nhigh));
7    c3 = (SDV(node_labeled_3) == SDV(node_labeled_9));
8    c3 = 3 == 3 = 1;
9
10   SDVnew(nhigh) = ite(1, SDVnew(nlow), SDVnew(nhigh));
11   SDVnew(node_labeled_9) = ite(1, SDVnew(node_labeled_3),
12      SDVnew(node_labeled_9));
13   SDVnew(node_labeled_9) = 3
14
15
16   /* State of TF outputs unchanged, from Figure 22J, after below has been accomplished */
17
18   /* Third value for nhigh when nlow is node_labeled_3. Set by line 4 of of Figure 28B. */
19   nhigh = node_labeled_8
20
21   /* c1, c2 and c3 all evaluate to zero */
22
23   SDVnew(nhigh) = ite(0, SDVnew(nlow), SDVnew(nhigh));
24   SDVnew(node_labeled_8) = ite(0, SDVnew(node_labeled_3),
25      SDVnew(node_labeled_8));
26   SDVnew(node_labeled_8) = ite(0, 3, 8)
27   SDVnew(node_labeled_8) = 8;
28
29
30   /* See Figure 22K for state of TF outputs after below has been accomplished */
31
32   /* Before returning from Add_CER, update SDVs according to loop of Figure 28B, lines 29-32 */
33   SDV(node_labeled_3) = SDVnew(node_labeled_3) = 3;
34   SDV(node_labeled_8) = SDVnew(node_labeled_8) = 8;
35   SDV(node_labeled_9) = SDVnew(node_labeled_9) = 3;
36   SDV(node_labeled_19) = SDVnew(node_labeled_19)
37      =
38              ITE(NOT(P0*E0), 3
39                  ITE(P0*E0, 8
40                      ITE(NOT(P0*E0), 3, 19)
41                  )
42              )
43
44      = ITE(NOT(P0*E0), 3, 8)
```

FIGURE 30

```
1    /*    determineConnectedNodeSet() determines all nodes (transitively) connected to a node n
2    and returns these nodes.
3          It uses a function determineNodesInSDV(x) that determines nodes indicated by a node x's
4    SDV (its "old" SDV, not its SDVnew). These are the nodes whose integer labels occur in the ITE
5    SDV of node x. */
6    determineConnectedNodeSet(node n)
7    {
8          nodeset := {n};
9          fwdset := ∅;
10         oldset := ∅;
11         while (nodeset != oldset)
12         {
13               oldset := nodeset;
14
15               foreach node ns ∈ (nodeset ∩ ¬fwdset)
16               {
17                     fwdset := fwdset ∪ ns;
18                     nodeset := nodeset ∪ determineNodesInSDV(ns);
19               }
20
21               foreach node ns ∈ (all_nodes_in_DFG ∩ ¬nodeset)
22               {
23                     if (nodeset ∩ determineNodesInSDV(ns) != ∅)
24                           nodeset := nodeset ∪ ns;
25               }
26         } /* end while */
27         return nodeset;
28   }
29
30   /*    An example algorithm, for assigning unique labels for each datapath node of each timestep,
31   is given below. This labeling has the property that nodes in the transitive fanin of a node x have
32   lower label numbers than node x. Achieves this by starting the labeling at the primary inputs and
33   increase the label values as proceed towards the primary outputs. This type of labeling can be done
34   to each timestep as it is added. Continue from highest label used in the previous timestep.
35         Algorithm assumes each node has already been assigned a level (distance from the primary
36   inputs). Levelizing a directed acyclic graph (e.g., a DFG) is a standard algorithm and can be done,
37   e.g., by a depth-first traversal of the graph. */
38   labelDFG( )
39   {
40   maxlabel := 0;
41   foreach level l from 0 to maxlevel {
42         nodeset := getNodesAtLevel(l);
43         foreach node n ∈ nodeset {
44               label(n) := maxlabel;
45               maxlabel := maxlabel + 1;
46         }
47   }
48   }
```

METHOD AND APPARATUS FOR PRODUCTION OF DATA-FLOW-GRAPHS BY SYMBOLIC SIMULATION

As provided for under 35 U.S.C. § 119(e), this patent claims benefit of the filing date for U.S. Provisional Application "Method and Apparatus For Production Of Data-Flow-Graphs By Symbolic Simulation," Application No. 60/635,152, filed Dec. 10, 2004. Application No. 60/635,152 is herein incorporated by reference.

CROSS REFERENCE TO RELATED APPLICATIONS

This application is related to the following four U.S. patent applications, all of which are herein incorporated by reference in their entirety:

"Method and Apparatus For Formally Comparing Stream-Based Designs," filed on Jun. 10, 2005, having inventors Alfred Koelbl and Carl Preston Pixley, filed with a Ser. No. 11/149,852 and having U.S. Postal Service Express Mail No. EV587-184-839US.

"Method and Apparatus For Automatic Test Bench Generation," filed on Jun. 10, 2005, having inventors Alfred Koelbl and Carl Preston Pixley, filed with a Ser. No. 11/150,685 and having U.S. Postal Service Express Mail No. EV587-184-842US.

"Method and Apparatus For Formally Checking Equivalence Using Equivalence Relationships," filed on Jun. 10, 2005, having inventors Alfred Koelbl and Carl Preston Pixley, filed with a Ser. No. 11/149,751 and having U.S. Postal Service Express Mail No. EV587-184-860US.

"Method and Apparatus For Initial State Extraction," filed on Jun. 10, 2005, having inventors Alfred Koelbl and Carl Preston Pixley, filed with a Ser. No. 11/149,827 and having U.S. Postal Service Express Mail No. EV587-184-873US.

FIELD OF THE INVENTION

The present invention relates generally to the comparison of models prepared at differing levels of abstraction, and more particularly to the comparison of a high-level model to a register transfer level model.

BACKGROUND OF THE INVENTION

To cope with the high complexity of modern hardware design, designers can adopt a methodology that starts with a very high-level design specification. Such high-level specification can also be referred to as a high-level model (HLM). An HLM captures basic functionality of the design, but can leave out implementation details. The focus can therefore be on algorithm design and design exploration, since even extensive changes in the HLM's architecture can be easily made. Furthermore, a methodology using HLMs enables validation of the architecture during the early stages of design. HLMs can be written in a high-level programming language, such as C or C++.

Once the HLM has been validated, and sufficient decisions have been made regarding implementation of the design, the HLM can be refined to an RTL model (RTLM), that can then be processed by more "back-end" tools that perform synthesis and placement. The process of producing the RTLM from the HLM, however, is often performed in a mainly manual fashion that is error prone. A need therefore exists for EDA tools to assist the designer in verifying that the RTLM adheres to (or is equivalent to) the HLM.

A known approach for determining equivalence between an RTLM and HLM is the running of extensive simulations on both models. The results of such simulations are compared. Such simulations can be very time consuming and can miss subtle discrepancies between the two models.

Therefore, there exists a need for better methods of determining equivalence between RTLMs and HLMs. A formal approach to determining such equivalence is desirable since such approaches have the possibility of actually proving that, according to some standard of equivalency, the two models are equivalent.

However, conventional approaches to formal analysis are often too inefficient when applied to anything but small scale designs. What is needed, therefore, are more efficient approaches to formal analysis that have a good expectation of proving equivalency between large-scale designs.

In addition to the formal analysis itself, issues that can also be addressed, for improving the efficiency of formal approaches to equivalence determination, include the following: producing an appropriate common representation of the RTLM and HLM; producing an appropriate test bench for combining the RTLM and HLM; and determining appropriate initial conditions from which to start a formal analysis.

SUMMARY OF THE INVENTION

Please refer to the Glossary of Selected Terms, included at the end of the Detailed Description, for the definition of selected terms used in the below Summary. Section numbers in the below Summary correspond to section numbers in the Detailed Description.

1. Summary of an Equivalency Testing System

A novel equivalency testing system is presented. As a framework for discussing the various components of the equivalency testing system, a pseudo-coded procedure called "test_for_equivalency" is also presented.

Both an RTLM and HLM to be compared for equivalence are converted into DFGs, called $RTLM_{DFG}$ and $HLM_{DFG}$. The HLM can be specified as a function written in a high-level programming language, such as C++. $HLM_{DFG}$ can be determined by a new technique, of symbolic simulation of the HLM, presented herein.

$RTLM_{DFG}$ and $HLM_{DFG}$ are put into a timestep form, referred to as $RTLM_{ts}$ and $HLM_{ts}$. An arbitrary timestep "t," of $RTLM_{ts}$ and $HLM_{ts}$, can be referred to as $RTLM_{ts}[t]$ and $HLM_{ts}[t]$.

A combining structure $CS_{ts}$ can be selected that couples $RTLM_{ts}$ and $HLM_{ts}$. A combining structure can also be referred to as a "test bench." The combining structure has the following property: if, for a timestep t, $RTLM_{ts}[t]$ and $HLM_{ts}[t]$ are equivalent according to a given (or automatically determined) notion of equivalence, then $CS_{ts}[t]$ will detect this. Different types of combining structures can be selected depending upon the type of circuit represented by $RTLM_{ts}$ and $HLM_{ts}$. Novel techniques, for classifying each of $RTLM_{ts}$ and $HLM_{ts}$, and for selecting a suitable $CS_{ts}$, are presented. In addition, novel forms of combining structure, suitable in general for formal verification, are presented. For example, a novel combining structure, for showing that $RTLM_{ts}$ and $HLM_{ts}$ are stream-equivalent, is presented.

The complete system, comprised of $RTLM_{ts}[t]$, $HLM_{ts}[t]$ and $CS_{ts}[t]$, is referred to as a "miter." The miter can have certain parts designated as representing control logic and other parts designated as representing datapath logic. Parts of the miter designated as control can be subject to a known form of bit-level equivalence checking. Parts of the miter designated as datapath are subject to a new form of equivalence checking that works above the bit level, using a node value indicator referred to herein as a "symbolic data value" or SDV, and that seeks to prove equivalence by a form of inductive theorem proving.

In the datapath portions of the miter, equivalence checking can be conducted at a higher level of abstraction if one is not interested in actual data values, but only in whether $RTLM_{ts}$ and $HLM_{ts}$ produce the same data (given that they receive the same input data). In this case, integers can be used as an abstraction for datapath data values: if two signals have the same integer number, this signifies that their actual data values are the same; if two signals have the different integer numbers, this signifies their actual data values are different. To refer to such integer values, the term "integer SDV" can be used.

If it can be proven that $RTLM_{ts}$ and $HLM_{ts}$ both produce the same SDVs on all of their primary outputs, and for all times, it is proven that both designs are equivalent. In order to determine the SDVs of the primary outputs of $RTLM_{ts}$ and $HLM_{ts}$, input SDVs must be propagated through the miter.

A novel form of inductive theorem proving starts from initial conditions for the first timestep for the miter (i.e., for timestep $RTLM_{ts}[0]$, $HLM_{ts}[0]$ and $CS_{ts}[0]$). The initial state for $RTLM_{ts}[0]$ can be determined by any suitable known means, but the initial state for $HLM_{ts}[0]$ can be determined by a new technique, of partial execution of the HLM, presented herein.

A first "phase" of SDV propagation is performed. In SDV propagation, SDVs of the first timestep are sought to be propagated forward to the outputs of the first timestep. If a path of propagation cannot be fully pursued to the outputs of a timestep, additional timesteps can be added. The first phase of SDV propagation ends when the miter is completely "populated" with SDVs up to a timestep called t_ready-1. The full population of SDVs means that if RTLM and HLM can be equivalent during those timesteps (i.e., the timesteps from the first timestep up to t_ready_1), this equivalence will be detected by the combining structure of each of those timesteps.

In propagating SDVs through a timestep, a complication arises with multiplexers. Consider the case of a two-input multiplexer where an integer SDV is present at each of the multiplexer's inputs. If the two SDVs are to be propagated through the multiplexer, the resulting SDV on the multiplexer output cannot be represented as an integer, since the multiplexer's selector input determines which SDV is routed to the output. To model the conditional dependency of the multiplexer output, on the selector condition, a second type of SDV, referred to herein as an ITE (If-Then-Else) SDV, is introduced.

The SDVs chosen and formed, as part of the first phase of SDV propagation, are guided by labels that are assigned to the nodes of the miter in a particular order as timesteps are added.

The timestep at t_ready is reencoded and the symbolic values of its datapath signals, relative to their timestep-invariant node names, are recorded as a potential first "fixed-point" of the SDV propagation process.

As part of the reencode, the order of label assignment, that guided the selection and formation of SDVs during the first phase of SDV propagation, is repeated from the beginning.

Starting with the potential first fixed-point as the initial condition, a second phase of SDV propagation is performed. Like the first phase, the ending of the second phase of SDV propagation is marked by the miter being completely "populated" with SDVs up to a later timestep, also called t_ready-1.

Because the second phase of SDV propagation is guided by a repetition of the same labeling process that guided the first phase of SDV propagation, if the potential first fixed-point is a real fixed-point, the exact same form of SDV propagation will occur during the second phase as occurred during the first phase.

This repetition of propagation phases can be detected as follows. The timestep of the later t_ready is reencoded. The symbolic values of the next-state and primary inputs of the later t_ready, relative to their timestep-invariant node names, are recorded as a potential second "fixed-point."

If the first and second, potential fixed-points, are identical, then it has been inductively proven that the process of SDV propagation can be repeated, indefinitely, for all timesteps. If each timestep "t," from the initial timestep of the first phase up to the timestep t_ready-1 of the second phase, indicates $HLM_{ts}[t]$ and $RTLM_{ts}[t]$ are equivalent (as indicated by $CS_{ts}[t]$), then it is known that HLM and RTLM are equivalent for all timesteps.

The proving of equivalence between HLM and RTLM can produce an "equivalence indicator" for a user of the system. If equivalence determination process cannot prove equivalence, a "counter example" can be produced to aid the user in locating where behavior of the HLM diverges from that of the RTLM.

1.1 Summary Of Conversion of HLM and RTLM to DFGs

Within test_for_equivalency, a procedure "RTLM_2_DFG" can be invoked for conversion of an RTLM into an $RTLM_{DFG}$. $RTLM_{DFG}$ is referred to in the pseudo-code as "RTLM_dfg." Also within test_for_equivalency, procedure "HLM_2_DFG" can be invoked for conversion of an HLM into an $HLM_{DFG}$.

1.2 Summary of Conversion into Timestep Form

Within test_for_equivalency, a procedure "generate_timestep" can be invoked twice: once for generation of $RTLM_{ts}$ from $RTLM_{DFG}$ and a second time for generation of $HLM_{ts}$ from $HLM_{DFG}$. $RTLM_{ts}$ is referred to in the pseudo-code as "RTLM_ts." $HLM_{ts}$ is referred to in the pseudo-code as "HLM_ts."

1.3 Summary of Combining Structure Generation

A process for producing a $CS_{ts}$ can be summarized as follows. $RTLM_{ts}$ and $HLM_{ts}$ can each be classified. Based upon the classification of each DFG, a $CS_{ts}$ can be selected.

A $CS_{ts}$ can be designed to produce an output "q" that has the following property: "q" for a timestep t, is TRUE if and only if $RTLM_{ts}[t]$ and $HLM_{ts}[t]$ are equivalent according to a given notion of equivalence.

One of the combining structures presented is for the comparison of stream-based designs. This stream-based combining structure, on its own and without a prior step of classification of the designs to be coupled, is novel. Other applications, of this stream-based combining structure, are discussed.

Production of the miter can include identification of control and datapath nodes. Each datapath node can be assigned a value referred to herein as an "SDV." Each control node can be assigned a value referred to herein as a "symbolic Boolean expression."

An SDV is not intended to represent a particular piece of data, or a particular value. Rather, an SDV is intended to represent whether one node of the datapath has been assigned the same value (or data structure) as another node of the datapath. An SDV can be of two types: integer and ITE.

An integer SDV is just an integer value. The actual data represented by the integer SDV can be arbitrarily complex.

An ITE SDV takes three arguments: a symbolic Boolean expression, a first SDV and a second SDV. If the symbolic Boolean expression is satisfied, then the value of the first SDV is returned by the ITE SDV, else the value of the second SDV is returned by the ITE SDV. The first and second SDVs can either be an integer SDV, or a nested ITE SDV.

An ITE SDV can be used to indicate whether or not datapath nodes are outputting the same data, at a particular time, depending upon which conditions of the control nodes are met.

A symbolic Boolean expression is the same as an ordinary Boolean expression, except that rather than being comprised of Boolean variables (e.g., "x" or "−x") and/or Boolean values (e.g., "1" or "0"), it is comprised of, respectively, symbolic Boolean variables and/or symbolic Boolean values. A symbolic Boolean expression can be a single symbolic Boolean variable or a single symbolic Boolean value. A symbolic Boolean expression can also be comprised of symbolic Boolean variables and/or symbolic Boolean values connected by Boolean operators.

A symbolic Boolean variable can differ from an ordinary Boolean variable as follows: it can indicate the timestep from which it arose. A symbolic Boolean value can differ from an ordinary Boolean value as follows: it can indicate the timestep from which it arose.

A CER is a symbolic Boolean expression that describes the conditions under which a node "n1" at a timestep "t1" has the same integer SDV as a node "n2" at a timestep "t2."

If "n1" and "n2" are both assigned integer SDVs, the CER between them can be as follows. The CER can be a logic 1 if both "n1" and "n2" have the same integer SDV. The CER can be a logic 0 if "n1" and "n2" have different integer SDVs.

If "n1" is assigned an integer SDV and "n2" is assigned an ITE SDV, then the CER between them can be as follows. The CER can be logic 0 if there is no setting of the variables of the ITE SDV for which it evaluates to the same integer SDV assigned to "n1." The CER can be a symbolic Boolean expression that specifies a setting of the variables of the ITE SDV for which it evaluates to the same integer SDV assigned to "n1."

If "n1" is assigned an ITE SDV "iteSDV1" and "n2" is assigned an ITE SDV "iteSDV2," then the CER between them can be as follows. Let us call the collection of all variables of iteSDV1 and iteSDV2 the "support" for any CER between them. The CER can be logic 0 if there is no setting of the support variables that causes iteSDV1 and iteSDV2 to evaluate to the same integer SDV. The CER can be a symbolic Boolean expression that specifies a setting of the variables of the support that causes iteSDV1 and iteSDV2 to evaluate to the same integer SDV.

Any appropriate heuristic or procedure can be used to identify a node of a miter as part of control or part of the datapath. Also, the division between control and datapath nodes can be guided by user input.

Within test_for_equivalency, a procedure "generate_test_bench" can be invoked for generation of $CS_{ts}$ from $RTLM_{ts}$ and $HLM_{ts}$. $CS_{ts}$ is referred to in the pseudo-code as "CS_ts."

1.4 Summary of Initializations

An "Active Timestep Range" (ATR) is the range of timesteps, of a miter, currently being processed with the objective of further propagating SDVs. An ATR begins at a timestep t=ATR_begin and continues to a timestep at t=ATR_end.

Prior to starting an equivalence-determining process, the following initializations can be done.

The ATR of the miter can be defined by setting values for ATR_begin and ATR_end. The miter can be initialized to begin as a single timestep at t=0. In this case, for example, ATR_begin and ATR_end can both be initialized to zero.

For each timestep of the ATR, each datapath node can be assigned a "label identifier." A label identifier is a globally unique identifier for each datapath node of a miter. Label identifiers can be used, as described below, for insuring that equivalence classes of nodes, that have been determined by an equivalence-determining process, are combined according to a predictable ordering.

In order to "prime" an SDV propagation process, whereby equivalences between nodes can be determined, the following initializations can be accomplished.

Initial SDVs, for the present-state nodes of the ATR, can be assigned. In order to determine such initial SDVs, initial states for RTLM and for HLM can be determined. A novel technique is described herein for determining an initial state of an HLM by partial execution of it.

SDVs can be assigned to datapath primary inputs of the ATR. Symbolic Boolean expressions can be assigned to control primary inputs of the ATR.

Propagation of SDVs through TFs can be assisted by the determination of CERs. Specifically, propagation of SDVs through a TF "TF1" and a TF "TF2" can be assisted by the determination of CERs between the inputs of TF1 and TF2. Such CERs, combined with a CEC of TF1 and TF2, can allow for CERs between the outputs of TF1 and TF2 to be determined.

Within test_for_equivalency, the present-state inputs of the initial timestep of the initial ATR (e.g., $RTLM_{ts}[0]$ and $HLM_{ts}[0]$), can be set by a procedure called "initialize_initial_timestep." initialize_initial_timestep can work by first finding initial states for RTLM and HLM. The initial state for HLM can be found by a novel technique that utilizes partial execution of the HLM. Results of the partial execution can be saved, using further novel techniques, such that initialization of the initial timestep can be accomplished.

1.5 Summary of Equivalence Checking with CERs

A flowchart, with an overview of a core equivalence-determining process, is presented.

The first step of the process is to produce and initialize a miter.

An SDV propagation process is applied to the ATR.

The ATR is tested for whether it has a timestep at t=t_ready that is ready for reencoding.

If there is a timestep t_ready, the following actions can be taken: t_ready is reencoded; a first fixed-point target (FPT) is extracted from t_ready and recorded in an array element FPT[0]; and the ATR is updated to begin at t_ready (i.e., ATR_begin=t_ready). In preparation for trying to find a second FPT, timesteps are also added to the ATR and they are initialized (or "primed") for more SDV propagation.

If a timestep ready for reencoding has not yet been found, the miter is tested for whether a maximum number of timesteps have already been tried. If a maximum number of timesteps have already been tried, the equivalence-determining process fails and a counter-example can be generated for the user. If a maximum number of timesteps have not been tried, a timestep (or timesteps) are added to the ATR. Once timesteps have been added to the ATR, the process repeats from the above step of applying an SDV propagation process to the ATR.

Assuming the search for a first FPT is successful, the above-described process is repeated in order to find a second FPT at a later timestep of the miter.

If a second FPT is found, the two FPTs can be compared. If the two FPTs are identical, then it is proven that $HLM_{ts}$ is equivalent to $RTLM_{ts}$ for all timesteps.

The equivalence-determining process presented herein is described mostly with respect to the analysis of a DFG that has been derived from an RTLM and HLM. However, the equivalence-determining process presented can be used for comparing two RTLMs to each other, or for comparing two HLMs to each other. Furthermore, the DFG, to which the equivalence-determining process presented herein is applied, can be derived from any type of initial source description.

Within test_for_equivalency, the procedure "equivalence_checking_with_CERs" can be called that performs the core equivalence determining process.

2. Summary of HLM to DFG Conversion by Symbolic Simulation

The term "symbolic simulation," as utilized herein, refers to a simulated execution of an input representation such that all possible scenarios, for flow-of-control, are considered. The result is a non-canonical data structure that explicitly represents the flows-of-control considered.

As an example, the input representation, to be symbolically simulated, can be a CFG. The CFG can be produced from an HLM, where the HLM is expressed in a high-level programming language, such as C or C++. The particular form of non-canonical data structure, produced by symbolic simulation of the CFG, can be a DFG.

Each possible flow-of-control through the CFG can be represented by a marker referred to herein as an "execution path." An execution path can serve as a bridge, between the CFG and the DFG being produced, as follows. In addition to marking a location with the CFG, an execution path can include an expression referred to herein as a "path condition." A path condition of an execution path "x" can express, in terms of variables set by nodes of the DFG being produced, the condition under which the CFG location (indicated by execution path "x") can be reached.

The initial value, of each variable of the CFG, can be represented as an input to the DFG to be produced. Once symbolic simulation is completed, these initial values can "flow through" the DFG and be transformed, by operators of the DFG, to produce output values for HLM variables.

Each possible flow of control through the CFG is encompassed within the DFG produced by symbolic simulation. Depending upon the initial values input to the DFG, data can flow through particular paths of the DFG in order to produce the correct result.

An example CFG, that can be symbolically simulated, is presented. An example symbolic simulation of the example CFG, to produce a DFG, is presented.

A key operation of any symbolic simulation is "splitting" an existing execution path "x," into two execution paths "x_true" and "x_false," when a conditional node "y" of a CFG is reached. Execution path x_true handles the case where the conditional expression, of conditional node "y," is satisfied. Execution path x_false handles the case where the conditional expression, of conditional node "y," is not satisfied. Symbolic execution fully explores both x_true and x_false so that the resulting DFG can handle both cases. Another key operation of symbolic simulation is "merging" two execution paths, "x_true" and "x_false," into a re-combined execution path "x."

The symbolic simulation techniques presented herein are discussed primarily with respect to their application to the equivalence-determining process presented herein. However, the symbolic simulation techniques presented herein can be used in conjunction with any application utilizing a non-canonical representation of an HLM. By way of example only, and without limiting the range of potential applications, non-canonical representations of an HLM can be useful with other types of design analysis tools and with synthesis tools.

Techniques for handling loops with efficient "decision procedures," during symbolic simulation, are presented.

The order in which execution paths are pushed-on or popped-off the queue of execution paths, during symbolic simulation, can have a significant impact on the efficiency of symbolic simulation and on the quality of the constructed DFG. In general, execution paths which are split should be merged again as soon as possible. This goal can be achieved by appropriately sorting the queue of execution paths.

As a preprocessing step, to applying symbolic simulation to a CFG, the nodes of the CFG can each be given a priority that determines when they are traversed during symbolic simulation. Execution paths that point to nodes with a higher priority can be traversed before execution paths pointing to lower priority nodes.

An example CFG, and an example application of a prioritization process to such CFG, is presented. The prioritization process, used for the example, is presented in pseudo-code form.

3. Summary of the Timestep Form

As discussed above, prior to applying an SDV-propagation process, the miter can be converted into timestep form.

An example DFG, for conversion into the timestep form, is presented.

An example conversion into timestep form, of the example DFG, is presented.

Production of the timestep form used herein is well-known in the art, and any suitable technique for production of the timestep form can be used in conjunction with the inventive techniques described herein.

4. Summary of Test Bench Generation

As discussed above, test bench generation relates to producing a DFG in timestep form, referred to herein as a "combining structure" (or $CS_{ts}$), for combining $RTLM_{ts}$ and $HLM_{ts}$ in a way that permits the resulting timestep, referred to herein as a "miter" timestep, to be tested for equivalence. A timestep "t" of a miter ($MT_{ts}[t]$) can be comprised of the following DFGs: $RTLM_{ts}[t]$, $HLM_{ts}[t]$ and $CS_{ts}[t]$.

A process for accomplishing the combination of DFGs can be summarized as follows. Each $RTLM_{ts}$ and $HLM_{ts}$ can each be classified, individually, based on structural criteria. The classification assigned is referred to herein as a "DFG class." Based upon the DFG class of $RTLM_{ts}$ and $HLM_{ts}$, a structure $CS_{ts}$ for combining the two DFGs can be selected. Such selection of a combining structure can be viewed as applying the DFG class of $RTLM_{ts}$ and the DFG class of $HLM_{ts}$ to a two-dimensional decision matrix. The selected combining structure can be constructed by drawing upon a library of DFG building blocks.

As discussed above, the $CS_{ts}$ produced can be designed to have a "q" output with the following property: "q," for a timestep t, is TRUE if and only if $RTLM_{ts}[t]$ and $HLM_{ts}[t]$ are equivalent. Once the $CS_{ts}$ has been produced, the miter timestep can be processed, for identification of control and datapath nodes, prior to application of an equivalence-determining procedure.

While the above-described process, for the selection of $CS_{ts}$, assumes $RTLM_{ts}$ and $HLM_{ts}$ each belong to only one DFG class, this is not necessarily the case. To address this situation, for each pair of corresponding primary outputs, from $RTLM_{ts}$ and $HLM_{ts}$, each primary output can be put into a DFG class to form a DFG class pair. This can be accomplished by applying the below-described classification techniques, to $RTLM_{ts}$ and $HLM_{ts}$, on a primary-output-by-primary-output basis. If all such pairs, of a DFG class for an output of $RTLM_{ts}$ with a DFG class for a corresponding output of $HLM_{ts}$, are the same, one type of miter can be generated for which equivalence determination is applied once.

However, if more than one type of pairing of DFG classes is identified, an appropriate miter can be generated for each different type of DFG class pair found. An equivalence-determining procedure can be applied to each miter. $RTLM_{ts}$ and $HLM_{ts}$ have been proven to be equivalent only if all such equivalence-determining tests are successful.

4.1 Summary of Classifying $RTLM_{ts}$ and $HLM_{ts}$

Each DFG can be classified based upon a structural analysis. The types of DFG classes can include: combinational, pipelined, handshaking and unknown. Methods for testing a DFG, as to whether it belongs to each of the DFG classes, are presented. The classification methods share the common goal of trying to determine how many prior cycles of input data can affect the result of a computation.

4.2 Summary of Combining Structure Selection

Based on the DFG class for $RTLM_{ts}$ and the DFG class for $HLM_{ts}$, an appropriate structure, for combining the two DFGs to produce $MT_{ts}$, can be selected. A decision matrix can be used. An example decision matrix is presented. The output of the example decision matrix is one of five categories of combining structure: combinational, cycle-accurate, pipelined, stream-based and error.

Each of the five categories of combining structure is presented.

4.2.1 Summary of Combinational

The combinational combining structure can be applied when both DFGs are classified as combinational.

4.2.2 Summary of Cycle-accurate

The cycle-accurate combining structure can be applied when either DFG is classified as unknown. The cycle-accurate combining structure can be preferred under these circumstances since it produces a "strong" form of equivalence testing that will not produce a false positive. On the other hand, because the cycle-accurate combining structure produces a $MT_{ts}$ that is so restrictive as to the conditions under which equivalence between $HLM_{ts}$ and $RTLM_{ts}$ can be found, it can produce a false negative where a "weaker" equivalence test might be able to show the DFGs are equivalent. Therefore, while the cycle-accurate combining structure is a suitable default, it can also be desirable to allow the user to select another combining structure that produces a weaker test for equivalence.

The cycle-accurate combining structure produces an equivalence test where both DFGs must produce exactly the same output on every clock cycle in order for equivalence to be found.

4.2.3 Summary of Pipelined

The pipelined combining structure can be applied under the following circumstances: both DFGs are classified as pipelined, one DFG is classified as combinational and the other is classified as pipelined. If one of the DFGs is classified as combinational, it can be converted into a one-stage pipeline.

The approach of a pipelined combining structure is to effectively modify one or both of the DFGs such that a cycle-accurate equivalence test can be performed.

Techniques are presented for using a pipelined combining structure to couple DFGs that use memories. The technique employs determination of a memory mapping between the memories of both designs.

4.2.4 Summary of Stream-Based

The stream-based combining structure is applicable when both $RTLM_{ts}$ and $HLM_{ts}$ have been put into the DFG class "handshaking."

Stream-based equivalence, if proven, can be characterized as follows. First, both $RTLM_{ts}$ and $HLM_{ts}$ receive the same stream of input data, but not necessarily at the same time. Second, both $RTLM_{ts}$ and $HLM_{ts}$ generate the same output data, but not necessarily at the same time. Phrased another way, stream-based equivalence means there are no constraints on the relative timing of the inputs or outputs of $RTLM_{ts}$ and $HLM_{ts}$, however, data packets produced by the two DFGs should be produced in the same order.

An overall method, by which a stream-based combining structure can be used, is as follows. First, create two sub-miters. Each sub-miter is comprised of an instance of $RTLM_{ts}$, $HLM_{ts}$ and the stream-based combining structure $CS\_STREAM_{ts}$. Second, if both sub-miters find equivalency, on a cycle-accurate basis, then $RTLM_{ts}$ and $HLM_{ts}$ are equivalent on a stream-accurate basis.

Each sub-miter is constructed as follows.

For a first sub-miter, $RTLM_{ts}$ is tested for equivalence with $HLM_{ts}$ under conditions that correspond to $RTLM_{ts}$ operating at "full speed." Put differently, every time $RTLM_{ts}$ can accept a set of data inputs, it is able to do so. $HLM_{ts}$ is tested for equivalence with $RTLM_{ts}$ under conditions that constrain its inputs to be the same as whatever $RTLM_{ts}$ indicates it is able to accept. Thus the first sub-miter determines equivalence between a fully exercised $RTLM_{ts}$ and a $HLM_{ts}$ limited to those inputs that exercise $RTLM_{ts}$.

If the result of comparing $RTLM_{ts}$ to $HLM_{ts}$ is successful, then it is known that for any inputs acceptable by $RTLM_{ts}$, $HLM_{ts}$ will produce stream-equivalent output. However, it is still not known whether, for the "full" range of inputs acceptable to $HLM_{ts}$, if $RTLM_{ts}$ can produce stream-equivalent outputs. This is accomplished by reversing the roles of $RTLM_{ts}$ and $HLM_{ts}$ in the second sub-miter.

Put more symbolically, it is first shown by the first sub-miter that the set of outputs (or SOO) of $RTLM_{ts}$ (or SOO ($RTLM_{ts}$)) is a subset of the SOO of $HLM_{ts}$ (or SOO ($HLM_{ts}$)). Put in mathematical relation form:

$$SOO(RTLM_{ts}) \subseteq SOO(HLM_{ts})$$

By reversing the roles of $RTLM_{ts}$ and $HLM_{ts}$, the second sub-miter can show that:

$$SOO(HLM_{ts}) \subseteq SOO(RTLM_{ts})$$

The only way both relations can be true is if the following is true:

$$SOO(HLM_{ts}) = SOO(RTLM_{ts})$$

An example stream-based combining structure, suitable for constructing the first and second sub-miters, is presented.

Since the first and second sub-miters can be constructed in an identical way, except for the roles of $RTLM_{DFG}$ and $HLM_{DFG}$ being reversed, just the construction of the first sub-miter is addressed.

The first sub-miter is constructed to allow DFG 2623 to process data as soon as it is able to, while not guaranteeing the same for DFG 2624.

DFGs 2623 and 2624, of a sub-miter, can produce their output packets at different times. A FIFO can be used to store outputs such that they can be compared. An example operation for such FIFO is presented.

The stream-based combining structure, presented herein, can be used in conjunction with any formal analysis tool. The stream-based combining structure, presented herein, can be used without the step of classifying the first and second designs that it couples.

When the stream-based combining structure is used without the step of classification, any appropriate representation can be used for the stream-based combining structure and for the first and second designs to be coupled. For the first and second designs to be coupled, each can be treated as a "black box," with just information on its inputs and outputs provided.

4.2.5 Summary of Error

The error combining structure can be applied if it is not known, for the classifications of the two DFGs, what combining structure, if any, should be applied.

4.3 Summary of Generating the Test Bench

Once a combining structure has been selected, $MT_{ts}$ can be generated.

4.4 Summary of Other Applications

The techniques of test bench generation presented herein are discussed primarily with respect to combining DFGs of an RTLM and HLM, for purposes of applying the equivalence determination process described herein. However, the test bench generation techniques presented herein can be used for combining any first DFG and second DFG, regardless of the source from which the first and second DFGs are derived. The resulting combination, of first DFG, second DFG and combining structure, can be used in conjunction with any formal analysis technique.

Furthermore, the test bench generation techniques presented herein can be used for combining a first and second design, where the first and second designs are not specified as DFGs. The step of classifying each of the first and second designs, in order to determine the applicable combining structure, only requires that the first and second designs be expressed in a representation that provides the necessary structural information. By way of example, a netlist representation could be used instead of a DFG representation.

5. Summary of Initialization of the Miter Timestep

As discussed above, in order to compare $RTLM_{ts}$ and $HLM_{ts}$ for potential equivalency, they may need to be set to equivalent initial states.

Suitable initial states of RTLM and HLM, for initializing $RTLM_{ts}$ and $HLM_{ts}$, can be determined.

Whenever both RTLM and HLM are ready, the initial states for RTLM and HLM can be translated into appropriate initial values for $RTLM_{ts}$ and $HLM_{ts}$.

For an HLM that is compiled, its initial state can be determined by the following process.

Before partially executing the HLM, the user can provide information on the location within the HLM where the initialization phase is finished, and a breakpoint can be set at the location.

An HLM written in a compiled language (such as C or C++) can be compiled such that debugging information is available. Debugging information, in a compiled executable, can be used to extract the values of program variables of the HLM when it stopped at the breakpoint.

An operating system process, under which the HLM runs, can be created.

For an HLM that is run with a dynamic (or run-time) linker, operating system libraries used by the HLM can be linked-to at run-time. At the time of such library linking, rather than linking the HLM's typical run-time library, a special "Interceptor Library" can be linked to.

An Interceptor Library is so-called because it can intercept operating system calls the HLM might make, such as those related to memory allocation, memory reallocation or memory deallocation.

The Interceptor Library functions can call the actual functions of the applicable operating system. Before returning, the Interceptor Library functions can record, for post run-time use, information about the currently allocated memory blocks.

The HLM can be run until the breakpoint is reached, at which point it is in an appropriate initial state to be used for setting the initial states of $RTLM_{ts}$ and $HLM_{ts}$. Because the HLM was executed with debugging information enabled, and with the Interceptor Library substituted for certain operating system procedures, the necessary information is available for the process of setting $RTLM_{ts}$ and $HLM_{ts}$ to initial states.

Once initial states for RTLM and HLM are available, a process is presented for translating their values into appropriate initial values for the initial timesteps of $RTLM_{ts}$ and $HLM_{ts}$.

An example initialization, for the control and datapath present-state inputs of an initial timestep, is presented.

The techniques of partial HLM execution, and of accessing the values of the partially executed HLM, are presented herein primarily with respect to initializing a DFG representation of the HLM. Furthermore, the discussion presented herein focuses primarily on applying the initialized DFGs to the equivalence determining process presented herein.

However, the techniques of partial HLM execution, and of accessing the values of the partially executed HLM, can be used in conjunction with initializing any formal analysis tool (including those that do not use DFGs), where the representation subject to formal analysis is derived from an HLM.

6. Summary of Verification with CERs

Pseudo-code, for a core equivalence-determining process, is presented. Before presenting the pseudo-code, an example application of a core equivalence-determining process is presented in overview form.

A core equivalence-determining process can be performed by invoking a pseudo-code procedure called "equivalence_checking_with_CERs." The hierarchical manner, in which procedures are invoked by equivalence_checking_with_CERs, is diagrammed.

7. Summary of Example

To illustrate the operation of the pseudo-code an example simulation is presented.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 2A defines certain global variables and symbolic constants that are used throughout the pseudo-code of FIGS. 24 to 30.

FIG. 2B depicts a pseudo-coded procedure called "test_for_equivalency" that represents an example equivalency testing system that operates in accordance with teachings of the present inventions.

FIGS. 7A-7F depict pseudo-code for symbolic simulation.

FIGS. 9A-9B show pseudo-code for assigning priorities as part of a preprocessing step to symbolic simulation.

FIG. 10A depicts an example DFG for conversion into the timestep form.

FIG. 10B shows a conversion of the DFG of FIG. 10A into the timestep form.

FIG. 11 shows a pseudo-code implementation for use in determining whether a DFG primary output is of DFG class "combinational."

FIG. 12 shows a pseudo-code implementation for use in determining whether a DFG primary output is of DFG class "pipelined."

FIG. 16B depicts a process to allow DFG 2623 to process data as soon as it is able to, while not guaranteeing the same for DFG 2624.

FIG. 17 depicts an example decision matrix for selecting an appropriate combining structure.

FIG. 20A presents, for an example application of an equivalence-determining process, an $HLM_{DFG}$ and $RTLM_{DFG}$.

FIG. 24 depicts pseudo-code for a core equivalence-determining process called equivalence_checking_with_CERs.

FIGS. 25A-25B depict pseudo-code for find_FPT.

FIG. 26 depicts pseudo-code for propagate_SDVs.

FIG. 27 depicts pseudo-code for TF_prop.

FIGS. 28A-28B depict pseudo-code for Add_CER.

FIGS. 29A-29E depict detailed actions in a first and second call to Add_CER.

FIG. 30 depicts example procedures for determining a CER transitive closure and for labeling.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

| | Table of Contents to Detailed Description |
|---|---|
| 1. | Equivalency Testing System |
| 1.1. | Conversion of HLM and RTLM to DFGs |
| 1.1.1. | Overview |
| 1.1.2. | Within test_for_equivalency |
| 1.2. | Conversion Into Timestep Form |
| 1.2.1. | Overview |
| 1.2.2. | Within test_for_equivalency |
| 1.3. | Combining Structure Generation |
| 1.3.1. | Overview |
| 1.3.2. | Symbolic Data Values (SDVs) and Conditional Equivalence Relations (CERs) |
| 1.3.2.1. | Integer SDV |
| 1.3.2.2. | ITE SDV |
| 1.3.2.3. | Symbolic Boolean Expression |
| 1.3.2.4. | CERs |
| 1.3.2.5. | MTBDDs |
| 1.3.3. | Identification Of Nodes As Control or Datapath |
| 1.3.4. | Within test_for_equivalency |
| 1.4. | Initializations |
| 1.4.1. | Overview |
| 1.4.2. | Active Timestep Range |
| 1.4.3. | SDV Propagation Processes |
| 1.4.4. | Within test_for_equivalency |
| 1.5. | Equivalence Checking With CERs |
| 1.5.1. | Overview |
| 1.5.2. | Other Applications |
| 1.5.3. | Ready For Reencoding |
| 1.5.4. | Fixed-Point Target (FPT) |
| 1.5.5. | Counter-Example Generation |
| 1.5.6. | Within test_for_equivalency |
| 2. | HLM to DFG Conversion By Symbolic Simulation |
| 2.1. | Overview |
| 2.2. | Other Applications |
| 2.3. | For HLM and RTLM Comparison |
| 2.4. | Initialization For CFG Traversal |
| 2.5. | Loop For Breadth-First Traversal Of CFG |
| 2.5.1. | Two EPs Point To Same CFG Node |
| 2.5.2. | Top EP Points To Conditional CFG Node |
| 2.5.3. | Top EP Points To Assignment CFG Node |
| 2.5.4. | Top EP Points To END CFG Node |
| 2.6. | Post-CFG-Traversal Processing |
| 2.7. | Handling Loops During Symbolic Simulation |
| 2.8. | Optimization: Global Priority Scheduling |
| 2.8.1. | Overview |
| 2.8.2. | Prioritization Pseudo-code |
| 2.8.2.1. | computePriorities |
| 2.8.2.2. | adjustPredecessors |
| 2.8.3. | Example Prioritization |
| 2.8.3.1. | First Iteration |
| 2.8.3.2. | Second Iteration |
| 2.8.3.3. | Third Iteration |
| 2.8.3.4. | Fourth Iteration |
| 2.8.3.5. | Fifth Iteration |
| 2.8.3.6. | Sixth Iteration |
| 2.8.3.7. | Seventh Iteration |
| 2.8.3.8. | Eighth Iteration |
| 2.8.3.9. | Ninth Iteration |
| 2.8.3.10. | Tenth Iteration |

-continued

Table of Contents to Detailed Description

Figure 21D:
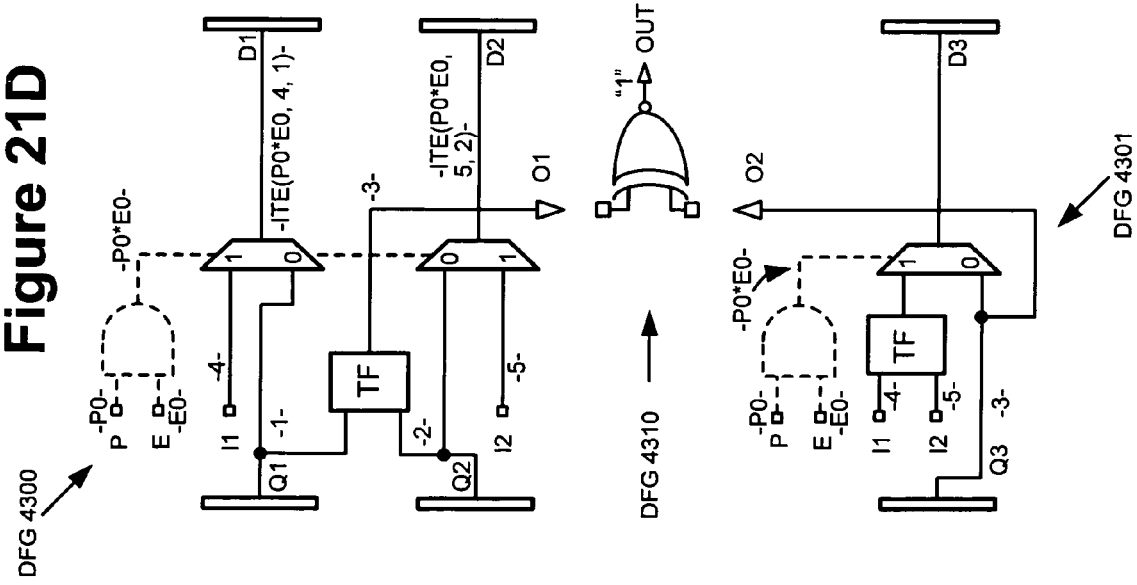
FIGS. 21A-21N and 21P-21Q (there is no FIG. 21O) present an example application of a core equivalence-determining process.
Figure 21E:
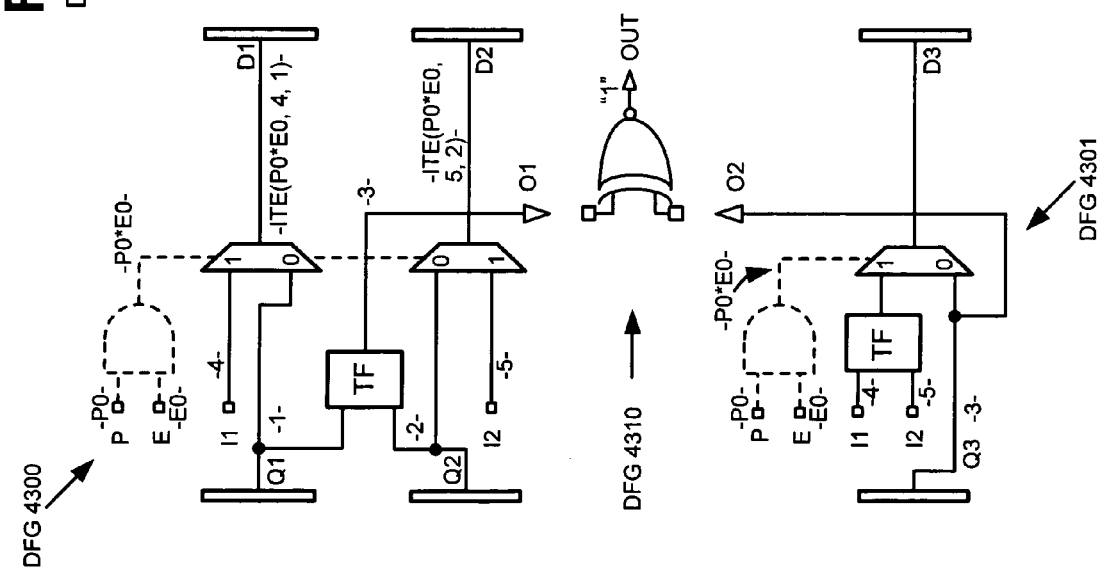
Figure 21H:
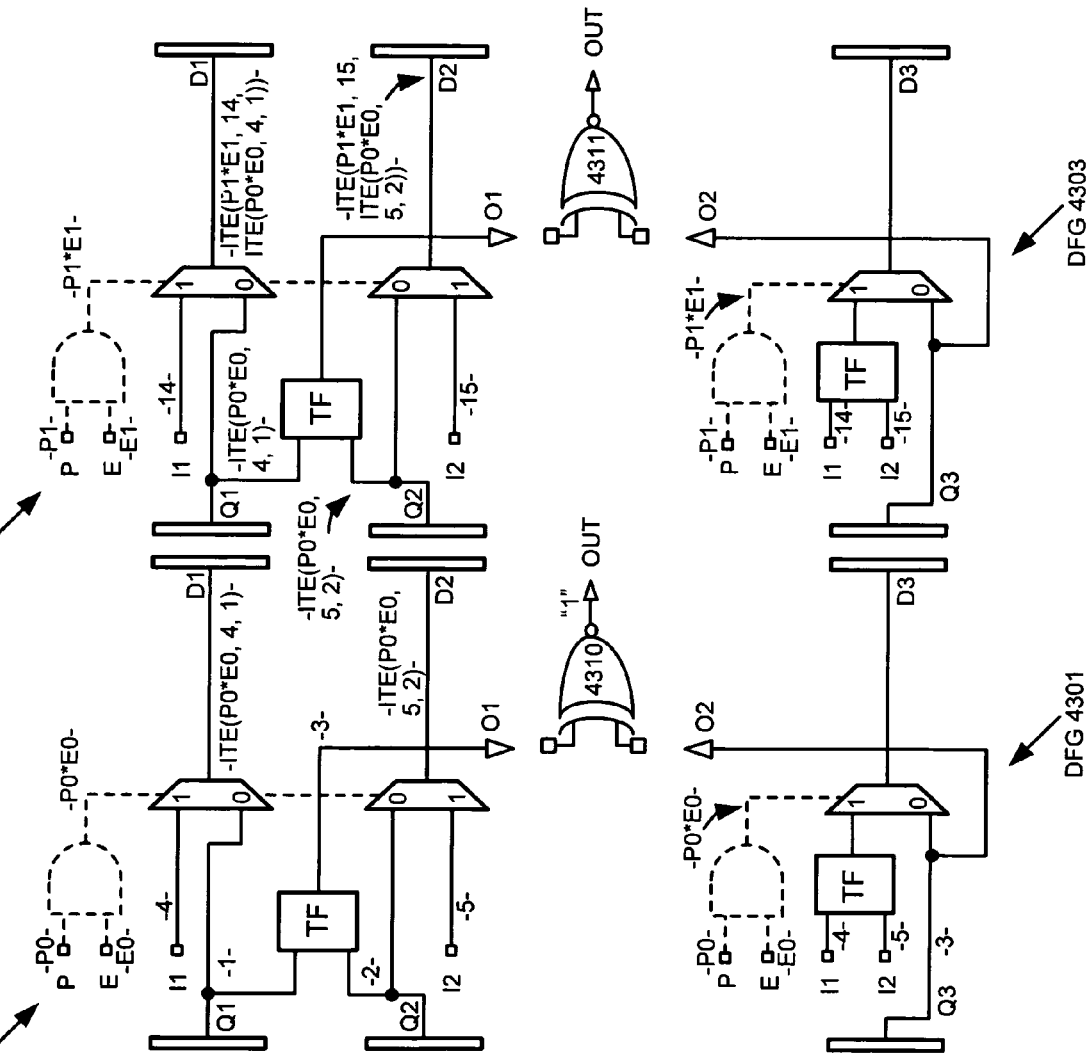
Figure 21I:
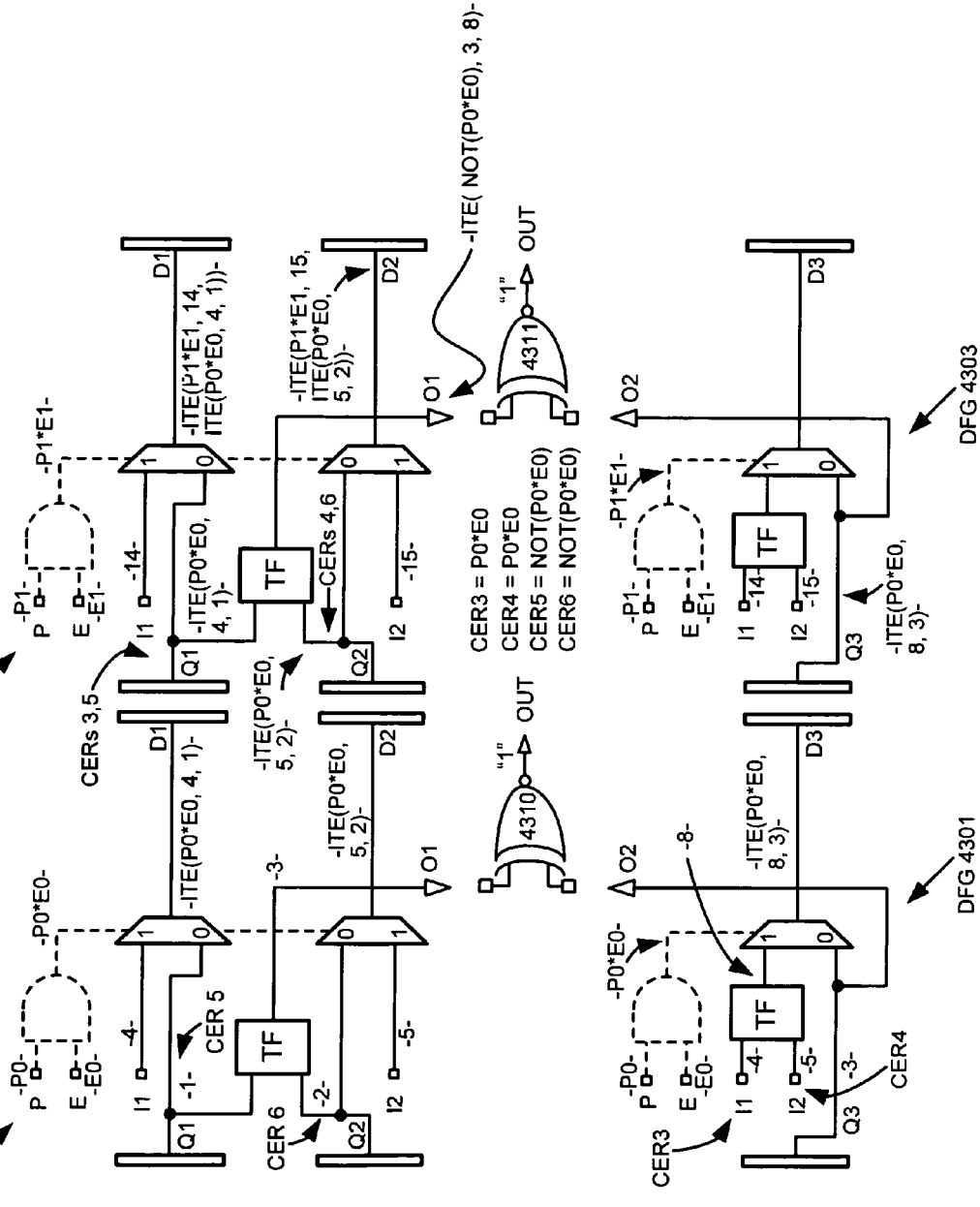
Figure 21J:
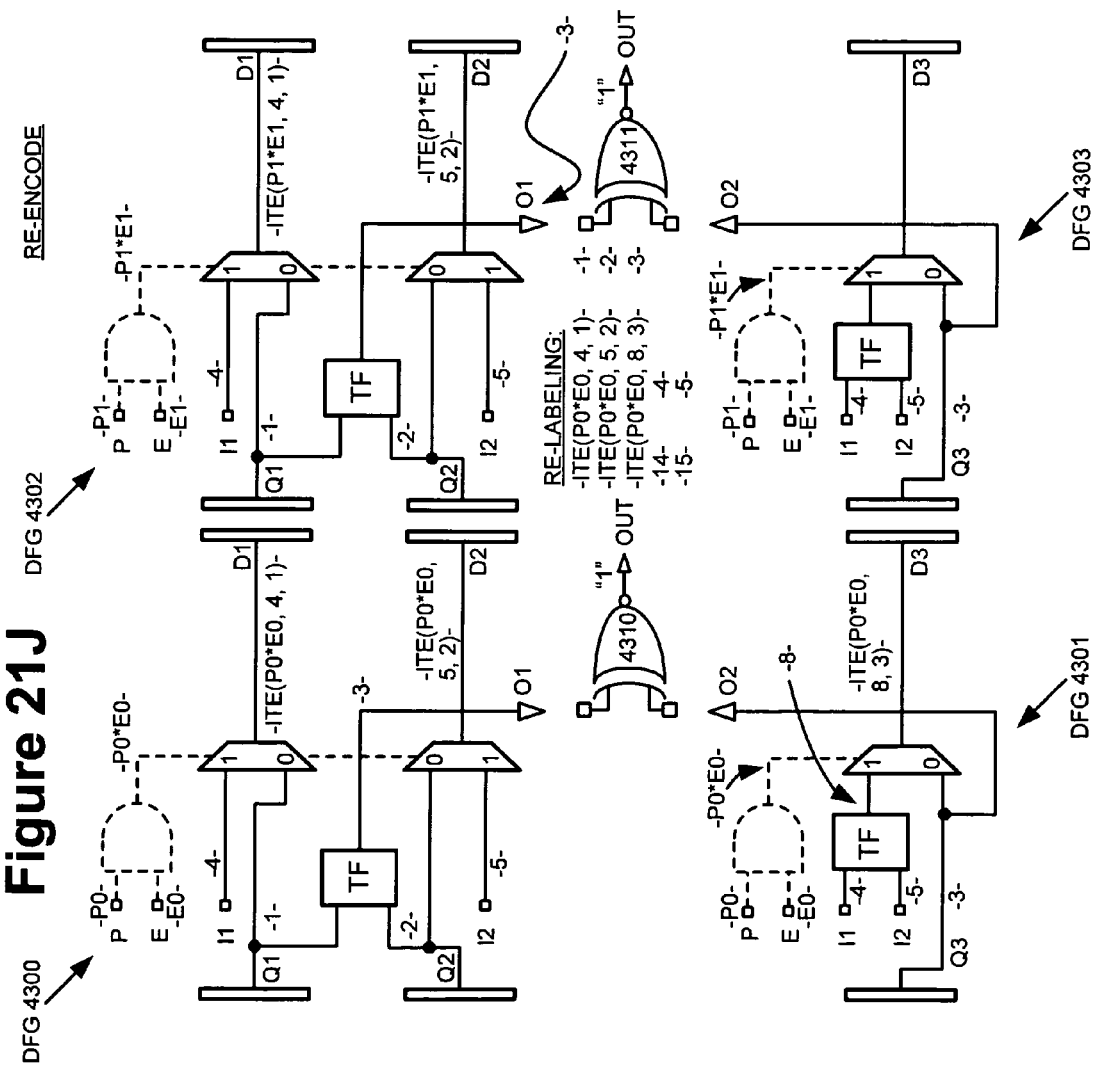
Figure 21K:
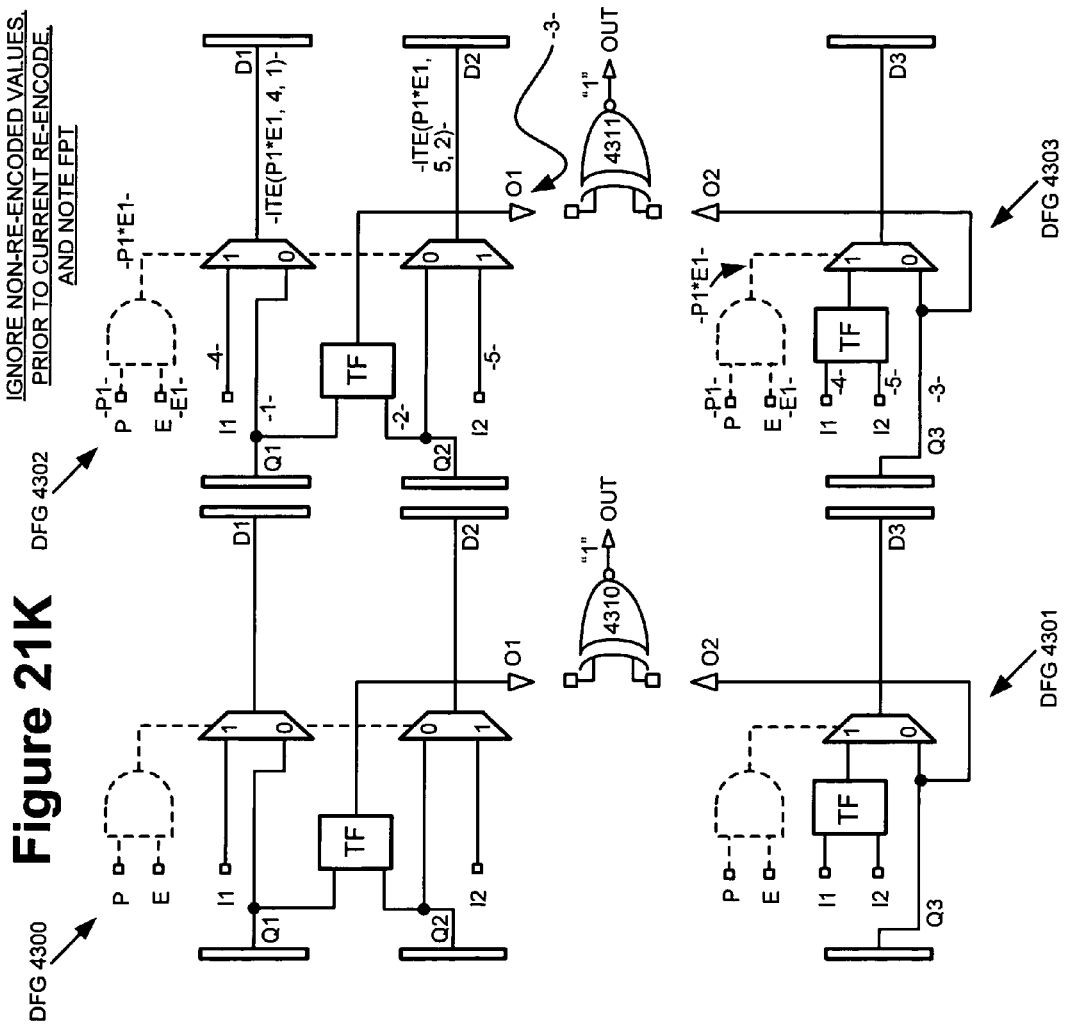
Figure 21L:
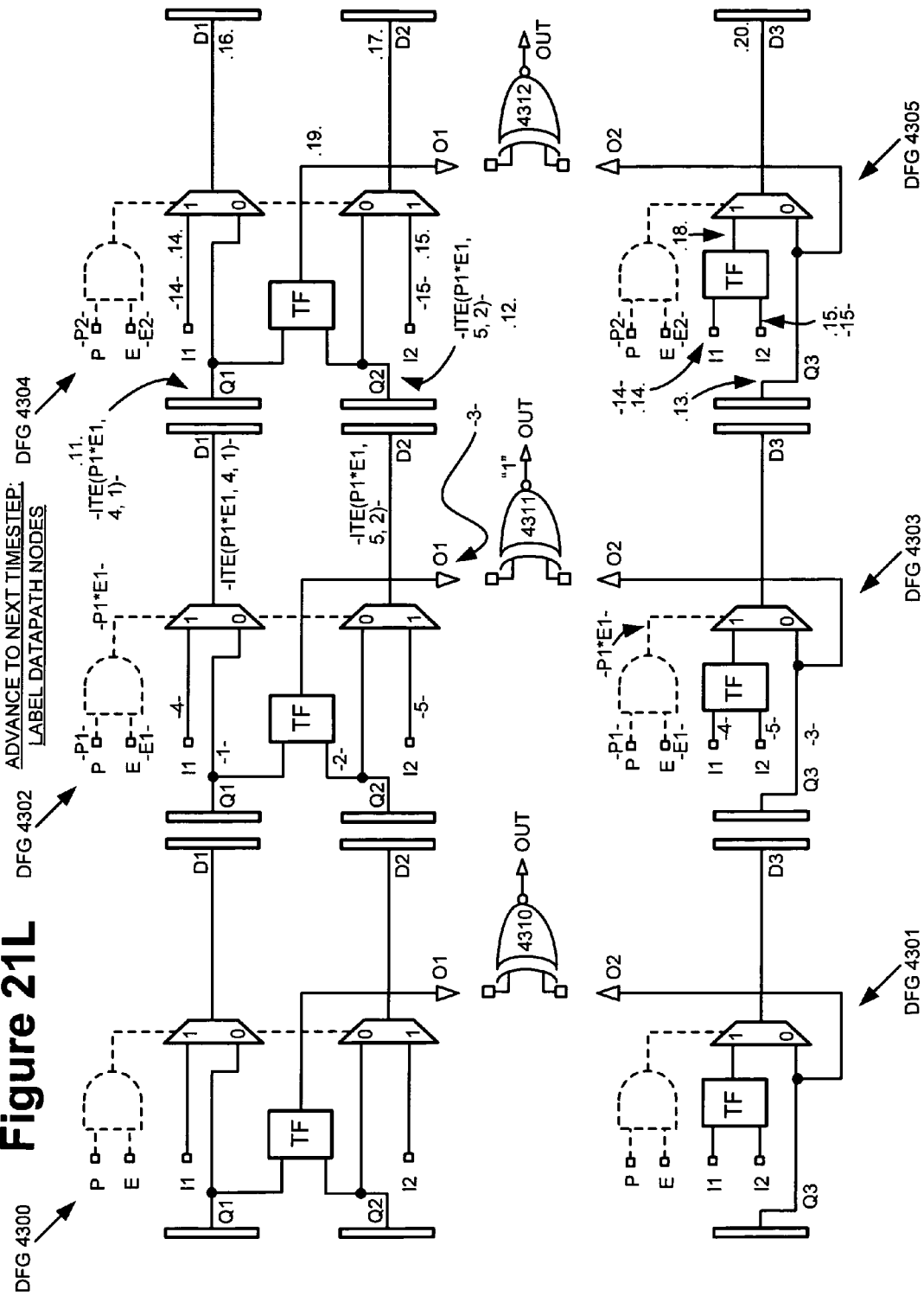
Figure 21M:
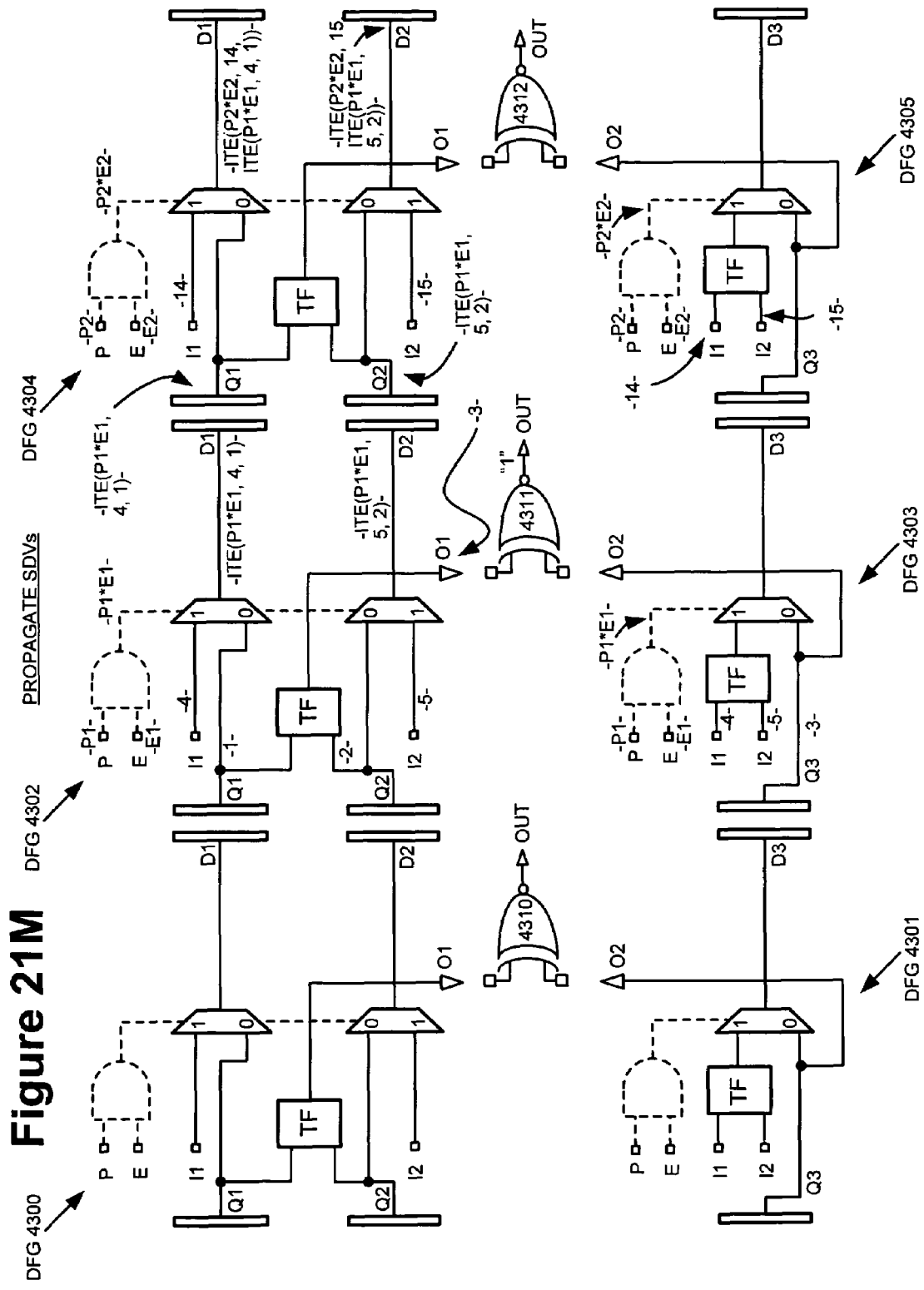
Figure 22A:
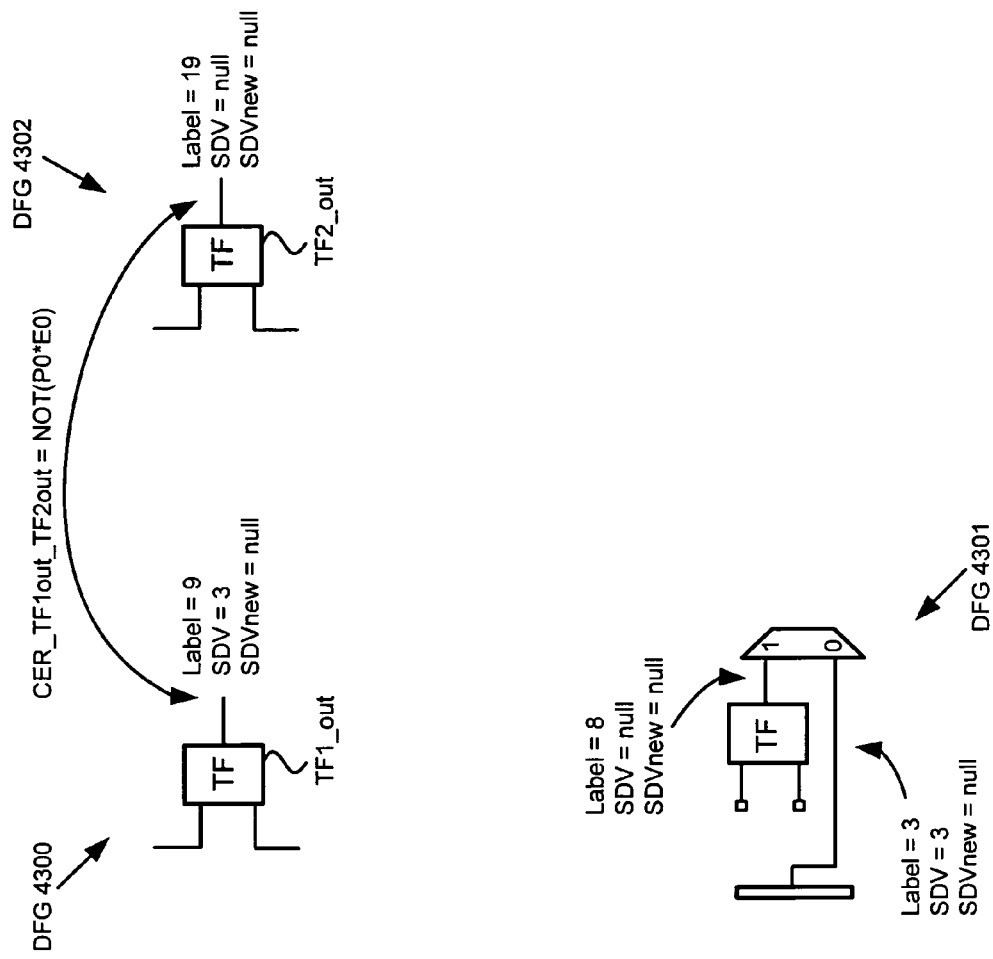
FIGS. 22A-22K depict detailed actions in a first and second call to Add_CER.
Figure 22B:
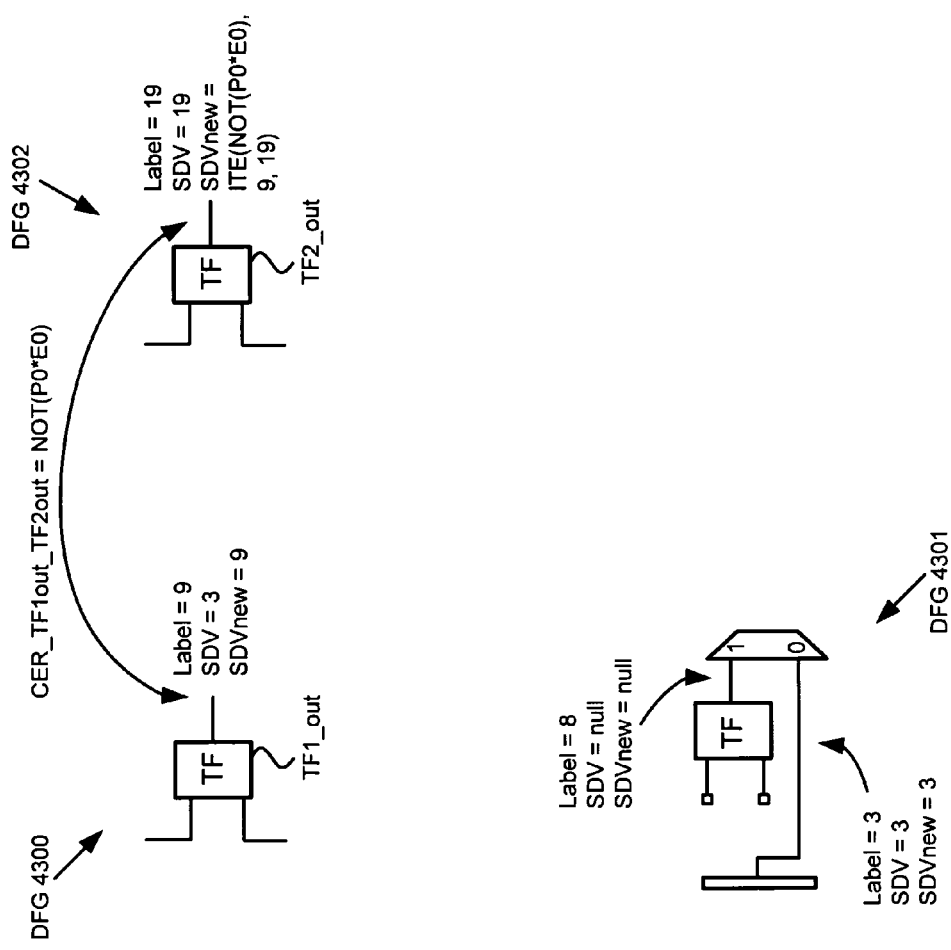
Figure 22C:
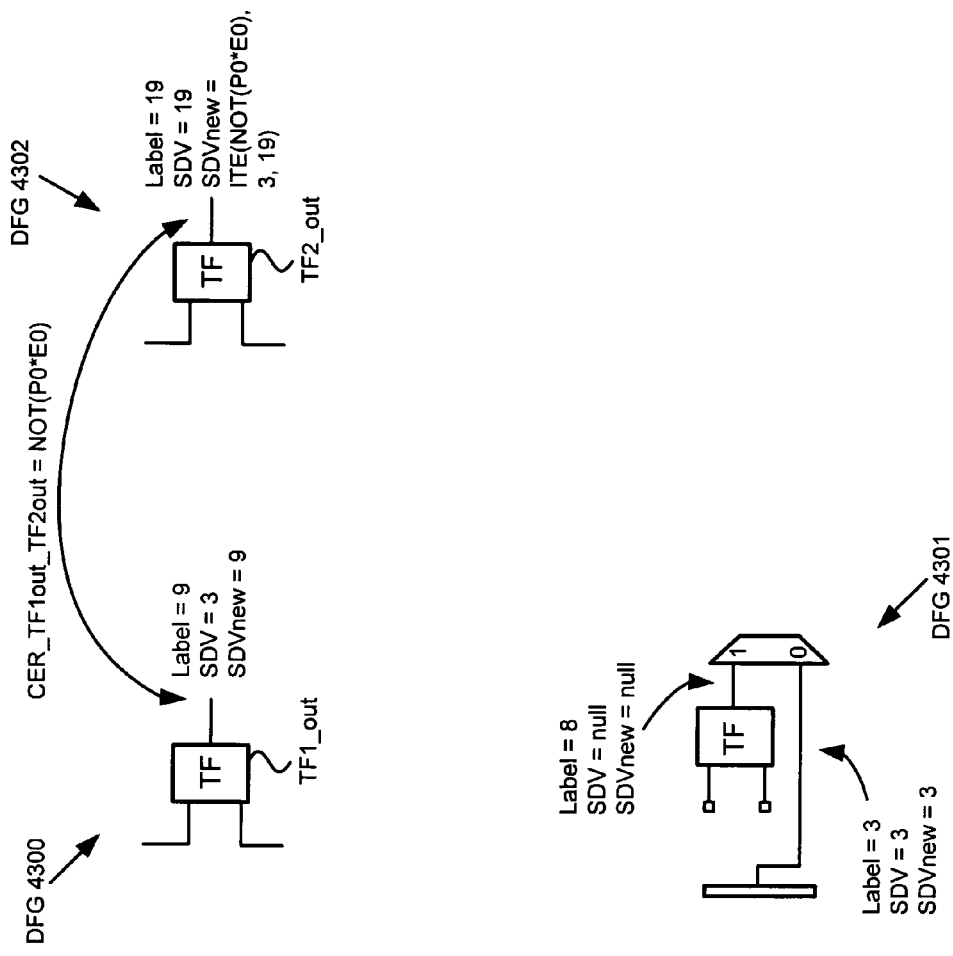
Figure 22D:
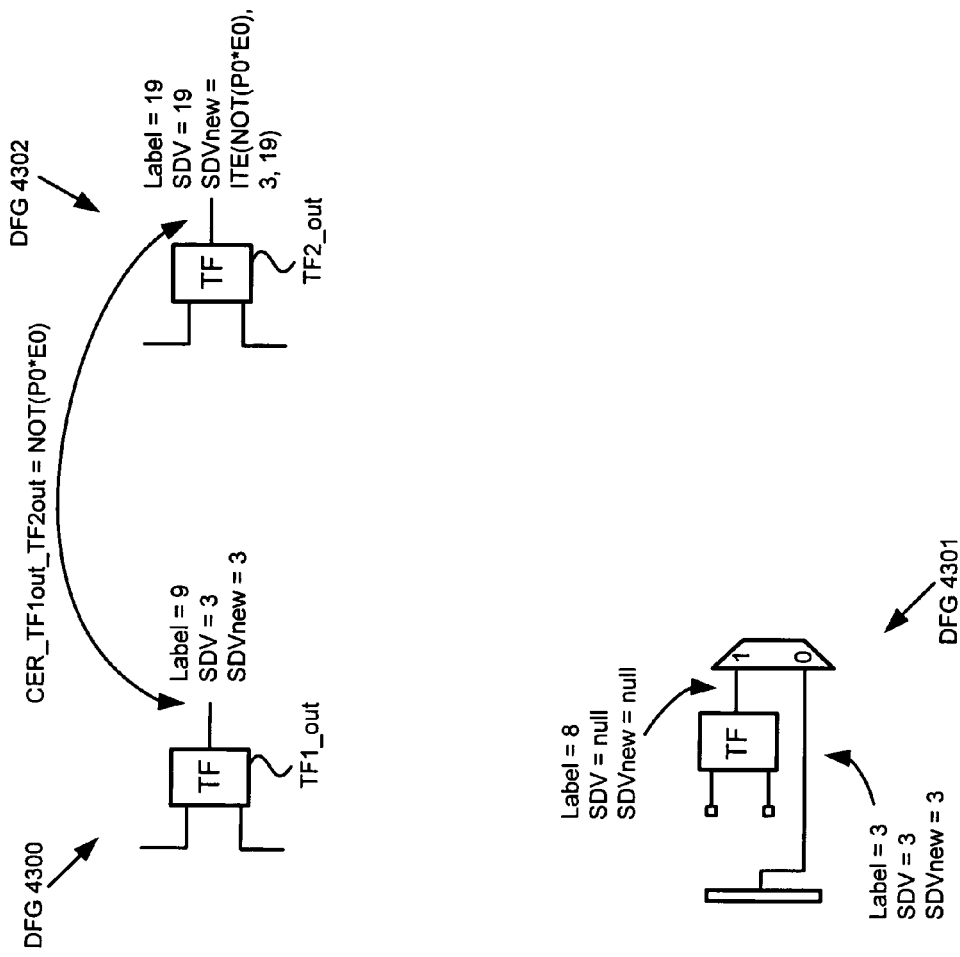
Figure 22E:
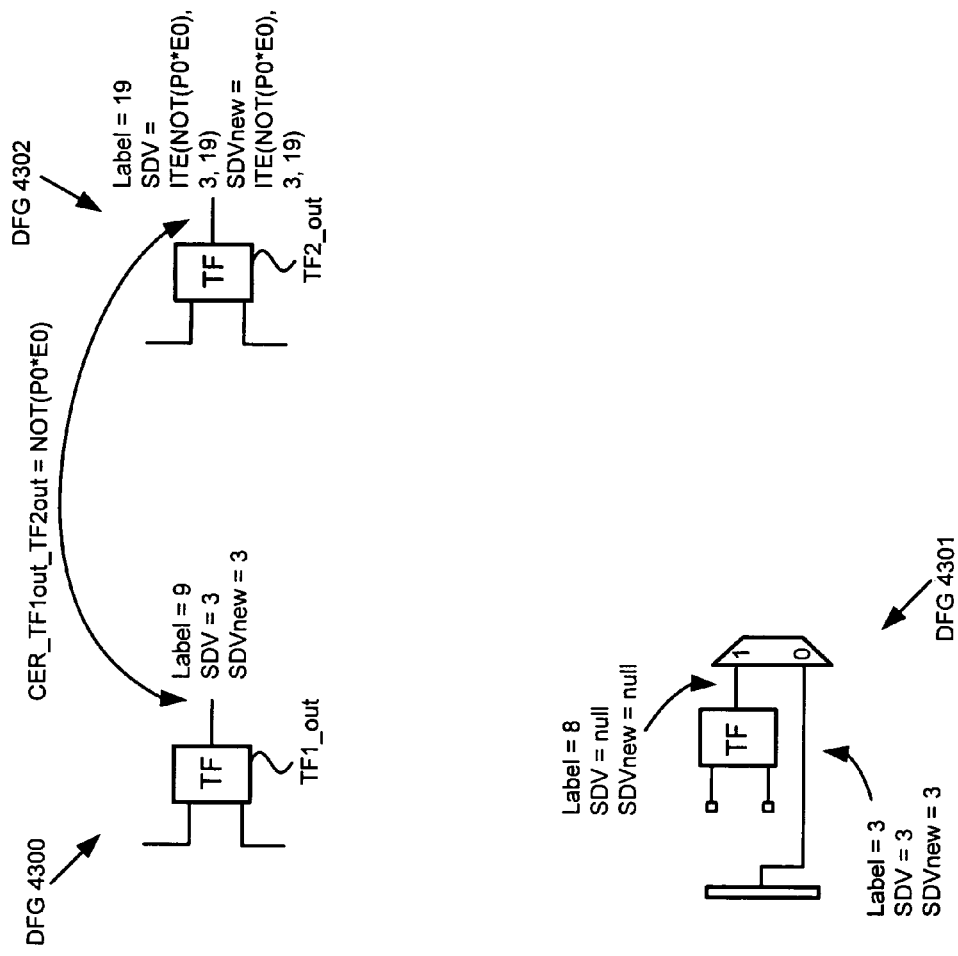

| | |
|---|---|
| 2.8.3.11. | Eleventh Iteration |
| 2.8.3.12. | Twelfth Iteration |
| 2.9. | Other Optimizations |
| 3. | The Timestep Form |
| 4. | Test Bench Generation |
| 4.1. | Classifying $RTLM_{ts}$ and $HLM_{ts}$ |
| 4.1.1. | Combinational |
| 4.1.2. | Pipelined |
| 4.1.3. | Handshaking |
| 4.1.4. | Unknown |
| 4.2. | Combining Structure Selection |
| 4.2.1. | Combinational |
| 4.2.2. | Cycle-accurate |
| 4.2.3. | Pipelined |
| 4.2.4. | Stream-Based |
| 4.2.4.1. | Overview |
| 4.2.4.2. | Input of Data to $RTLM_{ts}$ and $HLM_{ts}$ DFGs |
| 4.2.4.3. | Output of Data from RTLM and HLM DFGs |
| 4.2.4.4. | Other Applications |
| 4.2.5. | Error |
| 4.3. | Generating The Test Bench |
| 4.3.1. | Overview |
| 4.3.2. | Reset Logic |
| 4.3.3. | Clocking Logic |
| 4.3.4. | Use of Libraries |
| 4.4. | Other Applications |
| 5. | Initialization Of The Miter Timestep |
| 5.1. | Initializing RTLM |
| 5.2. | Initializing HLM |
| 5.3. | Translation To Initial Timestep |
| 5.4. | Example |
| 5.5. | Other Applications |
| 6. | Verification With CERs |
| 6.1.1. | Overview |
| 6.1.2. | equivalence_checking_with_CERs |
| 6.1.3. | label_datapath_nodes |
| 6.1.4. | initialize_timestep_state |
| 6.1.5. | initialize_timestep_inputs |
| 6.1.6. | find_FPT |
| 6.1.6.1. | Overview |
| 6.1.6.2. | Further Details |
| 6.1.7. | eval_control_exps |
| 6.1.8. | propagate_SDVs |
| 6.1.9. | reencode |
| 6.1.10. | mux_prop |
| 6.1.11. | TF_prop |
| 6.1.12. | Add_CER |
| 6.1.12.1. | Overview |
| 6.1.12.2. | Pseudo-Code |
| 7. | Example |
| 7.1. | test_for_equivalency |
| 7.2. | equivalence_checking_with_CERs |
| 7.3. | find_FPT |
| 7.3.1. | Application of find_FPT to FIG. 21B |
| 7.3.2. | Application of find_FPT to FIG. 21L |
| 7.4. | eval_control exps |
| 7.5. | propagate_SDVs |
| 7.5.1. | Applied to FIG. 21C |
| 7.5.2. | Applied to FIG. 21G |
| 7.5.3. | Applied to FIG. 21L |
| 7.6. | TF_prop |
| 7.6.1. | Applied to FIG. 21D |
| 7.6.2. | Applied to FIG. 21H |
| 7.6.2.1. | Pair (TF 4300, TF 4302) |
| 7.6.2.2. | Pair (TF 4301, TF 4302) |
| 7.6.3. | Applied to FIG. 21M |
| 7.7. | Add_CER |
| 7.7.1. | Applied to FIG. 22A |
| 7.7.2. | Applied to FIG. 22E |
| 8. | Hardware Environment |
| 9. | Glossary of Selected Terms |

1. Equivalency Testing System

Figure 1:
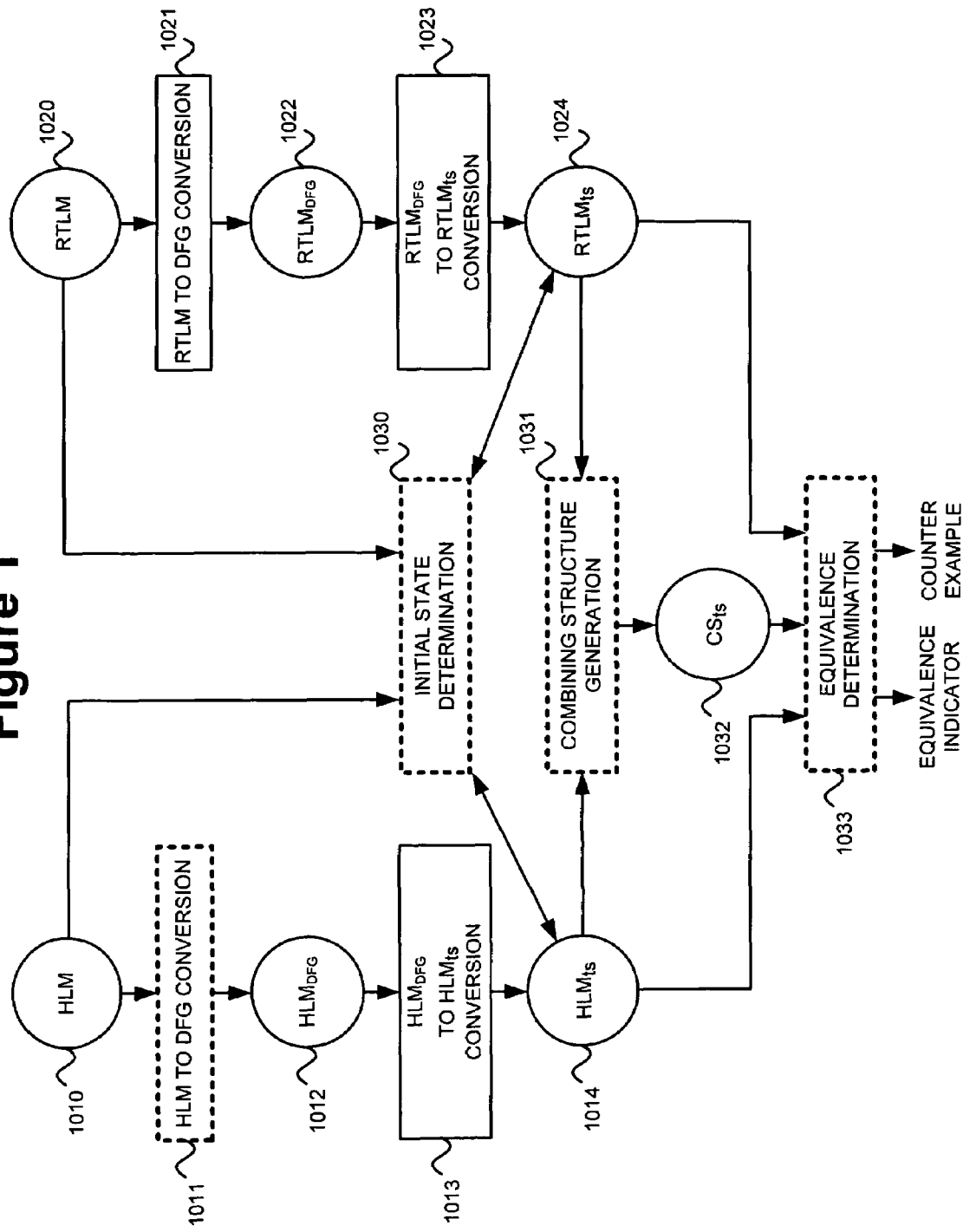
FIG. 1 presents a high-level overview of an equivalency testing system, where novel sub-systems are drawn with dashed lines.

This section begins by presenting a high-level overview of an equivalency testing system (see FIG. 1, where novel subsystems are drawn with dashed lines). Then, each of sub-sections 1.1 to 1.5 addresses, in further detail, a major component of such a system. To provide an example overall framework for presenting sub-sections 1.1 to 1.5, each of these sub-sections relates the component it discusses to a pseudo-coded procedure called "test_for_equivalency" (shown in FIG. 2B). test_for_equivalency presents an example equivalency testing system that operates in accordance with teachings of the present inventions. Each of sections 2-6, that follow this section 1, addresses a major component, of an equivalency testing system, in much greater detail. FIG. 2A defines certain global variables and symbolic constants that are used throughout the pseudo-code of FIGS. 24 to 30.

Both the RTLM and HLM, that are to be compared for equivalence, are converted into DFGs, called $RTLM_{DFG}$ and $HLM_{DFG}$. $RTLM_{DFG}$ can be determined by any suitable known means, but $HLM_{DFG}$ can be determined by a new technique, of symbolic simulation of the HLM, presented herein. FIG. 1 presents an input RTLM 1020 and HLM 1010. A novel HLM to DFG conversion process 1011 is used to produce $HLM_{DFG}$ 1012. An RTLM to DFG conversion process 1021 is used to produce $RTLM_{DFG}$ 1022.

$RTLM_{DFG}$ and $HLM_{DFG}$ are put into a timestep form, referred to as $RTLM_{ts}$ and $HLM_{ts}$. An arbitrary timestep "t," of $RTLM_{ts}$ and $HLM_{ts}$, can be referred to as $RTLM_{ts}[t]$ and $HLM_{ts}[t]$. FIG. 1 presents an $HLM_{DFG}$ to timestep conversion process 1013 that produces $HLM_{ts}$ 1014. FIG. 1 presents an $RTLM_{DFG}$ to timestep conversion process 1023 that produces $RTLM_{ts}$ 1024.

A combining structure $CS_{ts}$ can be selected, that couples to $RTLM_{ts}$ and $HLM_{ts}$. The combining structure has the following property: if, for a timestep t, $RTLM_{ts}[t]$ and $HLM_{ts}[t]$ are equivalent according to a given (or automatically determined) notion of equivalence, then $CS_{ts}[t]$ will detect this. Different types of combining structures can be selected depending upon the type of circuit represented by $RTLM_{ts}$ and $HLM_{ts}$. Novel techniques, for classifying each of $RTLM_{ts}$ and $HLM_{ts}$, and for selecting a suitable $CS_{ts}$, are presented. In addition, novel forms of combining structure, suitable in general for formal verification, are presented. For example, a novel combining structure, for showing that $RTLM_{ts}$ and $HLM_{ts}$ are stream-equivalent, is presented.

FIG. 1 presents a combining structure generation process 1031 that receives, as input, $HLM_{ts}$ 1014 and $RTLM_{ts}$ 1024. Process 1031 produces $CS_{ts}$ 1032.

The complete system, comprised of $RTLM_{ts}[t]$, $HLM_{ts}[t]$ and $CS_{ts}[t]$, will be referred to herein as "miter." The miter can have certain parts designated as representing control logic and other parts designated as representing datapath logic. Parts of the miter designated as control can be subject to a known form of bit-level equivalence checking. Parts of the miter designated as datapath are subject to a new form of equivalence checking that works above the bit level, using a node value indicator referred to herein as a "symbolic data value" or SDV, and that seeks to prove equivalence by a form of inductive theorem proving. Formation of the miter, and its processing for equivalence checking, is represented in FIG. 1 by $HLM_{ts}$ 1014, $CS_{ts}$ 1032 and $RTLM_{ts}$ 1024 feeding into equivalence determination process 1033.

In the datapath portions of the miter, equivalence checking can be conducted at a higher level of abstraction if one is not interested in actual data values, but only in whether $RTLM_{ts}$ and $HLM_{ts}$ produce the same data (given that they receive the same input data). In this case, integers can be used as an abstraction for datapath data values: if two signals have the same integer number, this signifies that their actual data values are the same; if two signals have the different integer numbers, this signifies their actual data values are different. To refer to such integer values, the term "integer SDV" can be used.

If it can be proven that $RTLM_{ts}$ and $HLM_{ts}$ both produce the same SDVs on all of their primary outputs, and for all times, it is proven that both designs are equivalent. In order to determine the SDVs of the primary outputs of $RTLM_{ts}$ and $HLM_{ts}$, input SDVs must be propagated through the miter.

A novel form of inductive theorem proving starts from initial conditions for the first timestep for the miter (i.e., for timestep $RTLM_{ts}[0]$, $HLM_{ts}[0]$ and $CS_{ts}[0]$). The initial state for $RTLM_{ts}[0]$ can be determined by any suitable known means, but the initial state for $HLM_{ts}[0]$ can be determined by a new technique, of partial execution of the HLM, presented herein. FIG. 1 represents the initialization of $HLM_{ts}$ 1014 and $RTLM_{ts}$ 1024 as follows. HLM 1010, RTLM 1020, $HLM_{ts}$ 1014 and $RTLM_{ts}$ 1024 all serve as inputs to an initial state determination process 1030. Initial state determination process 1030 sets $HLM_{ts}$ 1014 and $RTLM_{ts}$ 1024 to an initial state prior to their utilization by equivalence determination process 1033.

A first "phase" of SDV propagation is performed. In SDV propagation, SDVs of the first timestep are sought to be propagated forward to the outputs of the first timestep. If a path of propagation cannot be fully pursued to the outputs of a timestep, additional timesteps can be added. The first phase of SDV propagation ends when the miter is completely "populated" with SDVs up to a timestep called t_ready-1. The full population of SDVs means that if RTLM and HLM can be equivalent during those timesteps (i.e., the timesteps from the first timestep up to t_ready-1), this equivalence will be detected by the combining structure of each of those timesteps.

In propagating SDVs through a timestep, a complication arises with multiplexers. Consider the case of a two-input multiplexer where an integer SDV is present at each of the multiplexer's inputs. If the two SDVs are to be propagated through the multiplexer, the resulting SDV on the multiplexer output cannot be represented as an integer, since the multiplexer's selector input determines which SDV is routed to the output. To model the conditional dependency of the multiplexer output, on the selector condition, a second type of SDV, referred to herein as an ITE (If-Then-Else) SDV, is introduced.

The SDVs chosen and formed, as part of the first phase of SDV propagation, are guided by labels that are assigned to the nodes of the miter in a particular order as timesteps are added.

The timestep at t_ready is reencoded and the symbolic values of its datapath signals, relative to their timestep-invariant node names, are recorded as a potential first "fixed-point" of the SDV propagation process.

As part of the reencode, the order of label assignment, that guided the selection and formation of SDVs during the first phase of SDV propagation, is repeated from the beginning.

Starting with the potential first fixed-point as the initial condition, a second phase of SDV propagation is performed. Like the first phase, the ending of the second phase of SDV propagation is marked by the miter being completely "populated" with SDVs up to a later timestep, also called t_ready-1.

Because the second phase of SDV propagation is guided by a repetition of the same labeling process that guided the first phase of SDV propagation, if the potential first fixed-point is a real fixed-point, the exact same form of SDV propagation will occur during the second phase as occurred during the first phase.

This repetition of propagation phases can be detected as follows. The timestep of the later t_ready is reencoded. The symbolic values of the datapath signals of the later t_ready, relative to their timestep-invariant node names, are recorded as a potential second "fixed-point."

If the first and second, potential fixed-points, are identical, then it has been inductively proven that the process of SDV propagation can be repeated, indefinitely, for all timesteps. If each timestep "t," from the initial timestep of the first phase up to the timestep t_ready-1 of the second phase, indicates $HLM_{ts}[t]$ and $RTLM_{ts}[t]$ are equivalent (as indicated by $CS_{ts}[t]$), then it is known that HLM and RTLM are equivalent for all timesteps.

In FIG. 1, the proving of equivalence between HLM and RTLM corresponds to equivalence determination process 1033 producing an "equivalence indicator" for the user of the system. If equivalence determination process 1033 cannot prove equivalence, a "counter example" can be produced to aid the user in locating where behavior of the HLM diverges from that of the RTLM.

1.1. Conversion of HLM and RTLM to DFGs 1.1.1. Overview

Before an HLM and RTLM are compared, for purposes of determining equivalence, both can be translated into the common representation of a DFG (Data-Flow-Graph).

An HLM can be specified as a function written in a high-level programming language, such as C++. The DFG produced from the HLM can be referred to as an $HLM_{DFG}$. The DFG produced from the RTLM can be referred to as $RTLM_{DFG}$. Conversion of an RTLM into an $RTLM_{DFG}$ is well known and need not be described herein. A novel technique is described herein, in section 2 ("HLM to DFG Conversion By Symbolic Simulation"), for converting an HLM into an $HLM_{DFG}$ using symbolic simulation.

1.1.2. Within test_for_equivalency

In FIG. 2B, a procedure "RTLM_2_DFG" is invoked (see line 5) for conversion of an RTLM into an $RTLM_{DFG}$. $RTLM_{DFG}$ is referred to in the pseudo-code as "RTLM_dfg." FIG. 2B also shows the invocation (see line 8) of a procedure "HLM_2_DFG" for conversion of an HLM into an $HLM_{DFG}$. $HLM_{DFG}$ is referred to in the pseudo-code as "HLM_dfg." Procedure "HLM_2_DFG corresponds to HLM to DFG conversion process 1011 of FIG. 1. Procedure "RTLM_2_DFG corresponds to RTLM to DFG conversion process 1021 of FIG. 1.

1.2. Conversion into Timestep Form 1.2.1. Overview $RTLM_{DFG}$ and $HLM_{DFG}$ can be converted into the timestep (or time stage) form for further equivalence-determination processing. Conversion of a DFG into timestep form is described below in section 3 ("The Timestep Form"). The timestep form of $RTLM_{DFG}$ can be referred to as $RTLM_{ts}$. The timestep form of $HLM_{DFG}$ can be referred to as $HLM_{ts}$.

A timestep of time "t," of an arbitrary DFG "X" in timestep form (e.g., $X_{ts}$ or X_ts), can be referred to as an array element "t" of "X" (e.g., $X_{ts}[t]$ or X_ts[t]).

Prior to the conversion of $RTLM_{DFG}$ and $HLM_{DFG}$ into timestep form, each of their nodes can have a name, referred to herein as a "timestep-independent" name, that can be kept in the timestep form (see Glossary for definition of timestep-independent name).

1.2.2. Within test_for_equivalency $RTLM_{ts}$ is referred to in the pseudo-code as "RTLM_ts." $HLM_{ts}$ is referred to in the pseudo-code as "HLM_ts."

FIG. 2B shows the invocation (see line 14) of a procedure "generate_timestep" for generation of $RTLM_{ts}$ from $RTLM_{DFG}$ (which corresponds to $RTLM_{DFG}$ to $RTLM_{ts}$ conversion process 1023 of FIG. 1). FIG. 2B also shows the invocation (see line 15) of the procedure "generate_timestep"

for generation of $HLM_{ts}$ from $HLM_{DFG}$ (which corresponds to $HLM_{DFG}$ to $HLM_{ts}$ conversion process 1013 of FIG. 1).

1.3. Combining Structure Generation
1.3.1. Overview

Test bench generation relates to producing a DFG in timestep form, referred to herein as a "combining structure" (or $CS_{ts}$), for combining $RTLM_{ts}$ and $HLM_{ts}$ in a way that permits the resulting timestep, referred to herein as a "miter" timestep, to be tested for equivalence. A timestep "t" of a miter can be comprised of the following DFGs: $RTLM_{ts}[t]$, $HLM_{ts}[t]$ and $CS_{ts}[t]$.

A process for producing a $CS_{ts}$ can be summarized as follows. $RTLM_{ts}$ and $HLM_{ts}$ can each be classified. Based upon the classification of each DFG, a $CS_{ts}$ can be selected. A detailed description of this process is presented below in section 4 ("Test Bench Generation").

A $CS_{ts}$ can be designed to produce an output "q" that has the following property: "q" for a timestep t, is TRUE if and only if $RTLM_{ts}[t]$ and $HLM_{ts}[t]$ are equivalent according to a given notion of equivalence.

One of the combining structures presented is for the comparison of stream-based designs. This stream-based combining structure, on its own and without a prior step of classification of the designs to be coupled, is novel. Other applications, of this stream-based combining structure, are discussed.

Production of the miter can include identification of control and datapath nodes. Each datapath node can be assigned a value referred to herein as an "SDV." Each control node can be assigned a value referred to herein as a "symbolic Boolean expression." The below section 1.3.2 ("Symbolic Data Values (SDVs) and Conditional Equivalence Relations (CERs)") presents definitions for SDV and symbolic Boolean expression. The below section 1.3.3, "Identification Of Nodes As Control or Datapath," discusses considerations and techniques for identifying nodes as control or datapath.

1.3.2. Symbolic Data Values (SDVS) and Conditional Equivalence Relations (CERs)

Each node of the miter, identified as part of the datapath, can be assigned a value referred to herein as a "symbolic data value" or SDV. An SDV is not intended to represent a particular piece of data, or a particular value. Rather, an SDV is intended to represent whether one node of the datapath has been assigned the same value (or data structure) as another node of the datapath. An SDV can be of two types: integer and ITE.

1.3.2.1. Integer SDV

An integer SDV is just an integer value. If node "n1" at a timestep "t1" is assigned the same integer SDV as a node "n2" at a timestep "t2," this means that node "n1," for at least timestep "t1," and node "n2," for at least timestep "t2," have the same value. The actual data represented by the integer SDV, and is therefore the same at nodes "n1" and "n2," can be arbitrarily complex.

1.3.2.2. ITE SDV

An ITE SDV expression can be defined by the following context-free grammar:

<sbool_expr>=>symbolic Boolean expression
<integer_SDV>=>integer
<first_SDV>=><integer_SDV>
<second_SDV>=><integer_SDV>
<first_SDV>=>ITE(<sbool_expr>, <first_SDV>, <second_SDV>)
<second_SDV>=>ITE(<sbool_expr>, <first_SDV>, <second_SDV>)
<ITE_SDV>=>ITE(<bool_expr>, <first_SDV>, <second_SDV>)

An ITE SDV takes three arguments: a symbolic Boolean expression, a first SDV and a second SDV. Whether the symbolic Boolean expression is satisfied depends upon control nodes to which it relates. If the symbolic Boolean expression is satisfied, then the value of the first SDV is returned by the ITE SDV, else the value of the second SDV is returned by the ITE SDV. The first and second SDVs can either be an integer SDV, or a nested ITE SDV.

An ITE SDV can be used to indicate whether or not datapath nodes are outputting the same data, at a particular time, depending upon which conditions of the control nodes are met.

1.3.2.3. Symbolic Boolean Expression

A symbolic Boolean expression is the same as an ordinary Boolean expression, except that rather than being comprised of Boolean variables (e.g., "x" or "-x") and/or Boolean values (e.g., "1" or "0"), it is comprised of, respectively, symbolic Boolean variables and/or symbolic Boolean values. A symbolic Boolean expression can be a single symbolic Boolean variable or a single symbolic Boolean value. A symbolic Boolean expression can also be comprised of symbolic Boolean variables and/or symbolic Boolean values connected by Boolean operators.

A symbolic Boolean variable can differ from an ordinary Boolean variable as follows. A symbolic Boolean variable can include an indication of the timestep for which it was initially created. For example, a symbolic Boolean variable can include the integer "0" to indicate that it was initially created for the timestep zero. For the timestep zero, an example symbolic Boolean variable can be "X[0]" (corresponding to the Boolean variable "X").

A symbolic Boolean value can differ from an ordinary Boolean value as follows. A symbolic Boolean value can include an indication of the timestep for which it was initially created. For example, a symbolic Boolean value can include the integer "0" to indicate that it was initially created for the timestep zero. For the timestep zero, the symbolic Boolean values can be "1[0]" (corresponding to a Boolean "1") and "0[0]" (corresponding to a Boolean "0").

1.3.2.4. CERs

A CER is a symbolic Boolean expression that describes the conditions under which a node "n1" at a timestep "t1" has the same integer SDV as a node "n2" at a timestep "t2."

If "n1" and "n2" are both assigned integer SDVs, the CER between them can be as follows. The CER can be a logic 1 if both "n1" and "n2" have the same integer SDV. The CER can be a logic 0 if "n1" and "n2" have different integer SDVs.

If "n1" is assigned an integer SDV and "n2" is assigned an ITE SDV, then the CER between them can be as follows. The CER can be logic 0 if there is no setting of the variables of the ITE SDV for which it evaluates to the same integer SDV assigned to "n1." The CER can be a symbolic Boolean expression that specifies a setting of the variables of the ITE SDV for which it evaluates to the same integer SDV assigned to "n1."

If "n1" is assigned an ITE SDV "iteSDV1" and "n2" is assigned an ITE SDV "iteSDV2," then the CER between them can be as follows. Let us call the collection of all variables of iteSDV1 and iteSDV2 the "support" for any CER between them. The CER can be logic 0 if there is no setting of the support variables that causes iteSDV1 and iteSDV2 to evaluate to the same integer SDV. The CER can be a symbolic Boolean expression that specifies a setting of the variables of the support that causes iteSDV1 and iteSDV2 to evaluate to the same integer SDV.

1.3.2.5. MTBDDs

ITE SDVs (as well as integer SDVs) can be represented as MTBDDs. This permits a CER to be found, between two SDVs, by applying the two SDVs to any standard MTBDD solving package that seeks for the conditions under which the two SDVs produce the same value. The CER, resulting from the two MTBDDs, can be expressed as a BDD.

1.3.3. Identification of Nodes as Control or Datapath

Any appropriate heuristic or procedure can be used to identify a node of a miter as part of control or part of the datapath. Also, the division between control and datapath nodes can be guided by user input.

Identification of all nodes in a miter as being control results in the performance of a known type of equivalence checking at the bit level. This type of equivalence checking has the advantage that if the search is not intractable, an exact answer, as to whether the two designs are equivalent, will be found.

As one proceeds to indicate more of a miter as being datapath, the search for equivalence can become more tractable, but the probability of finding a "false negative" (i.e., an indication that the two designs are not equivalent when, in fact, the are equivalent) increases.

The following heuristic has been found to provide a suitable tradeoff between increased tractability, while keeping the probability of false negatives low: indicate all nodes as datapath, except for those in the transitive fanin of each multiplexer selector input.

1.3.4. Within test_for_equivalency $CS_{ts}$ is referred to in the pseudo-code as "CS_ts." FIG. 2B shows the invocation (see line 21) of a procedure "generate_test_bench" for generation of $CS_{ts}$ from $RTLM_{ts}$ and $HLM_{ts}$. Procedure "generate_test_bench" corresponds to combining structure generation process 1031 of FIG. 1.

1.4. Initializations

1.4.1. Overview

Prior to starting an equivalence-determining process, the following initializations can be done.

The ATR of the miter can be defined (see below section 1.4.2, "Active Timestep Range," for definition of ATR) by setting values for ATR_begin and ATR_end. The miter can be initialized to begin as a single timestep at t=0. In this case, for example, ATR_begin and ATR_end can both be initialized to zero.

For each timestep of the ATR, each datapath node can be assigned a "label identifier." A label identifier is a globally unique identifier for each datapath node of a miter. Label identifiers can be used, as described below, for insuring that equivalence classes of nodes, that have been determined by an equivalence-determining process, are combined according to a predictable ordering.

In order to "prime" an SDV propagation process, whereby equivalences between nodes can be determined, the following initializations can be accomplished (see below section 1.4.3, "SDV Propagation Processes," for a definition of SDV propagation processes).

Initial SDVs, for the present-state nodes of the ATR, can be assigned. In order to determine such initial SDVs, initial states for RTLM and for HLM can be determined. An initial state for RTLM can be determined in a well known manner that need not be described herein. A novel technique is described herein for determining an initial state of an HLM by partial execution of it.

SDVs can be assigned to datapath primary inputs of the ATR. Symbolic Boolean expressions can be assigned to control primary inputs of the ATR.

1.4.2. Active Timestep Range

An "Active Timestep Range" (ATR) is the range of timesteps, of a miter, currently being processed with the objective of further propagating SDVs (see below section 1.4.3 "SDV Propagation Processes"). An ATR begins at a timestep t=ATR_begin and continues to a timestep at t=ATR_end.

1.4.3. SDV Propagation Processes

An SDV Propagation process seeks to propagate SDVs through a miter's ATR as far as possible.

Propagation of an SDV means the following. For a component (e.g., a multiplexer or transformation function) within a timestep, it is the determination of an SDV for the component's output based upon the SDVs at its inputs. When propagating an SDV from a timestep at t=n to a timestep at t=n+1, it is the determination of an SDV for a present state input of t=n+1 based upon next state outputs of t=n.

Propagation of SDVs through TFs (see Glossary for definition of "TF") can be assisted by the determination of CERs. Specifically, propagation of SDVs through a TF "TF1" and a TF "TF2" can be assisted by the determination of CERs between the inputs of TF1 and TF2. Such CERs, combined with a CEC of TF1 and TF2, can allow for CERs between the outputs of TF1 and TF2 to be determined.

1.4.4. Within test_for_equivalency

The active timestep range can be defined to begin at the value set for "ATR_begin" (which also indicates the last timestep to be reencoded) and to end at the value set for "ATR_end." These can both be initialized to zero. FIG. 2B, lines 23-24.

The initial active timestep range (e.g., $RTLM_{ts}[0]$, $HLM_{ts}[0]$ and $CS_{ts}[0]$) can have its nodes labeled in levelized order by label_datapath_nodes. FIG. 2B, line 27.

The present-state inputs of the initial timestep of the initial ATR (e.g., $RTLM_{ts}[0]$ and $HLM_{ts}[0]$), can be set by a procedure called "initialize_initial_timestep." FIG. 2B, lines 32-33. initialize_initial_timestep can work by first finding initial states for RTLM and HLM. The initial state for RTLM can be found by any appropriate conventional technique. The initial state for HLM can be found by a novel technique that utilizes partial execution of the HLM. Results of the partial execution can be saved, using further novel techniques, such that initialization of the initial timestep can be accomplished. initialize_initial_timestep is discussed in detail in below section 5 ("Initialization Of The Miter Timestep"). In FIG. 1, procedure initialize_initial_timstep corresponds to initial state determination process 1030.

The datapath primary inputs and the control logic primary inputs of the initial timestep of the initial ATR can be initialized by calling a procedure called "initialize_timestep_inputs." FIG. 2B, line 40. initialize_timestep_inputs is discussed in detail in below sections 5.3 ("Translation To Initial Timestep") and 6.1.5 ("initialize_timestep_inputs").

1.5. Equivalence Checking with Cers

1.5.1. Overview

Figure 19:
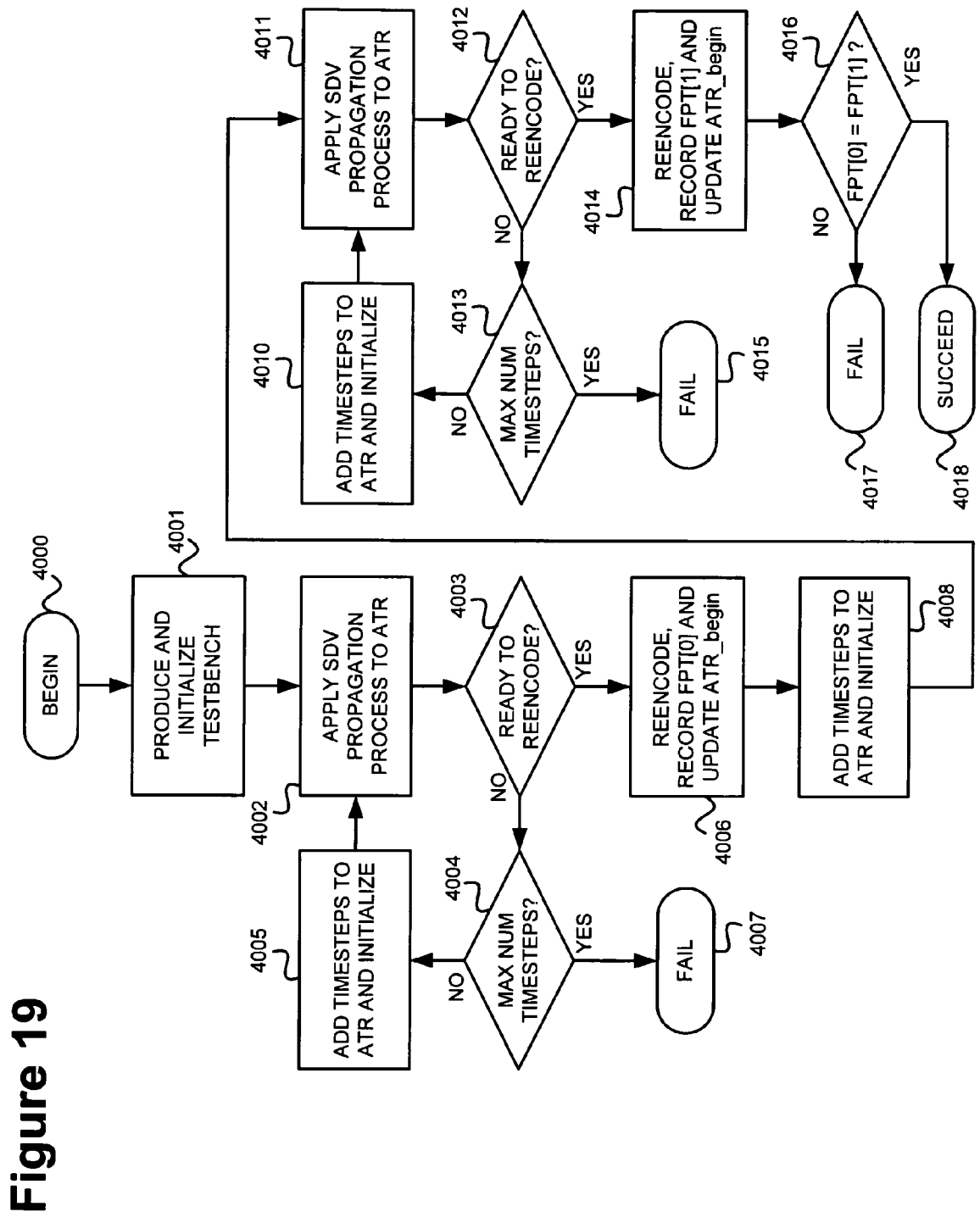
FIG. 19 presents an overview of an equivalence-determining process.

An overview of an equivalence-determining process is shown in FIG. 19.

The process begins at step 4000. The first step of the process is to produce and initialize a miter, as discussed above. Step 4001.

An SDV propagation process is applied to the ATR. Step 4002. SDV propagation processes are discussed above (e.g., see section 1.4.3 "SDV Propagation Processes").

The ATR is tested for whether it has a timestep at t=t_ready that is ready for reencoding. Step 4003. The conditions, for a timestep being ready for reencoding, are discussed in the below section 1.5.3 ("Ready For Reencoding"). If there is a timestep t_ready, the following actions can be taken (see step 4006): t_ready is reencoded; a fixed-point target (FPT) is extracted from t_ready and recorded in an array element FPT[0]; and the ATR is updated to begin at t_ready (i.e., ATR_begin=t_ready). A definition of "FPT" is presented in the below section 1.5.4 ("Fixed-Point Target (FPT)"). In preparation for trying to find another FPT, timesteps are also added to the ATR and they are initialized (or "primed") for more SDV propagation. FIG. 19, step 4008.

If a timestep ready for reencoding has not yet been found, the "no" branch of step 4003 is taken and the miter is tested (by step 4004) for whether a maximum number of timesteps have already been tried. If a maximum number of timesteps have already been tried, the "yes" branch of step 4004 is taken and the equivalence-determining process fails (in step 4007). If a maximum number of timesteps have not been tried, the "no" branch of step 4004 is taken and a timestep (or timesteps) are added to the ATR (by step 4005). Once timesteps have been added to the ATR, the SDV propagation process is repeated (at step 4002).

Continuing the above description, at the point where step 4008 has been accomplished, the collective function of steps of 4002 to 4007, in finding a first FPT, is essentially repeated by steps 4010 to 4015. Steps 4010 to 4015 seek to find a second FPT at a later timestep of the miter.

Steps 4010 to 4015 begin with an SDV propagation process applied to the newly-expanded ATR. Step 4011.

The ATR is tested for whether it has a timestep at t=t_ready that is ready for reencoding. Step 4012. The timestep t_ready, if found, is at a later timestep than the t_ready found by step 4003. The conditions, for a timestep to be ready for reencoding, are the same as those discussed above for step 4003.

If a timestep t_ready is found by step 4012, the following actions can be taken (by step 4014): the timestep at t_ready is reencoded; a second fixed-point target (FPT) is extracted from the timestep at t_ready and recorded in an array element FPT[1]; and the ATR is updated to begin at t_ready (i.e., ATR_begin=t_ready).

Continuing from the point where step 4014 is completed, the two FPTs can be compared. Step 4016. If the two FPTs are identical, then it is proven that $HLM_{ts}$ is equivalent to $RTLM_{ts}$ for all timesteps. Such success is indicated by taking the "yes" branch from step 4016 to step 4018 that causes a "succeed" to be indicated. If the two FPTs are not identical, then it is known that the equivalence-determining process cannot prove equivalence, for all timesteps, between $HLM_{ts}$ and $RTLM_{ts}$.

If a timestep at a time t_ready is not found by step 4012, the following actions can be taken. The miter is tested (by step 4013) for whether a maximum number of timesteps have already been tried. If a maximum number of timesteps have already been tried, the "yes" branch of step 4013 is followed and the equivalence-determining process fails (in step 4015). If a maximum number of timesteps have not been tried, the "no" branch of step 4013 is taken and a timestep (or timesteps) are added to the ATR (by step 4010). Once timesteps have been added to the ATR, the SDV propagation process is repeated (at step 4011).

1.5.2. Other Applications

The equivalence-determining process presented herein is described mostly with respect to the analysis of a DFG that has been derived from an RTLM and HLM. However, the equivalence-determining process presented can be used for comparing two RTLMs to each other, or for comparing two HLMs to each other. Furthermore, the DFG, to which the equivalence-determining process presented herein is applied, can be derived from any type of initial source description.

1.5.3. Ready for Reencoding

An ATR of a miter is ready for reencoding, at a timestep t_ready, if the following conditions are satisfied by each timestep from t=ATR_begin to t=t_ready-1:

All primary outputs have SDVs.;
All next-state outputs have SDVs.;
The combining structure indicates that HLM and RTLM are equivalent.

1.5.4. Fixed-Point Target (FPT)

The Fixed-Point Target (FPT) is a pattern of SDV assignment that, if found at a timestep t=x1, where "x1" is any permissible timestep, and is also found at a timestep t=x2, where "x2" is any permissible timestep after "x1," it is known that a "steady-state" of SDV propagation has been reached.

A suitable pattern of SDV assignment that can be recorded, as an FPT of a timestep "t_ready," is as follows:

For each signal of RTLM_ts[t_ready] and HLM_ts [t_ready], the correspondence between the timestep-independent name of the signal and its SDV value.

1.5.5. Counter-Example Generation

Whenever the equivalence-determining process fails, counter-example generation can be performed. With regard to FIG. 19, counter-example generation can be performed at steps 4007 or 4015. For either of these steps, a test can be performed to determine whether the failure to be ready for a reencode is due to a combining structure, for one of the timesteps from ATR_begin to ATR_end, indicating conditional equivalence between the HLM and RTLM.

A $CS_{ts}$, of some timestep "t," indicates equivalence conditionally if it has a CER "CS_CERs" which, if satisfied, would cause $CS_{ts}$[t] to indicate equivalence between $RTLM_{ts}$[t] and $HLM_{ts}$[t]. CS_CER should be a symbolic Boolean expression other than logic "1."

The set of all symbolic Boolean variables, comprising CS_CER, can be referred to as its "basis." Each setting, of the basis of CS_CER, for which $CS_{ts}$[t] will not indicate equivalence, is a potential counter-example. The basis can be set by assignment of Boolean values to the primary inputs of both designs. Any such assignment of Boolean values, that causes CS_CER to evaluate to "0," is a potential counter-example.

A designer can use a potential counter-example in conjunction with, for example, conventional simulation. The objective of the simulation is to determine whether the potential counter-example is a real counter-example that actually prevents a finding of equivalency between the HLM and RTLM.

If simulation cannot show that a potential counter-example is a real counter-example, the designer's conclusions can include the following: the equivalence-determining system may have produced a "false negative" (i.e., it may be that the HLM and RTLM are actually equivalent but the equivalence-determining system was not able to prove this). The possibility that a formal equivalence-determining system, in accordance with the present invention, may produce a false negative is balanced by the fact that, compared with conventional formal equivalence-determining systems, much larger designs are tractable.

For the case of step 4017 of FIG. 19, all the combining structures indicated equivalence, but the induction proof did not succeed. Thus, it can only be concluded that the designs are equivalent up to the latest timestep for which the combining structures indicated equivalence, but equivalence for all times has not been proven.

1.5.6. Within test_for_equivalency

The procedure "equivalence_checking with_CERs" is called that performs the core equivalence determining process. FIG. 2B, lines 42-43.

Given the miter, comprised of RTLM_ts, HLM_ts and CS_ts, equivalence_checking_with_CERs returns a TRUE if RTLM_ts is equivalent to HLM_ts. In FIG. 1, procedure equivalence_checking_with_CERs corresponds to equivalence determination process 1033.

2. HLM to DFG Conversion by Symbolic Simulation 2.1. Overview

The term "symbolic simulation," as utilized herein, refers to a simulated execution of an input representation such that all possible scenarios, for flow-of-control, are considered. The result is a non-canonical data structure that explicitly represents the flows-of-control considered.

As an example, the input representation, to be symbolically simulated, can be a CFG. The CFG can be produced from an HLM, where the HLM is expressed in a high-level programming language, such as C or C++. The particular form of non-canonical data structure, produced by symbolic simulation of the CFG, can be a DFG.

Each possible flow-of-control through the CFG can be represented by a marker referred to herein as an "execution path." An execution path can serve as a bridge, between the CFG and the DFG being produced, as follows. In addition to marking a location with the CFG, an execution path can include an expression referred to herein as a "path condition." A path condition of an execution path "x" can express, in terms of variables set by nodes of the DFG being produced, the condition under which the CFG location (indicated by execution path "x") can be reached.

The initial value, of each variable of the CFG, can be represented as an input to the DFG to be produced. Once symbolic simulation is completed, these initial values can "flow through" the DFG and be transformed, by operators of the DFG, to produce output values for HLM variables.

Each possible flow of control through the CFG is encompassed within the DFG produced by symbolic simulation. Depending upon the initial values input to the DFG, data can flow through particular paths of the DFG in order to produce the correct result.

Figures 3A, 3B:
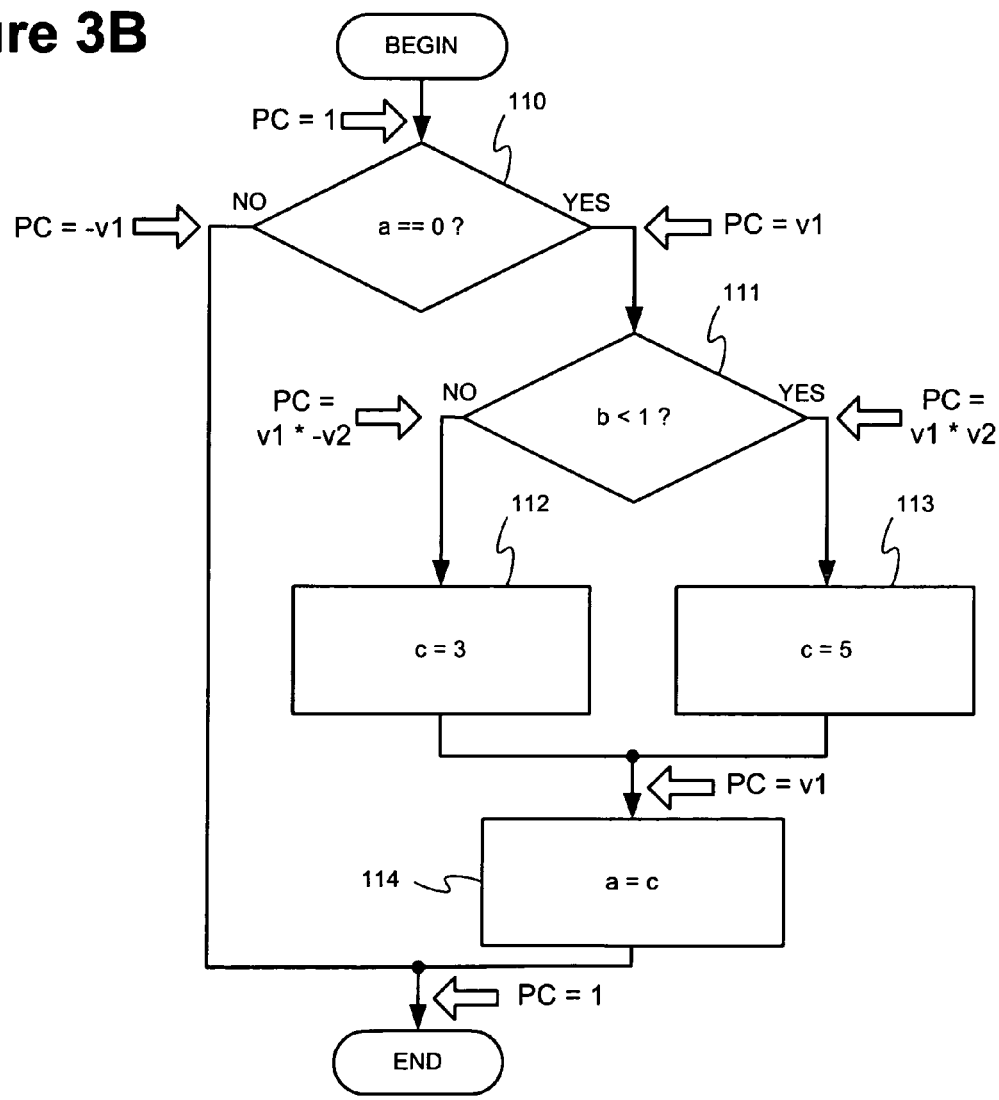
FIG. 3A presents an example of C or C++ code from which a CFG can be produced.
FIG. 3B presents an example CFG that can be symbolically simulated to produce a DFG.

An example CFG, that can be symbolically simulated, is shown in FIG. 3B. FIG. 3B can be produced from the example C or C++ code of FIG. 3A.

Figure 4A:
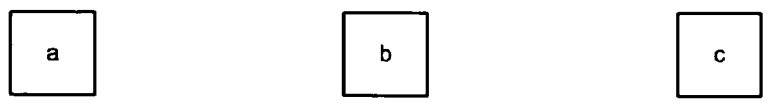
FIGS. 4A-4G depict steps in the creation of a DFG by symbolic simulation.

The symbolic simulation of FIG. 3B can begin with a DFG as shown in FIG. 4A. FIG. 4A represents each initial value of the CFG as an input node of the DFG to be produced. A non-canonical result, of symbolically simulating FIG. 3B, is the DFG shown in FIG. 4G. The initial values ("a," "b" and "c") flow through FIG. 4G and result in producing the final values (a', b' and c').

Figure 4B:
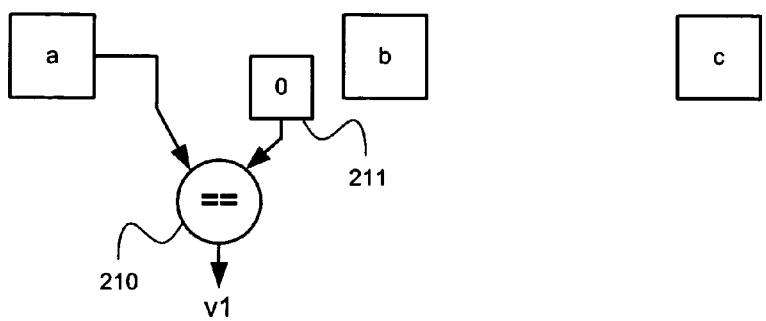
Figure 4C:
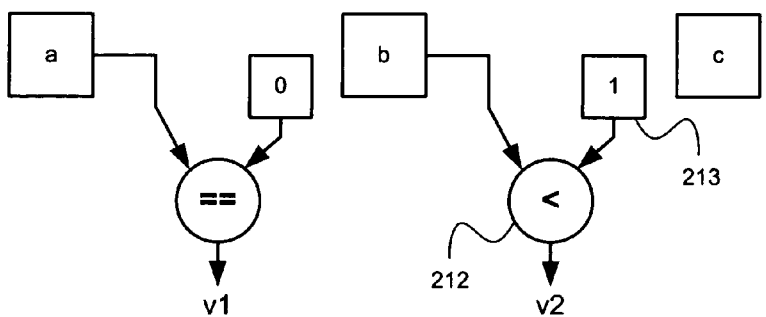
Figure 4D:
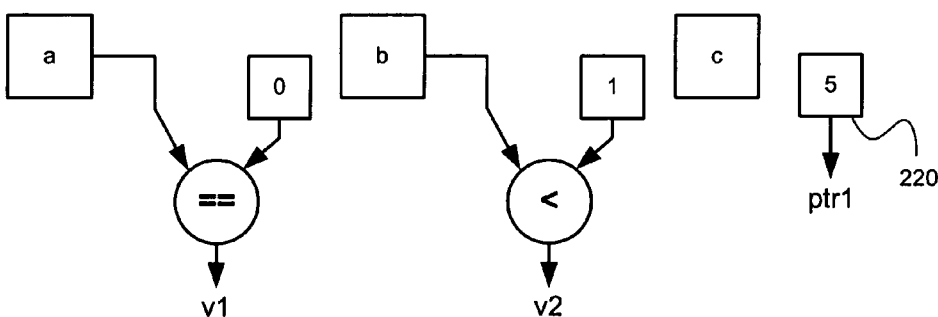
Figure 4E:
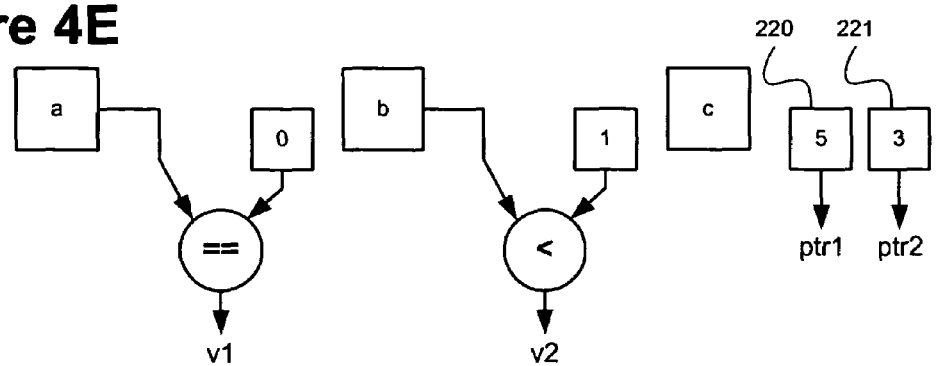
Figure 4F:
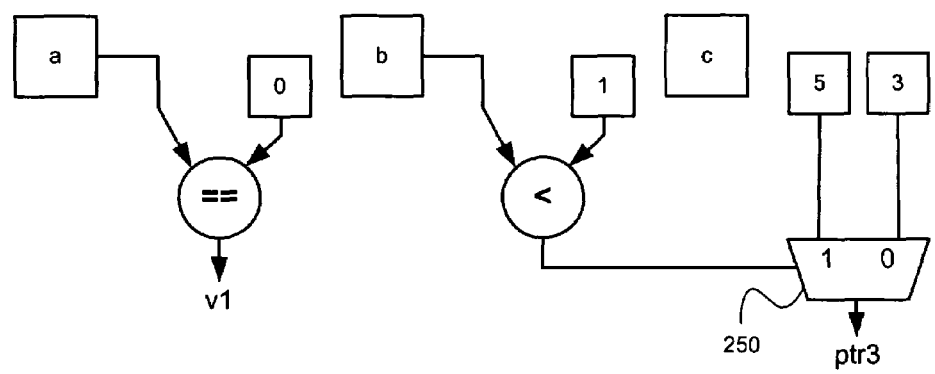
Figure 4G:
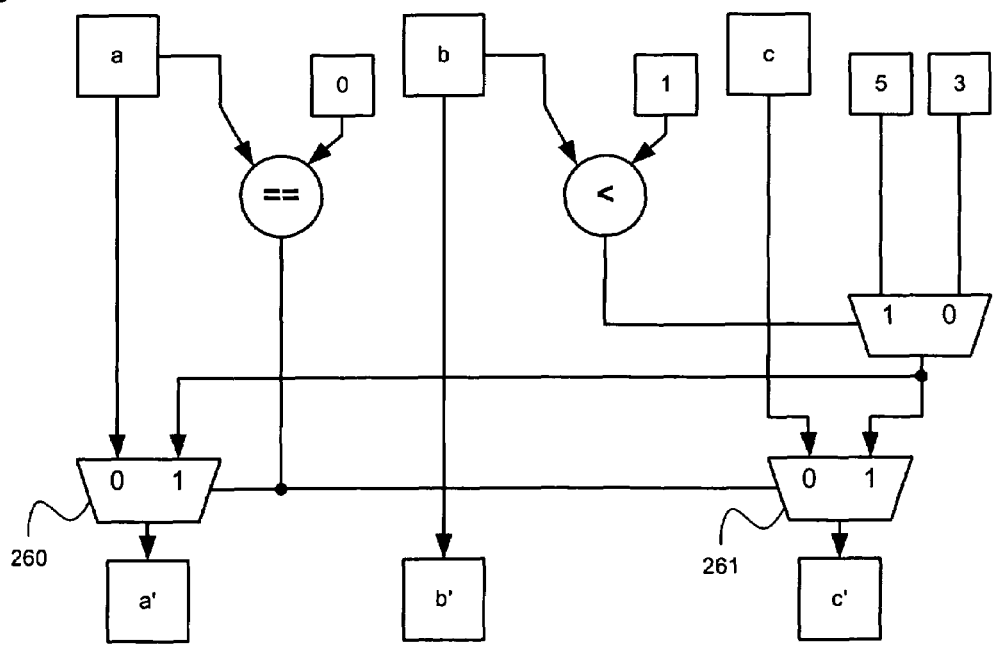

As can be seen, FIG. 4G encompasses each potential execution path of FIG. 3B. For example, in FIG. 3B, if the initial value of "a" is not zero, then none of initial values are changed. This execution scenario is encompassed, in the DFG of FIG. 4G, by the initial value nodes simply flowing, unchanged, to the final value nodes.

Under the scenario where "a" is equal to zero, two sub-scenarios are possible: "b" is less than one or "b" is not less than one. If "b" is less than one, than "c" is set to "5." If "b" is not less than one, than "c" is set to "3." These two sub-scenarios are encompassed, within FIG. 4G, by the multiplexer that selects between "5" or "3" depending upon the result of comparing "b" to "1." Regardless of the initial value of "b," "a" is set to the same value to which "c" is set. This is encompassed, within FIG. 4G, by the multiplexer that drives final value "a" selecting for the output of the multiplexer that selects between "5" or "3."

A step-by-step example symbolic simulation, that produces FIG. 4G, is presented below.

A key operation of any symbolic simulation is "splitting" an existing execution path "x," into two execution paths "x_true" and "x_false," when a conditional node "y" of a CFG is reached. Execution path x_true handles the case where the conditional expression, of conditional node "y," is satisfied. Execution path x_false handles the case where the conditional expression, of conditional node "y," is not satisfied. Symbolic execution fully explores both x_true and x_false so that the resulting DFG can handle both cases. Another key operation of symbolic simulation is "merging" two execution paths, "x_true" and "x_false," into a re-combined execution path "x." Examples of splitting and merging are discussed below with regard to the example production of FIG. 4G.

2.2. Other Applications

The symbolic simulation techniques presented herein are discussed primarily with respect to their application to the equivalence-determining process presented herein. However, the symbolic simulation techniques presented herein can be used in conjunction with any application utilizing a non-canonical representation of an HLM. By way of example only, and without limiting the range of potential applications, non-canonical representations of an HLM can be useful with other types of design analysis tools and with synthesis tools.

2.3. For HLM and RTLM Comparison

As discussed above, before an HLM and RTLM are compared, for purposes of determining equivalence, both can be translated into the common representation of a DFG.

This section describes a novel technique for converting an HLM into an $HLM_{DFG}$ using symbolic simulation. In terms of the example overall equivalence-determining system of FIG. 2B, this section addresses techniques for implementing RTLM_2_DFG (line 5) and HLM_2_DFG (line 8). However, an equivalence-determining system is just an example application of the symbolic-simulation based conversion technique presented.

In the $HLM_{DFG}$ produced, a node can represent any of the following: a primary input, a primary output, a combinational function (including a multiplexer) or a register.

As discussed above, symbolic simulation can be applied to an HLM described in any type of representation. For example, if the HLM is described in a high-level programming language, such as C++, compilation of the HLM can produce parse trees to which symbolic simulation can be applied. The particular representation discussed in detail herein, for application of symbolic simulation, is a control-flow graph (or CFG). A CFG representing the HLM is referred to herein as $HLM_{CFG}$. Conversion of an HLM into a $HLM_{CFG}$ is well known and need not be described herein.

A procedure for symbolic simulation, of an $HLM_{CFG}$, is depicted in the pseudo code of FIGS. 7A to 7F. FIGS. 7A to 7F are discussed below in conjunction with the example $HLM_{CFG}$ of FIG. 3B.

The $HLM_{CFG}$ of FIG. 3B was produced from the example code of FIG. 3A, where FIG. 3A is written in the C or C++ programming language.

Advantages of using a CFG representation of an HLM, upon which to apply symbolic simulation, include the following. A CFG provides a common representation to which HLMs, written in a variety of programming languages, can be converted. A CFG can provide a simpler representation, compared with the source HLM, upon which to apply symbolic simulation. For example, the various types of control structures, present in the C or C++ programming languages, can all be converted, in the CFG, to appropriate conditional nodes.

An example $HLM_{DFG}$, produced by application of the procedure of FIG. 7A to the $HLM_{CFG}$ of FIG. 3B, is shown in FIG. 4G.

FIGS. 4A-4F depict earlier steps in the creation of the $HLM_{DFG}$ of FIG. 4G. FIGS. 5A-5F depict intermediate data structures, used during the DFG production process, referred to herein as "output-lists." During the DFG generation process, each variable of the HLM has a corresponding output-list. FIGS. 6A-6H depict different states of a queue, referred to herein as an "execution path queue" or EP_queue, that can be used to perform a breadth-first traversal of $HLM_{CFG}$.

2.4. Initialization for CFG Traversal

Symbolic simulation can begin by producing a DFG representation for initial values of the HLM variables (see FIG. 7A, line 1). Each initial value can be represented by a node designated as representing a particular variable of the HLM. Once the DFG is completed, these initial values "flow through" the DFG and are transformed, by the operators of the DFG, to produce output values for HLM variables.

For the CFG of FIG. 3B, FIG. 4A shows nodes representing initial values for variables "a," "b" and "c."

Next, symbolic simulation can produce an intermediate representation, for each HLM variable, that comprises elements of the CFG and DFG. This intermediate representation is referred to herein as an output-list representation for each HLM variable (see FIG. 7A, line 3). The output-list can be comprised of elements, each referred to herein as an "OL_element." OL_elements, of an output-list, are connected by an implicit multiplexer that could implement, in a DFG, the function mapped by the OL_elements. Each OL_element can be comprised of two parts, one of which refers to the DFG and the other to the CFG. These two parts are referred to herein, respectively, as a "DFG-pointer" and a "path condition." A DFG-pointer can point to a particular node of $HLM_{DFG}$. A path condition can specify the conditions under which a particular thread of control is executed in an $HLM_{CFG}$. When the path condition of an OL_element is satisfied, its HLM variable should have the value produced by the $HLM_{DFG}$ node indicated by its DFG-pointer.

Figure 5A:
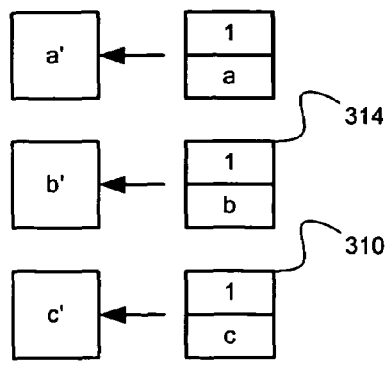
FIGS. 5A-5F depict intermediate data structures, that can be used during DFG production by symbolic simulation, referred to herein as "output-lists."

For the $HLM_{CFG}$ of FIG. 3B, FIG. 5A shows example, initial, output-lists for variables "a," "b" and "c." To distinguish the initial state of variables "a," "b" and "c," from their values as output by the $HLM_{DFG}$, the output-lists of FIG. 5A represent "a," "b" and "c" as "primed" variables.

An output-list's support set can be defined as the union of the support set for each path condition in each of its OL_elements.

Operations on an output-list can be structured to enforce that the following conditions are true. For each combination of values, assigned to an output-list's support set, only one path condition, of one OL_element, is satisfied. For each combination of values, assigned to an output-list's support set, at least one path condition, in one OL_element, is satisfied.

A path condition can be represented in the following hybrid format that uses both DFG and BDD representations. Each conditional expression, of a CFG conditional node, can be converted into a DFG, referred to herein as conditional_expression$_{DFG}$, that can be added to $HLM_{DFG}$. The output of conditional_expression$_{DFG}$ can be represented, in a path condition, by a variable. A path condition can be a Boolean expression on such variables, where the expression can be represented as a BDD.

The next step, in a symbolic simulation, can be to initialize a queue of execution paths. (FIG. 7A, lines 5-7) An execution path can be referred to herein as an "EP" and a queue of such EPs can be referred to as an "EP_queue." Each EP can be comprised of a path condition and a pointer to a node of $HLM_{CFG}$ to which such path condition applies. The initial EP, on EP_queue, can be a path condition comprised of a logic TRUE (since no conditions of the HLM need be evaluated to any particular value for the path to be executed) and a pointer to the first node of $HLM_{CFG}$.

Figure 6A:
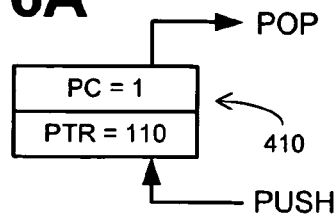
FIGS. 6A-6H depict different states of a queue, referred to herein as an "execution path queue," that can be used to perform a breadth-first traversal of an $HLM_{CFG}$.

For the example of FIG. 3B, an initial EP_queue is shown in FIG. 6A. In the EP_queues of FIGS. 6A-6H, EPs are inserted (or pushed) onto the bottom of the queue and removed (or popped) from the top.

Using EP_queue to keep track, symbolic simulation can explore the possible execution paths of $HLM_{CFG}$ in a breadth-first manner. Such breadth-first traversal can be driven by a loop (FIG. 7A, lines 9-23) that repeats until EP_queue is empty (tested for at FIG. 7A, line 9).

2.5. Loop for Breadth-First Traversal of CFG

For each iteration of the breadth-first search loop, four types of conditions can be tested for. The four conditions are discussed below.

2.5.1. Two EPs Point to Same CFG Node

Figure 6B:
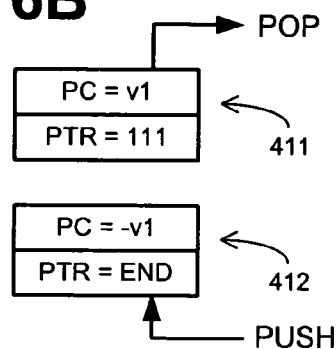
Figure 6C:
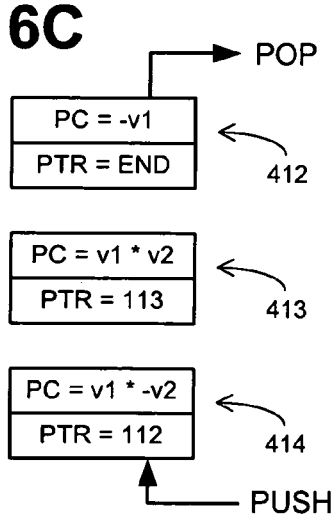
Figure 6D:
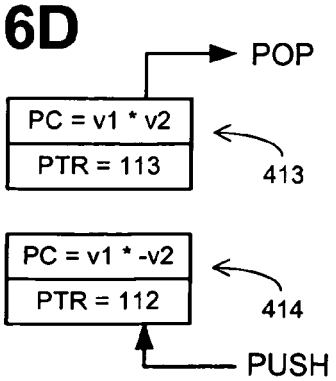

A first condition, that can be tested-for during a CFG traversal, is whether two EPs, of EP_queue, point to the same node of $HLM_{CFG}$ (FIG. 7A, line 11). An example EP_queue, satisfying this first condition, is shown in FIG. 6F, where both EPs point to node 114 of FIG. 3B. If the first condition is satisfied, the following steps can be performed (see FIG. 7B for the function "merge_EPs").

The two EPs pointing to the same CFG node, referred to herein as EP1 and EP2, can be removed from EP_queue (FIG. 7B, line 4). The contents of EP_queue can be appropriately shifted to remove the "gaps" created by the removal of EP1 and EP2.

An EP3 can be created (FIG. 7B, line 6) to replace EP1 and EP2. An example EP3, created to replace the example EP1 and EP2 of FIG. 6F, is shown in FIG. 6G. EP3 can point to the same node of $HLM_{CFG}$ as was pointed to by EP1 and EP2. The path condition of EP3 can be the simplified disjunction (FIG. 7B, lines 8-9) of the path conditions for EP1 (referred to herein as "pc1") and EP2 (referred to herein as "pc2"). With pc1 and pc2 represented as BDDs, standard techniques can be used for producing a simplified disjunction (referred to herein as "pc3"). For the EP1 and EP2 of FIG. 6F, the disjunction is:

$$v1*v2+v1*\sim v2$$

which simplifies to:

$$v1$$

EP3 can be pushed onto EP queue (FIG. 7B, line 11).

If the support of pc3 is a proper subset of the union of the supports of pc1 and pc2 (FIG. 7B, line 13) then, for certain HLM variables, it may be possible to simplify their output-list by shifting some of their path condition logic to $HLM_{DFG}$. This can be determined by calling (FIG. 7B, line 15) "construct_DFG." For the example EP3 of FIG. 6G, the support of its pc3 is {v1}, while the union of the supports of the pc1 and pc2, of FIG. 6F, is {v1, v2}.

construct_DFG can operate as follows (see FIG. 7B, lines 19-47). A set, referred to herein as "IS_pc3," can be identified. IS_pc3 can contain all OL_elements, of an HLM variable's output-list, whose path conditions intersect pc3 (see FIG. 7B, lines 22-23). If IS_pc3 contains more than one element (see FIG. 7B, line 25), it may be possible to merge the path conditions of its OL_elements, while shifting their logic to $HLM_{DFG}$. Such operation can be invoked by calling a function "merge_OL_elements" (FIG. 7B, line 29). For example, when EP_queue is in the state shown in FIG. 6F, a corresponding state of the output-lists is shown in FIG. 5C. Of HLM variables a', b' and c', only c' has OL_elements (labeled 350 and 351 in FIG. 5C) that intersect with pc3 (i.e., intersect with v1).

merge_OL_elements can operate as follows (see FIG. 7C). A nested ITE expression can be constructed from the elements of IS_pc3 (see FIG. 7C, line 6). The nested ITE can be any particular serialization of the multiplexer implied between OL_elements. The ITE can be converted into an MTBDD (FIG. 7C, line 8) which is then simplified (FIG. 7C, line 10). The simplified MTBDD can be converted back into a simplified ITE expression (FIG. 7C, line 12). The simplified ITE expression can be converted into a group of multiplexers, "mpg_simp_ITE_IS_pc3," that are added to $HLM_{DFG}$. (FIG. 7C, lines 14-15). A pointer to the multiplexer group can be returned (FIG. 7C, line 17).

Returning to construct_DFG, a new OL_element "OLE_new" can be appended to the HLM variable's output-list. The path condition of OLE_new is pc3 and its DFG-pointer points to the multiplexer group for IS_pc3. FIG. 7B, lines 31-33. All OL_elements on the output-list, that are members of IS_pc3, have their path conditions changed such that they do not intersect with pc3 anymore. FIG. 7B, lines 35-36. Any OL_element on the output-list that was completely contained in pc3, will get a path condition of zero and should be removed from the output-list. Any OL_element on the output-list that was only partially contained in pc3, will get a non-zero path condition and should not be removed from the output-list. FIG. 7B, lines 3841.

In the example, an IS_pc3, for the output-list of HLM variable c' as shown in FIG. 5C, comprises OL_elements 350 and 351. An ITE expression for this IS_pc3 is as follows:

ITE(v1*v2, ptr1, ITE(v1*-v2, ptr2, DC))

Where "DC" is a "don't care." The resulting simplified ITE expression can be:

ITE(v2, ptr1, ptr2)

FIG. 4F shows an mpg_simp_ITE_IS_pc3, comprised of multiplexer 250, that replaces the simplified ITE expression.

Figure 5B:
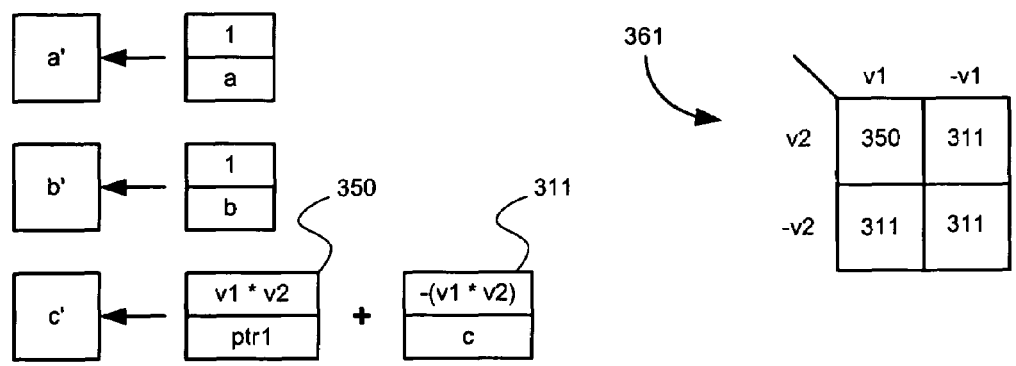
Figure 5C:
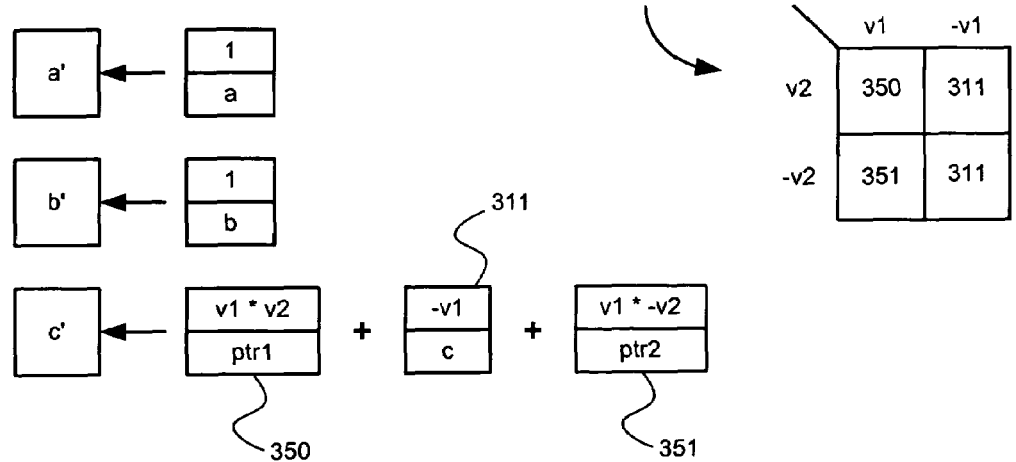
Figure 5D:
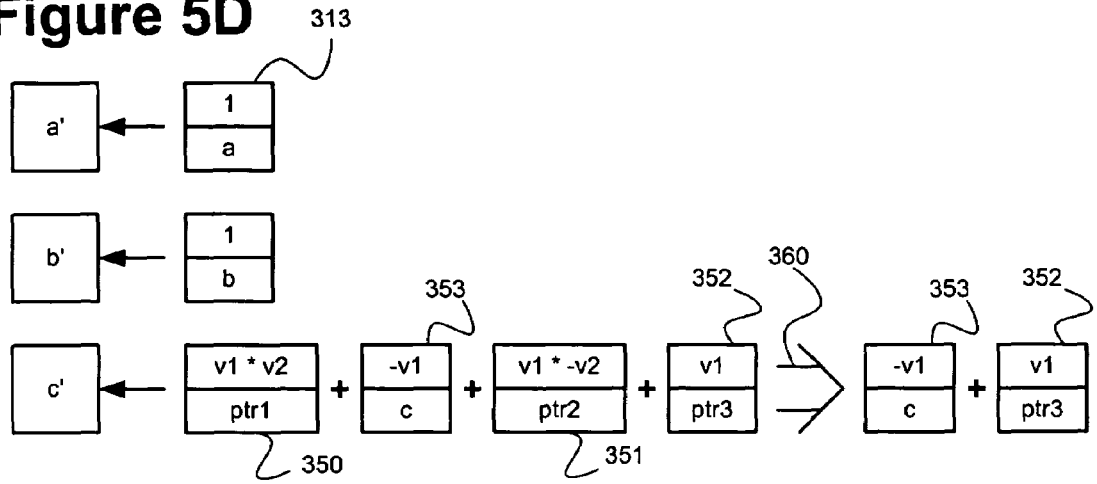

FIG. 5D comprises an arrow 360. On the left side of arrow 360, the following is shown. An OLE new is indicated by a numeral 352, that has been appended to the list of FIG. 5C. OL_element 352 has a path condition of pc3 (i.e., v1) and a pointer to mpg_simp_ITE_IS_pc3 (i.e., ptr3). Changing the path condition of OL_element 350 such that it does not intersect with pc3 (i.e., v1) can be achieved by computing (v1*v2)*-pc3=v1*v2*-v1=0. Since the resulting path condition is zero, OL_element 350 can be removed. Same applies to OL_element 351, leaving only OL_elements 352 and 353. The removal of 350 and 351 is shown on the right side of arrow 360.

2.5.2. Top EP Points to Conditional CFG Node

A second condition to be tested for, is whether the top EP points to a conditional node (FIG. 7A, line 14). This condition is met by EP_queue as shown in FIG. 6A (where EP 410 points to conditional statement 110 of FIG. 3B) and FIG. 6B (where top EP 411 points to conditional statement 111 of FIG. 3B). If this condition is met, the following steps can be performed (see FIG. 7D for the function "split_EP").

A DFG can be produced, for $HLM_{DFG}$, to perform the conditional expression of the conditional node pointed to by the top EP (FIG. 7D, line 4). For the EP 410 of FIG. 6A, the DFG produced for $HLM_{DFG}$ is shown in FIG. 4B as comprising comparator node 210 and constant node 211. For the EP 411 of FIG. 6B, the DFG produced for $HLM_{DFG}$ is shown in FIG. 4C as comprising comparator node 212 and constant node 213.

A BDD variable, referred to herein as "vnew," can be created to represent the value of the conditional expression (FIG. 7D, line 6). For FIG. 4B, vnew is v1 while for FIG. 4C vnew is v2.

Two EPs, referred to herein as EP_if and EP_else, can be created. EP_if's path condition can be pc*vnew and EP_else's path condition can be pc*-vnew, where the path condition of the top EP is referred to herein as "pc" (FIG. 7D, lines 8-9).

The top EP can be popped from EP_queue (FIG. 7D, line 10).

EP_if and EP_else can be pushed on EP_queue (FIG. 7D, line 12). The EP_if and EP_else, created from the EP 410 of FIG. 6A, are shown in FIG. 6B as EPs 411 and 412. The EP_if and EP_else, created from the EP 411 of FIG. 6B, are shown in FIG. 6C as EPs 413 and 414.

2.5.3. Top EP Points to Assignment CFG Node

A third condition to be tested for, is whether the top EP, referred to herein as an "EP_top," points to an assignment node (tested for by line 17 of FIG. 7A). This condition is met by EP_queue as shown in FIG. 6D (where EP 413 points to assignment statement 113 of FIG. 3B), FIG. 6E (where top EP 414 points to assignment statement 112 of FIG. 3B) and FIG. 6G (where top EP 417 points to assignment statement 114 of FIG. 3B). While FIG. 6F also has a top EP 415 that points to assignment statement 114, the first condition (that EP 415 and 416 point to the same CFG node) can have a higher priority and application of the steps of the first condition produce the EP_queue as shown in FIG. 6G. If the third condition is met, the following steps can be performed (see FIG. 7E for the function "process_and_advance_EP").

A function "merge_rhs" can be called (FIG. 7E, line 4) that adds an output to $HLM_{DFG}$ that produces the value of the assignment statement's right-hand side (rhs) and returns a pointer to such DFG output. merge_rhs can operate as follows (see FIG. 7F).

A set, referred to herein as "rhs_HLM_vars," can be identified (FIG. 7F, line 4). rhs_HLM_vars is the set of HLM variables of the rhs of the assignment pointed to by an EP_top. For assignment statements 113, 112 and 114, respectively, their rhs_HLM_vars can be: { }, { } and {c}.

For each variable "vcurr" of rhs_HLM_vars, the following can be done (see FIG. 7F, lines 6-13. Construct a DFG from OL_elements of the output-list for vcurr. The OL_elements used to construct the DFG are those whose path condition intersect with the path condition of the top EP (see call to "construct_DFG at line 10 of FIG. 7F). The DFG constructed is added to the list "rhs_HLM_DFGs." FIG. 7F, line 12.

Produce a set referred to herein as "rhs_HLM_cons" (FIG. 7F, lines 15). rhs_HLM_cons is the set of HLM constants of the rhs of the assignment. For assignment statements 113, 112 and 114, respectively, their rhs_HLM_cons can be: {5}, {3} and { }.

For each constant "ccurr" of rhs_HLM_cons, the following can be done (see FIG. 7F, lines 17-23. Construct a node for $HLM_{DFG}$ to represent the constant (FIG. 7F, lines 19-20). The DFG node constructed is added to the list "rhs_HLM_DFGs." FIG. 7F, line 22.

When assignment statement 113 is the top EP, as shown in FIG. 6D, $HLM_{DFG}$ is in the state shown in FIG. 4C and the output-lists are in the state shown in FIG. 5A. A node 220, to represent the constant 5, can be added as shown in FIG. 4D. This node can be added to rhs_HLM_DFGs.

Figure 6E:
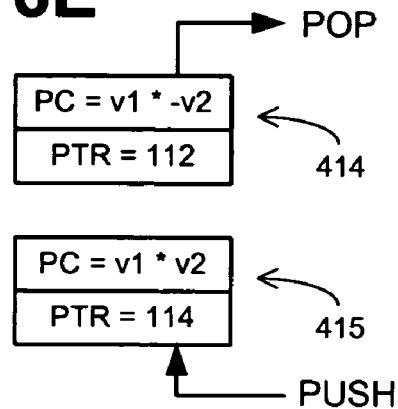
Figure 6F:
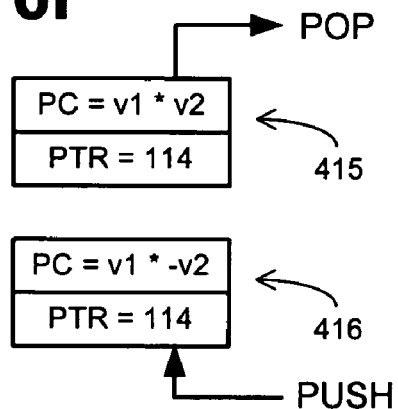
Figure 6G:
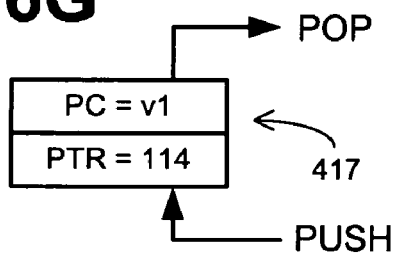

When assignment statement 112 is the top EP, as shown in FIG. 6E, $HLM_{DFG}$ is in the state shown in FIG. 4D and the output-lists are in the state shown in FIG. 5B. A node 221, to represent the constant 3, can be added as shown in FIG. 4E. This node can be added to rhs_HLM_DFGs.

When assignment statement 114 is the top EP, as shown in FIG. 6G, $HLM_{DFG}$ is in the state shown in FIG. 4F and the output-lists are in the state shown in FIG. 5D. Since this assignment statement has no constant on its rhs, no constant-representing node is added.

From rhs_HLM_DFGs, as applied through any operators of rhs, produce a DFG for $HLM_{DFG}$ referred to herein as rhs_DFG (FIG. 7F, lines 25-27).

For assignment statement 113, since it has no rhs operators, rhs_DFG is just node 220 (as shown, for example, in FIG. 4D), pointed to by ptr1, that represents a constant "5."

For assignment statement 112, since it has no rhs operators, rhs_DFG is just node 221 (as shown, for example, in FIG. 4E), pointed to by ptr2, that represents a constant "3."

For assignment statement 114, since it has no rhs operators, rhs_DFG is just multiplexer 250 (as shown, for example, in FIG. 4F), pointed to by ptr3.

Return a pointer to rhs_DFG (FIG. 7F, line 29).

For assignment statements 113, 112 and 114, respectively, the pointer returned is ptr1, ptr2 and ptr3.

Returning to process_and_advance_EP, write to the output-list, for the variable of the lhs of assignment, an OL_element, LE1, comprised of the path condition of EP_top and a DFG-pointer whose value is that of ptr2_rhs_DFG (FIG. 7E, lines 6-8). Insure that elements of output-list of lhs variable, other than LE1, cover, and only cover, complementary path conditions to those covered by LE1's path condition (FIG. 7E, lines 10-11).

For assignment statement 113, LE1 is shown as OL_element 350 of FIG. 5B. OL_element 310, of FIG. 5A, is not complementary to OL_element 350. In FIG. 5B, it is replaced by OL_element 311, which covers, and only covers, the complementary path conditions to those covered by OL_element 350. The complementary relationship of 350 and 311 is illustrated in FIG. 5B by truth table 361.

For assignment statement 112, LE1 is shown as OL_element 351 of FIG. 5C. OL_element 311, of FIG. 5B, is not complementary to OL_element 351. In FIG. 5C, it is altered to be complementary to 351, as well as to 350. The complementary relationship of 350, 311 and 351 is illustrated in FIG. 5C by truth table 362.

Figure 5E:
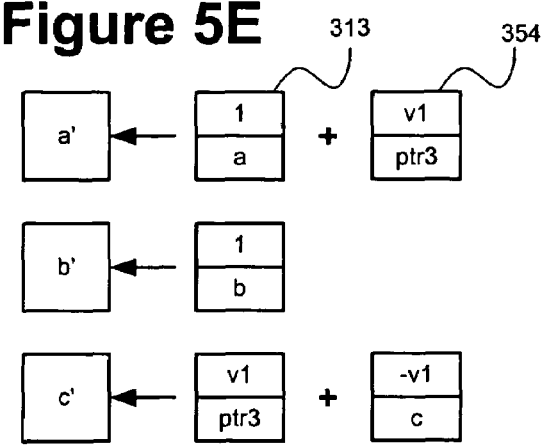
Figure 5F:
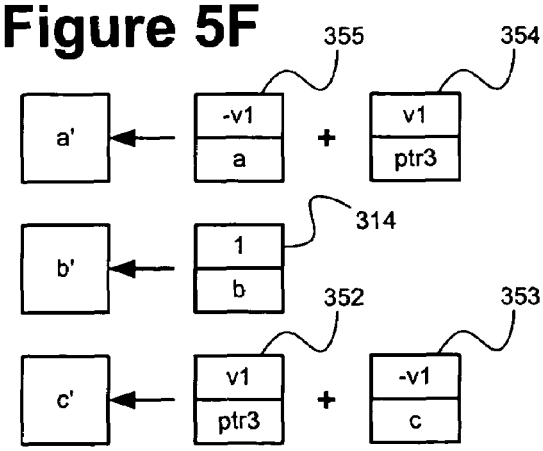

For assignment statement 114, LE1 is shown as OL_element 354 of FIG. 5E. OL_element 313, however, is not complementary to OL_element 354. In FIG. 5F, it is replaced by OL_element 355.

Advance EP_top to next node of $HLM_{CFG}$ (FIG. 7E, lines 13). Pop EP_top from top of EP_queue (FIG. 7E, line 15) and push EP_top back on EP_queue (FIG. 7E, lines 17).

For assignment statement 113, EP 413 (the EP_top at that time), of FIG. 6D, is advanced to node 114 and pushed back onto EP_queue in FIG. 6E as EP 415.

For assignment statement 112, EP 414 (the EP_top at that time), of FIG. 6E, is advanced to node 114 and pushed back onto EP_queue in FIG. 6F as EP 416.

Figure 6H:
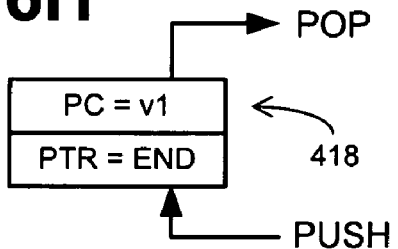

For assignment statement 114, EP 417 (the EP_top at that time), of FIG. 6G, is advanced to the END node and pushed back onto EP_queue in FIG. 6H as EP 418.

2.5.4. Top EP Points to END CFG Node

A fourth condition to be tested for is whether the top EP points to an END node (tested for by line 20 of FIG. 7A). If this condition is met, the top EP is popped from EP_queue (FIG. 7A, line 21). When all EP's have been thus popped from EP_queue, traversal of $HLM_{DFG}$ has been completed.

The "else" condition of conditional statement 110 points to the END node, as indicated by EP 412 that is added in FIG. 6B. In FIG. 6C, EP 412 is the top EP and is therefore popped from EP_queue.

After assignment statement 114 has been processed, the current EP (EP 418) points to the END node, as indicated in FIG. 6H. EP 418 is popped from EP_queue, emptying it, and thereby ending the loop.

2.6. Post-CFG-Traversal Processing

Once the CFG-traversal loop has completed, an $HLM_{DFG}$, that produces a value for each HLM variable, is created as follows.

For each HLM variable, convert the remaining elements, of its output-list representation, into a DFG that is added to $HLM_{DFG}$ (see FIG. 7A, lines 25-27). This can be accomplished by the following steps. A nested ITE expression can be constructed from the OL_elements of the output-list. The nested ITE can be any particular serialization of the multiplexer implied between OL_elements. The ITE can be converted into a MTBDD which is then simplified. The simplified MTBDD can be converted back into a simplified ITE expression. The simplified ITE expression can be converted into a group of multiplexers that are added to $HLM_{DFG}$.

For the example, FIG. 5F shows the output-lists once the CFG-traversal loop has completed.

An ITE expression for the output-list of HLM variable "a," shown in FIG. 5F as comprising OL_elements 355 and 354, is as follows:

ITE(-v1,a,ITE(v1,ptr3,DC))

Where "DC" is a "don't care." The resulting simplified ITE expression can be:

ITE(v1,ptr3,a)

The simplified ITE can be converted into multiplexer 260 of FIG. 4G.

The output-list for HLM variable "b," shown in FIG. 5F as comprising OL_element 314, is converted into a "b" primed output node in FIG. 4G.

An ITE expression for the output-list of HLM variable "c," shown in FIG. 5F as comprising OL_elements 352 and 353, is as follows:

ITE(-v1,c,ITE(v1,ptr3,DC))

Where "DC" is a "don't care." The resulting simplified ITE expression can be:

ITE(v1,ptr3,c)

The simplified ITE can be converted into multiplexer 261 of FIG. 4G.

2.7. Handling Loops During Symbolic Simulation

Loops are implicitly unrolled during symbolic simulation. If symbolic simulation is being done with a CFG, all loop types in the CFG (e.g., "for" loops, "while" loops, "do-while" loops) are reduced to if-nodes (or conditional-nodes) and nodes with backward edges (i.e., nodes from which a traversal can be made to a node closer to the starting point of the CFG).

The conditional-node that checks the loop condition generates two execution paths in symbolic simulation: one execution path that does a next loop iteration and another execution path that exits the loop. Without additional measures, this generation of two execution paths means there will be an execution path that executes the loop forever. In general, however, a meaningful loop eventually terminates. Thus, in many cases, it is possible to determine the maximum number of times a loop can be executed.

An approach to accomplishing this is to call a "decision procedure" every time the loop condition is evaluated. The decision procedure can try to determine if the last iteration of the loop has been reached or if the loop can be executed at least once more. Since the exact symbolic expression for the loop condition is stored in the DFG, any existing proof technique (e.g., any theorem prover, based on BDDs or SAT) can be utilized for this purpose. If it can be proven that the loop will not be executed again, under any circumstances, the execution path, for repeating the loop, can be destroyed.

Although an advantage of symbolic simulation is that it allows proof procedures to be embedded, while the DFG is being constructed, it can also be computationally costly to perform a proof every loop cycle. As a solution, symbolic simulation can be restricted to application of efficient decision procedures for such embedded proofs.

For example, a type of decision procedure, referred to herein as "constant propagation decision procedure," can be used. With a constant propagation decision procedure, nodes in the DFG whose operands are all constants can be replaced, on-the-fly, by their constant result. While a constant propagation decision procedure can only handle relatively simple loop types, these types can be sufficient for analysis of a broad range of hardware designs.

Example loop types that can be handled by a constant propagation decision procedure include the following: a loop with constant bounds, a set of nested loops where the number of iterations of the inner loop is bounded by the outer loop) and a loop that starts at a symbolic offset but has a fixed number of iterations. An example, of each of these loops types, follows.

The following is an example of a loop with constant bounds:
 for (int i=0; i<4; i++) { ... }
The following is an example of a suitable set of nested loops:
 for (int i=0;i<5;i++) {
  for (int j=0;j<i;j++){
   ...
  }
 }
The following is an example of a suitable loop that starts at a symbolic offset:
 for (int i=start; i<start+7; i++){ ... }

For the above example loop, with a symbolic starting offset, an approach to determining a constant propagation decision procedure can be as follows.

In the first iteration, the loop condition checked is: space "start<start+7." In the second iteration, the loop condition checked is: "start+1<start+7." In the third iteration, the loop condition checked is: "start+2<start+7." Generalizing from these three instances, it can be readily determined that a decision rule that can be applied to determine if these loop conditions are true is as follows:
 (start+c1)<(start+c2) is true if c1<c2
 where c1 and c2 are constants From the above decision rule, it can be seen that the value of "start" is unnecessary for determining whether the loop condition is satisfied. To decide the loop condition, knowing just the constants c1 and c2 is sufficient. This decision rule is valid for unbounded-width integers. For fixed width integers there is a possibility of overflow: if one side of the comparison does overflow but the other side does not, the above decision rule is no longer true.

An approach, to handling fixed width integers, is to assume that no overflow occurs on either side and to generate special constraint nodes in the DFG which assert that no overflow happens. A proof that the special constraint nodes are never violated can then be deferred until later in the overall process in which the production of the DFG is being used. For example, if DFG production by symbolic simulation is being used as part of an equivalence-determining system, a proof that the special constraint nodes are never violated can be deferred until an equivalence-determining procedure is applied.

2.8. Optimization: Global Priority Scheduling
2.8.1. Overview

The order in which execution paths are pushed-on or popped-off the EP_queue can have a significant impact on the efficiency of symbolic simulation and on the quality of the constructed DFG. In general, execution paths which are split in (e.g., by FIG. 7A, line 15) should be merged again as soon as possible (e.g., by FIG. 7A, line 12). This goal can be achieved by sorting the execution paths in the queue of EPs used for symbolic simulation, appropriately.

As a preprocessing step, to applying symbolic simulation to a CFG, the nodes of the CFG can each be given a priority that determines when they are traversed during symbolic simulation. EPs that point to nodes with a higher priority can be traversed before EPs pointing to lower priority nodes.

The priorities can be computed, for example, before invoking the algorithm of FIG. 7A. Then, during symbolic simulation (such as that shown by FIG. 7A), EPs on the queue of EPs can be sorted according to their priority. For example, EPs can be sorted in descending order, with the highest priority EP at the queue's output position and the lowest priority EP at the queue's input position. A higher priority can be represented by a numerically higher value. The priority of an EP is equivalent to the priority of the CFG node it points to. EPs with higher priority (pointing to higher priority CFG nodes) are popped before EPs with lower priority.

With global priority scheduling enabled, pushing an execution path on EP_queue does not always result in inserting an EP at the input position of the queue, but can, for example, result in inserting the EP at the middle of the queue at a location where its priority fits the descending ordering.

Two major goals of prioritization are as follows:
 (i) a node with more than one incoming edge should receive a lower priority than its predecessors (where the set of predecessors to a node "x" is comprised of each node "y" that has a directed edge to "x"); and
 (ii) a node within a cycle "x" should receive a higher priority than an exit node of the cycle (where an exit node is a node outside the cycle that can be traversed-to from a node of cycle "x").

Goal (i) ensures that an EP arriving at a CFG node with more than one incoming edge will wait at that node until EPs arrive from the other incoming edges. Goal (ii) ensures that any EP exiting a cycle wait at the cycle's exit node for EPs still in the cycle. Then, where there are multiple EPs waiting at the same node, the EPs can be automatically merged (e.g., see merge_EPs( ) at line 12 of FIG. 7A). Occasionally, goals (i) and (ii) cannot be achieved for all nodes at the same time. In that case, the presented heuristic tries to achieve them for as many nodes as possible.

Figure 8A:
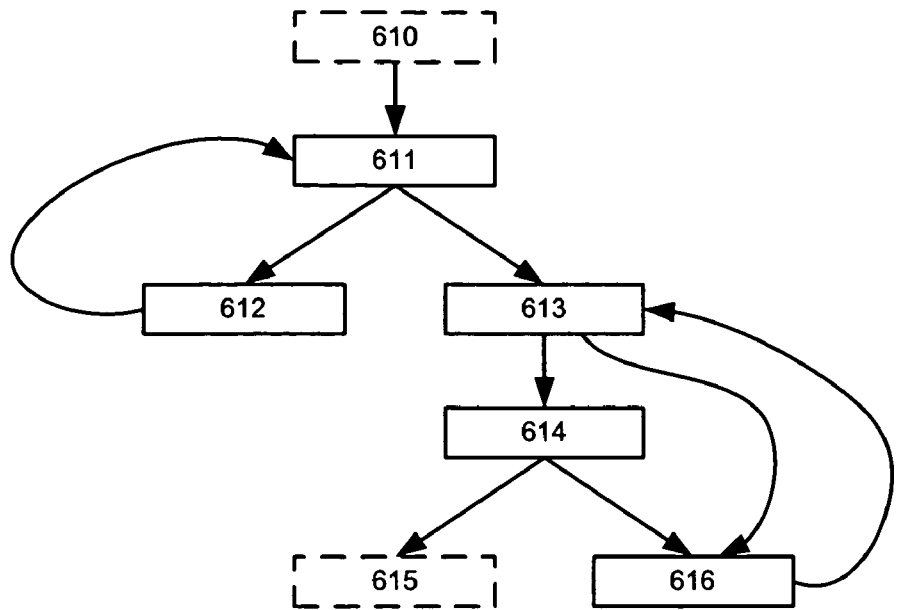
FIGS. 8A-8N and 8P-8Q (there is no FIG. 8O) depict an example of how the prioritization procedure, of FIGS. 9A-9B, can be applied.

FIG. 8A shows an example CFG to which prioritization can be applied. Nodes of FIG. 8A with more than one exiting edge (nodes 611, 613, 614, 616) are conditional nodes. Conditional nodes can be used to form loops. For example, node 611 can perpetuate a loop between itself and node 612, or node 611 can branch to node 613. Node 613 can either branch to node 614, thereby starting the loop body comprised of 613, 614 and 616, or node 613 can branch to node 616, thereby performing the loop body comprised of 613 and 616.

Figure 8B:
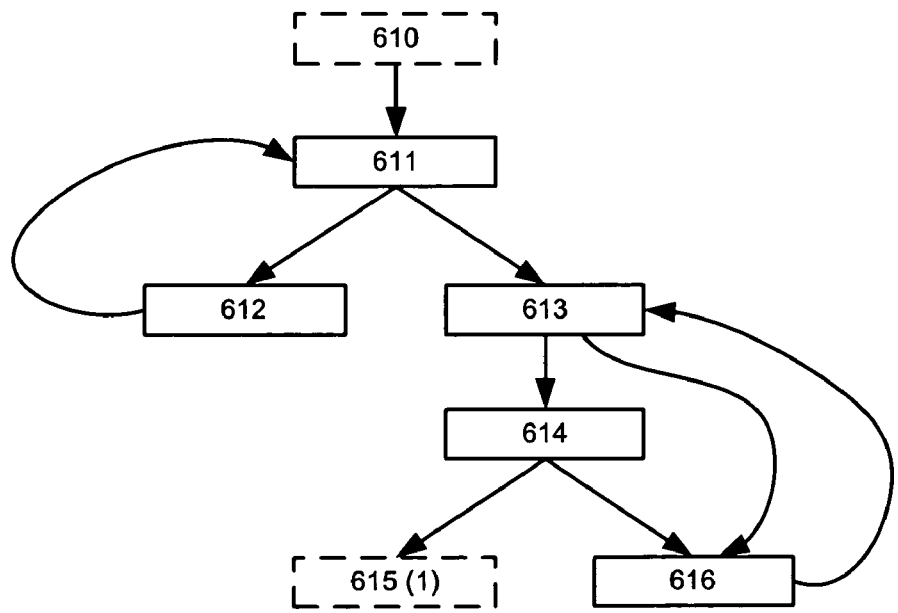
Figure 8C:
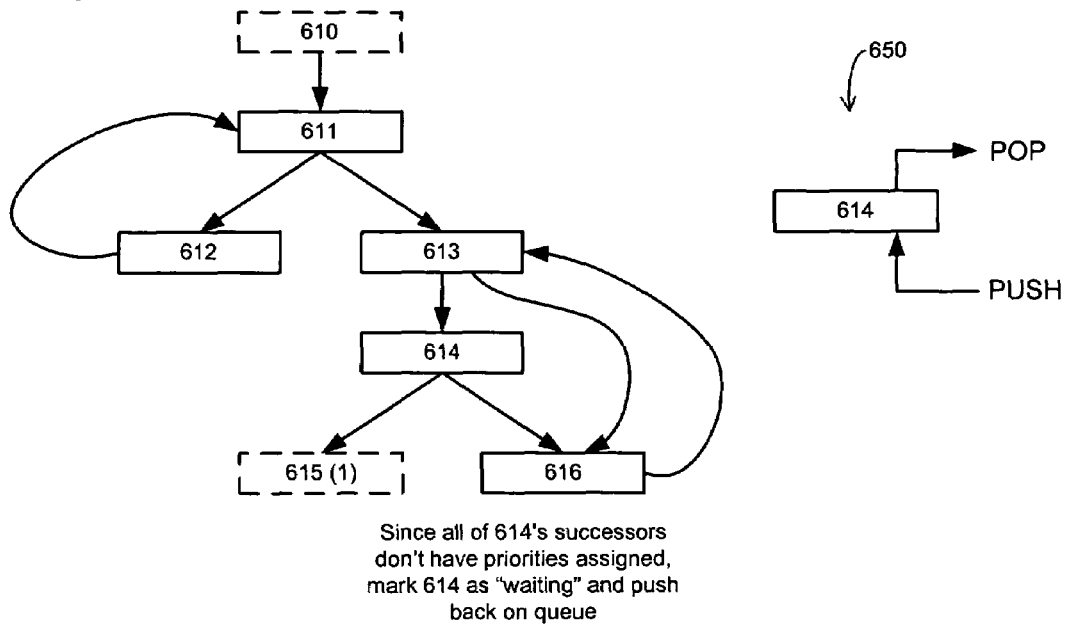
Figure 8D:
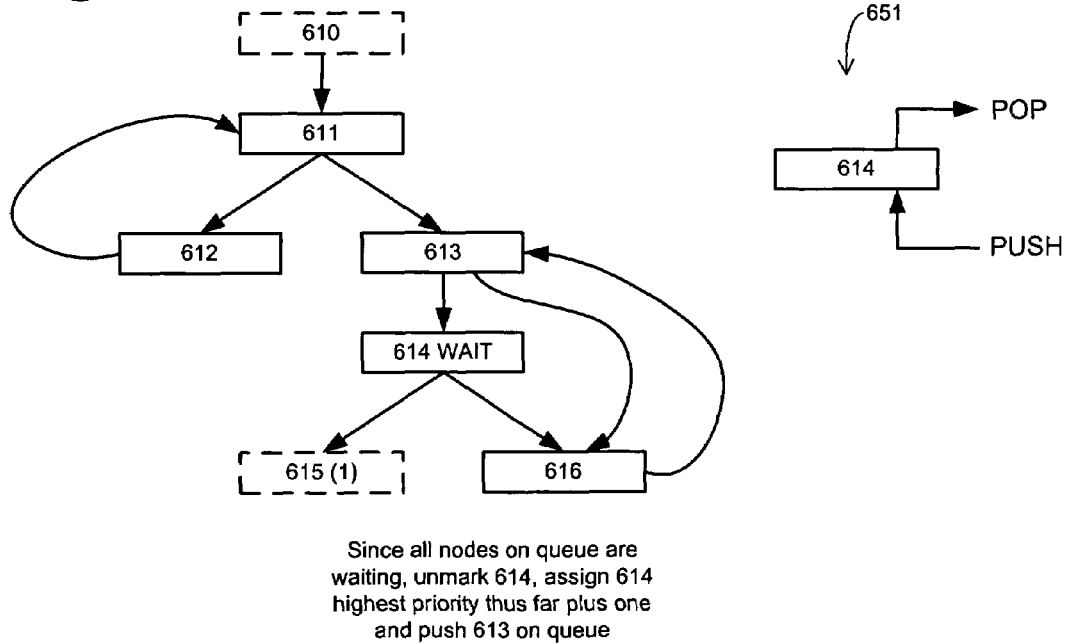
Figure 8E:
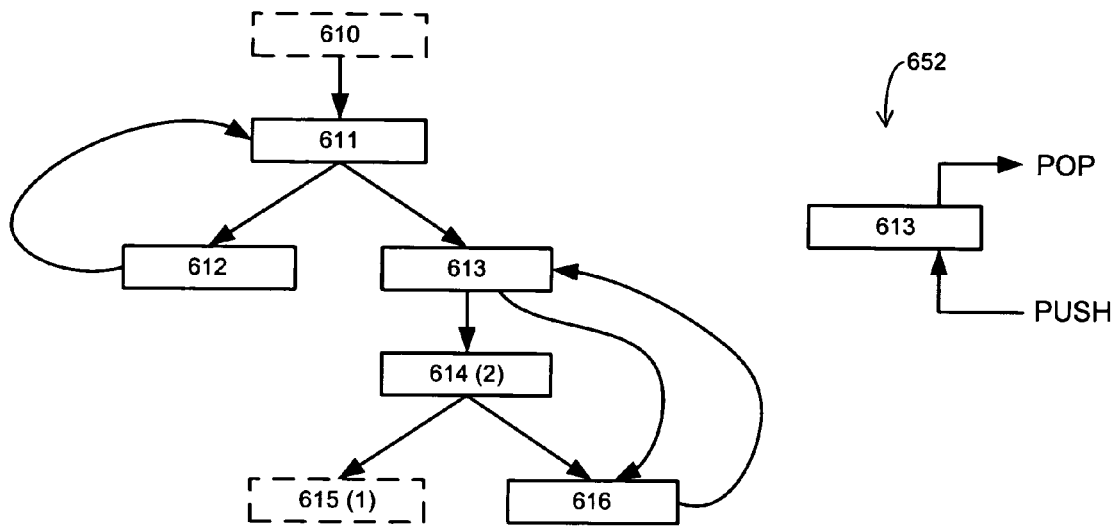
Figure 8F:
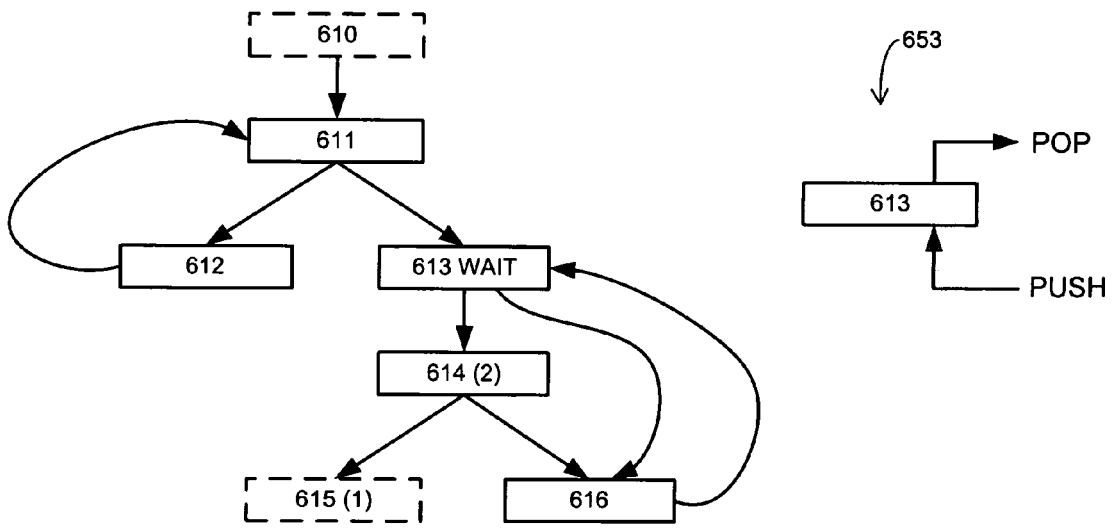
Figure 8G:
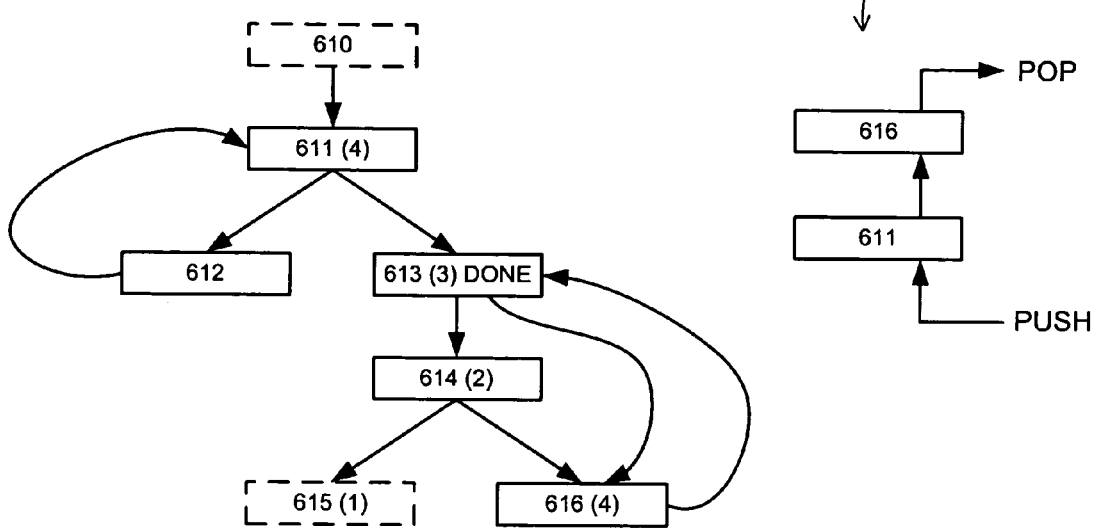
Figure 8H:
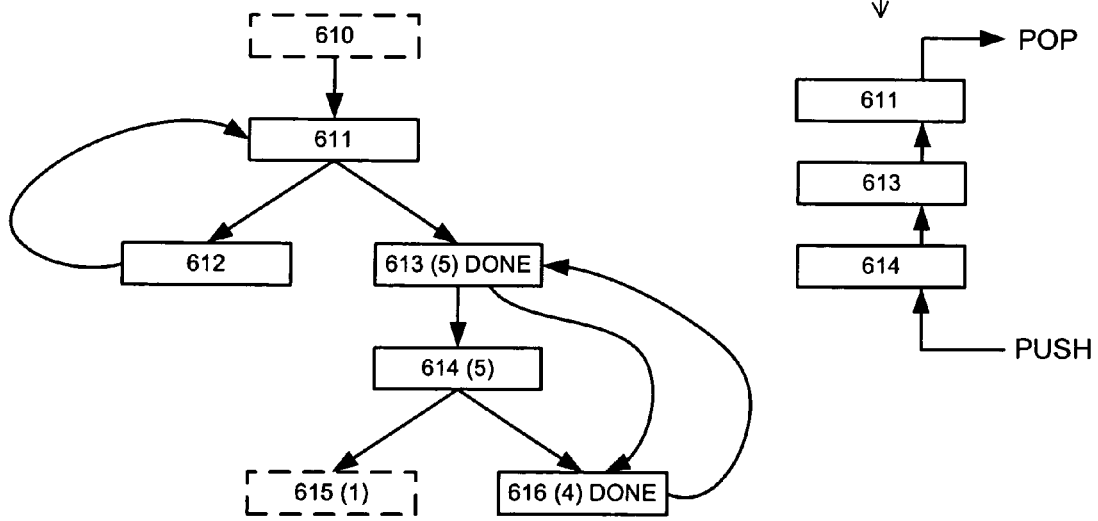
Figure 8I:
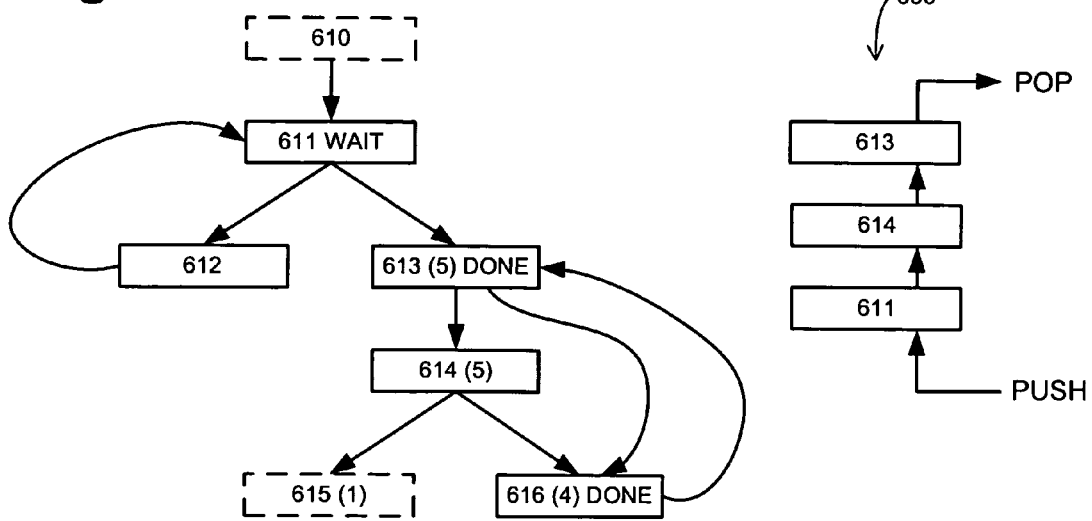
Figure 8J:
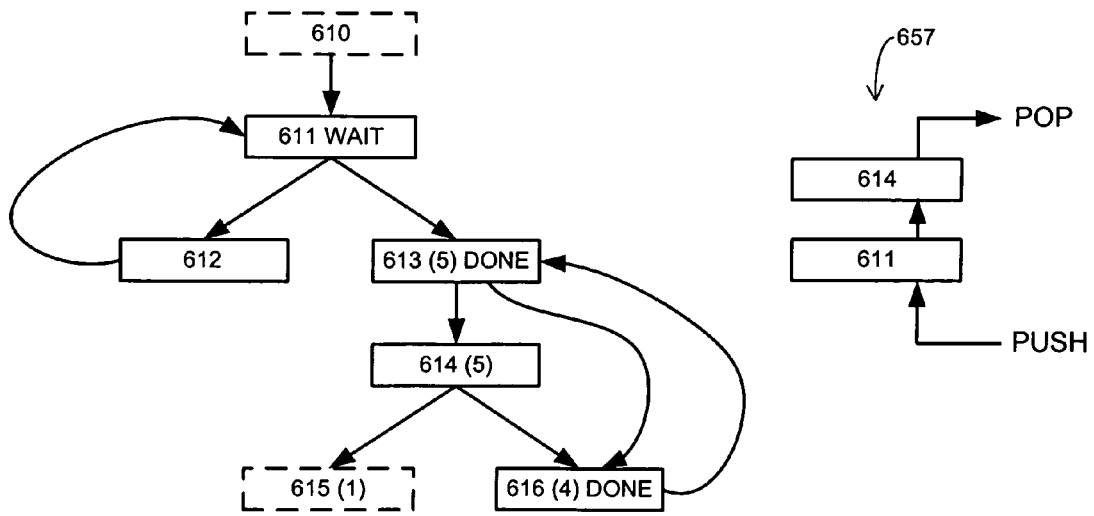
Figure 8K:
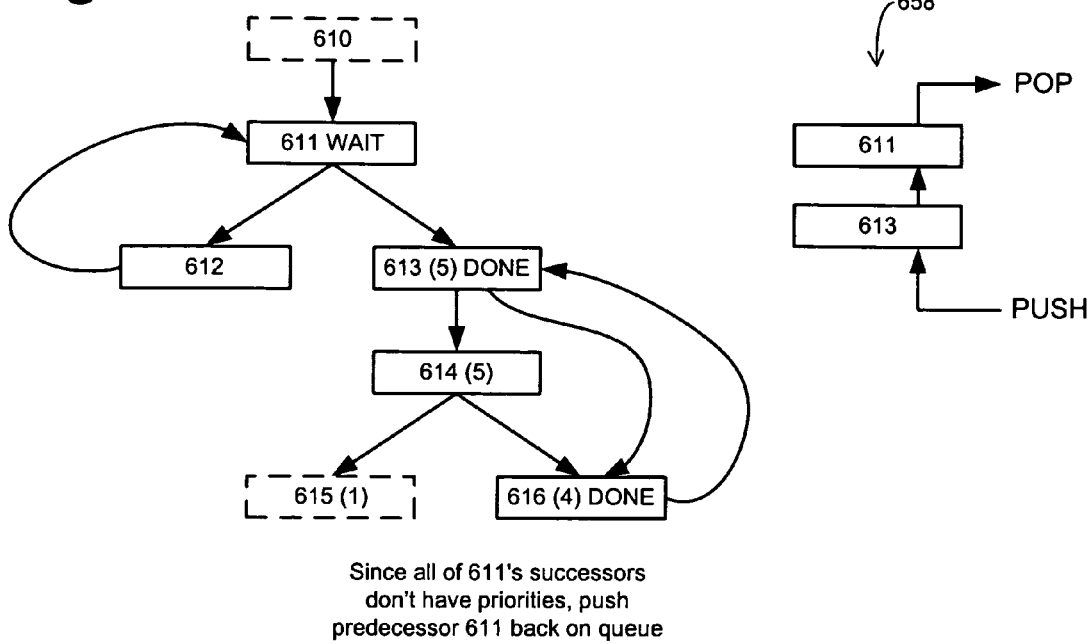
Figure 8L:
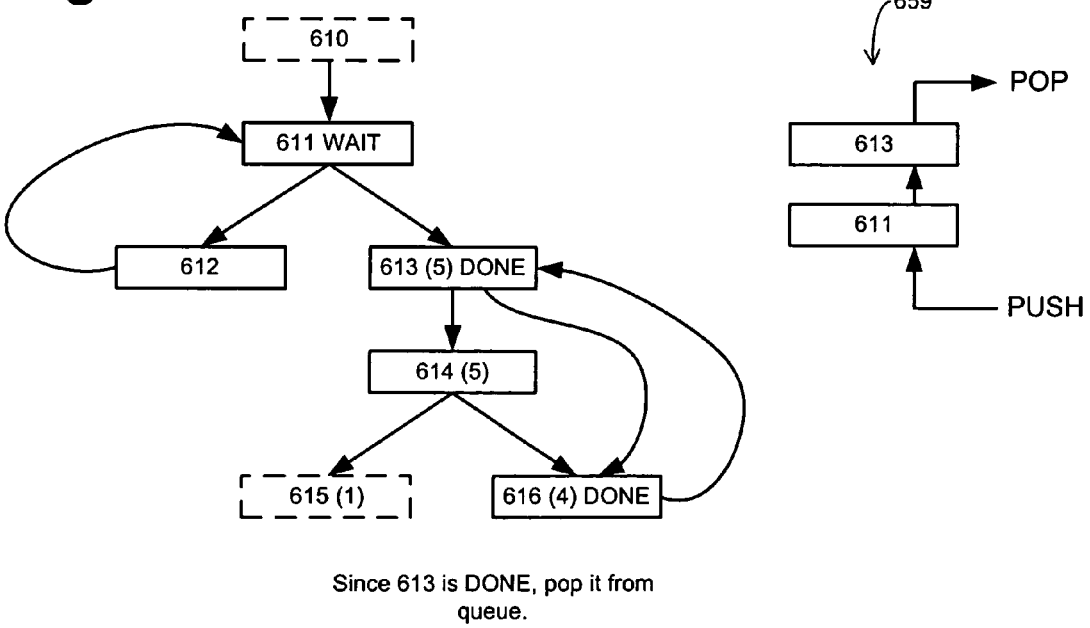
Figure 8M:
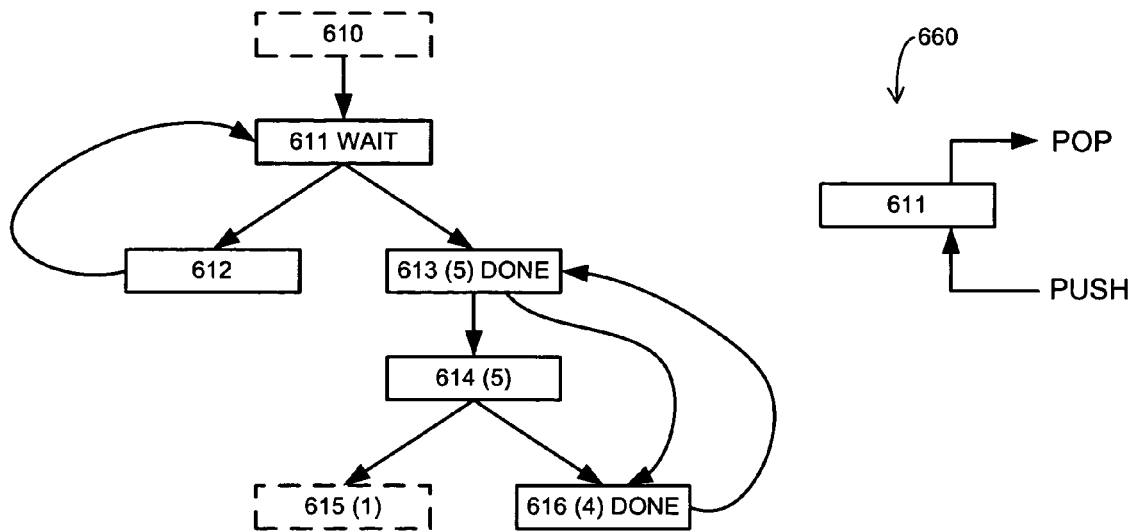
Figure 8N:
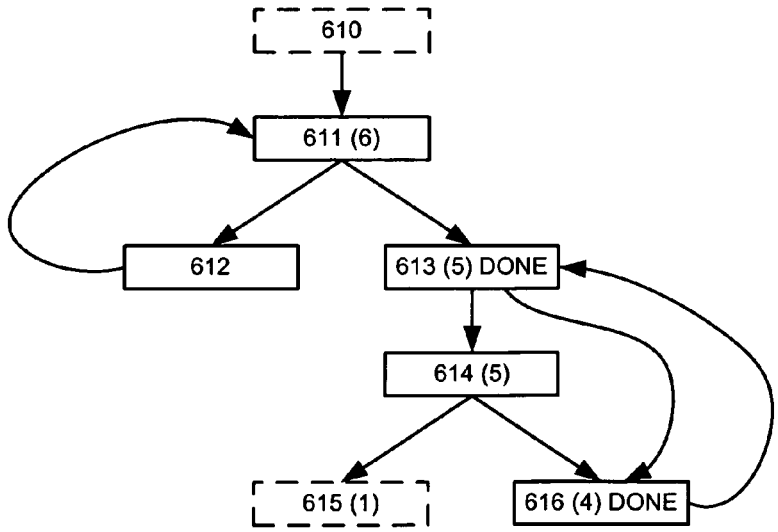
Figure 8P:
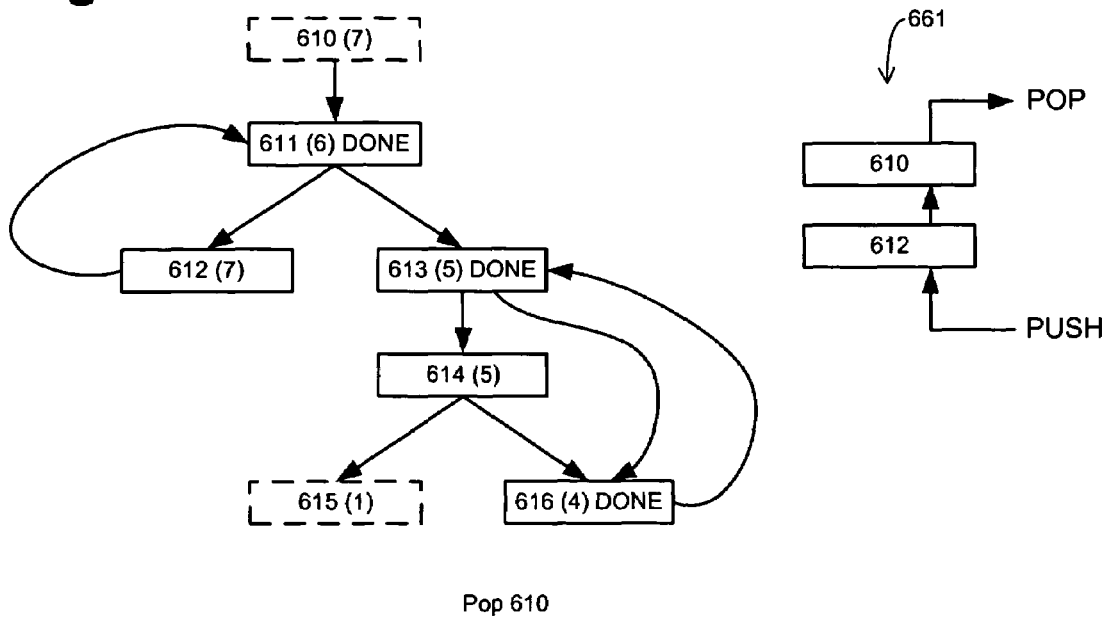
Figure 8Q:
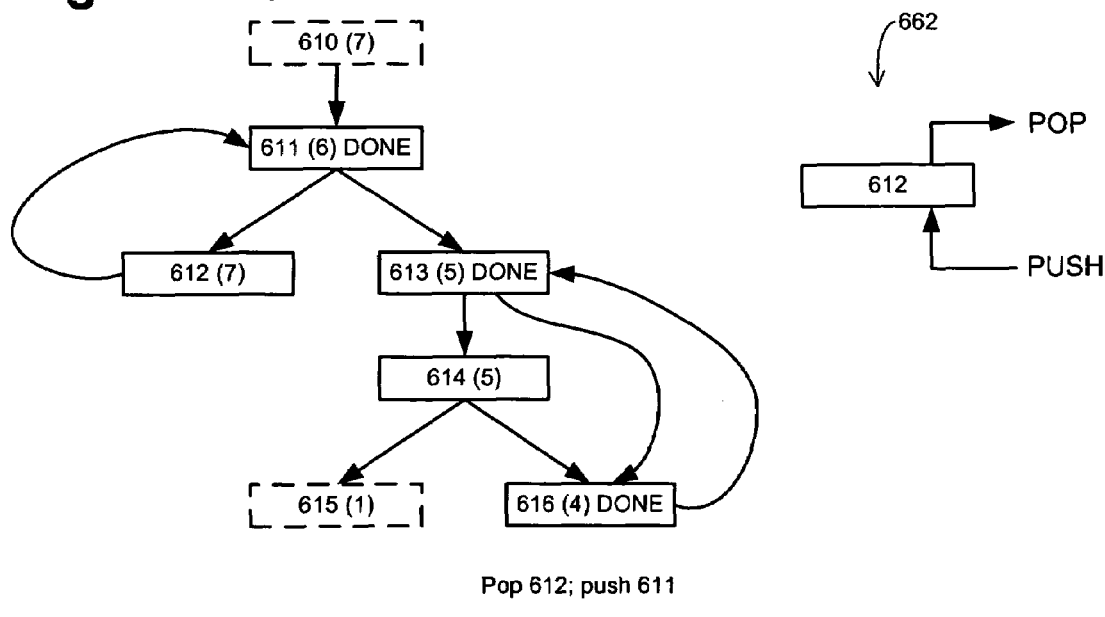

FIG. 8Q shows priorities, assigned to the CFG of FIG. 8A, in accordance with the above two major goals (an example process, for getting from FIG. 8A to FIG. 8Q is discussed below in connection with the pseudo-code of FIGS. 9A-9B). The two major goals of prioritization are satisfied in FIG. 8Q as follows.

Nodes with more than one incoming edge are: 611 (with predecessor 610), 613 (with predecessor 611) and 616 (with predecessors 613 and 614). As can be seen, the node with more than one incoming edge has a lower priority than its predecessors. A first cycle is comprised of nodes 611 and 612, having an exit node of 613 (node 613 is the exit node since it is the first node led to, by a node in the first cycle, that is not inside the cycle). A second cycle is comprised of nodes 613 and 616, having an exit node of 614 (node 614 is the exit node since it is the first node led to, by a node in the second cycle, that is not inside the cycle). A third cycle is comprised of nodes 613, 614 and 616, having an exit node of 615. As can be seen, the exit node of the third cycle (613, 614, 616) as well as the exit node of the first cycle (611, 612) have lower priorities than the nodes in the respective cycles. For the second cycle (613, 616), exit node 614 cannot have a lower priority than any node in the cycle without violating goal (i) for node 616.

2.8.2. Prioritization Pseudo-Code

FIGS. 9A-9B show pseudo-code for assigning priorities as part of a preprocessing step to symbolic simulation. The main function is "computePriorities" (see FIG. 9A) which calls "adjustPredecessors" (see FIG. 9B). A summary, of the operation of computePriorities and adjustPredecessors, follows. The END node, of the CFG to be prioritized, is assigned a lowest priority of "1". The heuristic search then works its way backward through the CFG. First, an attempt is made to assign priorities to all nodes whose successors already have a valid priority (FIG. 9A, line 12). If that is not possible (because there is at least one successor that has not been processed yet), all nodes on CFG_traversal_queue must be on a cycle in the CFG (FIG. 9A, line 30). In order to fulfill goal (ii), the first node on the queue is assigned a higher priority than that of any other node in the CFG (FIG. 9A, line 42). This automatically ensures that nodes within the cycle get higher priorities than any of the cycle-exit nodes. These steps are iterated until all nodes have been processed.

To achieve goal (i), the priorities of predecessor nodes are adjusted (FIG. 9B, line 13). To avoid cycles in the computation, those nodes are additionally marked as done. Nodes with a single incoming edge are not marked (FIG. 9B, line 5). This has the effect that priority changes on these nodes don't stop there but are allowed to propagate further.

A step-by-step discussion, of the pseudo-code of FIGS. 9A-9B, is as follows.

2.8.2.1. computePriorities computePriorities can begin by assigning a priority of "1" to the END node of the CFG to which it is applied (FIG. 9A, line 3).

Next, computePriorities can push the predecessors of the END node on a queue (FIG. 9A, line 4).

The loop of computePriorities can be started, and continued, so long as the queue "CFG_traversal_queue" is not empty (FIG. 9A, line 6).

The loop begins each iteration by setting a current node "curr_node" to the resulting of popping CFG_traversal_queue (FIG. 9A, line 8).

Up to three tests can then be performed. A first "if" (line 10) can test whether the current node is marked "DONE." A second "if" (line 12) can test whether all successors of the current node already have priorities assigned. A third "if" (line 30) can test whether all nodes on CFG_traversal_queue are marked as "WAITING."

If the first "if" is satisfied if the current node has been fully processed, and no action is taken in the current iteration.

If the second "if" is satisfied, the following steps can be taken (FIG. 9A, lines 13-20). If the current node has not yet been assigned a priority, then the current node is assigned a priority equal to the maximum priority assigned to any of its successors. Next, adjustPredecessors can be called. Third, the predecessors to the current node can be pushed onto CFG_traversal_queue.

If the second "if" is not satisfied, the following steps can be taken (FIG. 9A, lines 23-28). The current node can be marked as "WAITING." The current node can be pushed onto CFG_traversal_queue.

If the third "if" is satisfied, the following steps can be taken (FIG. 9A, lines 31-45). The current node can be set to the top node of CFG_traversal_queue. All nodes marked WAITING can be unmarked. The current node can be set to a priority one greater than the priority assigned to any other node. adjustPredecessors can be called. The predecessors to the current node can be pushed onto CFG_traversal_queue.

2.8.2.2. adjustPredecessors adjustPredecessors can operate as follows.

The predecessors to the current node, referred to as "preds_curr_node," can be found (FIG. 9B, line 3).

Up to two tests can then be done. A first "if" (FIG. 9B, lines 5-7) can be satisfied if: current node has only one predecessor, the one predecessor to current node already has a priority assigned and the one predecessor to current node is not marked "DONE." A second "if" (FIG. 9B, line 13) can be satisfied if the current node has more than one incoming edge.

If the first "if" is satisfied, the following action can be taken (FIG. 9B, lines 8-11): the one predecessor to the current node can be set to a priority that is the maximum of the predecessor's priority and the current node's priority.

If the second "if" is satisfied, the following steps can be taken (FIG. 9B, lines 14-20). Each predecessor to the current node can be set to a priority that is the maximum of the predecessor's priority and one plus the current node's priority. The current node can be marked "DONE."

2.8.3. Example Prioritization

FIGS. 8B-8Q depict how the procedure of FIGS. 9A-9B can be applied, step-by-step, to FIG. 8A.

computePriorities assigning a value of one to the END node (see FIG. 9A, line 3) is shown in FIG. 8B by node 615 being assigned a priority of one.

computePriorities pushing the predecessors to the END node on CFG_traversal_queue (FIG. 9A, line 4) is shown in FIG. 8C by predecessor node 614 being on a CFG_traversal_queue that is in a state 650.

Each iteration, of the "while" loop of computePriorities, is described as follows.

2.8.3.1. First Iteration

Current node is set to 614 (by line 8 of FIG. 9A). The "if" of line 12 of FIG. 9A is not satisfied by node 614. Node 614 is marked as "WAITING" (see FIG. 8D) and is pushed back on CFG_traversal_queue. The resulting state for the CFG_traversal_queue is shown as a state 651 in FIG. 8D.

In state 651 all nodes on CFG_traversal_queue are waiting. Node 614 is unmarked as WAITING (see FIG. 8E). Node 614 is assigned a priority one greater than the priority of node 615 (see FIG. 8E). adjustPredecessors performs no operations, since neither of its "if" statements are satisfied. The predecessor to node 614 is pushed onto CFG_traversal_queue and the resulting state of CFG_traversal_queue shown in FIG. 8E as state 652.

2.83.2. Second Iteration curr_node is 613. Since all successors to node 613 are not assigned priorities, node 613 is marked as "WAITING" (see FIG. 8F). Also, node 613 is pushed back onto CFG_traversal_queue, resulting in a state for CFG_traversal_queue shown in FIG. 8F as state 653.

In state 653 all nodes on CFG_traversal_queue are waiting. Node 613 is unmarked as WAITING (see FIG. 8G). Node 613 is assigned a priority one greater than the priority of node 614 (see FIG. 8G). Since 613 has more than one incoming edge, adjustPredecessors adjusts each predecessor to node 613 to have a priority of 4 (see FIG. 8G). adjustPredecessors also marks node 613 as "DONE" (see FIG. 8G). The predecessors to node 613 (nodes 616 and 611) are pushed onto CFG_traversal_queue and the resulting state of CFG_traversal_queue is shown in FIG. 8G as state 654.

2.8.3.3. Third Iteration curr_node is 616. Since all of node 616's successors have been assigned priorities and 616 has a priority, adjustPredecessors (FIG. 9A, line 18) is executed. Since node 616 has more than one incoming edge, each predecessor to 616 (nodes 613 and 614) is set to one-plus the priority of node 616 and node 616 is marked DONE (see FIG. 8H). When the call to adjustPredecessors returns, the predecessors to node 616 are pushed on CFG_traversal_queue (FIG. 9A, line 19). The resulting state for CFG_traversal_queue is shown in FIG. 8H as state 655.

28.3.4. Fourth Iteration curr_node is 611. Since all of 611's successors do not have priorities, mark 611 as WAITING and push back on queue. The resulting state for CFG_traversal_queue is shown in FIG. 8I as state 656.

2.8.3.5. Fifth Iteration curr_node is 613. Since 613 is already DONE, just pop it (line 10 of FIG. 9A is executed). The resulting state for CFG_traversal_queue is shown in FIG. 8J as state 657.

2.8.3.6. Sixth Iteration curr_node is 614. Since all of node 614's successors already have priorities, and since 614 already has a priority, adjustPredecessors (FIG. 9A, line 18) is executed. However, adjustPredecessors performs no operation. When the call to adjustPredecessors returns, the predecessors to node 614 are pushed on CFG_traversal_queue (FIG. 9A, line 19). The resulting state for CFG_traversal_queue is shown in FIG. 8K as state 658.

2.8.3.7 Seventh Iteration curr_node is 611. Since all of node 611's successors do not have priorities, push node 611 back on CFG_traversal_queue. The resulting state for CFG_traversal_queue is shown in FIG. 8L as state 659.

2.8.3.8. Eighth Iteration curr_node is 613. Since 613 is already DONE, just pop it (line 10 of FIG. 9A is executed). The resulting state for CFG_traversal_queue is shown in FIG. 8M as state 660.

2.8.3.9. Ninth Iteration curr_node is 611. Since all successors to node 611 do not already have priorities, the "else" of FIG. 9A, lines 23-28 is executed but achieves no net change to the state of FIG. 8M.

Since all nodes on queue are waiting, pop node 611 (see FIG. 9A, line 40), unmark node 611 from its state of WAITING and set node 611's priority to one-plus the maximum priority assigned to all nodes. The resulting state for the CFG is shown in FIG. 8N.

adjustPredecessors is called (see FIG. 9A, line 43). It sets the predecessors to node 611, nodes 610 and 612, to one-plus the priority of 611 and marks 611 as "DONE."

When the call to adjustPredecessors returns, nodes 610 and 612 are pushed on CFG_traversal_queue.

The resulting state for CFG_traversal_queue is shown in FIG. 8P as state 661.

2.8.3.10. Tenth Iteration curr_node is 610. The net result of executing computePriorities is to pop node 610. The resulting state for CFG_traversal_queue is shown in FIG. 8Q as state 662.

2.8.3.11. Eleventh Iteration curr_node is 612. The net result of executing computePriorities is to pop node 612 and to push node 611. The resulting state for CFG_traversal_queue is not shown.

2.8.3.12. Twelfth Iteration curr_node is 611. Since node 611 is DONE, it is simply popped and CFG_traversal_queue is then empty.

2.9. Other Optimizations

In generating the representation of the DFG, identical subgraphs can be shared. For example, nodes of the DFG can be stored in a hash-table. Identical nodes with identical operands can be detected in the hash-table and shared. With this optimization, determining the equality of two structurally identical DFGs becomes simple.

When a new DFG node is created, the symbolic expression upon which it is based can be checked against a collection of re-write rules. Three example re-write rules are as follows:

(1) a·a$\Rightarrow$a (2) ite(a,ite(b,c,d),d)$\Rightarrow$ite(a·b,c,d)

(3) (vector>>5)&0xf$\Rightarrow$extract(vector, 5, 4)

For re-write rules in the above format, a match of the left side of the rule causes the rule to "fire." The portion of the symbolic expression, that matches the left side of the rule, is replaced by the right side of the rule.

Example (1) is an example of using a re-write rule to perform simplification of Boolean expressions.

Example (2) is an example of using a re-write rule to perform simplification of ITE expressions.

Example (3) is an example of using a re-write rule to perform simplification of hardware-oriented programming language expressions. In particular, the left side of example (3) is a programming technique of C++ for extracting a range of bits from a bitvector. The particular example shown extracts 4 bits from the vector starting at bit 5. The re-write rule replaces the hardware-oriented programming language expression with an explicit expression of the hardware functionality desired. In the particular example, the left side of the re-write rule is substituted with an explicit range extraction expression. The substitution of a more explicit expression permits the resulting DFG to be more explicit, which can not only simplify the DFG but aid subsequent synthesis or verification.

3. The Timestep Form

As discussed above, prior to applying an SDV-propagation process, the miter can be converted into timestep form.

An example DFG, for conversion into the timestep form, is shown in FIG. 10A. The sequential DFG of FIG. 10A is comprised of three registers R1, R2 and R3. It is also comprised of a primary input "i" and a primary output "o." Registers R1, R2 and R3 each have an input $R1_{IN}$, $R2_{IN}$ and $R3_{IN}$. Registers R1, R2 and R3 each have an output $R1_{OUT}$, $R2_{OUT}$ and $R3_{OUT}$. When the DFG of FIG. 10A is converted into timestep form, all of the following names can be used as timestep-independent names: R1, R2, R3, "i," "o," $R1_{IN}$, $R2_{IN}$, $R3_{IN}$, $R1_{OUT}$, $R2_{OUT}$ and $R3_{OUT}$.

FIG. 10B shows a conversion of the DFG of FIG. 10A into the timestep form. FIG. 10B depicts two example timesteps: a timestep 4120 on the left side of dividing line 4110 at some time t=x and a timestep 4130 on the right side of dividing line 4110 at some time t=x+1. As can be seen, timesteps 4120 and 4130 have the same timestep-independent names.

Each timestep of FIG. 10B is identical, except for its position relative to other timesteps. In order to construct the timestep, each register of FIG. 10A is divided into two parts: a part that drives the present-state input to a timestep that comprises a register's output and part that accepts the next-state output of a timestep that comprises a register's input. An example present-state input 4121 is shown as driven by a register output, of timestep 4120, that has timestep-independent name "$R1_{OUT}$." An example next-state output 4122 is shown as driving a register input, of timestep 4120, that has timestep-independent name "$R1_{IN}$."

Further, the present-state inputs and the next-state outputs of each timestep have been arranged such that successive timesteps can be coupled by simply arranging them in a linear sequence.

Production of the timestep form used herein is well-known in the art, and any suitable technique for production of the timestep form can be used in conjunction with the inventive techniques described herein.

4. Test Bench Generation

As discussed above, test bench generation relates to producing a DFG in timestep form, referred to herein as a "combining structure" (or $CS_{ts}$), for combining $RTLM_{ts}$ and $HLM_{ts}$ in a way that permits the resulting timestep, referred to herein as a "miter" timestep, to be tested for equivalence. A timestep "t" of a miter ($MT_{ts}[t]$) can be comprised of the following DFGs: $RTLM_{ts}[t]$, $HLM_{ts}[t]$ and $CS_{ts}[t]$.

A process for accomplishing the combination of DFGs can be summarized as follows. Each $RTLM_{ts}$ and $HLM_{ts}$ can each be classified, individually, based on structural criteria. The classification assigned is referred to herein as a "DFG class." Based upon the DFG class of $RTLM_{ts}$ and $HLM_{ts}$, a structure $CS_{ts}$ for combining the two DFGs can be selected. Such selection of a combining structure can be viewed as applying the DFG class of $RTLM_{ts}$ and the DFG class of $HLM_{ts}$ to a two-dimensional decision matrix. The selected combining structure can be constructed by drawing upon a library of DFG building blocks.

As discussed above, the $CS_{ts}$ produced can be designed to have a "q" output with the following property: "q," for a timestep t, is TRUE if and only if $RTLM_{ts}[t]$ and $HLM_{ts}[t]$ are equivalent. Once the $CS_{ts}$ has been produced, the miter timestep can be processed, for identification of control and datapath nodes, prior to application of an equivalence-determining procedure.

While the above-described process, for the selection of $CS_{ts}$, assumes $RTLM_{ts}$ and $HLM_{ts}$ each belong to only one DFG class, this is not necessarily the case. To address this situation, for each pair of corresponding primary outputs, from $RTLM_{ts}$ and $HLM_{ts}$, each primary output can be put into a DFG class to form a DFG class pair. This can be accomplished by applying the below-described classification techniques, to $RTLM_{ts}$ and $HLM_{ts}$, on a primary-output-by-primary-output basis. If all such pairs, of a DFG class for an output of $RTLM_{ts}$ with a DFG class for a corresponding output of $HLM_{ts}$, are the same, one type of miter can be generated for which equivalence determination is applied once.

However, if more than one type of pairing of DFG classes is identified, an appropriate miter can be generated for each different type of DFG class pair found. An equivalence-determining procedure can be applied to each miter. $RTLM_{ts}$ and $HLM_{ts}$ have been proven to be equivalent only if all such equivalence-determining tests are successful.

4.1. Classifying $RTLM_{ts}$ and $HLM_{ts}$

Each DFG can be classified based upon a structural analysis. The types of DFG classes can include: combinational, pipelined, handshaking and unknown. Methods for testing a DFG, as to whether it belongs to each of the DFG classes, are presented below. The below methods share the common goal of trying to determine how many prior cycles of input data can affect the result of a computation. For example, a property that can be tested for, in the below methods, is whether a DFG has sequential cycles. Another property that can be tested for is the number of registers that need to be traced back through before reaching a primary input.

4.1.1. Combinational

Whether a DFG is of DFG class "combinational" can be determined as follows. For each primary output find its transitive fanin. If there are no register-outputs in each such transitive fanin, the output can be classified as combinational.

A pseudo-code implementation, of the test for combinationality, is shown in FIG. 11.

FIG. 11, lines 1-5, presents a loop that iterates over each primary output node, referring to each such node as "o" (line 1). For each node "o," its transitive fanin list ("tfi_list") is initially set to empty (line 2). Then, the procedure "traverseFanin" is called (line 3) to find the transitive fanin of node "o."

FIG. 11, lines 8-19, presents the procedure traverseFanin. traverseFanin is a recursive procedure, where each invocation of traverseFanin begins at a node "n" (see parameter list of line 11). traverseFanin iterates over each input "i" of node "n" (line 13), recursively calling traverseFanin. If node "n" itself is a primary input or the output of a register, it is added to the transitive fanin list.

Once the loop of FIG. 11, lines 1-5, is complete, another loop can iterate over each primary output or register input node, examining the transitive fanin list for each (that has been generated by the pseudo-code of FIG. 11). If none of these transitive fanin lists contain a register output node, the DFG can be classified as combinational.

4.1.2. Pipelined

A DFG primary output is of DFG class "pipelined" if that output is only affected by input-data in a finite number of previous cycles. Another way of stating this requirement is that the output must not depend on a cycle of registers.

Within the pipelined classification, there are the following three types of circuits. First, circuits where only a single input data affects the result of each computation. Second, circuits where input data over several cycles affects the result of each computation, as long as each input data only effects the output for a finite number of cycles. Third, circuits where input data can effect an output for an indefinite number of cycles, but such data is written into a memory. In this case, the user must specify where the memories in the DFG are located.

Detecting register cycles can be achieved by a depth-first traversal of the DFG starting at the primary outputs. If a register is encountered that has already been visited before, then a cycle has been detected.

Furthermore, for non-cyclic paths, it can be useful to count the number of pipeline stages. This is the number of registers on a path between a primary output and a primary input. If there are multiple paths, from an output to its inputs, with different numbers of pipeline stages, the lengths of all such paths can be stored.

An example pseudo-code implementation, for accomplishing the just-above-described traversal of a DFG, is shown in FIG. 12.

FIG. 12, lines 2-10, presents a loop that iterates over each primary output ("o") of the DFG (line 2). For each output "o," the procedure "computeRegistersOnPath" is called (line 5). computeRegistersOnPath returns a "false" if a cycle is found, and otherwise returns a list in its parameter "path_list." Each item of "path_list" is comprised of two values: the name of a primary input "i," and the number of registers between "o" and "i."

FIG. 12, lines 16-39, present a pseudo-code implementation for computeRegistersOnPath. computeRegistersOnPath begins by finding the transitive fanin of the output "o" passed to it (where "o" is referred to, within computeRegistersOnPath, as "n"). Specifically, at line 19 of FIG. 12, a call is issued to "tfi_list(n)." For each element of the transitive fanin that is a primary input or register-output (i.e., a "present-state output" in timestep form terminology), it is iterated by and assigned to "i." FIG. 12, line 19.

A test is performed to determine whether "i" is a primary input or the output of a register that has been declared by the user to be a memory. FIG. 12, line 20. As discussed below in section 4.2.3 ("Pipelined") if there is a memory mapping between the memories of the designs to be compared, the outputs of memories can be treated as primary inputs. If the test is satisfied, an element is added to the result list, returned by computeRegistersOnPath, comprised of the primary input "i" and the number of registers between "i" and the primary output (node "n"). FIG. 12, line 21.

If the test of line 20 is not satisfied, the "else" of lines 22 to 36 is performed. When performing the "else" it is known that "i" is a register output of a register that has not been declared a memory. If "i" has already been visited, a register cycle is detected and computeRegistersOnPath returns a FALSE. FIG. 12, lines 26-29. Otherwise, "i" is added to the list of visited registers. FIG. 12, line 30. The corresponding register input "rin" for "i" is obtained. FIG. 12, line 31. computeRegistersOnPath recursively calls itself, using "rin" as the "primary output" from which it searches. FIG. 12, lines 32-33. If the recursive call to computeRegistersOnPath returns FALSE, then the calling instance of computeRegistersOnPath returns FALSE as well. FIG. 12, lines 32-35.

4.1.3. Handshaking

A primary output falls under the DFG classification "handshaking" if a user specified a handshaking protocol for the output. Handshaking can be identified on an output by providing the user with a pre-defined library of handshaking protocols (e.g., request-busy or request-busy-next protocols) in terms of which the DFG can be defined.

Once an output of an $RTLM_{ts}$ or $HLM_{ts}$ has been defined as handshaking, it can generally be assumed that all its inputs are handshaking.

DFGs that do not use handshaking, but do require a variable number of cycles to perform their operation, can be handled by classifying them as handshaking.

4.1.4. Unknown

A DFG output is classified as "unknown" if it does not meet any other classifications.

4.2. Combining Structure Selection

Based on the DFG class for $RTLM_{ts}$ and the DFG class for $HLM_{ts}$, an appropriate structure, for combining the two DFGs to produce $MT_{ts}$, can be selected. A decision matrix can be used. An example decision matrix is shown in FIG. 17. As can be seen, the decision matrix takes as input a pair of DFG classifications "1" and "2." The output of the decision matrix is one of five categories of combining structure: combinational, cycle-accurate, pipelined, stream-based and error. The mapping of a pair of DFG classifications to a category is, for the particular example decision matrix, independent of the ordering of the two input DFG classes.

Each of the five categories of combining structure is discussed below.

4.2.1. Combinational

The combinational combining structure can be applied when both DFGs are classified as combinational.

A combinational combining structure can be created as follows (see FIG. 13).

A DFG 2310 represents $HLM_{ts}$ and a DFG 2311 represents $RTLM_{ts}$. Corresponding inputs of 2310 and 2311 are connected together. Corresponding outputs of 2310 and 2311 are input to a comparator, such as comparator 2312.

Figure 13:
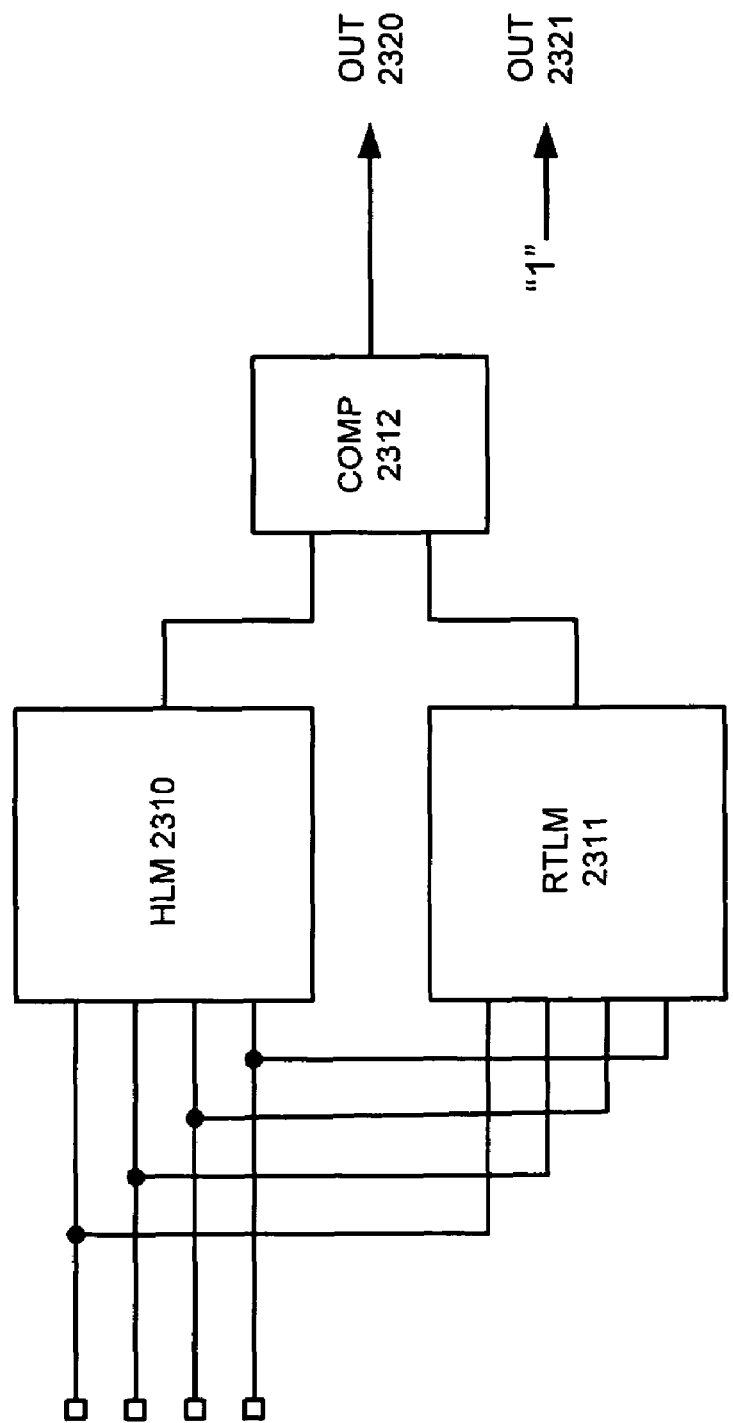
FIG. 13 depicts a combinational combining structure.

During formal equivalence proving, a task can be proving that the output of a comparator, such as output 2320 of comparator 2312, is equivalent to a logic "1" (represented, in FIG. 13, as being provided at an "output" 2321).

4.2.2. Cycle-Accurate

The cycle-accurate combining structure can be applied when either DFG is classified as unknown. The cycle-accurate combining structure can be preferred under these circumstances since it produces a "strong" form of equivalence testing that will not produce a false positive. On the other hand, because the cycle-accurate combining structure produces a $MT_{ts}$ that is so restrictive as to the conditions under which equivalence between $HLM_{ts}$ and $RTLM_{ts}$ can be found, it can produce a false negative where a "weaker" equivalence test might be able to show the DFGs are equivalent. Therefore, while the cycle-accurate combining structure is a suitable default, it can also be desirable to allow the user to select another combining structure that produces a weaker test for equivalence.

The cycle-accurate combining structure produces an equivalence test where both DFGs must produce exactly the same output on every clock cycle in order for equivalence to be found.

A cycle-accurate combining structure can be created as follows (see FIG. 14).

A DFG 2410 represents $HLM_{ts}$ and a DFG 2411 represents $RTLM_{ts}$. Corresponding inputs of 2410 and 2411 are connected together (and thus $RTLM_{ts}$ and $HLM_{ts}$ are applied the same input vector each clock cycle). Corresponding outputs of 2410 and 2411 are input to a comparator, such as comparator 2412. Additional clocking logic 2431 and reset logic 2430 is added.

Figure 14:
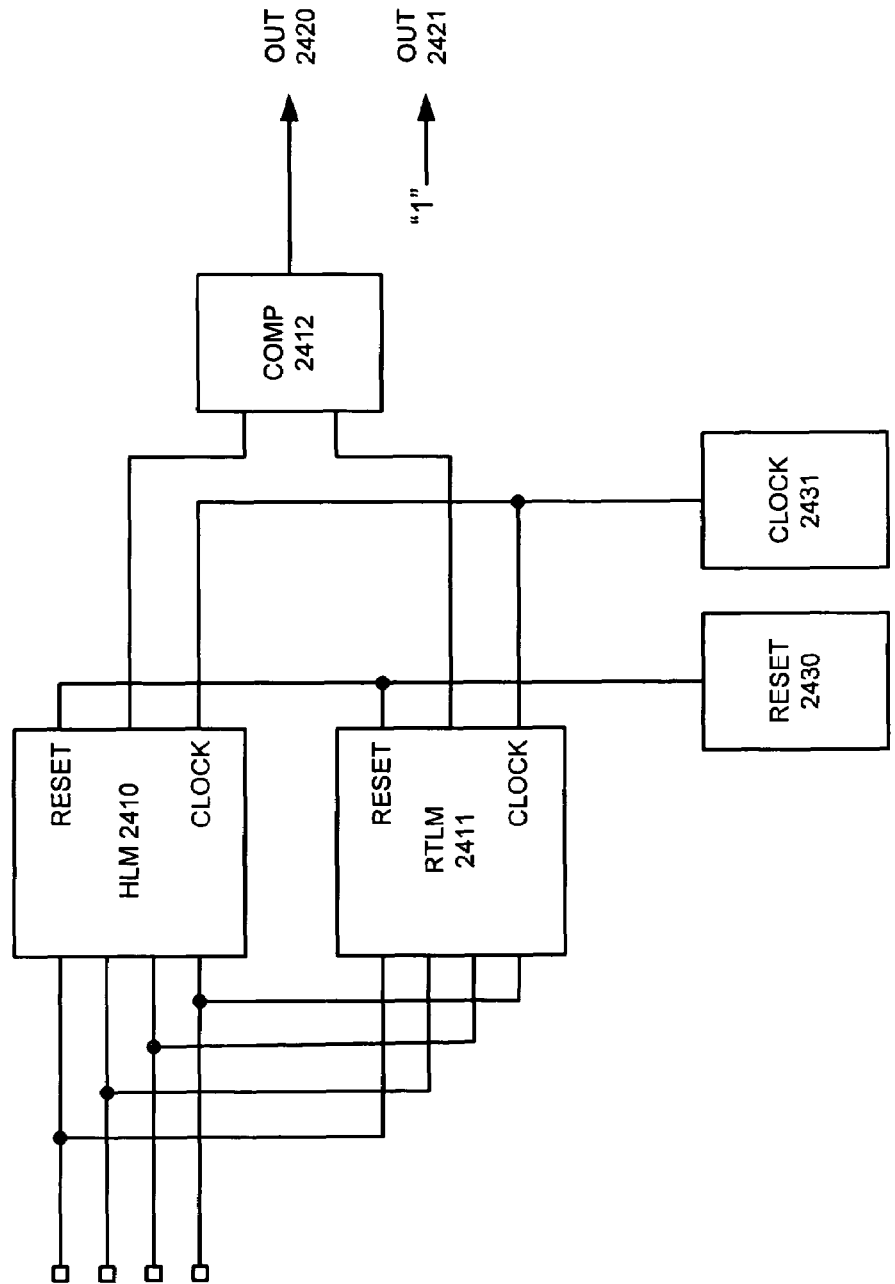
FIG. 14 depicts a cycle-accurate combining structure.

During formal equivalence proving, a task can be proving that the output 2420 of comparator 2412 is equivalent to a logic "1" (represented in FIG. 14 by an "output" 2421).

4.2.3. Pipelined

The pipelined combining structure can be applied under the following circumstances: both DFGs are classified as pipelined, one DFG is classified as combinational and the other is classified as pipelined. If one of the DFGs is classified as combinational, it can be converted into a one-stage pipeline.

The approach of a pipelined combining structure is to effectively modify one or both of the DFGs such that a cycle-accurate equivalence test can be performed.

Figure 15:
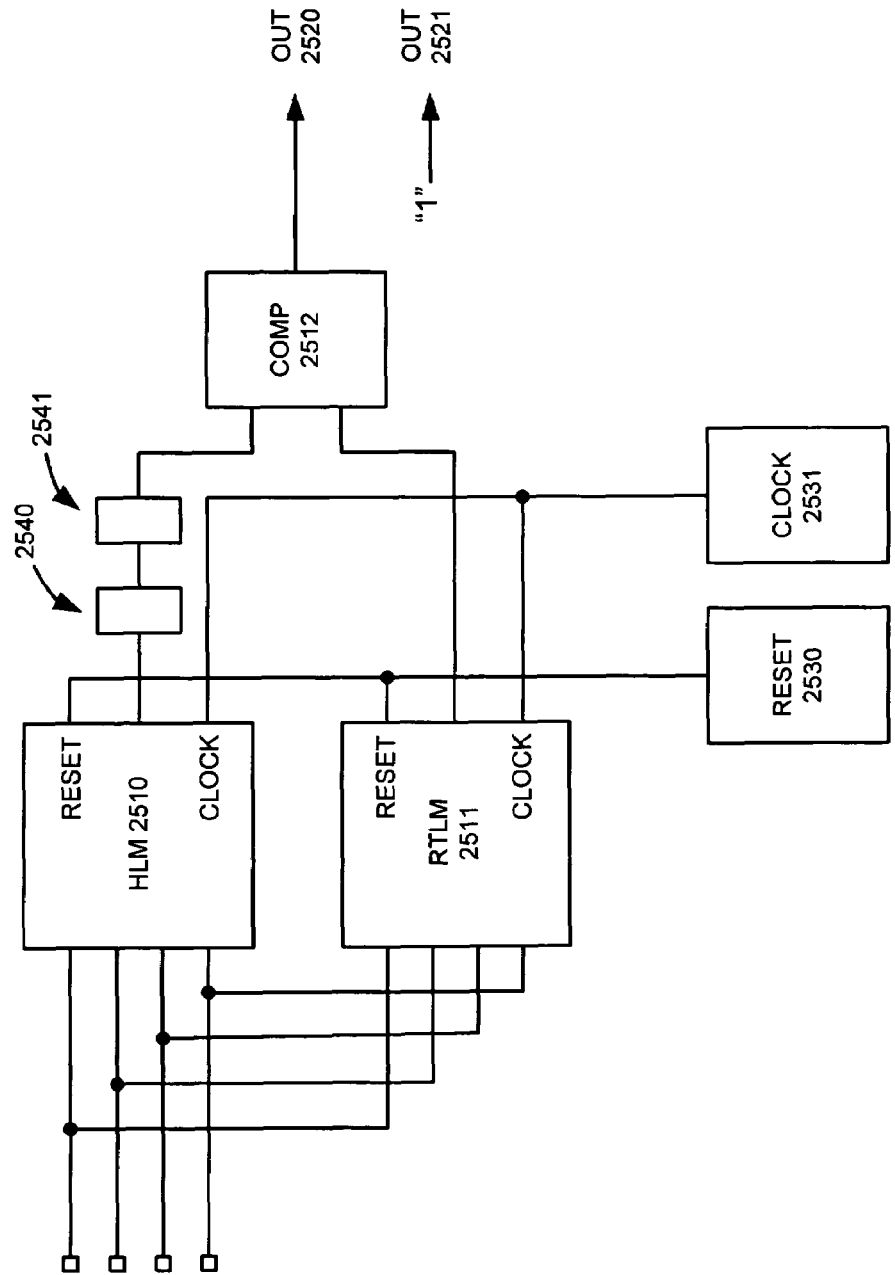
FIG. 15 depicts a pipelined combining structure.

A pipelined combining structure can be created as follows (see FIG. 15).

A DFG 2510 represents $HLM_{ts}$ and a DFG 2511 represents $RTLM_{ts}$. Corresponding inputs of 2510 and 2511 are connected together (and thus $RTLM_{ts}$ and $HLM_{ts}$ are applied the same input vector each clock cycle). Corresponding outputs of 2510 and 2511 are input to a comparator, such as comparator 2512. Additional clocking logic 2531 and reset logic 2530 is added.

In addition, if the number of pipeline stages are not the same in both designs, pipeline-equalizing (or "dummy") registers (e.g., registers 2540 and 2541) are inserted at the outputs of the design with fewer pipeline stages.

Counting the number of pipeline stages of each design can be accomplished by utilizing the analysis performed (discussed above) by which one or both DFGs were classified as DFG class "pipelined."

Such counting can be performed according to one of three different methods, the three methods referred to as "a," "b" or "c."

Whether method "a," "b" or "c" is applicable can be expressed in terms of whether certain conditions, referred to as conditions (i), (ii) and (iii), are true or false.

Condition (i) is that there are no memories in the DFG.

Condition (ii) is that, for each pair (o,i) of a primary output and primary input, all paths between them cross the same number of registers.

Condition (iii) is that, in addition to condition (ii) being true, the number of registers according to condition (ii), between each pair (o,i) of a primary output and primary input, are all equal to the same value.

Counting method "a" determines the number of pipeline stages, to represent a DFG, by counting the number of pipeline stages from any primary output to any primary input. Counting method "a" can be used if conditions (i), (ii) and (iii) are true.

Counting method "b" determines the number of pipeline stages, to represent a DFG, by counting the (o,i) pair with the greatest register count. Counting method "b" can be used if conditions (i) and (ii) are true, but condition (iii) is false.

Counting method "c" determines the number of pipeline stages, to represent a DFG, by counting the (o,i) pair with the greatest register count that does not pass through a memory. Counting method "c" can be used if condition (ii) is true, but conditions (i) and (iii) are false.

In order to prove equivalence between two DFGs that use memories, there must exist a memory mapping between the memories of both designs. That the memory mapping holds for all times can be shown by an up-front check that, for both DFGs, shows the same data is always written to the same location in each memory.

If such equality of memory mapping is found, then the memories can be effectively eliminated from the versions of the DFGs, used to construct $MT_{ts}$, as follows. In constructing the pipelined combining structure, the output nodes of the memories in the DFGs are treated as primary inputs. Just as with actual primary inputs, in the $MT_{ts}$, the corresponding memory output nodes of each DFG are connected together.

If the same type of equality of memory mapping can be shown between registers in the two DFGs, then such registers can also be effectively eliminated, from the versions of the DFGs used to construct $MT_{ts}$, by treating their output nodes as primary inputs.

4.2.4. Stream-Based

4.2.4.1. Overview

The stream-based combining structure is applicable when both $RTLM_{ts}$ and $HLM_{ts}$ have been put into the DFG class "handshaking."

Stream-based equivalence, if proven, can be characterized as follows. First, both $RTLM_{ts}$ and $HLM_{ts}$ receive the same stream of input data, but not necessarily at the same time. Second, both $RTLM_{ts}$ and $HLM_{ts}$ generate the same output data, but not necessarily at the same time. Phrased another way, stream-based equivalence means there are no constraints on the relative timing of the inputs or outputs of $RTLM_{ts}$ and $HLM_{ts}$, however, data packets produced by the two DFGs should be produced in the same order.

An overall method, by which a stream-based combining structure can be used, is as follows. First, create two sub-miters. Each sub-miter is comprised of an instance of $RTLM_{ts}$, $HLM_{ts}$ and the stream-based combining structure $CS\_STREAM_{ts}$. Second, if both sub-miters find equivalency, on a cycle-accurate basis, then $RTLM_{ts}$ and $HLM_{ts}$ are equivalent on a stream-accurate basis.

Each sub-miter is constructed as follows.

For a first sub-miter, $RTLM_{ts}$ is tested for equivalence with $HLM_{ts}$ under conditions that correspond to $RTLM_{ts}$ operating at "full speed." Put differently, every time $RTLM_{ts}$ can accept a set of data inputs, it is able to do so. $HLM_{ts}$ is tested for equivalence with $RTLM_{ts}$ under conditions that constrain its inputs to be the same as whatever $RTLM_{ts}$ indicates it is able to accept. Thus the first sub-miter determines equivalence between a fully exercised $RTLM_{ts}$ and a $HLM_{ts}$ limited to those inputs that exercise $RTLM_{ts}$.

If the result of comparing $RTLM_{ts}$ to $HLM_{ts}$ is successful, then it is known that for any inputs acceptable by $RTLM_{ts}$, $HLM_{ts}$ will produce stream-equivalent output. However, it is still not known whether, for the "full" range of inputs acceptable to $HLM_{ts}$, if $RTLM_{ts}$ can produce stream-equivalent outputs. This is accomplished by reversing the roles of $RTLM_{ts}$ and $HLM_{ts}$ in the second sub-miter.

Put more symbolically, it is first shown by the first sub-miter that the set of outputs (or SOO) of $RTLM_{ts}$ (or SOO ($RTLM_{ts}$)) is a subset of the SOO of $HLM_{ts}$ (or SOO ($HLM_{ts}$)). Put in mathematical relation form:

$$SOO(RTLM_{ts}) \subseteq SOO(HLM_{ts})$$

By reversing the roles of RTLMT and $HLM_{ts}$, the second sub-miter can show that:

$$SOO(HLM_{ts}) \subseteq SOO(RTLM_{ts})$$

The only way both relations can be true is if the following is true:

$$SOO(HLM_{ts}) = SOO(RTLM_{ts})$$

Figure 16A:
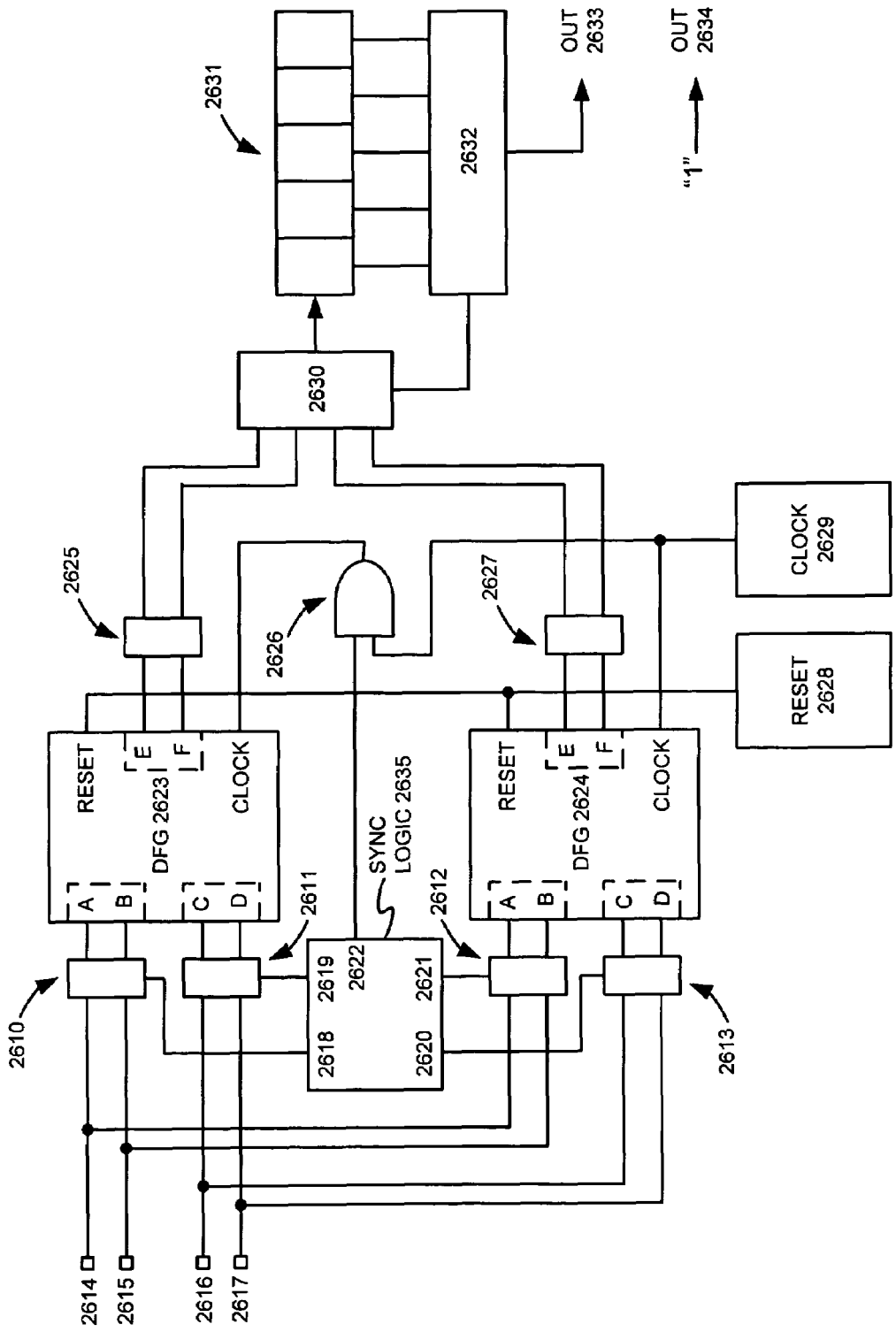
FIG. 16A depicts a stream-based combining structure.

An example stream-based combining structure, suitable for constructing the first and second sub-miters, is depicted in FIG. 16A. In discussing $HLM_{DFG}$ and $RTLM_{DFG}$, with regard to the first and second sub-miters, each is referred to as either DFG 2623 and DFG 2624. To construct the first sub-miter, in accordance with FIG. 16A, DFG 2623 and DFG 2624 refer to, respectively, $RTLM_{DFG}$ and $HLM_{DFG}$. To construct the second sub-miter, in accordance with FIG. 16A, DFG 2623 and DFG 2624 refer to, respectively, $HLM_{DFG}$ and $RTLM_{DFG}$.

Since the first and second sub-miters can be constructed in an identical way, except for the roles of $RTLM_{DFG}$ and $HLM_{DFG}$ being reversed, the below will just address construction of the first sub-miter.

4.2.4.2. Input of Data to $RTLM_{ts}$ and $HLM_{ts}$ DFGs

The first sub-miter is constructed to allow DFG 2623 to process data as soon as it is able to, while not guaranteeing the same for DFG 2624. This can be achieved by implementing the following process in the sub-miter (which is depicted in FIG. 16B):

(i) Until DFG 2623 is able to accept its next packet, DFG 2624 is not asked to accept its next packet. In FIG. 16B, this is depicted by step 2650 inhibiting requests to DFG 2624 and by decision point 2651 looping back to itself until DFG 2623 accepts its next packet.

(ii) When DFG 2623 accepts its next packet (decision point 2651 follows the "yes" branch to step 2652 and decision point 2653), if DFG 2624 is not able to accept its next packet at that time (decision point 2653 follows the "no" branch), the clock to DFG 2623 is switched off (see step 2654), "freezing" the state of DFG 2623. Once DFG 2624 accepts its next packet (decision point 2653 follows the "yes" branch), the clock to DFG 2623 is switched back on (see step 2655), and the process loops back to step (i).

FIG. 16A depicts two example handshaking inputs for each of DFG 2623 and 2624: a first handshaking input comprised of connection ports labeled "A" and "B," and a second handshaking input comprised of connection ports labeled "C" and "D." The dashed box around ports "A" and "B," and the other dashed box around ports "C" and "D," represent handshaking protocol interfaces. The packets accepted by the first and second handshaking inputs can be of any length, depending on the design of DFGs 2623 and 2624.

Counterpart handshaking protocol interfaces, to model an appropriate environment for DFG 2623, are labeled 2610 and 2611. Counterpart handshaking protocol interfaces, to model an appropriate environment for DFG 2624, are labeled 2612 and 2613.

Counterpart handshaking protocol interfaces 2610, 2611, 2612 and 2613 can be controlled by synchronization logic 2635 through its connection ports 2618, 2619, 2621 and 2620. Synchronization logic 2635 can also control whether clock 2629 is applied to DFG 2623 by controlling AND gate 2626. AND gate 2626 is controlled by output 2622 of synchronization logic 2635.

Reset logic 2628 can be responsible for putting DFGs 2623 and 2624 into an initial state. Clock unit 2629 can be responsible for providing clock signals to DFGs 2623 and 2624.

Regarding the above-described process (for allowing DFG 2623 to process data as soon as it is able to, while not guaranteeing the same for DFG 2624), it can be described, in terms of the particular units of FIG. 16A, as follows:

(i) Until a handshaking input to DFG 2623 indicates its acceptance of its next packet, the corresponding handshaking input to DFG 2624 is not asked to accept its next packet. This can be accomplished by synchronization logic 2635 as follows. For a particular handshaking protocol interface of DFG 2623, synchronization logic 2635 can detect whether it has accepted its next packet. If the handshaking protocol interface of DFG 2623 has not accepted, then synchronization logic 2635 can cause the corresponding counterpart handshaking protocol interface, for DFG 2624, to not request a packet acceptance of DFG 2624.

(ii) When a handshaking input to DFG 2623 has accepted its next packet, if the corresponding handshaking input to DFG 2624 is not able to accept its next packet at that time, the clock to DFG 2623 is switched off, "freezing" the state of DFG 2623. Once the handshaking input to DFG 2624 has accepted its next packet, the clock to DFG 2623 is switched back on, and the same process loops back to step (i). This can be accomplished by synchronization logic 2635 as follows. Once synchronization logic 2635 has detected that a handshaking input to DFG 2623 has accepted its next packet, synchronization logic 2635 then tests whether the corresponding handshaking input, to DFG 2624, has either accepted, or is able to accept, the next packet. If synchronization logic 2635 determines that the handshaking input to DFG 2624 has not accepted, or is not able to accept, its next packet, synchronization logic 2635 can switch off the clock input to DFG 2623 by lowering its output 2622. Synchronization logic 2635 presents the packet to the handshaking input of DFG 2624 until it has been accepted. No packets are presented to the other handshaking inputs of DFG 2624 during this time. When synchronization logic 2635 subsequently determines that the handshaking input to DFG 2624 has accepted its next packet, synchronization logic 2635 can switch on the clock input to DFG 2623.

4.2.4.3. Output of Data from RTLM and HLM DFGs

DFGs 2623 and 2624 can produce their output packets at different times. A FIFO can be used to store outputs such that they can be compared. In the following discussion, data enters at the "tail" of a FIFO and exits at the "head" of the FIFO.

A FIFO controller can have states called "DFG 2623 ahead," "DFG 2624 ahead" and "neither DFG ahead." Based upon the current FIFO controller state, and whether the latest packet to be output is from DFG 2623 or DFG 2624, the FIFO controller can operate as follows.

This paragraph addresses the case where the state is "neither DFG ahead." If a packet from DFG 2623 is produced, then it is pushed on the FIFO and the state changes to "DFG 2623 ahead." If a packet from DFG 2624 is produced, then it is pushed on the FIFO and the state changes to "DFG 2624 ahead."

This paragraph addresses the case where the state is "DFG 2623 ahead." If a packet from DFG 2623 is produced, then it is pushed on the FIFO and the state remains "DFG 2623 ahead." If a packet from DFG 2624 is produced, then it is compared with the packet at the head of the FIFO and the head of the FIFO is popped. If, as a result of the pop, the FIFO is empty, the state becomes "neither DFG ahead."

This paragraph addresses the case where the state is "DFG 2624 ahead." If a packet from DFG 2624 is produced, then it is pushed on the FIFO and the state remains "DFG 2624 ahead." If a packet from DFG 2623 is produced, then it is compared with the packet at the head of the FIFO and the head of the FIFO is popped. If, as a result of the pop, the FIFO is empty, the state becomes "neither DFG ahead."

A handshaking output, of DFGs 2623 and 2624, is represented by two connection ports labeled "E" and "F." The dashed box around ports "E" and "F" represents a handshaking protocol interface. A counterpart handshaking protocol interface, to model an appropriate environment for DFG 2623, is labeled 2625. A counterpart handshaking protocol interface, to model an appropriate environment for DFG 2624, is labeled 2627.

FIG. 16A represents the FIFO as a FIFO 2631. FIFO 2631 is controlled by a FIFO controller unit 2630 that receives data packets via counterpart handshaking protocol interfaces 2625 and 2627. Elements of FIFO 2631 are compared with a latest output packet, from either DFG 2623 or 2624 as appropriate, by a comparison unit 2632. Comparison unit 2632 can produce a signal representative of a logical "1," at its output 2633, when the comparison finds equality between the compared output packets.

Figure 16C:
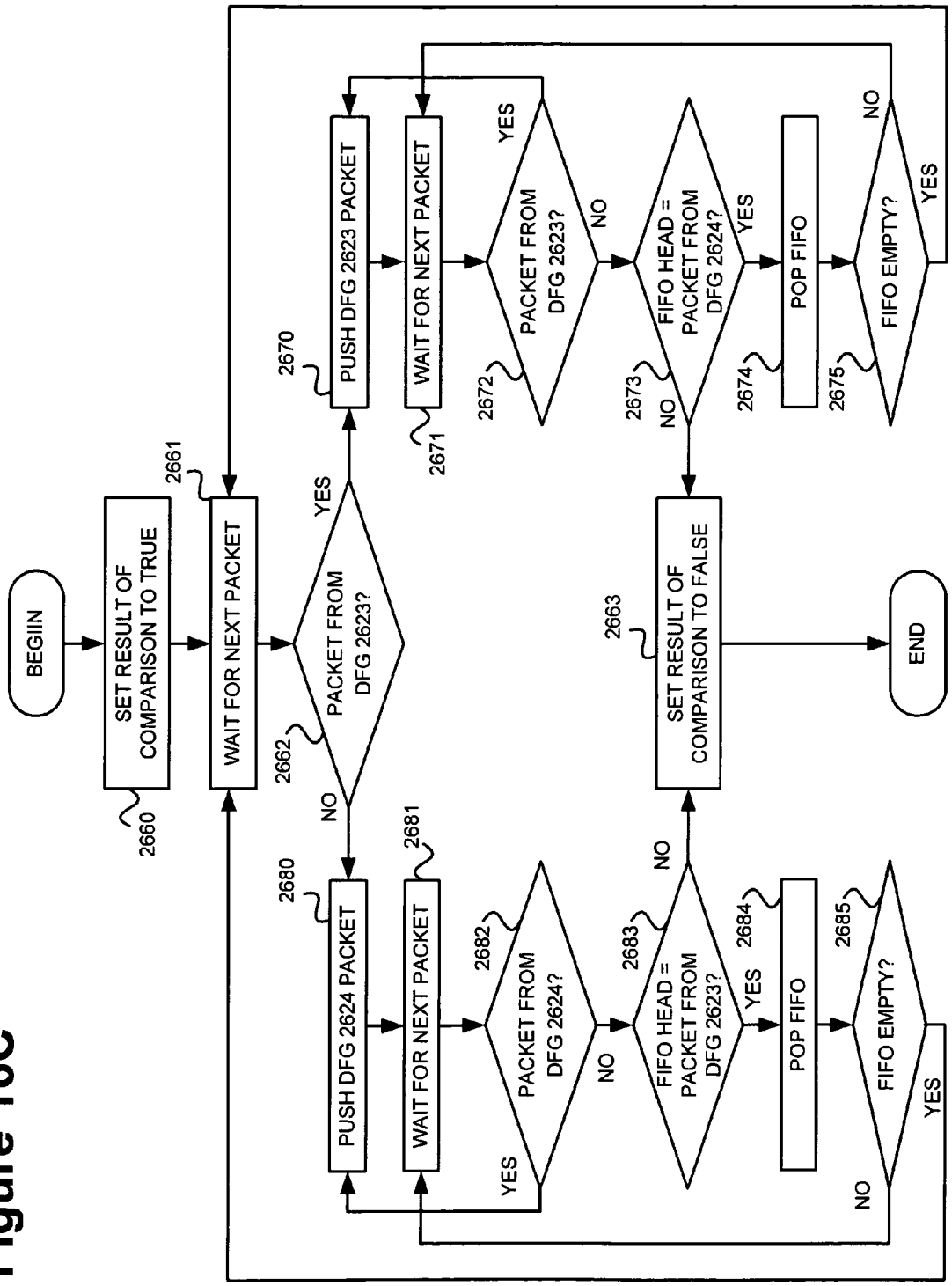
FIG. 16C depicts a more detailed view of an example operation of a FIFO controller.

A more detailed view, of an example operation of a FIFO controller, is shown in FIG. 16C. When first beginning to compare the outputs of DFG 2623 and 2624, the result of the comparisons can be initialized to TRUE (step 2660). Waiting for a next packet at step 2661 can correspond to the state, discussed above, of "neither DFG ahead." Steps 2680-2685 can correspond to being in the state "DFG 2624 ahead." Steps 2670-2675 can correspond to being in the state "DFG 2623 ahead."

Starting from step 2661, when a next (or first) packet arrives, it is tested by decision point 2662 for whether the packet is from DFG 2623 or 2624. If the packet is from DFG 2623, the "yes" branch of 2662 is followed to steps 2670-2675. If the packet is not from DFG 2623, then it is from DFG 2624 and the "no" branch of 2662 is followed to steps 2680-2685.

Steps 2670-2675 operate as follows. The packet from DFG 2623 is pushed on the FIFO (step 2670). The FIFO controller waits for a next packet (step 2671). When a next packet arrives, it is tested by decision point 2672. If the next packet is from DFG 2623, it is simply pushed on the FIFO (step 2670). If the next packet is from DFG 2624, it is tested by decision point 2673. If the FIFO head is not equal to the latest packet from DFG 2624, the result of the comparisons can be set to FALSE (step 2663) and the FIFO controller process can end. If the FIFO head is equal to the latest packet from DFG 2624, the FIFO head can be popped (step 2674) and the state of the FIFO can be tested by decision point 2675. If the FIFO is empty, the "state" of "neither DFG ahead" can be returned to by branching to step 2661. If the FIFO is not empty, the "state" of "DFG 2623 ahead" can be remained in by branching to step 2671.

Steps 2680-2685 operate in the same fashion as steps 2670-2675, except that steps 2680-2685 operate upon a FIFO containing packets from DFG 2624 and compares those FIFO packets to packets from DFG 2623.

4.2.4.4. OtherApplications

The stream-based combining structure, presented herein, can be used in conjunction with any formal analysis tool. The stream-based combining structure, presented herein, can be used without the step of classifying the first and second designs that it couples.

When the stream-based combining structure is used without the step of classification, any appropriate representation can be used for the stream-based combining structure and for the first and second designs to be coupled. For the first and second designs to be coupled, each can be treated as a "black box," with just information on its inputs and outputs provided.

4.2.5. Error

The error combining structure can be applied if it is not known, for the classifications of the two DFGs, what combining structure, if any, should be applied. This can occur when one DFG is classified as handshaking and the other DFG is classified as other than handshaking.

Under such circumstances, the user can be allowed to specify a suitable combining structure.

4.3. Generating the Test Bench

4.3.1. Overview

Once a combining structure has been selected, $MT_{ts}$ can be generated as follows.

The selected combining structure can first be generated in a hardware description language (HDL) such as Verilog HDL. Within such HDL description, $HLM_{ts}$ and $RTLM_{ts}$ can be coupled-to as "black boxes." In this way, the two DFGs do not need to be converted into the HDL. The resulting initial text bench, since it uses both HDL and DFG representation, can be referred to as $MT_{ts/HDL}$.

Once the complete $MT_{ts/HDL}$ has been produced, just the parts expressed in an HDL can be converted into a DFG representation in order to produce the $MT_{ts}$ to which equivalence proving can be applied.

4.3.2. Reset Logic

Rather than extracting an initial state for RTLM or HLM, as described below in section 5 ("Initialization Of The Miter Timestep"), and transferring such initial state to $MT_{ts}$, reset logic can be added to $MT_{ts}$.

To the extent such reset logic is "run," in order to determine initial state, operation of $MT_{ts}$ can be disabled during the first few timesteps (or cycles) of $MT_{ts}$ operation.

For the case where reset logic is used to determine an initial state for both $RTLM_{ts}$ and for $HLM_{ts}$, the portion of the combining structure, that checks for whether the data produced by the two DFGs is equivalent, can be disabled. For example, when comparing two DFGs classified as pipelined, with unknown initial states, if the results of the first few cycles of $MT_{ts}$ are not ignored, it may not be possible to prove equivalence.

For the case where reset logic is used to determine an initial state for $RTLM_{ts}$, but partial execution of the HLM is used to determine the initial state for $HLM_{ts}$ (as in below section 5 "Initialization Of The Miter Timestep"), clocking to $HLM_{ts}$ can be disabled during the first few cycles of $MT_{ts}$ operation. By disabling the clock to $HLM_{ts}$, the state assigned to $HLM_{ts}$ can be maintained while $RTLM_{ts}$ proceeds through a reset sequence.

Conversely, for the case where reset logic is used to determine an initial state for $HLM_{ts}$, but partial execution of the RTLM is used to determine the initial state for $RTLM_{ts}$ (as in below section 5 "Initialization Of The Miter Timestep"), clocking to $RTLM_{ts}$ can be disabled during the first few cycles of $MT_{ts}$ operation. By disabling the clock to $RTLM_{ts}$, the state assigned to $RTLM_{ts}$ can be maintained while $HLM_{ts}$ proceeds through a reset sequence.

4.3.3. Clocking Logic

During formal equivalence verification of $MT_{ts}$, it can be assumed there is only a single implicit clock.

If there are multiple clocks in $HLM_{ts}$ and $RTLM_{ts}$, these can be removed by preprocessing the DFG prior to formal equivalence verification. The preprocessing can simplify the multiple clocks by deriving a single, "common-denominator," clock rate. Each clock of the DFG is then expressed as a multiple of such common-denominator clock rate.

Such simplification can be done after $MT_{ts}$ has been generated.

4.3.4. Use of Libraries

The combining structure can be constructed from a library of HDL building blocks. Such a library can include building blocks that perform the following functions: reset-sequence generation, different clocking-schemes, different handshaking protocols or different kinds of FIFOs.

The library approach can make it easier for the user to create customized combining structures. For example, a user can add her or his own building blocks to the library and then swap, for certain building blocks of a pre-existing combining structure, newly added building blocks.

The library approach can also make it easier for the user to create entirely new combining structures, either from building blocks of an existing library or from newly-added building blocks.

4.4. Other Applications

The techniques of test bench generation presented herein are discussed primarily with respect to combining DFGs of an RTLM and HLM, for purposes of applying the equivalence determination process described herein. However, the test bench generation techniques presented herein can be used for combining any first DFG and second DFG, regardless of the source from which the first and second DFGs are derived. The resulting combination, of first DFG, second DFG and combining structure, can be used in conjunction with any formal analysis technique.

Furthermore, the test bench generation techniques presented herein can be used for combining a first and second design, where the first and second designs are not specified as DFGs. The step of classifying each of the first and second designs, in order to determine the applicable combining structure, only requires that the first and second designs be expressed in a representation that provides the necessary structural information. By way of example, a netlist representation could be used instead of a DFG representation.

5. Initialization of the Miter Timestep

As discussed above, in order to compare $RTLM_{ts}$ and $HLM_{ts}$ for potential equivalency, they may need to be set to equivalent initial states. A pseudo-code procedure, for setting $RTLM_{ts}$ and $HLM_{ts}$ to equivalent initial states, was introduced above as "initialize_initial_timestep." A more detailed discussion, of techniques for implementing initialize_initial_timestep, is presented in this section and explained in conjunction with FIG. 18A.

Figure 18A:
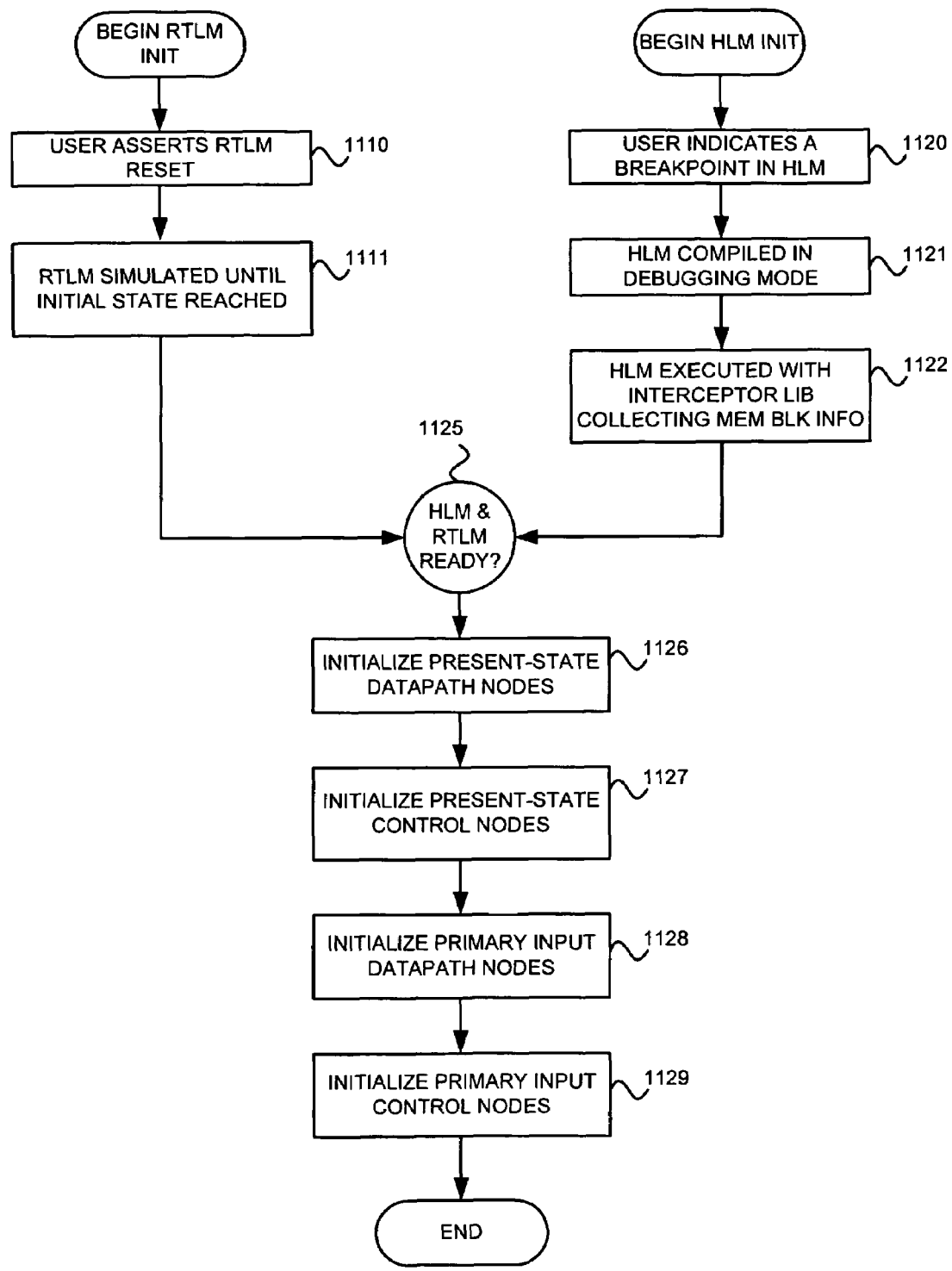
FIG. 18A depicts a flowchart for initialization of an initial timestep.

First, suitable initial states of RTLM and HLM, for initializing $RTLM_{ts}$ and $HLM_{ts}$, can be determined. Determining a suitable initial state for the RTLM is represented in FIG. 18A by steps 1110-1111. Determining a suitable initial state for the HLM is represented in FIG. 18A by steps 1120-1122. This determination of suitable initial states is addressed in the below sub-sections 5.1 ("Initializing RTLM") and 5.2 ("Initializing HLM").

Second, whenever both RTLM and HLM are ready (indicated in FIG. 18A by synchronization point 1125), the initial states for RTLM and HLM can be translated into appropriate initial values for $RTLM_{ts}$ and $HLM_{ts}$. This translation into appropriate initial values is represented in FIG. 18A by steps 1126-1129, and is addressed in the below sub-section 5.3 ("Translation To Initial Timestep").

5.1. Initializing RTLM

An initial state for RTLM, suitable for use in setting the initial states of $RTLM_{ts}$ and $HLM_{ts}$, can be determined as follows. A reset signal of the RTLM can be asserted (step 1110). The RTLM is simulated, using any appropriate known simulator, until it reaches an initial state as specified by the user (step 1111).

5.2. Initializing HLM

For an HLM that is compiled, its initial state can be determined by the following process.

Before partially executing the HLM, the user can provide information (step 1120) on the location within the HLM (e.g., a function or line-number) where the initialization phase is finished, and a breakpoint can be set at the location.

An HLM written in a compiled language (such as C or C++) can be compiled such that debugging information is available (step 1121). Debugging information, in a compiled executable, can be used to extract the values of program variables of the HLM when it stopped at the breakpoint. For example, debugging information can include a function, referred to herein as "program variable mapping function," that maps a program variable name to a location in memory where the program variable's value is stored.

An operating system process, under which the HLM runs, can be created.

For an HLM that is run with a dynamic (or run-time) linker, operating system libraries used by the HLM can be linked-to at run-time. At the time of such library linking, rather than linking the HLM's typical run-time library, a special "Interceptor Library" can be linked to.

An Interceptor Library is so-called because it can intercept operating system calls the HLM might make, such as those related to memory allocation, memory reallocation or memory deallocation. For the C and C++ programming languages, such operating system calls include: "malloc," "realloc" and "free." Malloc allocates a dynamic block of memory. Free frees a dynamic block of memory. Realloc allocates a larger dynamic block of memory for a dynamic block of memory that has already been allocated. The already-allocated block is copied into the newly-allocated block.

The Interceptor Library functions can call the actual functions of the applicable operating system. Before returning, the Interceptor Library functions can record, for post run-time use, information about the currently allocated memory blocks. Information recorded can include a pointer to an allocated memory block and the size of an allocated memory block.

The HLM can be run until the breakpoint is reached (step 1122), at which point it is in an appropriate initial state to be used for setting the initial states of $RTLM_{ts}$ and $HLM_{ts}$. Because the HLM was executed with debugging information enabled, and with the Interceptor Library substituted for certain operating system procedures, the following information is available for the process of setting $RTLM_{ts}$ and $HLM_{ts}$ to initial states.

To extract the state of program variables as of the time the breakpoint occurred, the program variable mapping function can be used. To extract the state of program variables that serve as pointers, as of the time the breakpoint occurred, the following process can be used. The program variable mapping function can be used to extract the pointer address. Information stored by the Interceptor Library procedures can be used to determine the allocated memory block corresponding to such pointer address. For example, Interceptor Library procedures can store the begin and end addresses of allocated memory blocks. If a pointer of the HLM points to an address within the begin and end addresses of an allocated memory block, then that memory block's values can be used for initialization of $RTLM_{ts}$ and $HLM_{ts}$.

For an HLM run on an interpreter, the following modifications, to the above-described approach for compiled HLMs, can be employed. The mechanism for setting a breakpoint can then be replaced by a procedure, in the interpreter, that stops interpretation at a specified line number. The functionality of the Interceptor Library can be integrated into the procedures that implement the interpreter, which procedures can save information on the allocation of memory blocks. Extraction of variable values can be accomplished by accessing internal data-structures of the interpreter and, where appropriate, using the saved memory block allocation information.

5.3. Translation to Initial Timestep

Once initial states for RTLM and HLM are available (i.e., synchronization point 1125 has been reached), their values can be translated into appropriate initial values, for the initial timesteps of $RTLM_{ts}$ and $HLM_{ts}$, as follows.

Datapath present-state nodes, of $MT_{ts}$, can be initialized as follows (step 1126).

For each datapath present-state node of $RTLM_{ts}$, "dp_ps_RTLM_ts," its corresponding value in the $RTLM_{ts}$, "dp_ps_RTLM," can be sought. For each datapath present-state node of $HLM_{ts}$, "dp_ps_HLM_ts," its corresponding value in the HLM, "dp_pS_HLM," can be sought.

dp_ps_RTLM can be determined from dp_ps_RTLM_ts by any suitable known means. For example, the timestep-independent name of dp_ps_RTLM_ts can be used to locate dp_ps_RTLM.

dp_ps_HLM can be determined from dp_ps_HLM_ts as follows. For ordinary program variables, the timestep-independent name of dp_ps_HLM_ts can be used with the program variable mapping function to map to a location in memory where dp_ps_HLM is stored. For a pointer variables, the location in memory, found with the program variable mapping function, is a pointer to a location inside a block of memory. Using the pointer value, in conjunction with information stored by the Interceptor Library, the memory block pointed to can be identified. The contents of the memory block identified can then be the dp_ps_HLM.

A set of datapath present-state nodes, "DP_PS_TS," can be defined to contain all nodes of type dp_ps_RTLM_ts or dp_ps_HLM_ts that have a corresponding model value, where corresponding model value is defined as follows. For each member of DP_PS_TS, where the member is of type dp_ps_RTLM_ts, its corresponding model value is dp_ps_RTLM, and where the member is of type dp_ps_HLM_ts its corresponding model value is dp_ps_HLM.

DP_PS_TS can be divided into subsets, where each subset has the following property: all members have the same corresponding model value. Each subset "x" of DP_PS_TS can be assigned a unique integer SDV "y." Each member of a subset "x," in $MT_{ts}$, can have its SDV initialized to "y." If a subset "x" of DP_PS_TS contains only one member, then that member is initialized to a unique integer SDV, with respect to the SDV initializations provided to all other datapath present-state nodes of $MT_{ts}$.

Control present-state nodes, of $MT_{ts}$, can be initialized as follows (step 1127).

For each control present-state node of $RTLM_{ts}$, "ct_ps_RTLM_ts," its corresponding value in the RTLM, "ct_ps_RTLM," can be sought. For each control present-state node of $HLM_{ts}$, "ct_ps_HLM_ts," its corresponding value in the HLM, "ct_ps_HLM," can be sought. Determining ct_ps_RTLM from ct_ps_RTLM_ts can be found in the same manner, discussed above, for finding dp_ps_RTLM from dp_ps_RTLM_ts. Determining ct_ps_HLM from ct_ps_HLM_ts can be found in the same manner, discussed above, for finding dp_ps_HLM from dp_ps_HLM_ts.

Each ct_ps_RTLM_ts can be initialized to a symbolic Boolean value that directly represents its corresponding ct_ps_RTLM. For example, if the ct_ps_RTLM for a ct_ps_RTLM_ts is a logic "1," then ct_ps_RTLM_ts can be initialized to the symbolic Boolean value "1[0]." The index, of the symbolic Boolean value "1[0]," is added to indicate that the logic "1" was assigned to the node ct_ps_RTLM_ts in the initial timestep zero. As another example, if the ct_ps_RTLM for a ct_ps_RTLM_ts is a logic "0," then ct_ps_RTLM_ts can be initialized to the symbolic Boolean value "0[0]."

In the same manner, each ct_ps_HLM_ts can be initialized to a symbolic Boolean value that directly represents its corresponding ct_ps_HLM.

Datapath primary input nodes, of $MT_{ts}$, can be initialized as follows (step 1128). Pairs of corresponding datapath primary input nodes, from $RTLM_{ts}$ and $HLM_{ts}$, can be found. The member of each pair from $RTLM_{ts}$ can be referred to as "dp_pi_RTLM_ts" and the member of each pair from $HLM_{ts}$ can be referred to as "dp_pi_HLM_ts." dp_pi_RTLM_ts and dp_pi_HLM_ts can form a corresponding pair of nodes if they share the same timestep-independent name. dp_pi_RTLM_ts and dp_pi_HLM_ts can be assigned a common integer SDV.

Control primary input nodes, of $MT_{ts}$, can be initialized as follows (step 1129). Pairs of corresponding control primary input nodes, from $RTLM_{ts}$ and $HLM_{ts}$, can be found. The member of each pair from $RTLM_{ts}$ can be referred to as "ct_pi_RTLM_ts" and the member of each pair from $HLM_{ts}$ can be referred to as "ct_pi_HLM_ts." ct_pi_RTLM_ts and ct_pi_HLM_ts can form a corresponding pair of nodes if they share the same timestep-independent name. ct_pi_RTLM_ts and ct_pi_HLM_ts can be assigned a common symbolic Boolean variable.

With regard to initializing the primary input nodes, both control and datapath, this can be accomplished in the pseudo-code by "initialize_timestep_inputs" rather than being included with "initialize_initial_timestep."

5.4. Example

Figure 18B:
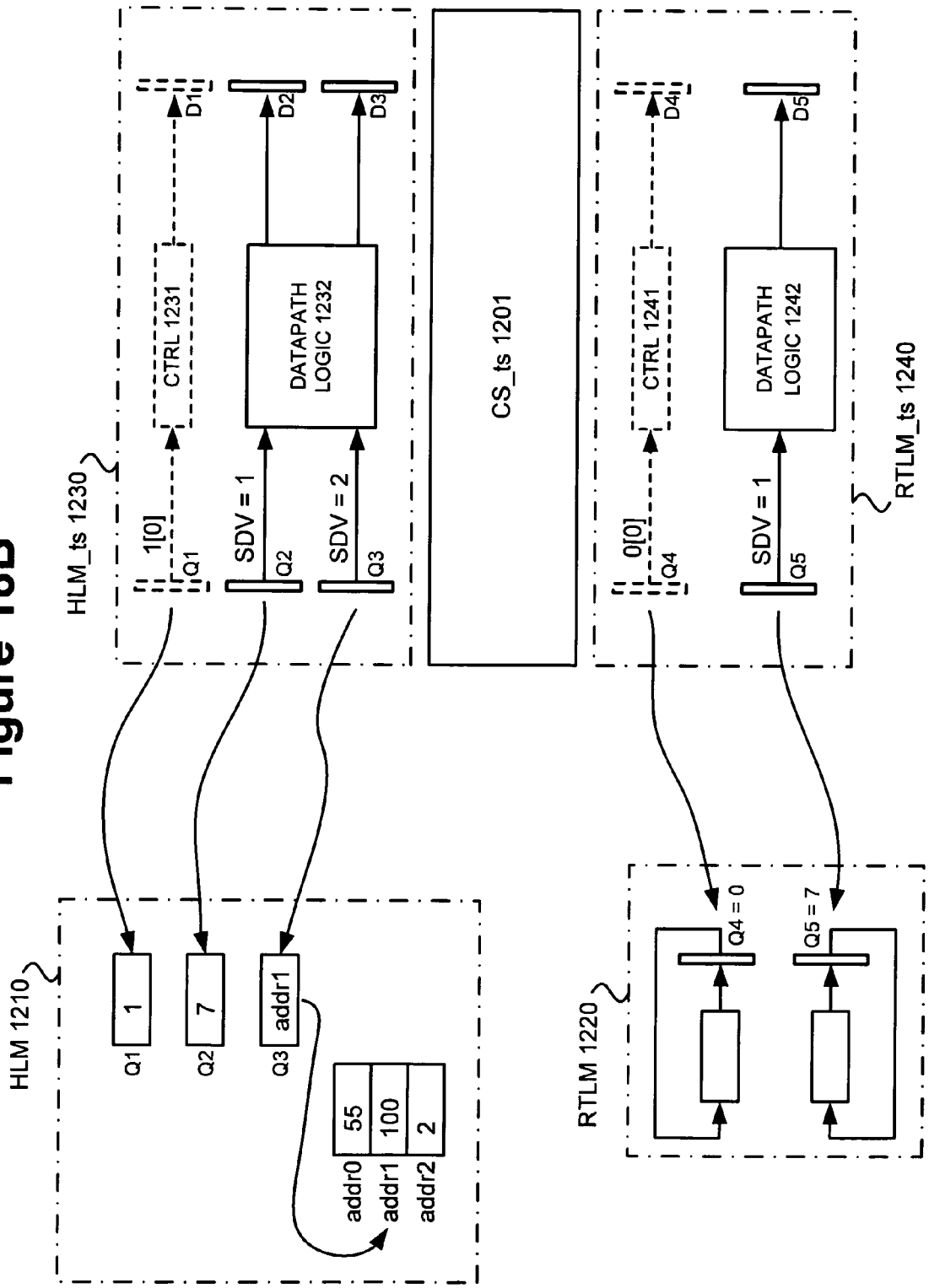
FIG. 18B presents an example initialization of the control and datapath present-state inputs for an initial timestep.

FIG. 18B presents an example initialization of the control and datapath present-state inputs for an initial timestep.

The initial timestep is comprised of the following: HLM_ts 1230, CS_ts 1201 and RTLM_ts 1240. Together, these three components for an initial miter. It is assumed that the initial time is zero.

Internal components of CS_ts 1201 are not shown.

HLM_ts 1230 is comprised of the following. There is a control section, comprised of a present-state input with timestep-independent name "Q1." Q1 is input to a block of control logic 1231, whose internal components are not shown. Internal components of control logic 1231 can include logic gates and TFs. Control logic 1231 produces a next-state output with timestep-independent name "D1." Elements of the control section are drawn in dashed form.

HLM_ts 1230 also has a datapath section comprised of present-state inputs with timestep-independent names "Q2" and "Q3." Q2 and Q3 are input to a block of datapath logic 1232, whose internal components are not shown. Internal components of datapath logic 1232 can include TFs and multiplexers. Datapath logic 1232 produces two next-state outputs with timestep-independent names "D2" and "D3."

RTLM_ts 1240 is comprised of the following. There is a control section, comprised of a present-state input with timestep-independent name "Q4." Q4 is input to a block of control logic 1241, whose internal components are not shown. Internal components of control logic 1241 can include logic gates and TFs. Control logic 1241 produces a next-state output with timestep-independent name "D4." Elements of the control section are drawn in dashed form.

RTLM_ts 1240 also has a datapath section comprised of a present-state input with timestep-independent name "Q5." Q5 is input to a block of datapath logic 1242, whose internal components are not shown. Internal components of datapath logic 1242 can include TFs and multiplexers. Datapath logic 1242 produces a next-state output with timestep-independent names "D5."

Corresponding to HLM_ts 1230 is an HLM 1210 that is shown in a partially executed state. Similarly, corresponding to RTLM_ts 1240 is an RTLM 1220 that is shown in a partially executed state.

The set of datapath present-state nodes, "DP_PS_TS," that contains all nodes of type dpps_RTLM_ts or dp_ps_HLM_ts, along with the corresponding model value for each, is as follows:

Q2 7

Q3 55, 100, 2

Q5 7

The corresponding model value for "Q2" of HLM_ts 1230 can be found as follows. If "Q2" is an ordinary program variable, its timestep-independent name can be applied to the program variable mapping function to map to a location in memory, of HLM 1210, where the value "7" is stored.

The corresponding model value for "Q3" of HLM_ts 1230 can be found as follows. Its timestep-independent name can be applied to the program variable mapping function to map to a location in memory, of HLM 1210, where the address "addr1" is stored. Using the pointer value "addr1," in conjunction with information stored by the Interceptor Library when HLM 1210 was executing, the memory block pointed to can be identified. In this case, the memory block spans an address range from "addr0" to "addr2." The contents of this memory block can then be the values for "Q3."

The corresponding model value for "Q5" of RTLM_ts 1240, in RTLM 1220, can be found as follows. The timestep-independent name "Q5" can be used to locate the corresponding register in RTLM 1220, which register has the value "7."

DP_PS_TS can be divided into the following subsets: {Q2, Q5} and {Q3}. The subset {Q2,Q5} can be assigned the integer SDV "1" and the subset {Q3} can be assigned the integer SDV "2."

The corresponding value for "Q1" of HLM_ts 1230, in HLM 1210, can be found in the same way that it was found for "Q2." The only difference is that "Q1" is at the bit level. The value found for "Q1," in HLM 1210, is a binary "1." This translates into the symbolic Boolean value "1[0]" for "Q1" in HLM_ts 1230.

The corresponding value for "Q4" of RTLM_ts 1240, in RTLM 1220, can be found in the same way that it was found for "Q5." The only difference is that "Q4" is at the bit level. The value found for "Q4," in RTLM 1220, is a binary "0." This translates into the symbolic Boolean value "0[0]" for "Q4" in RTLM_ts 1240.

5.5. Other Applications

The techniques of partial HLM execution, and of accessing the values of the partially executed HLM, are presented herein primarily with respect to initializing a DFG representation of the HLM. Furthermore, the discussion presented herein focuses primarily on applying the initialized DFGs to the equivalence determining process presented herein.

However, the techniques of partial HLM execution, and of accessing the values of the partially executed HLM, can be used in conjunction with initializing any formal analysis tool (including those that do not use DFGs), where the representation subject to formal analysis is derived from an HLM.

6. Verification with CERs

This section presents, in pseudo-code, the core equivalence-determining process presented above in FIG. 19. The core equivalence-determining process, presented in FIG. 19, is comprised of all steps of FIG. 19 with the exception of the initializations of step 4001. Correspondences between the pseudo-code and the steps of FIG. 19 are presented. Before presenting the pseudo-code, this section begins by presenting, in overview, an example application of a core equivalence-determining process.

6.1.1. Overview

FIGS. 21A-21N and 21P-21Q present an example application of a core equivalence-determining process.

FIG. 21A depicts an initial miter $MT_{ts}[0]$, comprised of an $RTLM_{ts}[0]$, $HLM_{ts}[0]$ and $CS_{ts}[0]$. $CS_{ts}[0]$ is indicated in FIG. 21A as DFG 4310. DFG 4310 has one primary output "OUT" that is true only if $RTLM_{ts}[0]$, $HLM_{ts}[0]$ are equivalent. The choices for $RTLM_{ts}[0]$ and $HLM_{ts}[0]$, in FIG. 21A, are as follows. RTLMT[0] can be DFG 4300 and $HLM_{ts}[0]$ can be DFG 4301. Alternatively, $RTLM_{ts}[0]$ can be DFG 4301 and $HLM_{ts}[0]$ can be DFG 4300.

The control portion of FIG. 21A is indicated in dashed form, while the rest of FIG. 21A is datapath. More specifically, the control portion is comprised of two AND gates: one in DFG 4300 (referred to as AND 4300) and the other in DFG 4301 (referred to as AND 4301). AND 4300 controls the select inputs, in parallel, of two multiplexers. AND 4301 controls the select input of one multiplexer.

When the select input to a multiplexer is at logic "1," the input to the multiplexer labeled "1" is selected. Conversely, when the select input to a multiplexer is at logic "0," the input to the multiplexer labeled "0" is selected. For example, consider the multiplexer of DFG 4300 that produces a next-state output with timestep-independent name "D1," referred to herein as "MUX_1_4300." When its select input is at logic "1," MUX_1_4300 selects the primary input with timestep-independent name "I1." When its select input is at logic "0," MUX_1_4300 selects the present-state input with timestep-independent name "Q1."

FIG. 21B shows $MT_{ts}[0]$ set to initial SDVs and symbolic Boolean variables. To conserve graphical space, SDVs and symbolic Boolean variables are indicated in FIGS. 21A-21N and 21P-21Q by being enclosed in a pair of hyphens. Timestep-independent names are not enclosed within any pair of symbols. The timestep-independent names for DFGs 4300 and 4301, and the initial integer SDV for each, are as follows:

I1 4
I2 5
Q1 1
Q2 2
Q3 3
O1 3
O2 3

"I1" and "I2" are primary inputs, "O1" and "O2" are primary outputs and "Q1," "Q2" and "Q3" are present-state inputs. DFGs 4300 and 4301 also include next-state outputs, indicated by the following timestep-independent names:

"D1," "D2" and "D3." "D1," "D2" and "D3," however, have not yet been assigned SDVs. A goal of SDV propagation is to propagate SDVs to each of them.

For the particular example of FIG. 21B, the setting of "O1," "O2" and "Q3" to the same SDV is not accomplished by the automatic initialization procedures presented in above section 5 ("Initialization Of The Miter Timestep"). This particular part of the initialization can be accomplished, for example, under "manual" direction by the designer. The designer may understand, having created the designs under test, that "O1," "O2" and "Q3" need to be initialized to the same value in order for equivalence to be found.

The timestep-independent names for DFGs 4300 and 4301, and the initial integer symbolic Boolean variables for each, are as follows:

P P0
E E0

"P" and "E" are primary inputs.

FIG. 21B corresponds, in FIG. 19, to having accomplished step 4001.

The equivalent of step 4002 is depicted, in the example, by FIGS. 21C to 21F. FIG. 21C shows the evaluation of the control logic (specifically, the symbolic Boolean expression "P0*E0" is propagated to the output of the AND gate in DFGs 4300 and 4301.

FIG. 21D shows the propagation of SDVs through the multiplexers of DFG 4300. Specifically, the multiplexer that receives integer SDVs "4" and "1" at its inputs is given the ITE SDV "ITE(P0*E0,4,1)" at its output. Similarly, the multiplexer that receives integer SDVs "5" and "2" at its inputs is given the ITE SDV "ITE(P0*E0,5,2)" at its output. There is no propagation through the multiplexer of DFG 4301 since that multiplexer only has an SDV at one of its inputs. The other input to the multiplexer is driven by a TF block to whose output an SDV has not yet been propagated.

FIG. 21E corresponds to the part of SDV propagation where propagation through TF blocks is attempted. Propagation through TF blocks can be performed when the following conditions, between a pair of TFs called "TF1" and "TF2," are satisfied. First, conditions (called conditional equivalence relations or CERs), under which TF1 and TF2 receive the same input data, are sought. Second, TF1 and TF2 are compared, without consideration for the broader DFG in which they're coupled, for whether they are functionally equivalent. When a non-null CER can be found, and when the second condition is satisfied, TF1 and TF2 can be assigned SDVs that evaluate as follows. When the non-null CER evaluates to true, the outputs of TF1 and TF2 should have the same integer SDV. When the non-null CER evaluates to false, the outputs of TF1 and TF2 should have different integer SDVs. As can be seen from FIG. 21E, there are no conditions under which the TF of DFG 4300 and the TF of DFG 4301 can receive the same input data. Therefore, there is nothing that can be asserted about the output of the TF of DFG 4301.

If FIG. 21E did depict SDV propagation, FIG. 21F would show any further SDV propagation that is possible as a result of propagation through a TF or TFs.

Step 4003, of FIG. 19, can be applied to FIG. 21F. In FIG. 21F, there is no miter timestep, prior to timestep $MT_{ts}[0]$, that can satisfy the conditions indicative of $MT_{ts}[0]$ being ready for reencode.

The actions of steps 4004-4005 are shown in FIG. 21G. Since a maximum number of timesteps has not yet been added to the miter of FIG. 21F, an additional timestep $MT_{ts}[1]$ is added and initialized in FIG. 21G. The timestep-independent names for DFGs 4302 and 4303, and the initial integer SDV for each, are as follows:

I1 14
I2 15
Q1 ITE(P0*E0,4,1)
Q2 ITE(P0*E0,5,2)

The timestep-independent names for DFGs 4302 and 4303 that have not yet been assigned SDVs are as follows: "O1," "O2," "Q3," "D1," "D2" and "D3."

The timestep-independent names for DFGs 4302 and 4303, and the initial integer symbolic Boolean variables for each, are as follows:

P P1
E E1

The equivalent of step 4002 is depicted, in the example, by FIGS. 21H to 21I.

FIG. 21H shows the evaluation of the control logic and the propagation of SDVs through the multiplexers of DFG 4302.

FIG. 21I corresponds to the part of SDV propagation where propagation through TF blocks is attempted. As can be seen from FIG. 21I, there is a CER under which the TF of DFG 4300 and the TF of DFG 4302 can receive the same input data: NOT(P0*E0). Furthermore, there is a CER under which the TF of DFG 4302 and the TF of DFG 4301 can receive the same input data: P0*E0. If it is assumed that these three TFs are equivalent (see next paragraph for explanation of "equivalent"), an integer SDV "8" can be propagated to the output of the TF of DFG 4301 and an ITE SDV "ITE(NOT (P0*E0), 3, 8)" can be propagated to the output of the TF of DFG 4302. As can be seen, with these newly propagated SDVs, the outputs of the TFs of DFGs 4300 and 4302 are the same (i.e., integer SDV "3") when "NOT(P0*E0)" is TRUE. Also, the outputs of the TFs of DFGs 4302 and 4301 are the same (i.e., integer SDV "8") when "NOT(P0*E0)" is FALSE.

Finding the three TFs equivalent can be accomplished as follows. When any TF is considered in isolation, apart from any circuit to which it may be coupled, it can be referred to as being "isolated." When all three TFs have been isolated, they are equivalent if each of them represents the same function as the other two.

As of FIG. 21I, the ATR is comprised of $MT_{ts}[0]$ to $MT_{ts}[1]$. Application of step 4003 of FIG. 19 to FIG. 21I results in a determination that miter timestep $MT_{ts}[0]$ satisfies the conditions for $MT_{ts}[1]$ to be reencoded.

FIG. 21J shows the result of step 4006 being performed. As of FIG. 21J, the ATR is set to begin and end at $MT_{ts}[1]$. This re-setting of the ATR is more clearly indicated in FIG. 21K, where any values, prior to the current reencode, are ignored. The FPT[0], that can be recorded from $MT_{ts}[1]$ of FIG. 21K is as follows:

I1 4
I2 5
Q1 1
Q2 2
Q3 3
O1 3
O2 3
D1 ITE(P1*E1,4,1)
D2 ITE(P1*E1,5,2)

FIG. 21K is identical to FIG. 21F, except that the timestep indices, of the symbolic Boolean variables, are one greater in FIG. 21K. Therefore, proceeding forward with SDV propagation from FIG. 21K is identical (except for symbolic Boolean variable timestep indices) to what has already been discussed in FIGS. 21G to 21K. The SDV propagation shown in FIGS. 21G to 21K corresponds to the SDV propagation shown in FIGS. 21L-21N and 21P-21Q. FIGS. 21L-21N and 21P-21Q represent the action of steps 4008 to 4014 of FIG. 19.

Figure 21N:
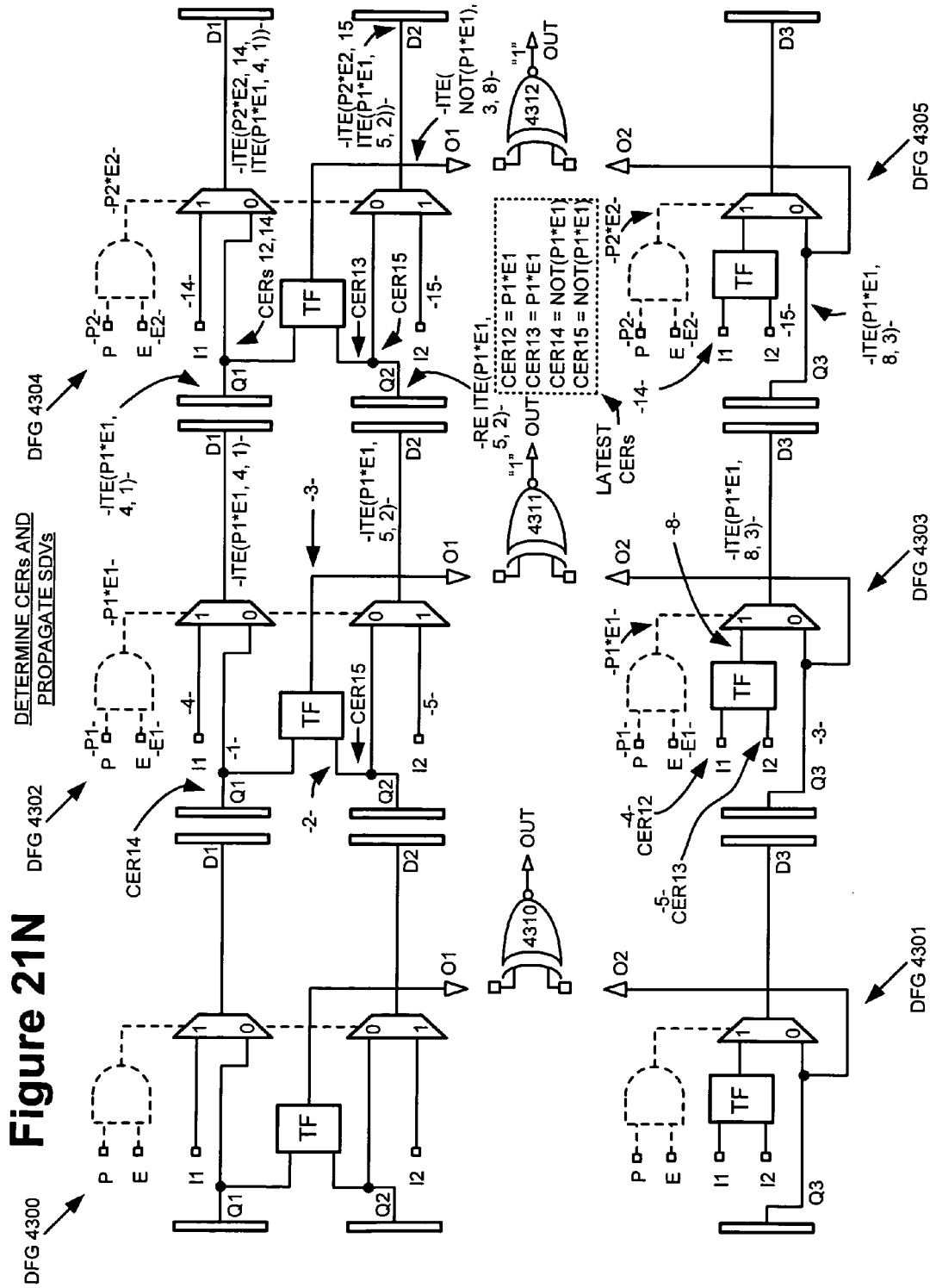
Figure 21P:
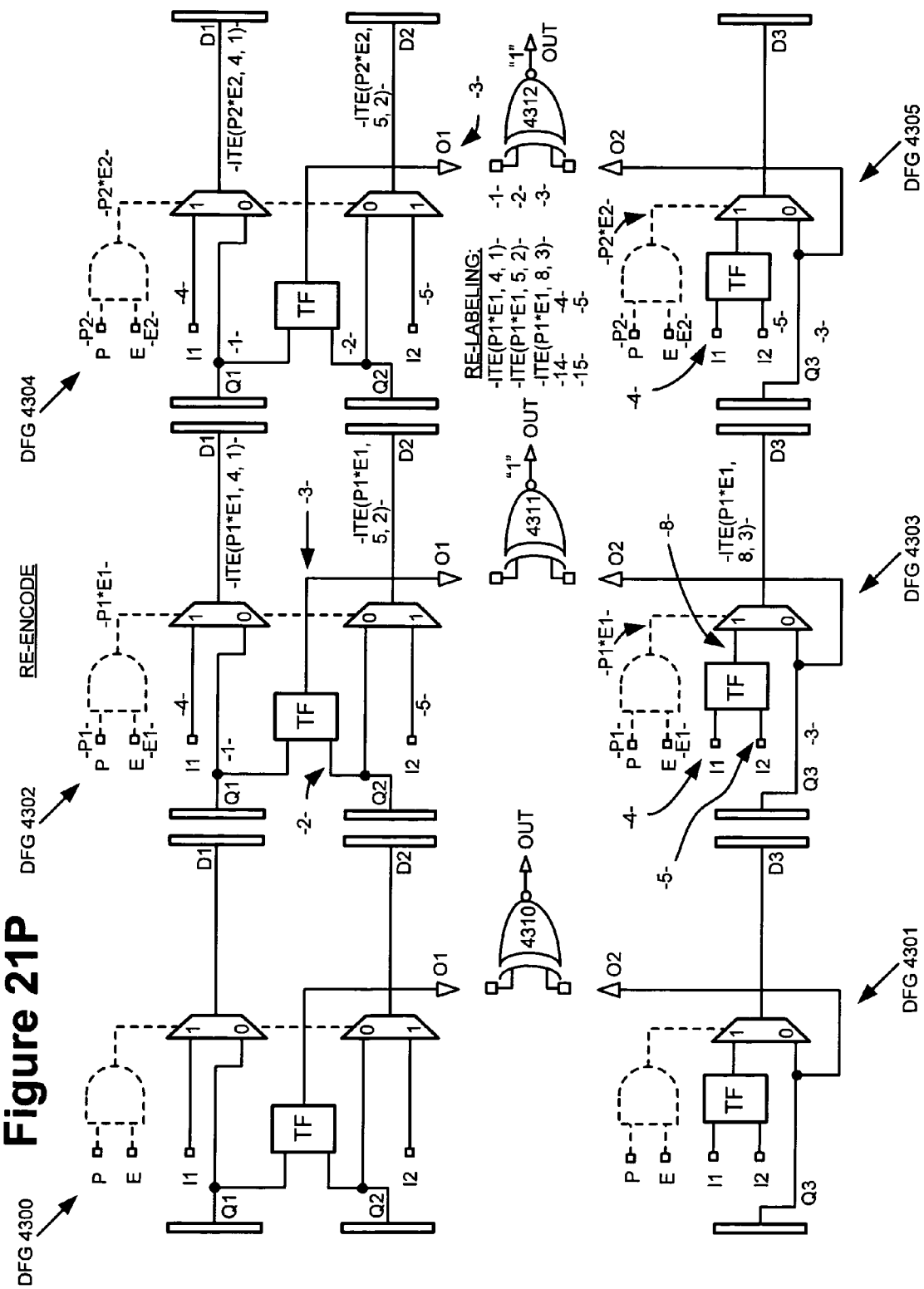
Figure 21Q:
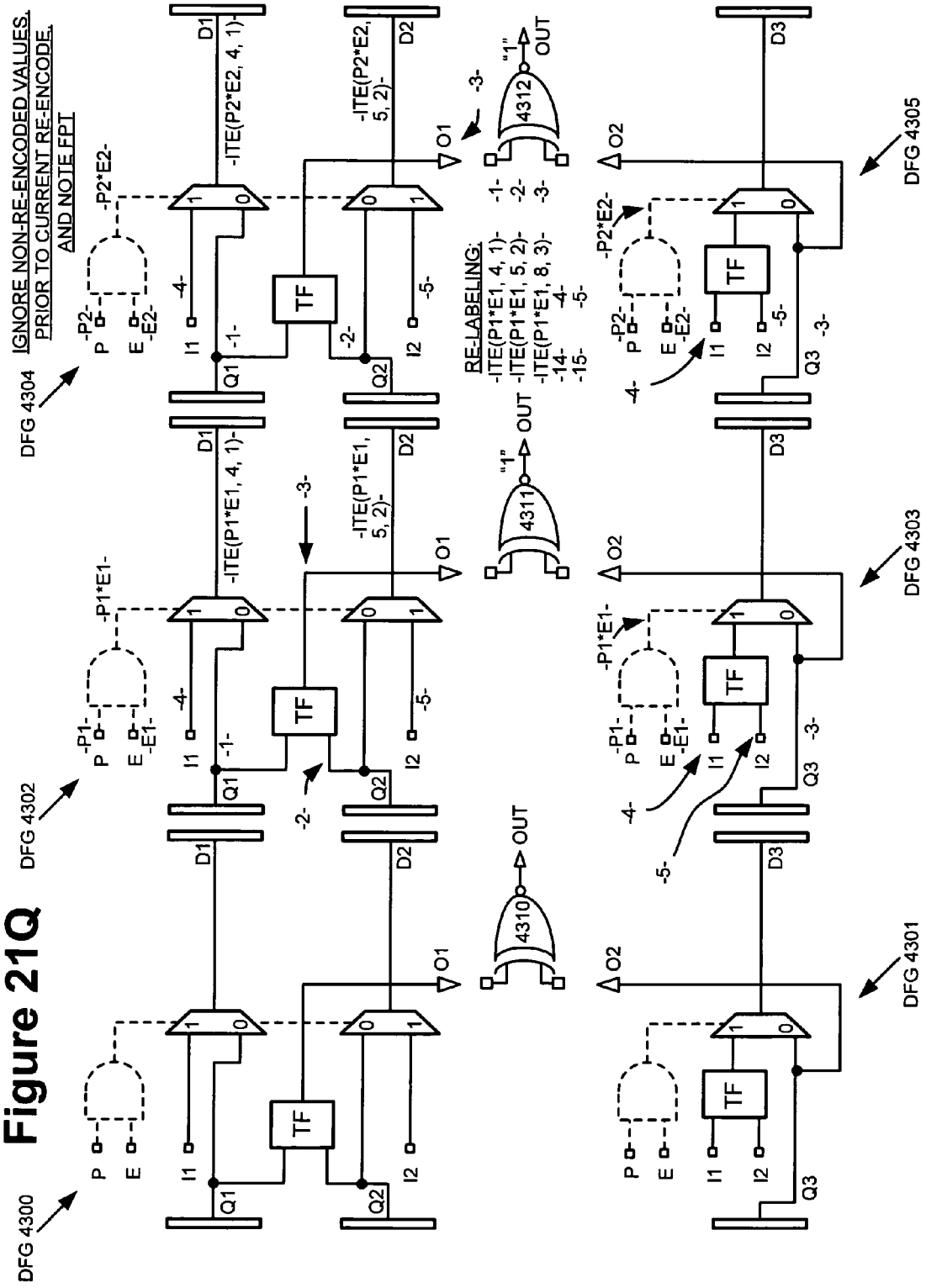

The FPT[1], that can be recorded from $MT_{ts}[2]$ of FIG. 21Q is as follows:

I1 4
I2 5
Q1 1
Q2 2
Q3 3
O1 3
O2 3
D1 ITE(P2*E2,4,1)
D2 ITE(P2*E2,5,2)

Since FPT[1] is identical to FPT[0] (such testing corresponding to step 4016 of FIG. 19), except for symbolic Boolean variable timestep indices, equivalence for all timesteps has been proven.

6.1.2. equivalence_checking_with_CERs

Figure 23:
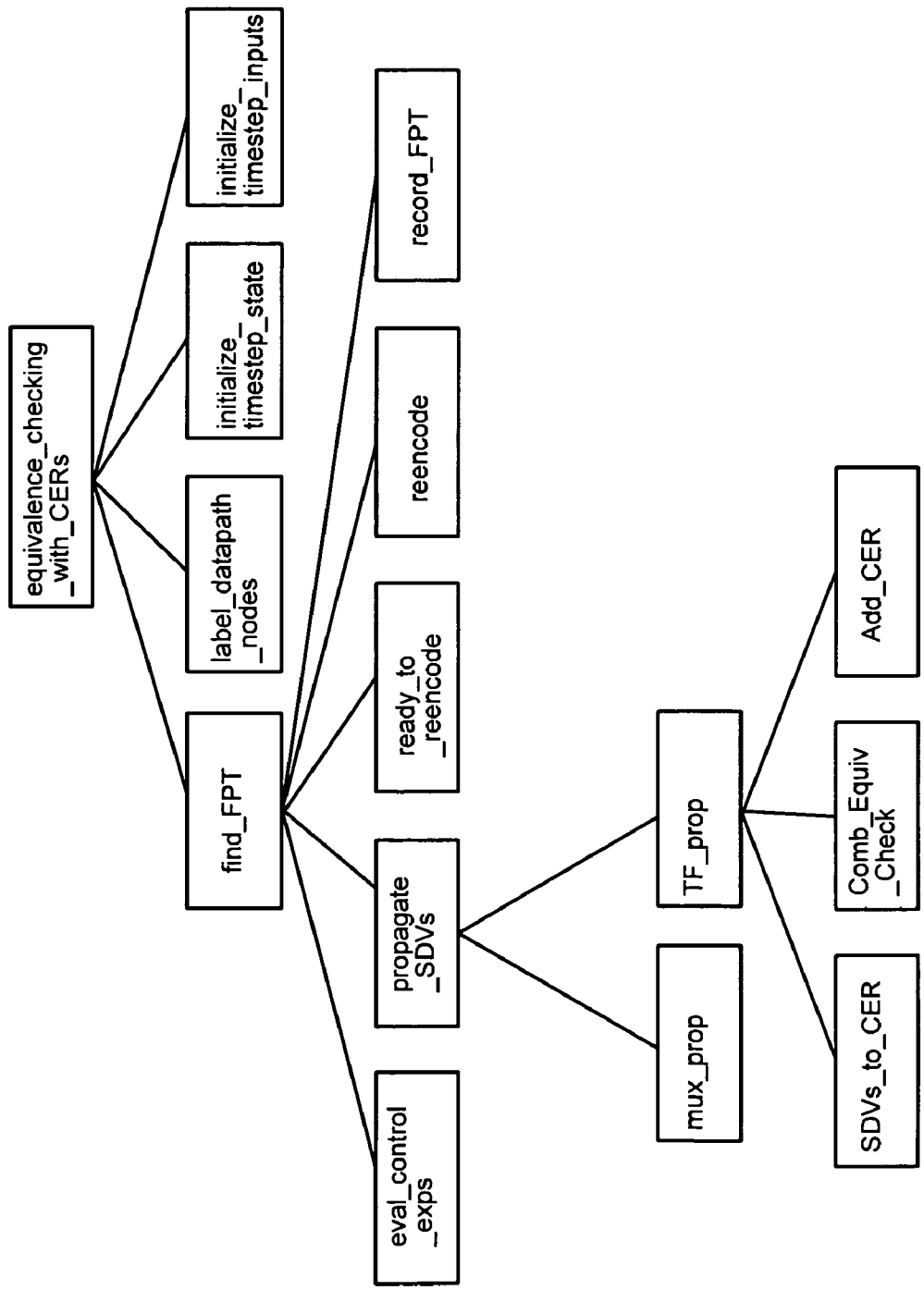
FIG. 23 depicts the hierarchical manner in which procedures are invoked by equivalence_checking_with_CERs.

A core equivalence-determining process can be performed by invoking equivalence_checking with_CERs as shown in FIG. 24. The hierarchical manner, in which procedures are invoked by equivalence_checking_with_CERs, is diagrammed in FIG. 23. As can be seen from FIG. 23, equivalence_checking_with_CERs directly invokes four procedures. One of the four procedures invoked, "find_FPT," directly invokes five additional procedures. One of the five procedures invoked by find_FPT, "propagate_SDVs," directly invokes two more procedures. One of the two procedures invoked by propagate_SDVs, "TF_prop," directly invokes three more procedures.

equivalence_checking_with_CERs calls find_FPT to find a first FPT. FIG. 24, lines 6-7. With respect to FIG. 19, this first call to find_FPT performs the equivalent of steps 4002 to 4007. The equivalent of step 4008, that adds timesteps to the ATR and initializes them in preparation for finding the second FPT, is performed by lines 9 to 23 of FIG. 24.

For the first call to find_FPT, the FPT found is stored in an array element FPT[0]. If the first call to find_FPT is successful, find_FPT is called again. If the first call to find_FPT is not successful, a counter example is generated and equivalence_checking_with_CERs returns the value FALSE. FIG. 24, lines 41-44.

Prior to the second call to find_FPT, the following steps (that correspond to step 4008 of FIG. 19) can be accomplished. ATR_end can be advanced. FIG. 24, line 9. The nodes of the additional timestep can be labeled by calling "label_datapath_nodes." FIG. 24, line 10. The present state of the just-added timestep can be set to the SDVs of the last timestep's next-state outputs by calling "initialize_timestep_state." FIG. 24, line 15. The primary inputs, of the just-added timestep, can be set by calling "initialize_timestep_inputs." FIG. 24, line 23.

For the second call to find_FPT (FIG. 24, lines 25-26), the FPT found can be stored in an array element FPT[1]. With respect to FIG. 19, this second call to find_FPT performs the equivalent of steps 4010 to 4015.

If the second call to find_FPT is not successful, a counter example can be generated and equivalence_checking_with_CERs can return FALSE. FIG. 24, lines 34-38.

If the second call to find_FPT is successful, the two FPTs can be compared. FIG. 24, line 27. This comparison corresponds to step 4016 of FIG. 19. If the two FPTs are the same, equivalence_checking_with_CERs returns the value TRUE. FIG. 24, line 28. If the two FPTs are not the same equivalence_checking_with_CERs returns the value FALSE since equivalence was only proven for some timesteps and not all. FIG. 24, line 32.

6.1.3. label_datapath_nodes

As was introduced above, a label identifier is a globally unique identifier for each datapath node of a miter. Label identifiers can be used, as described in the below section 6.1.12 "Add_CER," for insuring that equivalence classes of nodes, that have been determined by an equivalence-determining process, are combined according to a predictable ordering.

Labels can be generated, by label_datapath_nodes, as a sequence of increasing integers and they can be assigned to the nodes of a timestep in levelized order, starting from the primary inputs level and proceeding to the primary outputs level. By assigning labels in this manner it can be assured that an integer label for a node "x" will always be greater than any integer label for a node in the transitive fanin of "x." An example labeling procedure is shown in FIG. 30, 38-48.

Each call to label_datapath_nodes can act to label all nodes of just the particular timestep specified and then label_datapath_nodes can return to the calling procedure. If the highest integer assigned by label_datapath_nodes on a particular invocation is "n," the next time label_datapath_nodes is called, it can start assigning labels at "n+1." This type of "memory," between calls to label_datapath_nodes, can be accomplished by storing the value of the beginning label value, for the next invocation of label_datapath_nodes, in a global variable "beginning_label_value." The initial value for beginning_label_value, prior to the first invocation of label_datapath_nodes, can be "1."

At a certain point during the SDV propagation process (i.e., when it is desired to reencode a timestep), beginning_label_value can be set back to "1."

6.1.4. initialize_timestep_state

Performs a simple form of SDV propagation when a new timestep is added to an ATR: each present-state input of the just-added timestep is set to the SDV of the corresponding next-state output of the last timestep.

6.1.5. initialize_timestep_inputs

When called, initialize_timestep_inputs can initialize datapath primary inputs, and control primary inputs, as follows.

For the datapath primary inputs, initialization can be accomplished as follows. For each pair of corresponding primary inputs, one from RTLM_ts and one from HLM_ts, they can share the same integer SDV to indicate they are always set to the same value. Correspondence, for purposes of identifying a pair of corresponding primary inputs, can be determined by the primary inputs sharing the same timestep-independent names.

For the control primary inputs, initialization can be accomplished as follows. For each pair of corresponding primary inputs, one from RTLM_ts and one from HLM_ts, they can share the same symbolic Boolean variable to indicate they are always set to the same Boolean value. The symbolic Boolean variables created can include an indication of the timestep for which they are created. Correspondence, for purposes of identifying a pair of corresponding primary inputs, can be determined by the primary inputs sharing the same timestep-independent names.

6.1.6. find_FPT

6.1.6.1. Overview

Pseudo-code for find_FPT is depicted in FIGS. 25A-25B.

find_FPT's goal is as follows. Given a sequence of timesteps, beginning at the last timestep "ATR_begin" to be encoded (or reencoded), up to a latest timestep "ATR_end," propagate SDVs such that, from timestep ATR_begin to a timestep "t_ready-1," the following conditions for doing a reencode (tested for by "ready_to_preencode," FIG. 25A, line 29) are satisfied:

All primary outputs, of RTLM_ts[ATR_begin] to RTLM_ts[t_ready-1] and of HLM_ts[ATR_begin] to HLM_ts[t_ready-1], have SDVs;

All next state outputs, of RTLM_ts[ATR_begin] to RTLM_ts[t_ready-1] and of HLM_ts[ATR_begin] to HLM_ts[t_ready-1], have SDVs; and For CS_ts[ATR_begin] to CS_ts[t_ready-1], the "q" output indicates RTLM_dfg=HLM_dfg.

If the conditions for a reencode are satisfied, then timestep "t_ready-1" is the timestep just before the next timestep to be reencoded. The timestep at t_ready is reencoded (by "reencode," FIG. 25A, line 37) and the FPT of timestep tready is recorded (by "record_FPT," FIG. 25A, line 42) as the following:

For each signal of RTLM_ts[tready] and HLM_ts[t_ready], the correspondence between the timestep-independent name of the signal and its SDV value.

It should be noted that within an FPT, as defined above, the indices of control inputs, in any ITE-SDV expressions present, are expressed relative to the last timestep to be reencoded (or, if a reencode has not yet occurred, relative to the initial timestep of the miter).

The last timestep to be reencoded, as indicated by "ATR_begin," is updated to the value of t_ready.

If the conditions for a reencode are not satisfied, find_FPT can try adding another timestep to the range of timesteps within which it seeks to find equivalences. This can be accomplished by incrementing latest_timestep. If a maximum number of timesteps have been tried, and the conditions for a reencode are still not satisfied, then find_FPT can return value of FALSE.

6.1.6.2. Further Details

A more detailed discussion, of the pseudo-code for find_FPT, is as follows.

Each iteration of the "while" loop of find_FPT (see FIG. 25A, line 10 to FIG. 25B, line 27), represents an attempt by find_FPT to satisfy the conditions for reencoding. SDVs are propagated, within the range of timesteps ATR_begin to ATR_end, by invoking the procedures "eval_control_exps" and "propagate_SDVs." With respect to FIG. 19, the execution of "eval_control exps" and "propagate_SDVs" corresponds to the application of an SDV propagation process by step 4002 or 4011.

eval_control_exps (FIG. 25A, line 13) evaluates the control expressions of RTLM_ts[ATR_end] and HLM_ts [ATR_end].

propagate_SDVs (FIG. 25A, line 19) seeks to fully propagate SDVs from RTLM_ts[AT Rbegin] to RTLM_ts [ATR_end] and from HLM_ts[ATR_begin] to HLM_ts [ATR_end]. More detailed discussion of the operations of propagate_SDVs is discussed in the below section 6.1.8 "propagate_SDVs."

find_FPT then tests for whether the conditions for a reencode have been satisfied with the procedure "ready_to_reencode." FIG. 25A, lines 29-30. With respect to FIG. 19, the execution of "ready_to_reencode" corresponds to the testing performed by step 4003 or 4012.

If ready_to_reencode fails, find_FPT can test whether ATR_end has been set to its maximum value. FIG. 25B, line 2. With respect to FIG. 19, such testing corresponds to step 4004 or 4013. If ATR_end is set to its maximum value, find_FPT can end and return a value of FALSE. FIG. 25B, lines 3-6. With respect to FIG. 19, this corresponds to step 4007 or

4015. If ATR_end is not set to its maximum value, find_FPT can do the following (which corresponds to step 4005 or step 4010 of FIG. 19):

increments ATR_end (FIG. 25B, line 9);

levelized labeling of the nodes of RTLM_ts[ATR_end] and HLM_ts[ATR_end] with the procedure "label_datapath_nodes" (FIG. 25B, line 10), where the labels can proceed incrementally from the last label used when label_datapath_nodes was last called;

initialize the present state of RTLM_ts[ATR_end] and HLM_ts[ATR_end] with the next-state SDVs of RTLM_ts[ATR_end-1] and HLM_ts[ATR_end-1] (See call to "initialize_timestep_state" at FIG. 25B, line 15);

initialize the datapath and control primary inputs of RTLM_ts[ATR_end] and HLM_ts[ATR_end] (See call to "initialize_timestep_inputs" at FIG. 25B, lines 22-23); and continue the "while" loop by setting try_next_timestep to TRUE (FIG. 25B, line 24).

If ready_to_reencode succeeds, it can return a value of TRUE and set one of its parameters (e.g., the variable "t_ready-1") to the location of the timestep just before the timestep to be reencoded. The following steps, that correspond to step 4006 or 4014 of FIG. 19, can also be done. Reencoding, of the timestep at t_ready, can be accomplished by invoking "reencode." FIG. 25A, line 37. The FPT, of the timestep at t_ready, can be extracted by calling the procedure "record_FPT." FIG. 25A, line 42. Further, a variable that indicates the last timestep to be reencoded (e.g., "ATR_begin") can be updated to the value of t_ready. FIG. 25A, line 45. find_FPT can then return by setting try_next_timestep to FALSE. FIG. 25A, line 47.

6.1.7. eval_control_exps

Each time a timestep is added by find_FPT, its control expressions need to be evaluated. This is accomplished by invoking eval_control_exps. FIG. 25A, line 13.

6.1.8. propagate_SDVs propagate_SDVs executes a "while" loop. FIG. 26, lines 12-24. The "while" loop applies the procedures "mux_prop" (FIG. 26, line 19) and "TF_prop" (FIG. 26, line 23). So long as mux_prop or TF_prop returns a value of TRUE (and each of these procedures returns a value of TRUE when it is able to cause a change to the DFG to which it is applied), propagate_SDVs will continue to iterate its "while" loop.

6.1.9. reencode

Reencoding, of a timestep at t=t_ready, can be accomplished as follows.

The procedure "label_datapath_nodes" can be "reset" such that, upon its next invocation, it will label the nodes of a specified timestep starting from the lowest integer value it can assign. label_datapath_nodes can then be applied to the timestep at t=t_ready such that all of the labels of that timestep are overwritten.

For each present-state input "PSinput_x" to a timestep t_ready, its current SDV value "curr_SDV_PSinput_x" can be replaced by its newly-assigned label value "new_SDV_PSinput_x." Then, wherever else, in timestep t_ready (or in a later timestep), curr_SDV_PSinput_x appears, it can be replaced by new_SDV_PSinput_x.

Similarly, for each primary input "Pinput_x" to a timestep t_ready, its current SDV value "curr_SDV_Pinput_x" can be replaced by its newly-assigned label value "new_SDV_Pinput_x." Then, wherever else, in timestep tready (or in a later timestep), curr_SDV_Pinput_x appears, it can be replaced by new_SDV_Pinput_x.

6.1.10. mux_prop

Without loss of generality, mux_prop is described herein as applied to two-input multiplexers. Anyone of ordinary skill in the art will readily appreciate how to adapt mux_prop to multiplexers with a greater number of inputs.

mux_prop propagates SDVs through a multiplexer "X," provided that the following conditions are met: each data input to "X" has an SDV and the control input to "X" has a symbolic Boolean expression (referred to herein as "SBV_X").

If we refer to the SDV at each input of "X" as SDV_1 and SDV_2, where SDV_1 is selected if SBV_X is true while otherwise SDV_2 is selected, the function of mux_prop is to produce the following ITE SDV for the output of "X":

ITE(SBV_X,SDV_1,SDV_2)

6.1.11. TF_prop

TF_prop operates as follows. Please see FIG. 27.

TF_prop contains an outer loop that iterates over each pair of TFs (TF1 and TF2) in the miter DFG. FIG. 27, line 4. For each pair of TFs, an inner loop iterates over each pair of inputs TF1_in and TF2_in, where TF1_in is an input of TF1 and TF2_in is an input of TF2. FIG. 27, lines 6-7.

The CER between TF1_in and TF2_in, referred to herein as "CER_TF1in_TF2in," is determined. FIG. 27, lines 9-10. CER TF1_in_TF2 in can be determined by obtaining the SDV for TF1_in and the SDV for TF2_in (with the procedure "get_SDV_4node"). Another procedure, referred to as "SDVs_to_CER," can determine whether there is any set of conditions CER_TF1in_TF2 in for which the SDV for TF1_in and the SDV for TF2_in evaluate to the same value.

The CER CER_TF1in_TF2 in produced by SDVs_to_CER can be tested (by procedure "CER_can_be_true") for whether it is satisfiable. FIG. 27, line 12. For example, if there is no set of conditions for which the SDV for TF1_in and the SDV for TF2_in produce the same value, then the CER CER_TF1in_TF2 in produced by SDVs_to_CER will always be FALSE.

If CER_TF1in_TF2 in is satisfiable, then it is possible for TF1 and TF2, under certain conditions, to produce the same outputs. To determine for certain whether this is the case, and under what conditions, the following steps can be done. A combinational equivalence check can be done between TF1 and TF2 by calling the procedure "Comb_Equiv_Check." FIG. 27, line 13. Comb_Equiv_Check returns a value of TRUE if TF1 and TF2 compute the same combinational function. Comb_Equiv_Check determines that, for each input "x1" to TF1 there is a corresponding input "x2" of TF2 that performs the same function. If Comb_Equiv_Check returns a value of TRUE, then a further determination can be done to see whether there is a CER, called "CER_TF1out_TF2out," for which TF1 and TF2 do produce the same outputs. FIG. 27, lines 19-20.

For example, if there is a CER_TF1out_TF2out that, if satisfied, causes each pair of corresponding inputs, between TF1 and TF2, to receive the same values, then it has been determined that the value produced by TF1_out always equals the value of TF2_out.

If a non-null CER_TF1out_TF2out is found, "Add_CER" can be called. FIG. 27, lines 22-24. Add_CER can adjust the SDVs, of TF1_out and TF2_out, such that they evaluate to the same value when the conditions of CER_TF1out_TF2out are satisfied.

6.1.12. Add_CER

6.1.12.1. Overview

The basic function of Add_CER is to couple two pre-existing equivalence classes (the equivalence class of nodes in the CER transitive closure of TF1_out and the equivalence class of nodes in the CER transitive closure of TF2_out) to produce a new combined equivalence class.

To accomplish this, a new SDV (also referred to as "SDVnew") is determined for each node of the new combined equivalence class. Each SDVnew is determined in terms of the pre-existing SDVs and in a particular order. The order in which a node is selected, for a determination of its SDVnew, is determined by the node's label identifier. A label identifier is globally unique for each node of a miter DFG. Having label identifiers assigned according to a predetermined ordering procedure insures that pre-existing equivalence classes are combined according to a predetermined ordering that produces the following property:

Assume a first application of find_FPT produces two pre-existing equivalence classes "pre_EC1" and "pre_PEC2," with the combined equivalence class referred to as "com_EC1."

Assume a second application of find_FPT produces two pre-existing equivalence classes "pre_EC3" and "pre_PEC4," with the combined equivalence class referred to as "com_EC2."

Assume that "pre_EC1" is equivalent to "pre_EC3" and "pre_EC2" is equivalent to "pre_EC4."

Then, "com_EC1" will be equivalent to "com_EC2."

Suitable label identifiers can be, for example, positive integers. With integer label identifiers, each SDVnew can be determined, in terms of the pre-existing SDVs, according to the following order. Without loss of generality, assume the label identifiers, of both pre-existing equivalence classes, combine to form a set of integers "1" to "n." For the node with label identifier "1," its SDVnew can be the same as its current SDV. For the node with label identifier "2," its SDVnew can be expressed in terms of the current SDV for the node with label identifier "1." In general, for any node "k," where "1"<"k"<"n," its SDVnew can be expressed in terms of the SDVnew for each node with a label identifier less than "k."

6.1.12.2. Pseudo-Code

Add_CER begins by determining the CER transitive closure of all nodes of the miter that are connected to TF1_out or TF2_out. FIG. 28A, lines 5-9. This transitive closure is referred to as "nodeset." An example procedure, for determining the CER transitive closure, is shown in FIG. 30, lines 6-28, as "determineConnectedNodeSet."

Each node of nodeset can be initialized as follows. FIG. 28A, lines 13-17. SDVnew can be set to the label identifier. If the node does not already have an SDV, it is set to the label identifier.

An outer loop of Add_CER (FIG. 28B, lines 1-2) iterates over each node "nlow" of nodeset, in order of decreasing label identifier value.

An inner loop of Add_CER (FIG. 28B, lines 4-5) can determine the set of all nodes whose node labels are greater than nlow's and can iterate over each node "nhigh" of that set, in order of decreasing label identifier value.

Thus, nhigh always points to a node whose label identifier is greater than nlow's.

For each pair, nlow, nhigh, an SDVnew for nhigh is constructed. FIG. 28B, line 25. The condition "c1|c2|c3" of the SDVnew is the CER between nlow and nhigh, determined using the current SDVs. In general, either all of "c1," "c2" and "c3" are FALSE, or only one of "c1," "c2" and "c3" evaluates to a non-FALSE value.

The statement for evaluating c1 seeks to find a CER between nlow and nhigh in the following way. FIG. 28B, lines 9-12. It is assumed that nlow is in the same pre-existing equivalence class with TF1_out and it is assumed that nhigh is in the same pre-existing equivalence class with TF2_out. If either of these assumptions is not true, c1 evaluates to a FALSE value.

The statement for evaluating c2 seeks to find a CER between nlow and nhigh in the following way. FIG. 28B, lines 15-18. It is assumed that nlow is in the same pre-existing equivalence class with TF2_out and it is assumed that nhigh is in the same pre-existing equivalence class with TF1_out. If either of these assumptions is not true, c2 evaluates to a FALSE value.

The statement for evaluating c3 seeks to find a CER between nlow and nhigh in the following way. FIG. 28B, lines 21-22. It is assumed that nlow is in the same pre-existing equivalence class with nhigh. If this assumption is not true, c3 evaluates to a FALSE value.

7. Example

To illustrate the operation of the above-described pseudo-code, this section presents an example simulation of the "test_for_equivalency" procedure. Each pseudo-coded procedure invoked, directly or indirectly, by test_for_equivalency is also part of the example simulation.

7.1. test_for_equivalency

This example simulation does not start with examples for source HLM and RTLM.

The production of $HLM_{DFG}$ and $RTLM_{DFG}$, from HLM and RTLM, is also not shown. As described above, such production can be performed by test_for_equivalency calling RTLM_2_DFG and HLM_2_DFG. FIG. 2B, line 5 and line 8.

The example simulation begins with $HLM_{DFG}$ and $RTLM_{DFG}$ already produced. Such example DFGs are shown in FIG. 20A as DFGs 4200 and 4201. One of the DFGs can be $HLM_{DFG}$ and the other $RTLM_{DFG}$.

Figure 20B:
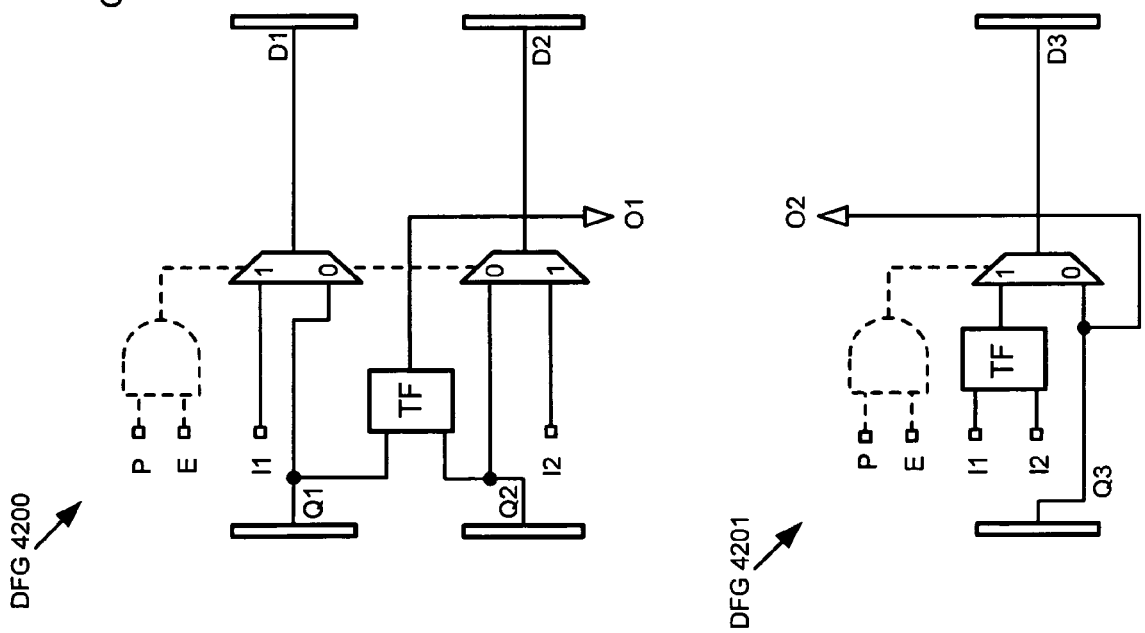
FIG. 20B presents, for an example application of an equivalence-determining process, DFGs 4200 and 4201 in timestep form.

FIG. 20B depicts DFGs 4200 and 4201 in timestep form, as can be accomplished by test_for_equivalency calling generate_timestep. FIG. 2B, line 14 and line 15. HLM_ts and RTLM_ts can be generated such that, for each timestep used, the control and datapath sections identified. FIG. 20B shows the control sections are comprised of dashed lines while the datapath is comprised of solid lines.

A suitable combining structure, for DFGs 4200 and 4201 of FIG. 20B, can be selected by calling generate_test_bench. FIG. 2B, line 21. generate_test_bench can operate as follows.

DFGs 4200 and 4201 of FIG. 20B can both be classified as being of type "unknown."

According to the combining structure decision matrix (see FIG. 17), a "cycle-accurate" $CS_{ts}$ can be chosen. FIG. 21A shows a $CS_{ts}[0]$ 4310, along with DFGs 4200 and 4201 renumbered as 4300 and 4301.

Since the search for equivalence is defined to begin at time "t=0," FIG. 2B, lines 23-24, show the variables "ATR_begin" and "ATR_end" set to zero.

The resulting timestep, $RTLM_{ts}[0]$, $HLM_{ts}[0]$ and $CS_{ts}[0]$, can have its nodes labeled in levelized order by label_datapath_nodes. FIG. 2B, line 27.

FIG. 21A shows the levelized labeling of nodes as follows: to conserve graphical space in the drawing, a label is indicated in FIG. 21A as a number placed in-between two periods. (It should be noted that the levelized labeling of FIG. 21A is correct, so long as one assumes the following two pairs of nodes each represents a single: node "I1" of DFG 4300 and node "I1" of DFG 4301 represent a singled node labeled "4;" and node "I2" of DFG 4300 and node "I2" of DFG 4301 represent a singled node labeled "5." The same assumption applies for nodes "I1" and "I2," in FIGS. 21G and 21L.)

$RTLM_{ts}[0]$ and $HLM_{ts}[0]$ can be initialized by calling "initialize_initial_timestep." FIG. 2B, lines 32-33. The datapath and control primary inputs of $RTLM_{ts}[0]$ and $HLM_{ts}$

[0] can be set by calling "initialize_timestep_inputs." FIG. 2B, line 40. A resulting state for the first timestep is shown in FIG. 21B. As was noted above, in section 6.1.1 ("Overview"), the setting of "O1," "O2" and "Q3" to the same SDV can be accomplished under "manual" direction by the designer.

The core equivalence-determining process can begin by calling "equivalence_checking_with CERS." FIG. 2B, lines 42-43.

7.2. equivalence_checking_with_CERs

The example application of equivalence_checking_with_CERs operates as follows.

equivalence_checking_with_CERs begins by applying find_FPT (FIG. 24, lines 6-7) to FIG. 21B to produce FIG. 21K. See below section 7.3.1 ("Application of find_FPT to FIG. 21B") for the FPT loaded into FPT[0].

equivalence_checking_with_CERs adds another timestep (FIG. 24, line 9) to produce FIG. 21L.

Also shown in FIG. 21L is the initialization of the additional timestep by label_datapath_nodes, initialize_timestep_state and initialize_timestep_inputs. FIG. 24, lines 10-23.

equivalence_checking_with_CERs applies find_FPT (FIG. 24, lines 25-26) to FIG. 21L to produce FIG. 21Q. See below section 7.3.2 ("Application of find_FPT to FIG. 21L") for the FPT loaded into FPT[1].

The two FPTs found are compared. FIG. 24, line 27.

Since the two FPTs are the same (except for the indices of the symbolic Boolean variables applied to control ITE SDVs), equivalence_checking_with_CERs returns TRUE.

7.3. find_FPT

The example applications of find_FPT are as follows.

7.3.1. Application of find_FPT to FIG. 21B

The result of applying eval_control_exps to FIG. 21B is shown in FIG. 21C.

The result of applying propagate_SDVs to FIG. 21C is shown in FIG. 21F. More detailed discussion of the operations of propagate_SDVs, that produces the change from FIGS. 21C to 21F, is discussed in the below section 7.5 "propagate_SDVs."

ready_to_reencode fails when applied to FIG. 21F.

It is assumed the maximum value for latest timestep is not reached, and another timestep is added as is shown in FIG. 21G.

The timestep added in FIG. 21G can be labeled by calling the procedure "label_datapath_nodes" (FIG. 25B, line 10).

The timestep added can have its present state initialized by calling the procedure "initialize_timestep_state" (FIG. 25B, line 15).

The timestep added and can have its datapath and control primary inputs initialized by calling the procedure "initialize_timestep_inputs" (FIG. 25B, line 22).

In the next iteration of the "while" loop, invocation of the procedures "eval_control exps" and "propagate SDVs" on FIG. 21G produces the DFG of FIG. 21I.

When ready_to_reencode is applied to the DFG of FIG. 21I, the conditions for a reencode are satisfied and ready_to_reencode sets t_ready to one. Given that ATR_begin is set to zero, the conditions for a reencode are satisfied by FIG. 21I as follows:

All primary outputs, of RTLM_ts[0] to RTLM_ts[0] and of HLM_ts[0] to HLM_ts[0], have SDVs;

All next state outputs, of RTLM_ts[0] to RTLM_ts[0] and of HLM_ts[0] to HLM_ts[0], have SDVs; and For CS_ts[0] to CS_ts[0], the "q" output indicates RTLM_dfg=HLM_dfg.

Since timestep 0 of FIG. 21I satisfies ready_to_reencode, the procedure "reencode" (FIG. 25A, line 37) is applied to timestep 1 of FIG. 21I to yield FIG. 21J.

FIG. 21K is the same as FIG. 21J, except that non-reencoded values are omitted to make it visually easier to see the values comprising the FPT recorded by record_FPT (FIG. 25A, line 42). The FPT of FIG. 21K is as follows:

For present state inputs:
Q1=1
Q2=2
Q3=3
For primary inputs:
I1=4
I2=5
the remaining signals:
D1=ITE(P[1]*E[1],4,1)
D2=ITE(P[1]*E[1],5,2)

Note that the indices of control inputs in ITE-SDVs (i.e., "P" and "E") are expressed relative to timestep 1, which is the latest timestep to be reencoded (in the Figures, the indices of "P" and "E" are expressed without brackets).

7.3.2. Application of find_FPT to FIG. 21L

In the first iteration of the "while" loop, for the second call to find_FPT, invocation of the procedures "eval_control_exps" and "propagate_SDVs" on FIG. 21L produces the DFG of FIG. 21N.

When ready_to_reencode is applied to the DFG of FIG. 21N, the conditions for a reencode are satisfied and ready_to_reencode sets its parameter t_ready to two. Given that ATR_begin is set to one, the conditions for a reencode, that are satisfied by FIG. 21N, are as follows:

All primary outputs, of RTLM_ts[1] to RTLM_ts[1] and of HLM_ts[1] to HLM_ts[1], have SDVs;

All next state outputs, of RTLM_ts[1] to RTLM_ts[1] and of HLM_ts[1] to HLM_ts[1], have SDVs; and For CS_ts[1] to CS_ts[1], the "q" output indicates RTLM_dfg=HLM_dfg.

Since timestep 1 of FIG. 21N satisfies ready_to_reencode, the procedure "reencode" is applied to timestep 1 of FIG. 21N to yield FIG. 21P.

FIG. 21Q is the same as FIG. 21P, except that non-reencoded values are omitted to make it visually easier to see the values comprising the FPT recorded by application of record_FPT. The FPT of FIG. 21Q is as follows:

For present state inputs:
Q1=1
Q2=2
Q3=3
For primary inputs:
I1=4
I2=5
For the remaining signals:
D1=ITE(P[2]*E[2],4,1)
D2=ITE(P[2]*E[2],5,2)

Note that the indices of control inputs in ITE-SDVs (i.e., "P" and "E") are expressed relative to timestep 2, which is the latest timestep to be reencoded.

7.4. eval_control_exps

The example applications of eval_control_exps are as follows.

The transition from FIG. 21B to FIG. 21C is a result of an application of eval_control_exps. As can be seen, the control circuitry comprises an AND gate in DFG 4300 and an AND gate in DFG 4301. In FIG. 21C, the symbolic Boolean variables, at the inputs to these AND gates have resulted in the symbolic Boolean expression at the output of each AND gate.

FIG. 21G shows the addition of a timestep at time one and the evaluation of symbolic Boolean variables at the inputs to the AND gates of DFGs 4302 and DFG 4303 is shown in FIG. 21H.

FIG. 21L shows the addition of a timestep at time two and the evaluation of symbolic Boolean variables at the inputs to the AND gates of DFGs 4304 and DFG 4305 is shown in FIG. 21M.

7.5. propagate_SDVs

The example applications of eval_control_exps are as follows.

7.5.1. Applied to FIG. 21C propagate_SDVs can be applied to FIG. 21C to produce the DFG of FIG. 21F.

First, propagate_SDVs can apply mux_prop to the DFG of FIG. 21C to produce FIG. 21D. As can be seen, an ITE SDV has been propagated to the output of each multiplexer of DFG 4300. Since the DFG changed from FIG. 21C to FIG. 21D, mux_prop returns a value of TRUE.

Next, propagate_SDVs can apply TF_prop to the DFG of FIG. 21D to produce FIG. 21F. Since the DFG did not change, from FIG. 21D to FIG. 21F, TF_prop returns a value of FALSE.

propagate_SDVs will execute its "while" loop a second time, since mux_prop returned a value of TRUE on the first iteration. On the second iteration of the "while" loop, both mux_prop and TF_prop return a value of FALSE and so propagate_SDVs returns.

7.5.2. Applied to FIG. 21G propagate_SDVs can be applied to FIG. 21G to produce the DFG of FIG. 21I.

On a first iteration of the "while" loop, mux_prop can be applied to the DFG of FIG. 21G to produce FIG. 21H. As can be seen, an ITE SDV has been propagated to the output of each multiplexer of DFG 4302. Since the DFG changed from FIG. 21G to FIG. 21H, mux_prop returns a value of TRUE.

TF_prop can be applied to the DFG of FIG. 21H to produce FIG. 21I. As can be seen, an ITE SDV has been propagated to the output of the TF of DFG 4302. Also, an integer SDV has been propagated to the output of the TF of DFG 4301. Since the DFG changed from FIG. 21H to FIG. 21I, TF_prop returns a value of TRUE.

On a second iteration of the "while" loop, both mux_prop and TF_prop return FALSE, and propagate_SDVs ends.

7.5.3. Applied to FIG. 21L propagate_SDVs can be applied to FIG. 21L to produce the DFG of FIG. 21N.

On a first iteration of the "while" loop, mux_prop can be applied to the DFG of FIG. 21L to produce FIG. 21M. As can be seen, an ITE SDV has been propagated to the output of each multiplexer of DFG 4304. Since the DFG changed from FIG. 21L to FIG. 21M, mux_prop returns a value of TRUE.

TF_prop can be applied to the DFG of FIG. 21M to produce FIG. 21N. As can be seen, an ITE SDV has been propagated to the output of the TF of DFG 4304. Also, an integer SDV has been propagated to the output of the TF of DFG 4303. Since the DFG changed from FIG. 21M to FIG. 21N, TF_prop returns a value of TRUE.

On a second iteration of the "while" loop, both mux_prop and TF_prop return FALSE, and propagate_SDVs ends.

7.6. TF_prop

The example applications of TF_prop are as follows.

7.6.1. Applied to FIG. 21D

Application of TF_prop to FIG. 21D produces FIG. 21F.

In FIG. 21D there are only two TFs: the TF of DFG 4300 (referred to herein as TF 4300) and the TF of DFG 4301 (referred to herein as TF 4301). Therefore, there is only one pair of TFs that can be iterated over by the outer loop of TF_prop. For each pair of inputs, between TF 4300 and TF 4301, the CER_TF1in_TF2in is null. This inability to find any CERs CER_TF1in_TF2in is represented by FIG. 21E being the same as FIG. 21D.

Since no non-null values for CER_TF1in_TF2 in are produced, no values for CER_TF_out_TF2out are produced. This inability to find any CERs CER_TF_out_TF2out is represented by FIG. 21F being the same as FIG. 21E.

7.6.2. Applied to FIG. 21H

Application of TF_prop to FIG. 21H produces FIG. 21I.

The net result for SDV propagation, in going from FIG. 21H to 431, is as follows: the output of the TF of DFG 4302 (referred to herein as TF 4302) is assigned ITE SDV "ITE (NOT(P0*E0), 3, 8)" and the output of TF 4301 is assigned integer SDV "8." TF_prop achieves this propagation as follows.

In FIG. 21H there are four TFs: TF 4300, TF 4301, the TF 4302 and the TF of DFG 4303 (referred to herein as TF 4303). Between these four TFs, the following six pairs can be iterated over by the outer loop of TF_prop: (TF 4300, TF 4301), (TF 4302, TF 4303), (TF 4300, TF 4302), (TF 4301, TF 4303), (TF 4300, TF 4303) and (TF 4301, TF 4302).

From among these six pairs, only the following two produce a CER CER_TF_out_TF2out: (TF 4300, TF 4302) and (TF 4301, TF 4302).

7.6.2.1. Pair (TF4300, TF4302)

For (TF 4300, TF 4302), the actions of TF_prop are as follows.

For (TF 4300, TF 4302) the two CERs of type CER_TF1 in_TF2 in are as follows. The first is the CER "NOT(P0*E0)" between the following two inputs: the input of TF 4300 with integer SDV "1" (which input is indicated in FIG. 21I by an arrow labeled "CER 5") and the input of TF 4302 with ITE SDV "ITE(P0*E0,4,1)" (which input is indicated in FIG. 21I by an arrow labeled "CERs 3,5"). The second is the CER "NOT(P0*E0)" between the following two inputs: the input of TF 4300 with integer SDV "2" (which input is indicated in FIG. 21I by an arrow labeled "CER 6") and the input of TF 4302 with ITE SDV "ITE(P0*E0,5,2)" (which input is indicated in FIG. 21I by an arrow labeled "CERs 4,6"). The resulting CER_TF_out_TF2out, between the output of TF 4300 and TF 4301, is "NOT(P0*E0)."

Add_CER is called with its parameters set as follows:
CER_TF_out_TF2out=NOT(P0*E0)
TF1_out=output of TF 4300
TF2_out=output of TF 4302

The detailed actions of Add_CER, with the above parameters, is covered in the below section 7.7 "Add_CER." FIG. 22A shows a simplified view of FIG. 21H. Operations of Add_CER can result in FIG. 22A being transformed to FIG. 22E, where the output of TF 4302 is given ITE SDV "ITE (NOT(P0*E0), 3,19)."

7.6.2.2. Pair (TF4301, TF4302)

For (TF 4301, TF 4302), the actions of TF_prop are as follows.

For (TF 4301, TF 4302) the two CERs of type CER_TF1 in_TF2 in are as follows. The first is the CER "P0*E0" between the following two inputs: the input of TF 4301 with integer SDV "4" (which input is indicated in FIG. 21I by an arrow labeled "CER 3") and the input of TF 4302 with ITE SDV "ITE(P0*E0,4,1)" (which input is indicated in FIG. 21I by an arrow labeled "CERs 3,5"). The second is the CER "P0*E0" between the following two inputs: the input of TF 4301 with integer SDV "5" (which input is indicated in FIG. 21I by an arrow labeled "CER 4") and the input of TF 4302 with ITE SDV "ITE(P0*E0,5,2)" (which input is indicated in FIG. 21I by an arrow labeled "CERs 4,6"). The resulting CER_TF_out_TF2out, between the output of TF 4301 and TF 4302, is "P0*E0."

Add_CER is called with its parameters set as follows:
CER_TF_out_TF2out=P0*E0
TF1_out=output of TF 4301
TF2_out=output of TF 4302

The detailed actions of Add_CER, with the above parameters, is covered in the below section 7.7 "Add_CER." To summarize, however, operations of Add_CER can result in FIG. 22E being transformed to FIG. 22K, where the output of TF 4302 is given ITE SDV "ITE(NOT(P0*E0),3,8)" and the output of TF 4301 is given integer SDV "8." FIG. 22K has the final result that is seen in FIG. 21I.

7.6.3. Applied to FIG. 21M

Application of TF_prop to FIG. 21M produces FIG. 21N. Production of FIG. 21N from FIG. 21M is the same (except for the timestep numbers involved) as production of FIG. 21I from FIG. 21H.

7.7. Add_CER

The example applications of Add_CER are as follows. The below applications of Add_CER are only those invoked by TF_prop in the above section 7.6.2 ("Applied to FIG. 21H"). Since action of Add_CER cannot be seen in the transition from FIG. 21H to 431, it is discussed with respect to FIG. 22 (which presents a simplified view of FIG. 21H).

7.7.1. Applied to FIG. 22A

As discussed above in section 7.6.2.1 ("Pair (TF 4300, TF 4302)"), when processing the miter state of FIG. 22A, Add_CER can be called with its parameters set as follows:
CER_TF1out_TF2out=NOT(P0*E0)
TF1_out=output of TF 4300
TF2_out=output of TF 4302

The detailed actions of Add_CER, with the above parameters, are depicted in FIGS. 29A-29B. FIGS. 29A-29B identify nodes by their label numbers. For example, line 5 of FIG. 29A refers to TF1_out as "node_labeled_9," rather than as the output of TF 4300.

The net result of Add_CER executing the actions of FIG. 29A is to convert FIG. 22A to the state shown in FIG. 22B. The net result of Add_CER executing the actions of FIG. 29B is to convert FIG. 22B to the state shown in FIG. 22E. Step-by-step, the actions shown by FIGS. 29A-29B are as follows.

Lines 3-6 of FIG. 29A show the parameter values with which Add_CER is called.

FIG. 29A at lines 9-12 shows the determination of nodeset.

FIG. 29A, lines 15-18 show the initialization of SDV and SDVnew values.

FIG. 29A, line 22 shows the nodes of nodeset in descending order.

FIG. 29A at lines 25-27 show the selection of the first (nlow, nhigh) pair: (node_labeled_9, node_labeled_19).

For (node_labeled_9, node_labeled_19), only c1 evaluates to a non-zero value (of "NOT(P0*E0)") and such evaluation is shown at lines 30-35 of FIG. 29A.

FIG. 29A, lines 38-40 show the determination of SDVnew for node_labeled_19.

FIG. 29B at lines 1-24 show the actions performed for the (nlow, nhigh) pair: (node_labeled_3, node_labeled_19). The net result of Add_CER executing the actions of FIG. 29B, lines 1-24, is to convert FIG. 22B to the state shown in FIG. 22C.

FIG. 29B at lines 27-41 show the actions performed for the (nlow, nhigh) pair: (node_labeled_3, node_labeled_9). The net result of Add_CER executing the actions of FIG. 29B, lines 27-41, is to convert FIG. 22C to the state shown in FIG. 22D.

FIG. 29B at lines 44-49 show the actions performed after all (nlow, nhigh) pairs have been iterated over. The net result of Add_CER executing the actions of FIG. 29B, lines 44-49, is to convert FIG. 22D to the state shown in FIG. 22E.

7.7.2. Applied to FIG. 22E

As discussed above in section 7.6.2.2 ("Pair (TF 4301, TF 4302)"), when processing the miter state of FIG. 22E, Add_CER can be called with its parameters set as follows:
CER_TF1_out_TF2out=P0*E0
TF1_out=output of TF 4301
TF2_out=output of TF 4302

The detailed actions of Add_CER, with the above parameters, are depicted in FIGS. 29C-29E.

Figure 22F:
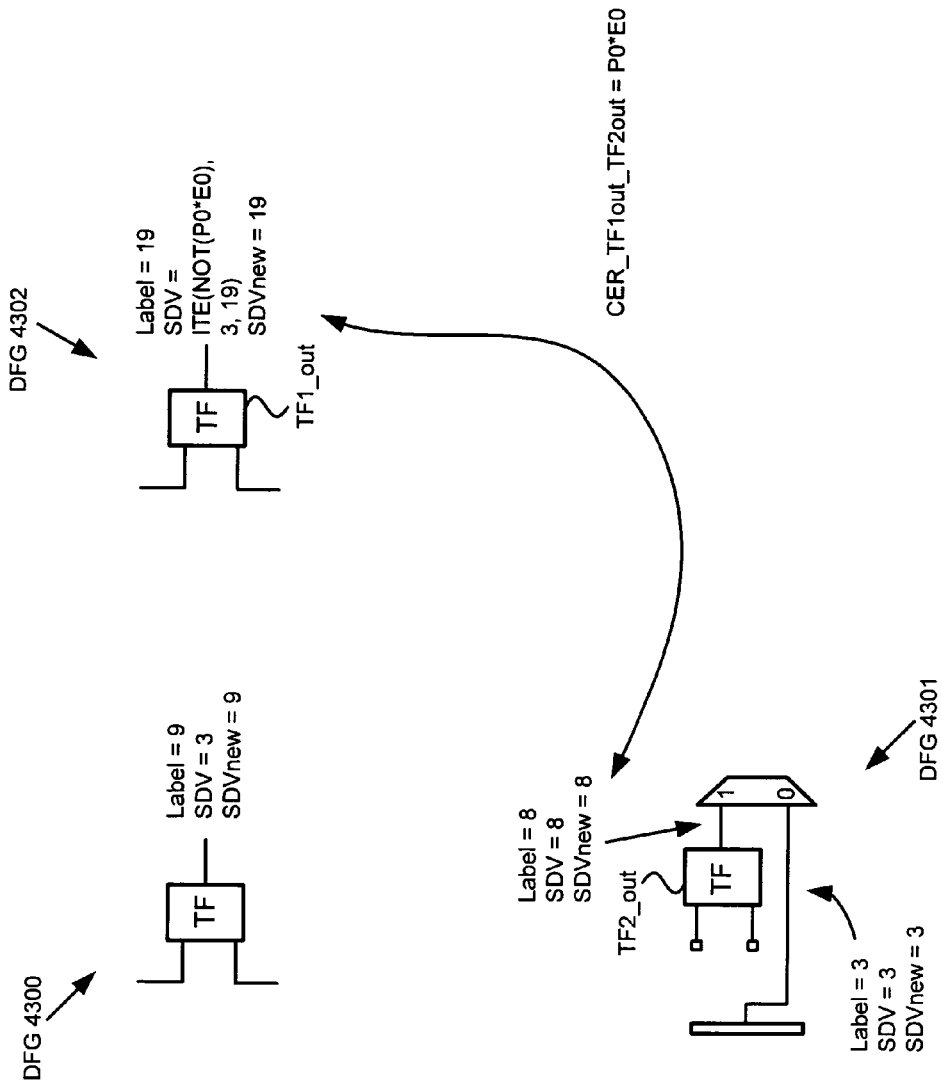
Figure 22G:
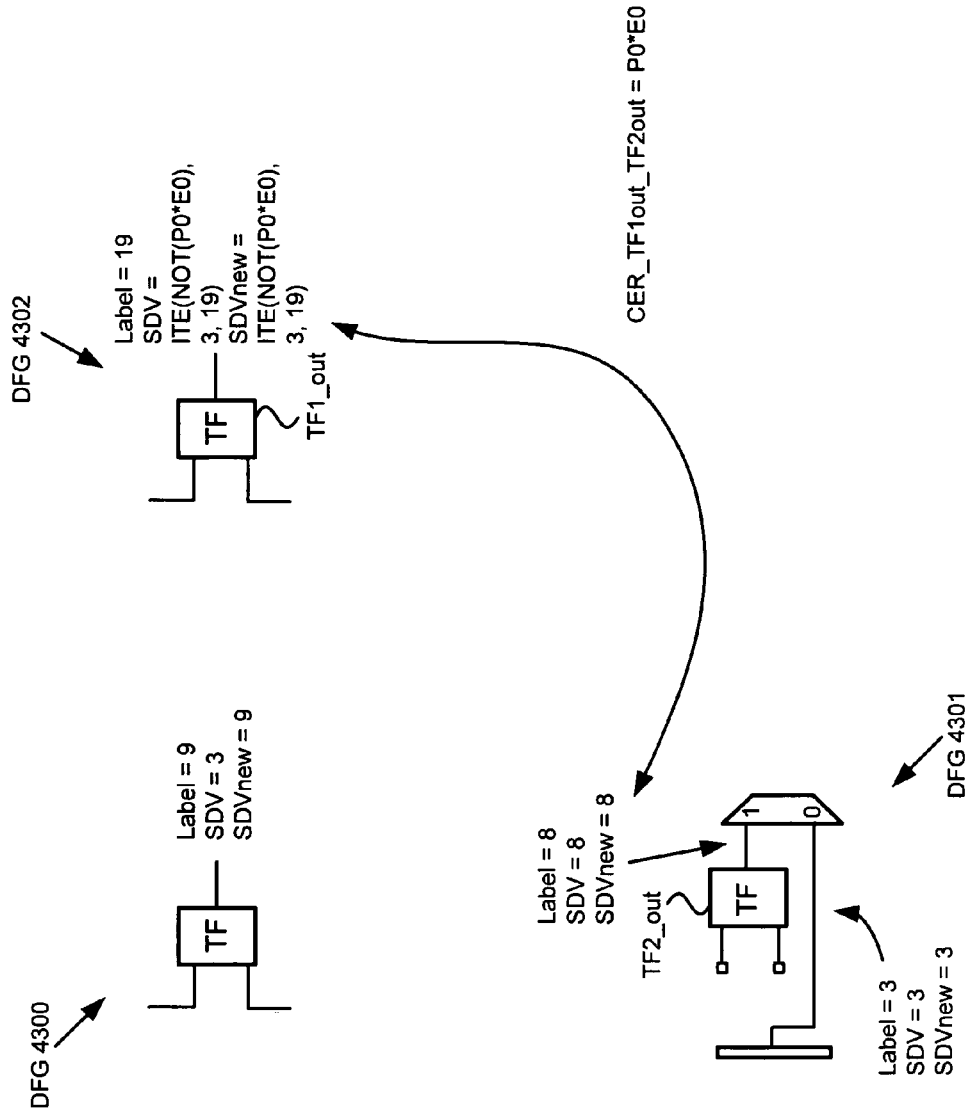
Figure 22H:
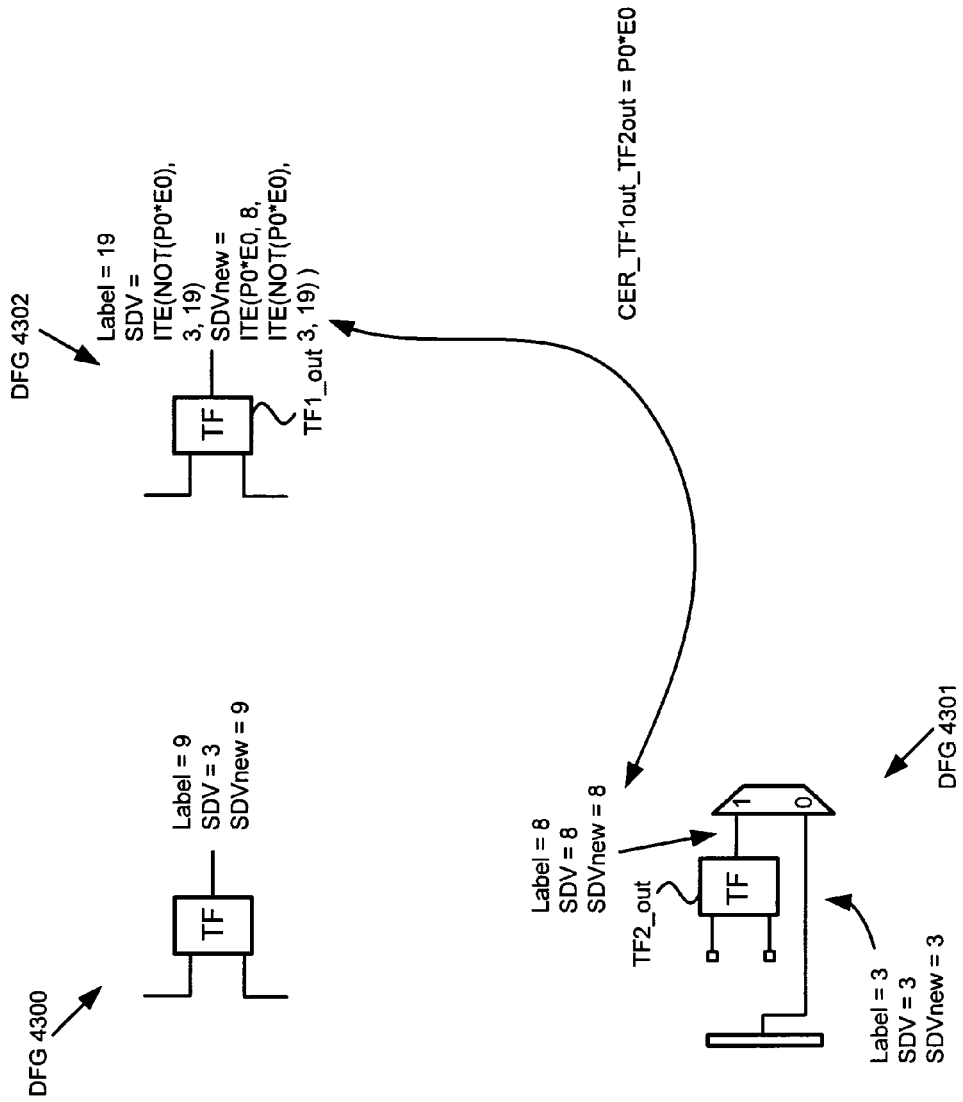
Figure 22I:
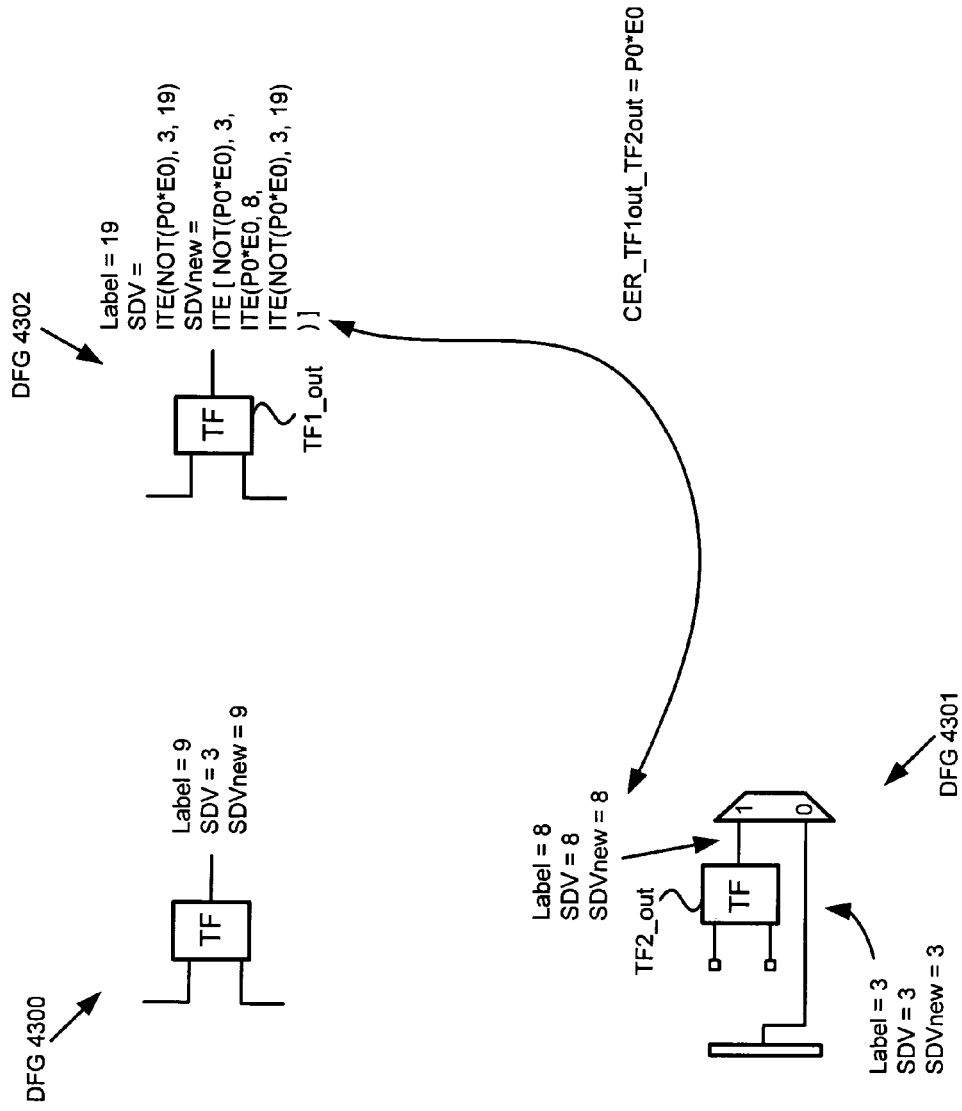
Figure 22J:
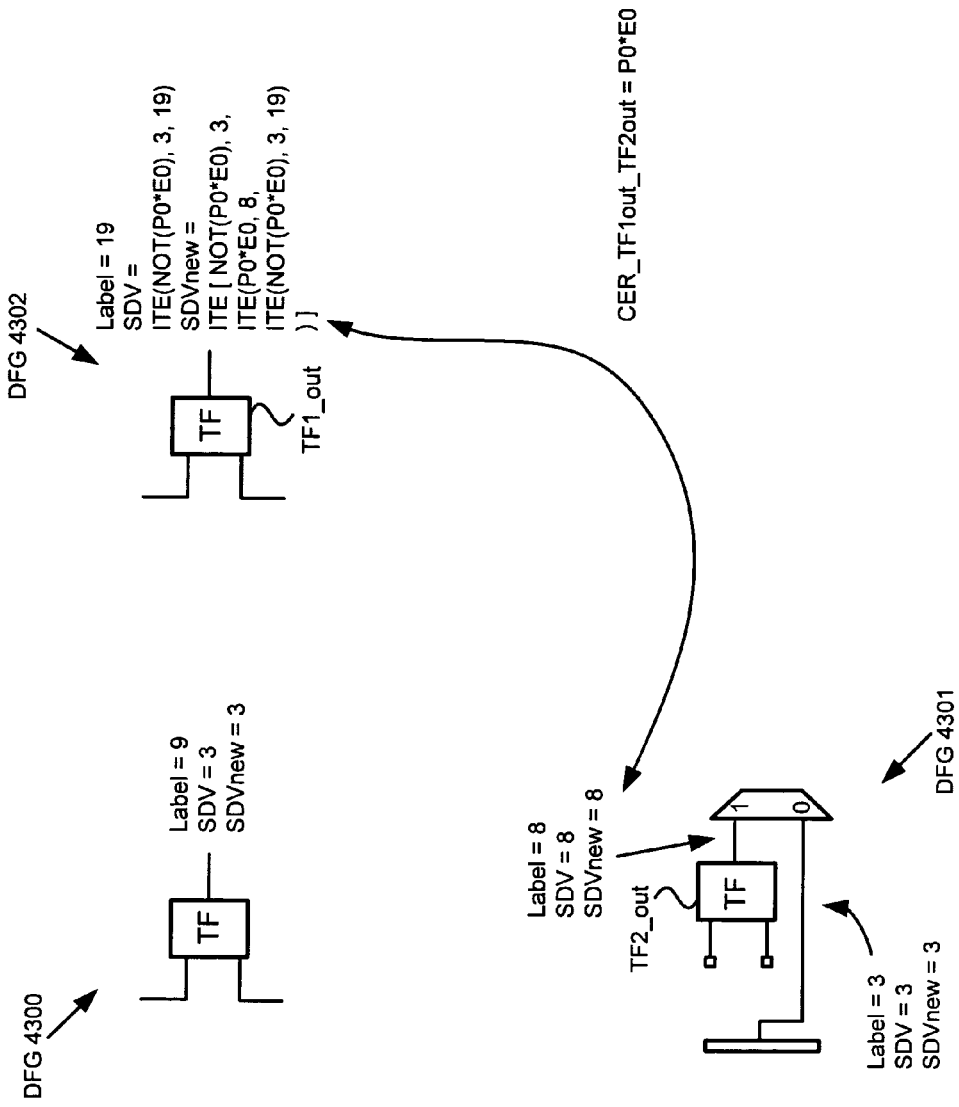
Figure 22K:
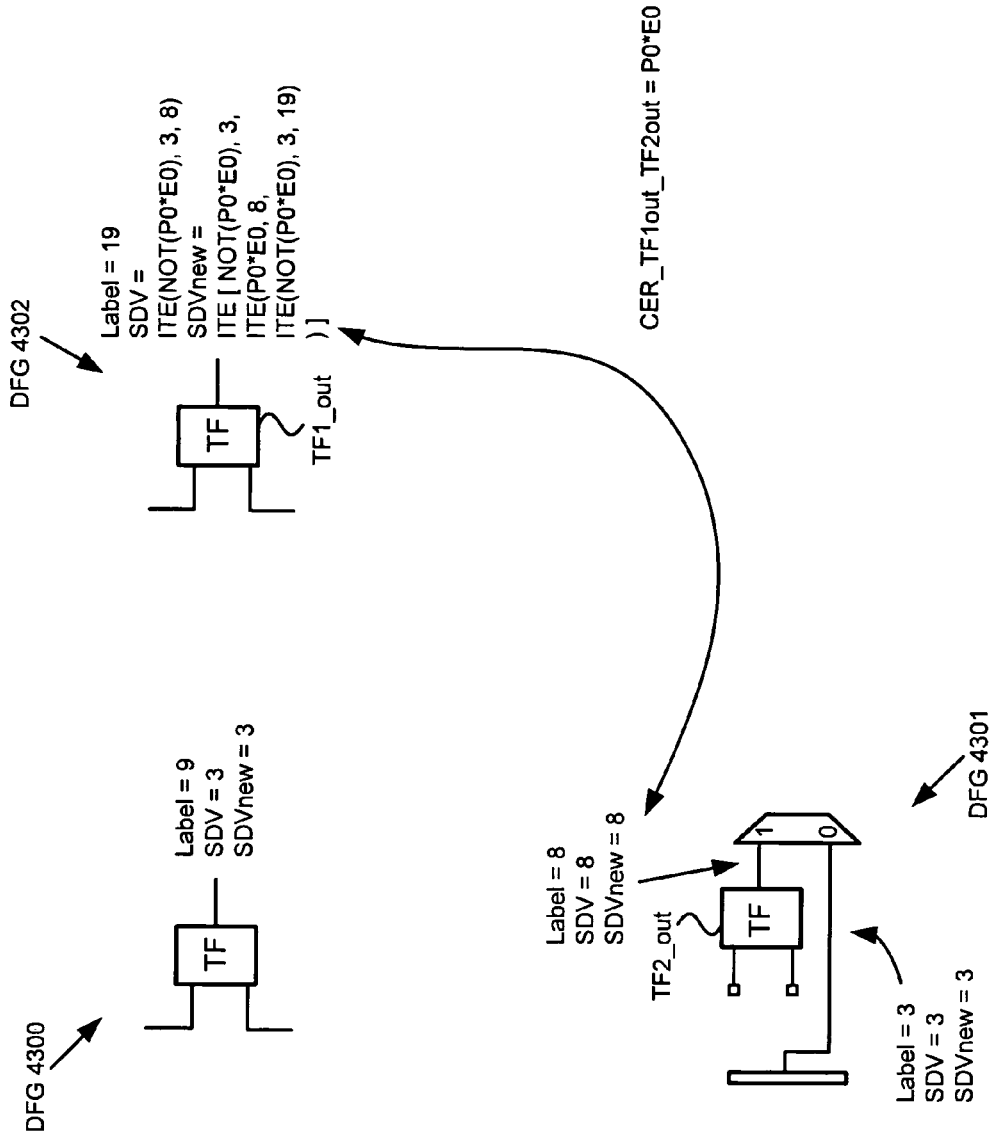

The net result of Add_CER executing the actions of FIG. 29C, lines 1-16 is to convert FIG. 22E to the state shown in FIG. 22F. The net result of Add_CER executing the actions of FIG. 29C, lines 19-34 is to convert FIG. 22F to the state shown in FIG. 22G. The net results of Add_CER executing the actions of FIG. 29D, lines 1-18, are shown in FIG. 22H. The net results of Add_CER executing the actions of FIG. 29D, lines 2149, are shown in FIG. 22I. The net results of Add_CER executing the actions of FIG. 29E, lines 1-27, are shown in FIG. 22J. The net results of Add_CER executing the actions of FIG. 29E, lines 3044, are shown in FIG. 22K. Step-by-step, the actions shown by FIGS. 29C-29E are as follows.

Lines 4-6 of FIG. 29C show the parameter values with which Add_CER is called.

FIG. 29C at lines 8-10 shows the determination of nodeset.

FIG. 29C, lines 12-16 show the initialization of SDV and SDVnew values.

FIG. 29C, line 23 shows the nodes of nodeset in descending order.

FIG. 29C at lines 25-28 show the selection of the first (nlow, nhigh) pair: (node_labeled_9, node_labeled_19).

For (node_labeled_9, node_labeled_19), all of c1, c2 and c3 evaluate to a zero value.

FIG. 29C, lines 32-34 show the determination of SDVnew for node_labeled_19.

FIG. 29D at lines 1-18 show the actions performed for the (nlow, nhigh) pair: (node_labeled_8, node_labeled_19). The net result of Add_CER executing the actions of FIG. 29D, lines 1-18, is to convert FIG. 22G to the state shown in FIG. 22H.

FIG. 29D at lines 21-30 show the actions performed for the (nlow, nhigh) pair: (node_labeled_8, node_labeled_9).

FIG. 29D at lines 3349 show the actions performed for the (nlow, nhigh) pair: (node_labeled_3, node_labeled_19).

FIG. 29E at lines 1-13 show the actions performed for the (nlow, nhigh) pair: (node_labeled_3, node_labeled_9).

FIG. 29E at lines 16-27 show the actions performed for the (nlow, nhigh) pair: (node_labeled_3, node_labeled_8).

FIG. 29E at lines 3044 show the actions performed after all (nlow, nhigh) pairs have been iterated over. The net result of Add_CER executing the actions of FIG. 29E, lines 30-44, is to convert FIG. 22J to the state shown in FIG. 22K.

8. Hardware Environment

Figure 31:
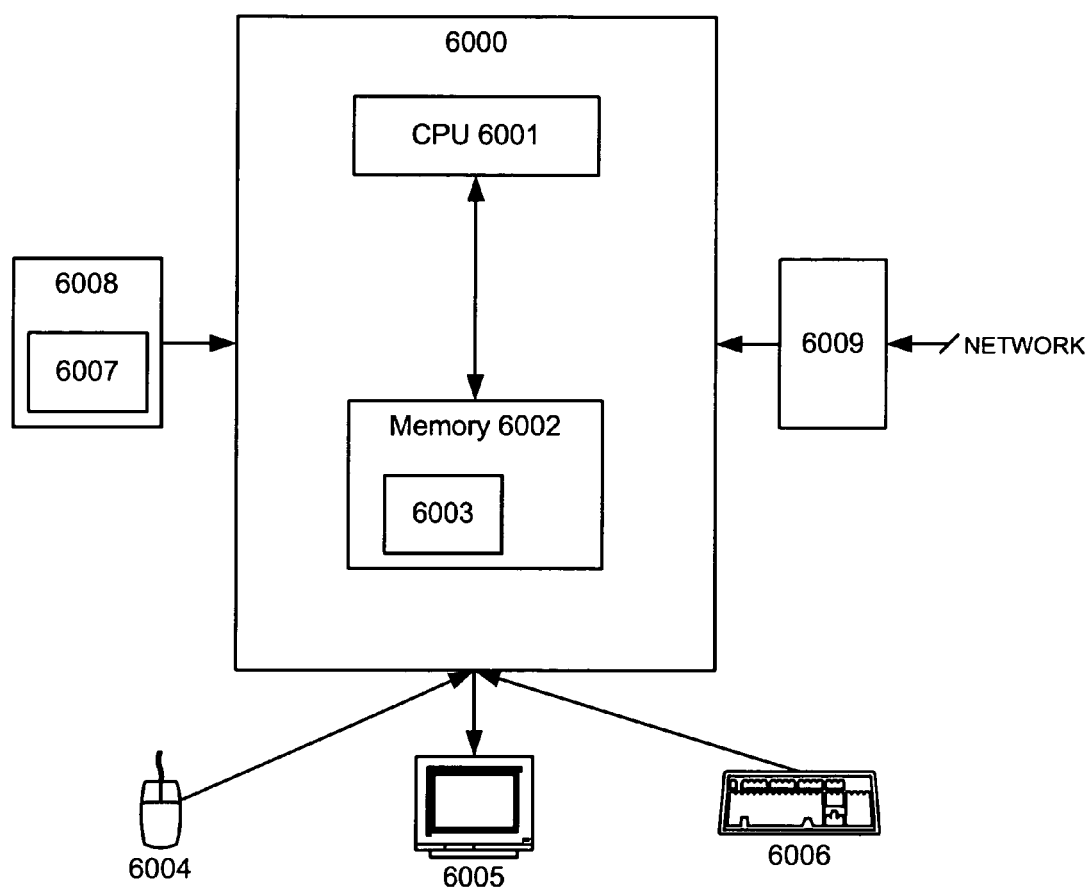
FIG. 31 depicts a data processing system for executing the equivalence determining architecture of the present invention, or for executing each of its component sub-systems individually.

The equivalence determining architecture of the present invention, or each of its component sub-systems individually, can be executed within a computing environment (or data processing system) such as that of FIG. 31. FIG. 31 depicts a workstation computer 6000 comprising a Central Processing Unit (CPU) 6001 (or other appropriate processor or processors) and a memory 6002. Memory 6002 has a region 6003 in which is stored the software tools (or computer programs) and data of the present invention. While 6003 is depicted as a single region, those of ordinary skill in the art will appreciate that, in fact, such software may be distributed over several memory regions or several computers. Furthermore, depending upon the computer's memory organization (such as virtual memory), memory 6002 may comprise several types of memory (including cache, random access memory, hard disk and networked file server). Computer 6000 can be equipped with a display monitor 6005, a mouse pointing device 6004 and a keyboard 6006 to provide interactivity between the software of the present invention and a chip designer. Computer 6000 also includes a way of reading computer readable instructions from a computer readable medium 6007, via a medium reader 6008, into the memory 6002. Computer 6000 also includes a way of reading computer readable instructions via the Internet (or other network) through network interface 6009.

In some embodiments, computer programs embodying the present invention are stored in a computer readable medium, e.g. CD-ROM or DVD. In other embodiments, the computer programs are embodied in an electromagnetic carrier wave. For example, the electromagnetic carrier wave may include the programs being accessed over a network.

9. Glossary of Selected Terms

CEC: Combinational Equivalence Check.

CFG: Control Flow Graph

Conditional expression: The expression, of a CFG conditional node, that evaluates to TRUE or FALSE. Flow of control, from the conditional node, proceeds in one of two directions depending upon the conditional expression's value.

EP: Execution Path.

EP queue: A queue of EPs. EPs can enter an EP queue at the "bottom" or input end of the queue. EPs can exit an EP queue at the "top" or output end of the queue.

FPT: Fixed-Point Target.

HLM: High-Level Model

HDL: Hardware Description Language, such as Verilog HDL.

Intersect: Two functions are defined, herein, to "intersect" if there is at least one input combination for which both are satisfied.

ITE: If-Then-Else.

lhs: left-hand-side

Miter: A term used herein to refer to the combination of $RTLM_{ts}[t]$, $HLM_{ts}[t]$ and $CS_{ts}[t]$.

MTBDD: Multi-Terminal Binary Decision Diagram. A type of BDD that can represent functions that return values other than just logic one or logic zero.

Non-canonical data structure: A data structure for representing symbolic functions, e.g., ((a+b)<(c−d)). A data structure is non-canonical if there exist several structurally different representations for the same function. A DFG is one type of non-canonical data structure. Example: The function 'a+b' can be represented with several different DFGs, e.g., (a+b+0) or ((a+c)+(b−c)).

Pseudo-code: The pseudo-code presented herein is loosely based on the C programming language. The C programming language is described in such texts as "A Book on C," by A. Kelley and I. Pohl, Benjamin Cummings Pub. Co., Third Edition, 1995, ISBN 0-8053-1677-9, herein incorporated by reference in its entirety. In pseudo-code procedure calls, a parameter is prefixed with the "&" operator to indicate that the called procedure will operate on the data object of the calling procedure. This use of the "&" operator is a standard part of the C programming language.

rhs: right-hand-side

RTLM: RTL Model

SDV: Symbolic Data Value. Can be of two types: integer SDV or ITE SDV.

Test bench: also referred to herein as a "combining structure" or CS.

Timestep-independent name: Each timestep used as part of the same miter repeats the same set of timestep-independent names. The timestep-independent names are carried over from the DFG that is converted into the timestep form. Timestep-independent names are characterized by the following property: any node "n1" of a timestep at time t=x1, where "x1" is any permissible timestep, and any node "n2" of a timestep at time t=x2, where "x2" is any permissible timestep other than "x1," that have the same timestep-independent name, serve the same function within their respective timesteps.

TF: Transformation Function. Identified in the Figures as any block labeled "TF." The contents of a TF is defined to be purely combinational logic.

Verilog HDL: A hardware description language. It is maintained as a standard by the Institute of Electrical and Electronic Engineers (IEEE). An example Verilog HDL standard is IEEE 1364.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for producing a non-canonical data flow graph (DFG) structure by symbolic simulation of an input representation, comprising:
    determining a set of next execution paths to be processed from a set of active execution paths;
    determining a set of indication points, in the input representation, from the set of next execution paths;
    determining a next symbolic simulation operation to be performed, for producing the non-canonical DFG structure, using the indication points; and
    performing the next symbolic simulation operation on the input representation for producing the non-canonical DFG structure.

2. The method of claim 1, wherein the input representation is a control-flow graph.

3. The method of claim 2, wherein the step of determining a set of indication points further comprises:
    determining a location, in the control-flow graph, for each execution path of the set of next execution paths to be processed.

4. The method of claim 3, wherein the step of determining a next symbolic simulation operation to be performed further comprises:
    determining a type of node indicated by an execution path of the set of next execution paths to be processed.

5. The method of claim 1, further comprising a step of:
    determining the input representation from a high-level hardware model specification.

6. The method of claim 1, wherein the set of active execution paths is organized as a queue.

7. The method of claim 6, wherein the set of next execution paths to be processed is located at an output end of the queue.

8. The method of claim 1, wherein the step of determining a set of indication points further comprises:
    determining a first execution path and a second execution path indicate a same location of control flow in the input representation.

9. The method of claim 1, wherein the step of determining a next symbolic simulation operation to be performed further comprises:
   deciding to perform a next symbolic simulation operation of merging the first and second execution paths because they both indicate the same location of control flow in the input representation.

10. The method of claim 1, wherein the step of determining a set of indication points further comprises:
    determining a first execution path indicates, in the input representation, an evaluation of a conditional.

11. The method of claim 10, wherein the step of determining a next symbolic simulation operation to be performed further comprises:
    deciding to perform a next symbolic simulation operation of splitting the first execution path because it indicates evaluation of a conditional in the input representation.

12. The method of claim 1, wherein the step of determining a set of indication points further comprises:
    determining a first execution path indicates, in the input representation, an evaluation of an assignment.

13. The method of claim 12, wherein the step of determining a next symbolic simulation operation to be performed further comprises:
    deciding to perform a next symbolic simulation operation of producing, for the non-canonical DFG structure, a portion that evaluates according to the assignment evaluation indicated in the input representation.

14. The method of claim 9, wherein the of action of merging the first and second execution paths further comprises:
    determining a first path condition for a merged execution path by simplifying a disjunction of a path condition of the first execution path and a path condition of the second execution path.

15. The method of claim 14, further comprising the following steps:
    representing a first output, for inclusion in the non-canonical DFG structure, by an intermediate representation comprising output elements, wherein each output element refers to a non-canonical DFG structure and to a path condition of the input representation;
    identifying a first set of output elements whose path condition intersect with the first path condition; and
    producing a first multiplexer, for the non-canonical DFG structure, corresponding to the first set of output elements.

16. The method of claim 15, further comprising the following step:
    adding an output element to the intermediate representation that refers to the first multiplexer and to the first path condition.

17. The method of claim 15, further comprising the following step:
    for each output element, that is a member of the first set of output elements, change its path condition such that it does not intersect the first path condition.

18. The method of claim 17, further comprising the following step:
    for each output element, that is a member of the first set of output elements, whose path condition is fully contained in the first path condition, remove the output element from the intermediate representation for the first output.

19. The method of claim 15, wherein the step of producing a first multiplexer further comprises the following step:
    constructing a first ITE expression from the first set of output elements.

20. The method of claim 19, further comprising the following step:
    converting the first ITE expression into a first multi-terminal binary decision diagram.

21. The method of claim 20, further comprising the following step:
    simplifying the first multi-terminal binary decision diagram.

22. The method of claim 10, further comprising the following step:
    building a first non-canonical DFG structure for a conditional expression of the conditional.

23. The method of claim 22, further comprising the following step:
    generating a first variable that represents the first non-canonical DFG structure;
    generating a second execution path that includes a second path condition that is a conjunction of a first path condition of the first execution path and the first variable; and
    generating a third execution path that includes a third path condition that is a conjunction of a first path condition of the first execution path and a complement of the first variable.

24. The method of claim 12, further comprising the following step:
    representing a first output, to be set by the assignment, by an intermediate representation comprising output elements, wherein each output element refers to a non-canonical DFG structure and to a path condition of the input representation;
    building a first non-canonical DFG structure to represent evaluation of the assignment;
    adding a first output element to the intermediate representation that refers to the first non-canonical DFG structure and a first path condition of the first execution path.

25. The method of claim 24, further comprising the following step:
    insuring that output elements of the intermediate representation, other than the first output element, cover complementary path conditions to those covered by the first output element.

26. The method of claim 12, further comprising the following steps:
    identifying a first variable used to evaluate the assignment;
    representing the first variable by an intermediate representation comprising output elements, wherein each output element refers to a non-canonical DFG structure and to a path condition of the input representation;
    identifying a first set of output elements whose path condition intersect with a first path condition of the first execution path; and
    producing a first multiplexer, for the non-canonical DFG structure, corresponding to the first set of output elements;
    using the first multiplexer to build a non-canonical DFG structure that evaluates the assignment.

27. The method of claim 12, further comprising the following steps:
    identifying a first constant used to evaluate the assignment;
    producing a first node, for the non-canonical DFG structure, corresponding to the first constant;
    using the first node to build a non-canonical DFG structure that evaluates the assignment.

28. The method of claim 1, further comprising the following steps:
- representing a first output by an intermediate representation comprising output elements, wherein each output element refers to a non-canonical DFG structure and to a path condition of the input representation; and
- building a first non-canonical DFG structure, from the intermediate representation, to represent evaluation of the first output.

29. The method of claim 28, wherein the step of building a first non-canonical DFG structure further comprises:
- constructing a ITE expression from the output elements.

30. The method of claim 29, wherein the step of building a first non-canonical DFG structure further comprises:
- constructing a multi-terminal BDD from the ITE expression.

31. The method of claim 30, wherein the step of building a first non-canonical DFG structure further comprises:
- simplifying the multi-terminal BDD.

32. The method of claim 10, wherein the step of determining a next symbolic simulation operation to be performed further comprises:
- analyzing the conditional as being of a first type;
- applying a decision procedure corresponding to the first type.

33. The method of claim 32, wherein the step of applying a decision procedure further comprises:
- determining whether, starting at a first point in a symbolic simulation, the conditional always evaluates to a particular value.

34. The method of claim 33, wherein the step of applying a decision procedure further comprises:
- determining whether the conditional always evaluates to a particular value by application of a proof technique.

35. The method of claim 33, wherein the step of applying a decision procedure further comprises:
- determining whether a loop, formed with the conditional, terminates by determining a constant that bounds iteration.

36. The method of claim 1, further comprising:
- keeping the set of active execution paths sorted.

37. The method of claim 1, further comprising:
- keeping the execution paths, of the set of active execution paths, sorted according to a priority assigned to a location of the input representation indicated by each execution path.

38. The method of claim 37, further comprising:
- keeping the set of active execution paths sorted in descending order of priority, with a highest priority execution path at a top of a queue containing the set of active execution paths.

39. The method of claim 1, further comprising:
- traversing the input representation and assigning priorities to the input representation that effect an ordering of the set of active execution paths.

40. The method of claim 39, further comprising:
- traversing a plurality of nodes of the input representation and assigning a priority to a first node that is lower than any priority of a first plurality of predecessor nodes, wherein the first node has a first plurality of incoming edges from the first plurality of predecessor nodes.

41. The method of claim 39, further comprising:
- traversing a plurality of nodes of the input representation and assigning a priority to a first plurality of nodes, within a first cycle, that is higher than a priority of an exit node, wherein the exit node is outside any cycle and can be traversed-to from a node of the first cycle.

42. The method of claim 1, further comprising a step of:
- determining the input representation from a program written in a programming language.

43. The method of claim 42, wherein the programming language is used primarily for hardware model specification.

44. The method of claim 42, wherein the programming language is general purpose.

45. The method of claim 1, wherein the non-canonical DFG structure is a data-flow graph.

46. A data-processing system for producing a non-canonical data flow graph (DFG) structure by symbolic simulation of an input representation, comprising the following subsystems:
- a sub-system configured to determine a set of next execution paths to be processed from a set of active execution paths;
- a sub-system configured to determine a set of indication points, in the input representation, from the set of next execution paths;
- a sub-system configured to determine a next symbolic simulation operation to be performed, for producing the non-canonical DFG structure, using the indication points; and
- a sub-system configured to perform the next symbolic simulation operation on the input representation for producing the non-canonical DFG structure.

47. A computer readable storage device, having computer-readable code devices embodied therein, that when executed by a computer cause the computer to perform a method for producing a non-canonical data flow graph (DFG) structure by symbolic simulation of an input representation, the method comprising:
- determining a set of next execution paths to be processed from a set of active execution paths;
- determining a set of indication points, in the input representation, from the set of next execution paths;
- determining a next symbolic simulation operation to be performed, for producing the non-canonical DFG structure, using the indication points; and
- performing the next symbolic simulation operation on the input representation for producing the non-canonical DFG structure.

* * * * *